United States Patent
Rayner

(10) Patent No.: US 9,229,494 B2
(45) Date of Patent: Jan. 5, 2016

(54) ACCESSORIES FOR USE WITH HOUSING FOR AN ELECTRONIC DEVICE

(71) Applicant: TreeFrog Developments, Inc., San Diego, CA (US)

(72) Inventor: Gary Rayner, San Diego, CA (US)

(73) Assignee: TREEFROG DEVELOPMENTS, INC., San Diego, CA (US)

( * ) Notice: Subject to any disclaimer, the term of this patent is extended or adjusted under 35 U.S.C. 154(b) by 401 days.

(21) Appl. No.: 13/726,469

(22) Filed: Dec. 24, 2012

(65) Prior Publication Data
US 2014/0028243 A1 Jan. 30, 2014

Related U.S. Application Data

(60) Provisional application No. 61/579,636, filed on Dec. 22, 2011, provisional application No. 61/649,911, filed on May 21, 2012, provisional application No. 61/694,744, filed on Aug. 29, 2012, provisional application No. 61/708,629, filed on Oct. 1, 2012.

(51) Int. Cl.
| | |
|---|---|
| H02J 7/00 | (2006.01) |
| G06F 1/18 | (2006.01) |
| G06F 1/16 | (2006.01) |
| H02J 7/02 | (2006.01) |
| F16M 11/04 | (2006.01) |
| F16M 11/10 | (2006.01) |
| F16M 11/14 | (2006.01) |
| F16M 11/20 | (2006.01) |
| F16M 13/00 | (2006.01) |

(Continued)

(52) U.S. Cl.
CPC .............. *G06F 1/182* (2013.01); *F16M 11/041* (2013.01); *F16M 11/105* (2013.01); *F16M 11/14* (2013.01); *F16M 11/2057* (2013.01); *F16M 13/00* (2013.01); *F16M 13/022* (2013.01); *F16M 13/04* (2013.01); *G06F 1/163* (2013.01); *G06F 1/1632* (2013.01); *G06F 1/1635* (2013.01); *G06F 1/1637* (2013.01); *H02J 7/0052* (2013.01); *H02J 7/025* (2013.01); *H04B 1/385* (2013.01); *H04B 1/3877* (2013.01); *H04B 1/3888* (2013.01); *H05K 5/0013* (2013.01); *H05K 5/0086* (2013.01); *H05K 5/061* (2013.01); *A45C 2011/003* (2013.01); *H04B 2001/3855* (2013.01); *H04B 2001/3894* (2013.01); *H04M 1/04* (2013.01)

(58) Field of Classification Search
USPC ........... 320/112, 108; 361/701, 703, 722, 724
See application file for complete search history.

(56) References Cited

U.S. PATENT DOCUMENTS

| | | |
|---|---|---|
| 3,521,216 A | 7/1970 | Tolegian |
| 3,808,577 A | 4/1974 | Mathauser |

(Continued)

OTHER PUBLICATIONS

International Search Report and Written Opinion dated Mar. 8, 2013, for PCT application No. PCT/US2012/071520.

*Primary Examiner* — Brian Ngo

(57) ABSTRACT

This disclosure relates generally to a device for retaining an electronic device as well as for methods for using the device for the purpose of doing the same. In various instances, the electronic device includes a housing and the retaining device is adapted for interfacing with the housing of the electronic device. The housing may be a separate unit from the electronic device or part of the electronic device itself. In various instances, the housing is a separate unit from the electronic device, within which the electronic device is fitted. In certain instances, the housing for the electronic device is adapted for protecting the device from one or more of shock, liquid, dust, snow, and the like. The electronic device may be any suitable electronic device, such as a computer, mobile computer, notebook computer, tablet computer, telephone, personal digital assistant, or the like.

21 Claims, 192 Drawing Sheets

(51) Int. Cl.
  *F16M 13/02* (2006.01)
  *F16M 13/04* (2006.01)
  *H04B 1/3827* (2015.01)
  *H04B 1/3877* (2015.01)
  *H04B 1/3888* (2015.01)
  *H05K 5/00* (2006.01)
  *H05K 5/06* (2006.01)
  *H04M 1/04* (2006.01)
  *A45C 11/00* (2006.01)
  *H04B 1/38* (2015.01)

(56) References Cited

U.S. PATENT DOCUMENTS

| | | |
|---|---|---|
| 3,810,258 A | 5/1974 | Mathauser |
| 3,816,679 A | 6/1974 | Hotchkiss |
| 4,312,580 A | 1/1982 | Schwomma et al. |
| 4,420,078 A | 12/1983 | Belt et al. |
| 4,584,718 A | 4/1986 | Fuller |
| 4,649,453 A | 3/1987 | Iwasawa |
| 4,895,530 A | 1/1990 | Gugelmeyer et al. |
| 6,304,459 B1 | 10/2001 | Toyosato et al. |
| 7,158,376 B2 * | 1/2007 | Richardson et al. ..... 361/679.56 |
| 7,409,148 B2 | 8/2008 | Takahashi et al. |
| 7,464,813 B2 | 12/2008 | Carnevali |
| 7,889,489 B2 | 2/2011 | Richardson et al. |
| 7,889,498 B2 | 2/2011 | Diebel et al. |
| 7,993,071 B2 | 8/2011 | Clawson |
| 8,917,496 B2 | 12/2014 | Richardson et al. |
| 2005/0134215 A1 | 6/2005 | Bozzone et al. |
| 2008/0094027 A1 | 4/2008 | Cho |
| 2010/0298025 A1 | 11/2010 | Spence |
| 2011/0077063 A1 | 3/2011 | Yabe et al. |

* cited by examiner

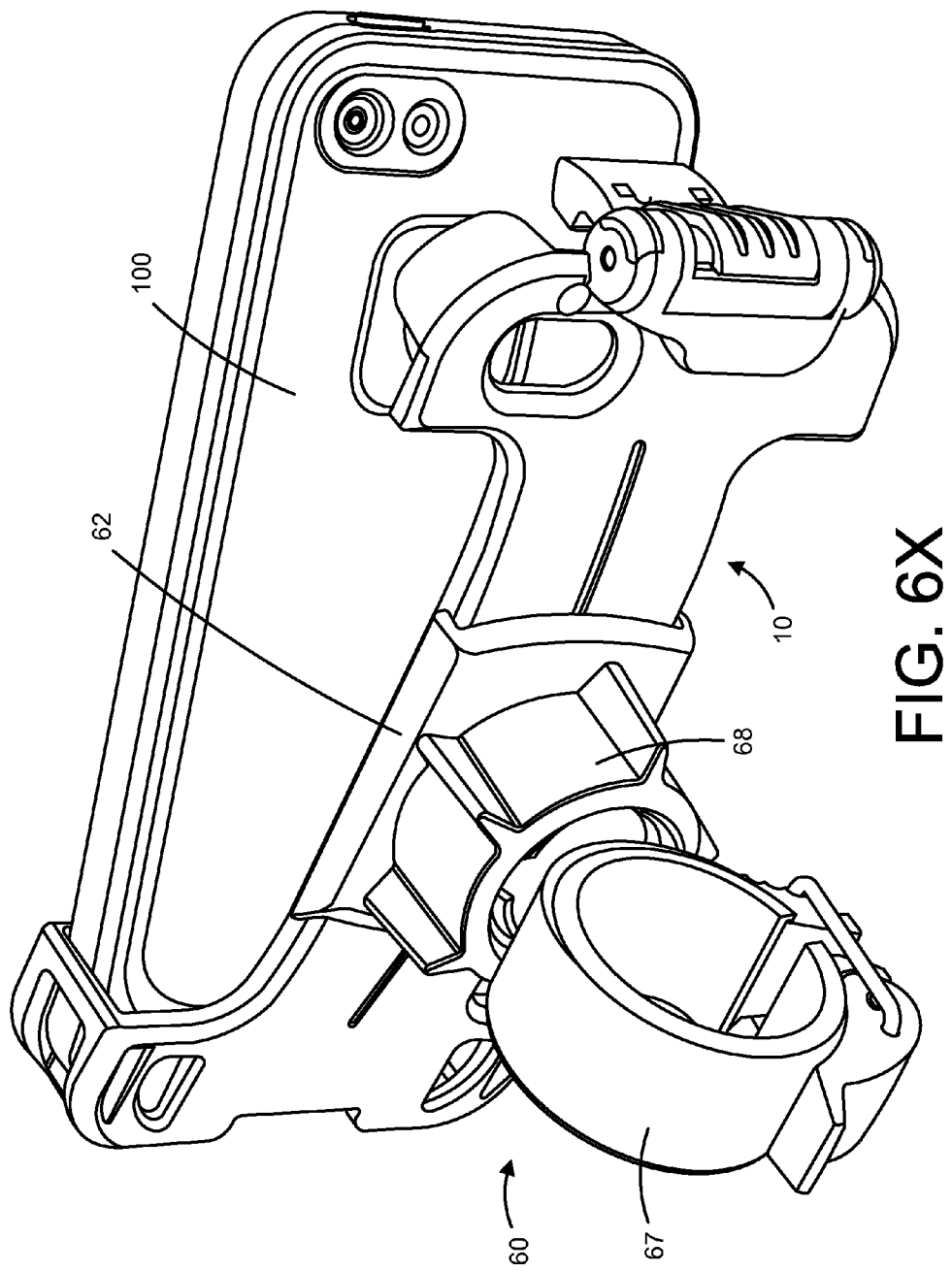

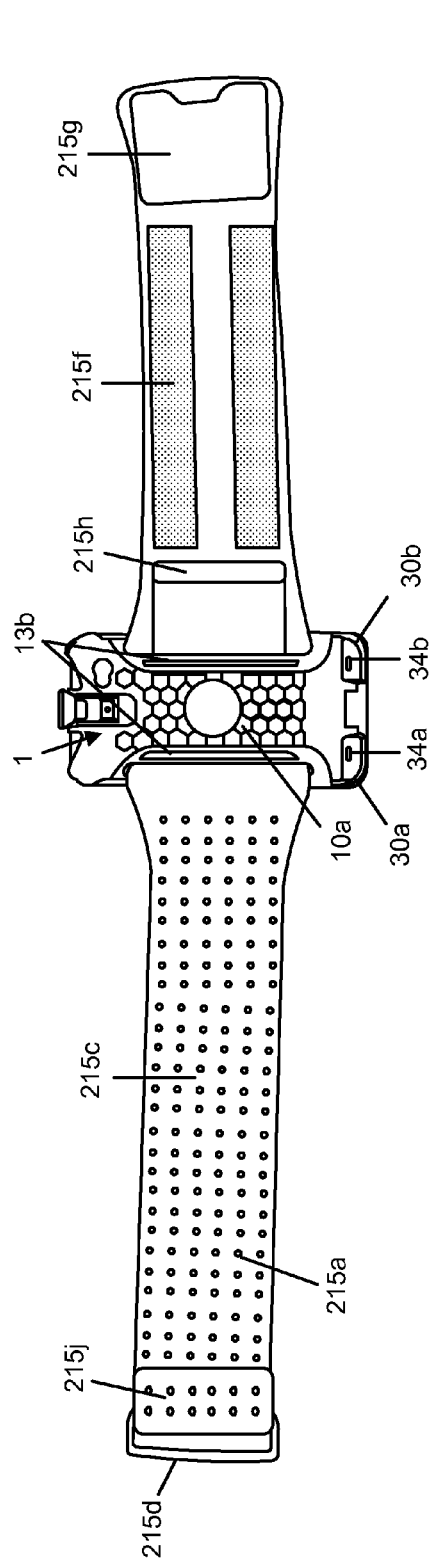
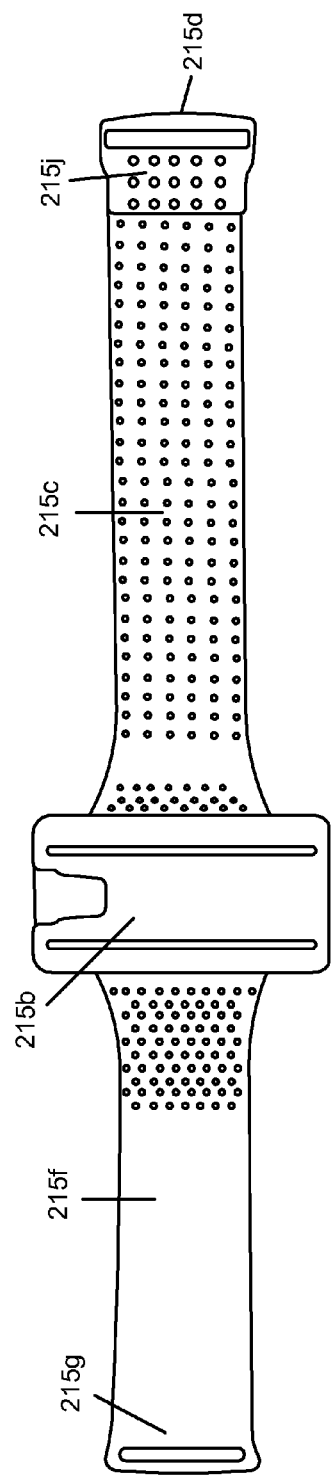
FIG. 7F(a)
FIG. 7F(b)

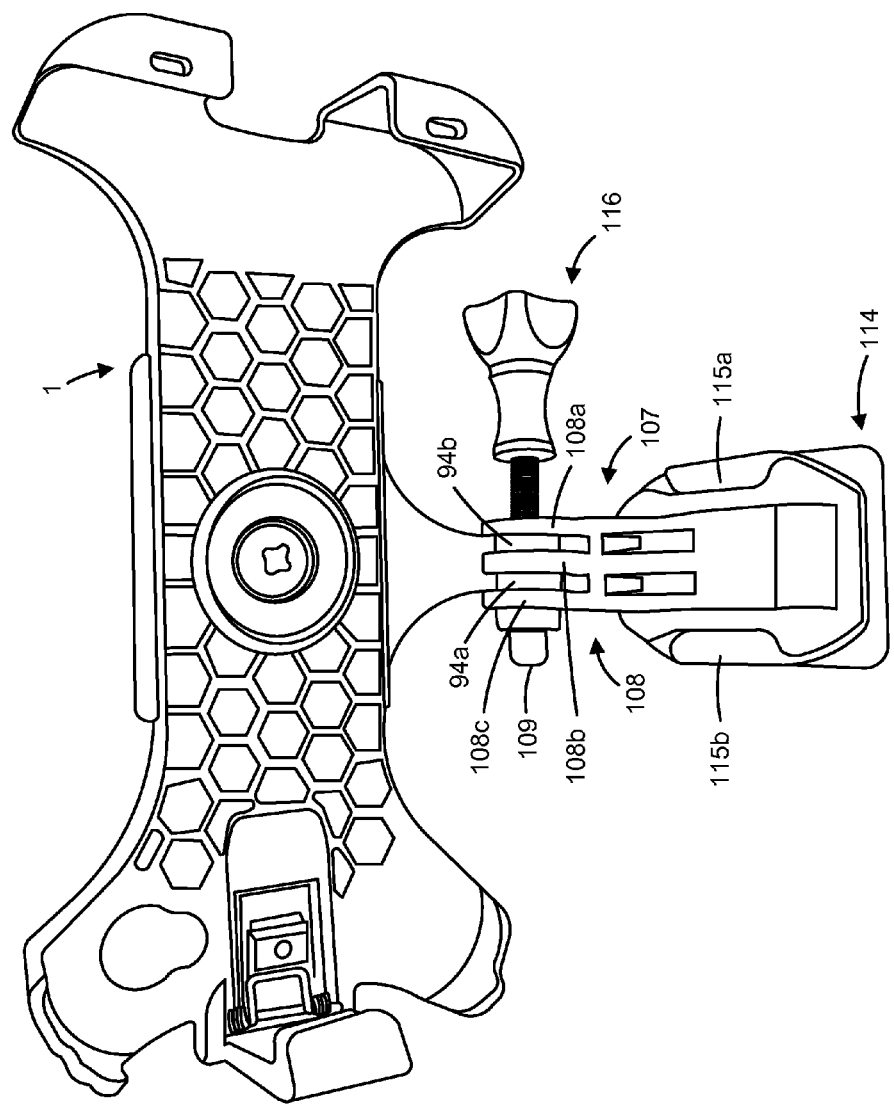

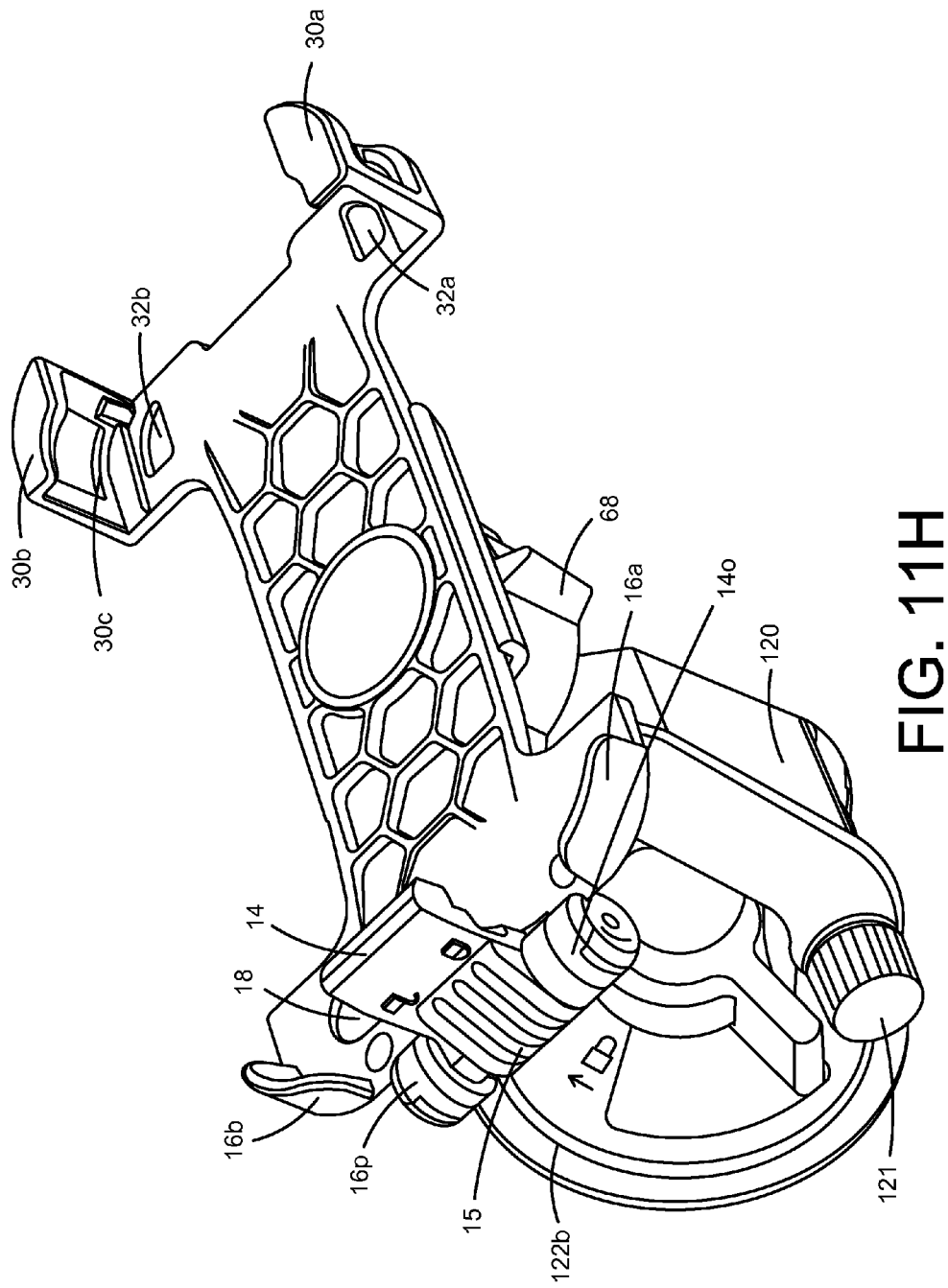

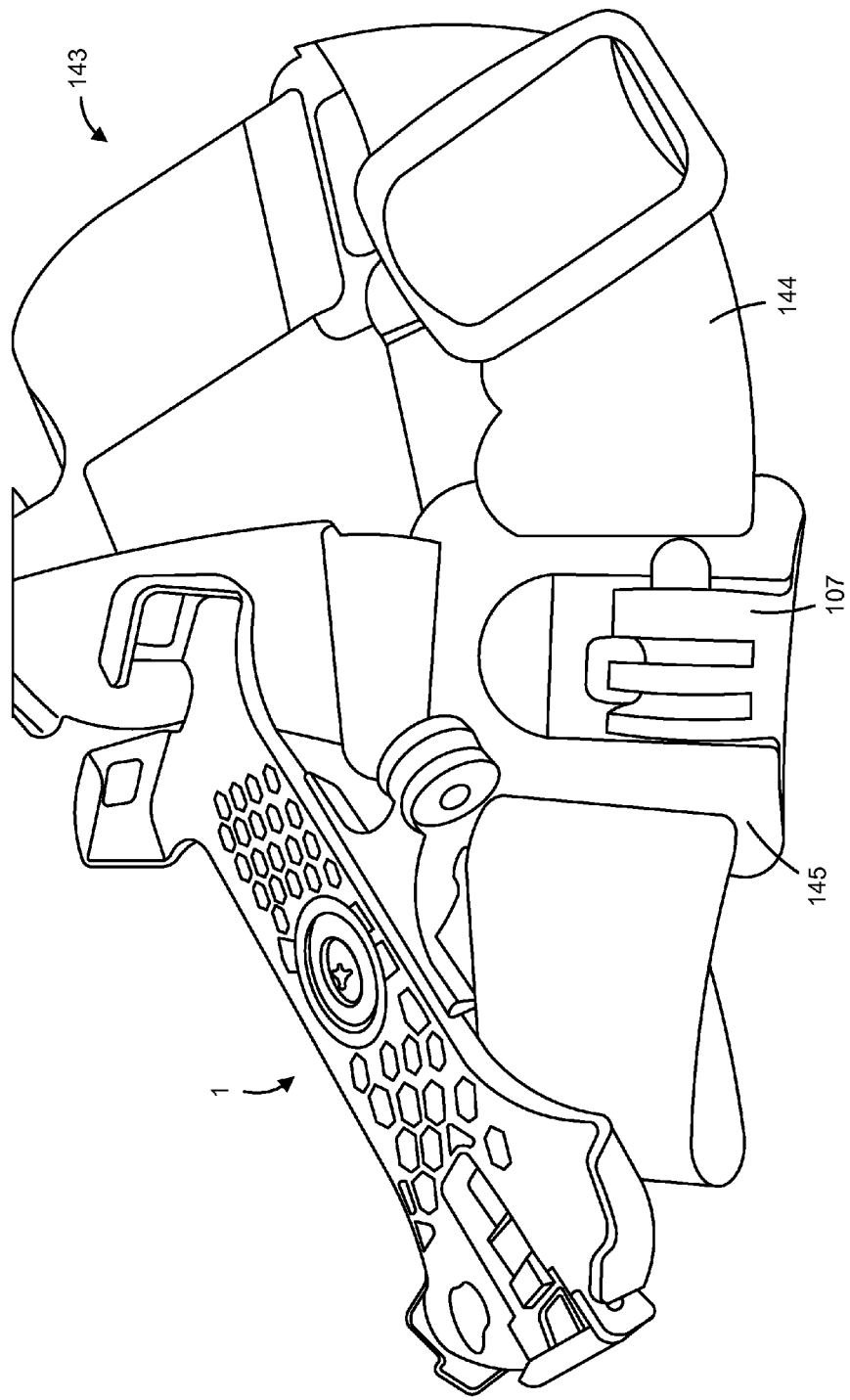

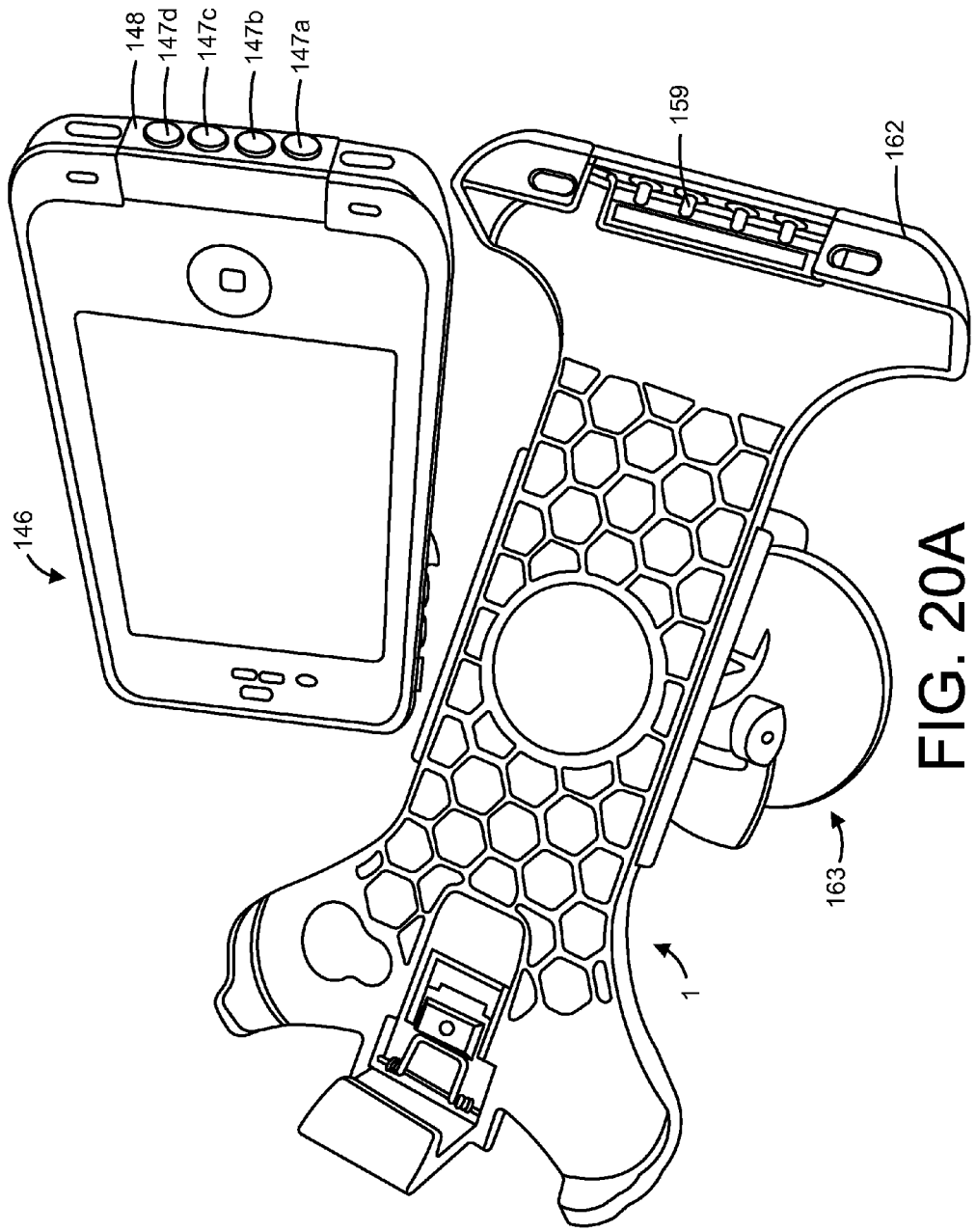

ACCESSORIES FOR USE WITH HOUSING FOR AN ELECTRONIC DEVICE

CROSS REFERENCE TO RELATED APPLICATION

This application is related to PCT Application Serial No. PCT/US12/71520 entitled, "Accessories For Use With Housing For An Electronic Device" filed on Dec. 21, 2012, and this application claims priority under 35 U.S.C. §119(e) to the following applications: U.S. Provisional Patent Application Ser. No. 61/579,636 entitled "Accessories For Use With Housing For An Electronic Device", filed on Dec. 22, 2011, U.S. Provisional Patent Application Ser. No. 61/649,911 entitled "Accessories For Use With Housing For An Electronic Device", filed on May 21, 2012, U.S. Provisional Patent Application Ser. No. 61/694,744 entitled "Accessories For Use With Housing For An Electronic Device", filed on Aug. 29, 2012, and U.S. Provisional Patent Application Ser. No. 61/708,629 entitled "Accessories For Use With Housing For An Electronic Device", filed on Oct. 1, 2012, the entirety of which is incorporated herein by reference.

FIELD

This disclosure relates generally to a device for retaining an electronic device as well as for methods for using the device for the purpose of doing the same. In various instances, the electronic device includes a housing and the retaining device is adapted for interfacing with the housing of the electronic device. The housing may be a separate unit from the electronic device or part of the electronic device itself. In various instances, the housing is a separate unit from the electronic device, within which the electronic device is fitted. In certain instances, the housing for the electronic device is adapted for protecting the device from one or more of shock, liquid, dust, snow, and the like. The electronic device may be any suitable electronic device, such as a computer, mobile computer, notebook computer, tablet computer, telephone, personal digital assistant, or the like.

BACKGROUND

Electronic devices are well known and widely used. For instance, mobile computers, tablet PCs, telephones, personal digital assistants, and the like are electronic devices that are capable of receiving inputs, calculating data pertaining to those inputs, and generating outputs concerning the same. Such data may be important in maximizing ones efficiency and/or enjoyment when participating in the various activities of daily life. Consequently, such electronic devices that are capable of collecting, compiling, and outputting such data are also important in maximizing ones efficiency and/or enjoyment when interacting with such varied activities present in daily life.

However, in participating in these various activities can expose such electronic devices to conditions such as rain, dirt, dust, mud, snow, and water (in all of its forms) that can be damaging to these electronic devices. Additionally, the typical housing that encases the components of these electronic devices are fragile or otherwise breakable and can be damaged by mistreatment and/or other inappropriate handling, such as by dropping. It is, therefore, useful to have a housing within which an electronic device, or the components thereof, in need of protection may be housed so as to protect it from inclement conditions, mistreatment, and/or inappropriate handling. Consequently, the housing of the actual electronic device itself may be ruggedized, or a separate housing designed to house the electronic device may be provided so as to protect the electronic device, or its components, from such damage. One such housing is provided in U.S.S.N. 12, which is incorporated herein by reference in its entirety.

An unfortunate circumstance of ruggedizing a housing of the electronic device itself and/or providing a separate protective housing for the same is that it increases the size of the electronic device making transportation of the device more cumbersome. Accordingly, on one hand, providing environmental protection for such electronic devices allows them to be used in situations wherein the fear of breakage would otherwise prevent their use, however, such protection makes their transport more difficult and therefore decreases their usability. There is therefore a need in the art for a mechanism whereby such portable electronic devices are capable of being protected at the same time as being easily transported. It would further be useful to develop a transportation mechanism that increases the usability of such electronic devices during transportation.

The present disclosure is directed to an apparatus and system for more easily transporting a housing of an object, such as a device and/or the components thereof, as well as methods for using the same, in a manner that offers both protection for the device from adverse environmental conditions, inclement weather, mishandling and/or damage, such as from contacting a fluid, such as water, at the same time as increasing its usability while being transported.

SUMMARY

In one aspect, a device or a system of devices for one or more of protecting, retaining, and/or transporting an object, such as a device, for instance, an electronic device, is provided. In its most basic form, the device may be a sled, which sled is configured for retaining an electronic device and/or an electronic device that has been housed within a housing such as a ruggedized housing. The retaining sled itself may then be adapted in various manners so as to be easily transported in one or more of a multiplicity of ways.

Accordingly, in one instance, a sled for retaining an electronic device is provided. The sled includes an elongated member having a proximal portion and a distal portion, which elongated member is circumscribed by a perimeter portion. The elongated member is configured for interfacing with a surface of an electronic device or a housing that is capable of housing the same, e.g., a front or back surface of an electronic device or a housing, such as a ruggedized housing, therefore. One or both of the elongated member or the perimeter portion are configured for supporting the electronic device while in the sled.

The sled further includes at least one clasping mechanism that is configured for removably retaining the electronic device within the sled. Any suitable clasping mechanism may be employed so long as such clasping mechanism is capable of interfacing with a portion of the electronic device, and/or a housing therefore, as well as the sled in such a manner that by said interaction the electronic device is retained within the sled. The clasping mechanism may be positioned anywhere along the sled, and in some instances, is positioned along the perimeter portion, such as at one or both of said proximal and/or distal portions of the elongated member.

The object to be retained may be any suitable object capable of being retained within such a sled. In certain instances, the object is a device, such as an electronic device. Suitable electronic devices may include one or more of a mobile computing device, such as a personal computer, a notebook computer, a tablet computer, an electronic reader, a mobile telephone, a personal digital assistant, and other such electronic devices and/or a combination of the same. In certain instances, the object is a housing configured to house a device, such as an electronic device.

It is understood that the sled herein disclosed may be configured for retaining an electronic device itself, or a housing within which an electronic device is to be housed, such as a ruggedized housing. For the purpose of enhancing clarity and for ease of reference only, the following disclosure will be described with reference to the sled being configured for retaining a housing, which housing is adapted for housing the electronic device. It is nevertheless to be understood that the sled may just as easily be adapted for interfacing directly with the electronic device itself rather than through the medium of a housing for said electronic device.

Accordingly, in various embodiments, one or more of the aforementioned electronic devices may be provided in conjunction with a housing, such as a waterproof and/or shockproof housing, such as that described in U.S. Patent Publication No. 2012/0118773, the contents of which are incorporated by reference herein for all purposes. In such embodiments, the sled may be configured for interfacing with and retaining the housing, which housing houses the electronic device. Such a housing, therefore, may be configured such that the electronic device may be fitted within the housing, so as to be protected thereby, and the sled may be configured for receiving and retaining the housing therein.

In certain instances, therefore, the sled may include one or more support elements, such as along a perimeter portion of the sled, wherein the support members are configured for supporting and/or retaining the housing and/or electronic device within the sled. One or more support elements may be provided such as along one or more perimeter edges and/or corners. For instance, in certain embodiments, two supporting elements may be provided, such as at the corners of the distal portion of the elongated member, and/or two supporting elements may be provided, such as at the corners of a proximal portion of the elongated member. In another instance, one or more sides or edges of the sled may include suitable supporting elements.

The support element may have any suitable configuration so long as it is capable of interacting with a housing and/or electronic device and supporting and/or retaining the housing within the sled. For instance, in certain instances, the supporting element may be configured as a pocket and/or a dead stop. For example, in certain instances, a plurality of support members may be provided, such as at the proximal and/or distal corners of the sled, wherein some of the support members are configured as a pocket, such as at the distal corners, and some of the support members are configured as hard stops, such as at the proximal corners. Additional or alternative support members may also be provided, such as along one or more of the side edges of the sled.

In certain embodiments, the sled is configured for receiving a utility attachment. For instance, the sled may be adapted for being coupled to a utility member such as a belt clip member, a bike clip member, an armband member, a universal mounting member, a car mounting system, a windshield mounting system, an external or internal battery charging system, a solar panel system, an external speaker system, and the like. For example, a portion of the sled may be configured for being removably or non-removably coupled to one or more utility members the coupling of which converts the sled into one or more accessories for use with an electronic device, more specifically for use in transporting and/or using an electronic device during transportation. In certain embodiments, the one or more accessory attachments may be interchangeable with the sled making the sled and attachments an interchangeable system, in other embodiments, once an attachment is coupled to the sled it is coupled in a non-removable fashion. The disclosure provides an apparatus for covering at least part of a mobile computing device having a touch screen display. The mobile computing device can also have an electrical connection in a housing that houses the mobile computing device. The apparatus includes a liquid resistant encasement that prevents damage to the mobile computing device from a liquid when the mobile computing device is encased in the liquid resistant encasement and when the liquid resistant encasement is in a sealed configuration with the mobile computing device, the liquid resistant encasement further enabling operation of the touch screen display when the mobile computing device is encased therein, the encasement having an outer surface and an inner surface and an aperture passing therethrough proximate the electrical connection; a charging mechanism adapted to sealably occupy the aperture in the encasement, the charging mechanism having a charge carrier proximate the interior surface of the encasement, the charging mechanism further having an electrical connection adapter having a first electrical interface for interfacing with the electrical connection of the mobile computing device when the encasement covers the at least part of the mobile computing device that includes the electrical connection, and the electrical connection adapter further having a second electrical interface electrically coupled with the charge carrier for transferring electrical charge from the charge carrier to the first electrical interface.

The disclosure also provides an apparatus for covering and charging a mobile computing device having a housing that comprises a touch screen display. The mobile computing device can also include one or more liquid permeable features. The one or more liquid permeable features can include an electrical connection for charging the mobile computing device. The apparatus includes an encasement that enables operation of the touch screen display of the housing of the mobile computing device, the encasement to cover at least part of the mobile computing device that includes the electrical connection, the encasement having one or more sealing members for providing a liquid resistant seal to the one or more liquid permeable features of the mobile computing device, the encasement having an outer surface and an interior surface; and a charging mechanism having a charge carrier proximate the interior surface of the encasement, the charging mechanism further having an electrical connection adapter having a first electrical interface for interfacing with the electrical connection of the mobile computing device when the encasement covers the at least part of the mobile computing device that includes the electrical connection, and the electrical connection adapter further having a second electrical interface electrically coupled with the charge carrier for transferring electrical charge from the charge carrier to the first electrical interface.

In one embodiment, the charge carrier is an induction plate. In another embodiment, the charge carrier is a battery.

The disclosure also provides an apparatus for covering at least part of a mobile computing device having a touch screen display including an electrical connection in a housing that houses the mobile computing device. In one embodiment, the apparatus includes an encasement that covers at least a part of the mobile computing device. In certain embodiments, the encasement includes at least one aperture in the encasement proximate the electrical connection, the at least one aperture having a gasket seat. The apparatus can also include an electrical connection adapter having a body for enclosing the at least one aperture in the encasement, the electrical connection adapter having a first electrical interface connected with the body, the first electrical interface for interfacing with the electrical connection of the mobile computing device when the body encloses the at least one aperture in the encasement, the electrical connection adapter further having a second electrical interface connected with the body, the second electrical interface for transferring electrical power and/or data signals to and from the first electrical interface, the second electrical interface including a plurality of sealed, electrically-conductive members; and a gasket for being seated on the gasket seat to seal an interface between the at least one aperture in the encasement and the body of the electrical connection adapter.

In certain embodiments, the apparatus includes an encasement that covers at least part of the mobile computing device that includes the electrical connection, the encasement having a bottom member to cover at least a first portion of the mobile computing device, and a top member to cover at least a second portion of the mobile computing device, the top member configured to allow touch access to the touch screen display; and a coupling mechanism to couple the top member with the bottom member to cover the first and second portions of the mobile computing device, and to seal the top member with the bottom member.

In certain embodiments, the apparatus also includes a second coupling mechanism to couple the electrical connection adapter to the encasement when the body encloses the at least one aperture in the encasement.

The disclosure also provides an apparatus for covering at least part of a mobile computing device having a touch screen display. The mobile computing device also includes an electrical connection in a housing that houses the mobile computing device. In certain embodiments, the apparatus includes an encasement that enables operation of the touch screen display and covers at least part of the mobile computing device that includes the electrical connection, the encasement having a frame; and an electrical connection adapter disposed within a surface of the frame proximate the electrical connection, the electrical connection adapter having a first electrical interface connected with the frame, the first electrical interface for interfacing with the electrical connection of the mobile computing device when the mobile computing device is covered by the encasement, the electrical connection adapter further having a second electrical interface connected with the frame, the second electrical interface for transferring electrical power and/or data signals to and from the first electrical interface, the second electrical interface including a plurality of sealed, electrically-conductive members.

In certain embodiments, an electrical connection adapter can be embedded, attached to, integrated with, interior to or exterior to a surface of the frame proximate the electrical connection.

The disclosure also provides an apparatus for covering at least part of a mobile computing device having a touch screen display. The mobile computing device further having an electrical connection in a housing that houses the mobile computing device. In certain embodiments, the apparatus includes an encasement that enables operation of the touch screen display and covers at least part of the mobile computing device that includes the electrical connection, the encasement having an outer surface and an inner surface; an aperture passing through the inner surface and the outer surface of the encasement proximate the electrical connection; an electrical connection adapter having a body for enclosing the at least one aperture in the encasement, the electrical connection adapter having a first electrical interface connected with the body, the first electrical interface for interfacing with the electrical connection of the mobile computing device when the body encloses the at least one aperture in the encasement, the electrical connection adapter further having a second electrical interface connected with the body, the second electrical interface for transferring electrical power and/or data signals to and from the first electrical interface, the second electrical interface including a plurality of sealed, electrically-conductive members; and a gasket for being seated on the gasket seat to seal an interface between the at least one aperture in the encasement and the electrical connection adapter.

In certain embodiments, the encasement has a bottom member that covers at least a first portion of the mobile computing device, and a top member that covers at least a second portion of the mobile computing device. The top member can be configured to allow touch access to the touch screen display.

The disclosure also provides an apparatus for covering at least part of a mobile computing device having a touch screen display. The mobile computing device can also include an electrical connection in a housing that houses the mobile computing device. In certain embodiments, the apparatus includes a liquid resistant encasement that prevents damage to the mobile computing device from a liquid when the mobile computing device is encased in the liquid resistant encasement and when the liquid resistant encasement is in a sealed configuration with the mobile computing device, the liquid resistant encasement further enabling operation of the touch screen display when the mobile computing device is encased therein, the encasement having an outer surface and an inner surface and an aperture passing therethrough proximate the electrical connection; an electrical connection adapter having a body for sealing the at least one aperture against liquid intrusion into the liquid resistant encasement, the electrical connection adapter having a first electrical interface connected with the body, the first electrical interface for interfacing with the electrical connection of the mobile computing device when the body encloses the at least one aperture in the liquid resistant encasement, the electrical connection adapter further having a second electrical interface connected with the body, the second electrical interface for transferring electrical power and/or data signals to and from the first electrical interface, the second electrical interface including a plurality of sealed, electrically-conductive members.

The disclosure also provides a system for covering and charging a mobile computing device having a housing that comprises a touch screen display. The mobile computing device also including one or more liquid permeable features. The one or more liquid permeable features can also include an electrical connection for charging the mobile computing device. In certain embodiments, the system includes an encasement that enables operation of the touch screen display of the housing of the mobile computing device. In certain embodiments, the encasement covers at least part of the mobile computing device that includes the electrical connection. The encasement can include one or more sealing members for providing a liquid resistant seal to the one or more liquid permeable features of the mobile computing device, the encasement having an outer surface and an interior surface; a first induction plate proximate the interior surface of the encasement; and an electrical connection adapter having a first electrical interface for interfacing with the electrical connection of the mobile computing device when the encasement covers the at least part of the mobile computing device that includes the electrical connection, the electrical connection adapter further having a second electrical interface electrically coupled with the first induction plate for transferring electrical charge from the first induction plate to the first electrical interface. The encasement can also include a base unit having a second inductive plate for inducing a transfer of inductive charge to the first inductive plate of the encasement, which transfers the charge to the electrical connection adapter and to the electrical connection of the mobile computing device.

In certain embodiments, the base unit includes one or more alignment members that provide alignment for the encasement when the encasement is mated with the base unit, and to align the first induction plate with the second induction plate. In other embodiments, the liquid is water.

The disclosure also provides an apparatus for covering and charging a mobile computing device having a housing that comprises a touch screen display. The mobile computing device can also include one or more liquid permeable features. The one or more liquid permeable features can include an electrical connection for charging the mobile computing device. The apparatus can include an encasement that enables operation of the touch screen display of the housing of the mobile computing device, the encasement to cover at least part of the mobile computing device that includes the electrical connection. Optionally, the encasement having one or more sealing members for providing a liquid resistant seal to the one or more liquid permeable features of the mobile computing device. The encasement can also include an outer surface and an interior surface; a charging mechanism having an induction plate proximate the interior surface of the encasement, the charging mechanism further having an electrical connection adapter having a first electrical interface for interfacing with the electrical connection of the mobile computing device when the encasement covers the at least part of the mobile computing device that includes the electrical connection, and the electrical connection adapter further having a second electrical interface electrically coupled with the first induction plate for transferring electrical charge from the induction plate to the first electrical interface.

In certain embodiments, the encasement is a liquid resistant encasement that prevents damage to the mobile computing device from a liquid when the mobile computing device is encased in the liquid resistant encasement and when the liquid resistant encasement is in a sealed configuration with the mobile computing device, the liquid resistant encasement further enabling operation of the touch screen display when the mobile computing device is encased therein, the encasement having an outer surface and an inner surface and an aperture passing therethrough proximate the electrical connection.

BRIEF DESCRIPTION OF THE FIGURES

FIGS. 6U-6X are directed to an alternative embodiment of a sled and locking mechanism implemented with a bike mount and adapter.

FIGS. 10A-10G are directed to implementations of a mounting system for a sled of the disclosure.

FIGS. 11A-11H are directed to other implementations of a mounting system for a sled of the disclosure.

FIGS. 15A-15D are directed to other implementations of a mounting system for a sled of the disclosure.

FIGS. 20A-20B are directed to other implementations of an electrical device charging system for charging the electrical device as it is enclosed.

DETAILED DESCRIPTION OF THE DISCLOSURE

Figure 1A:
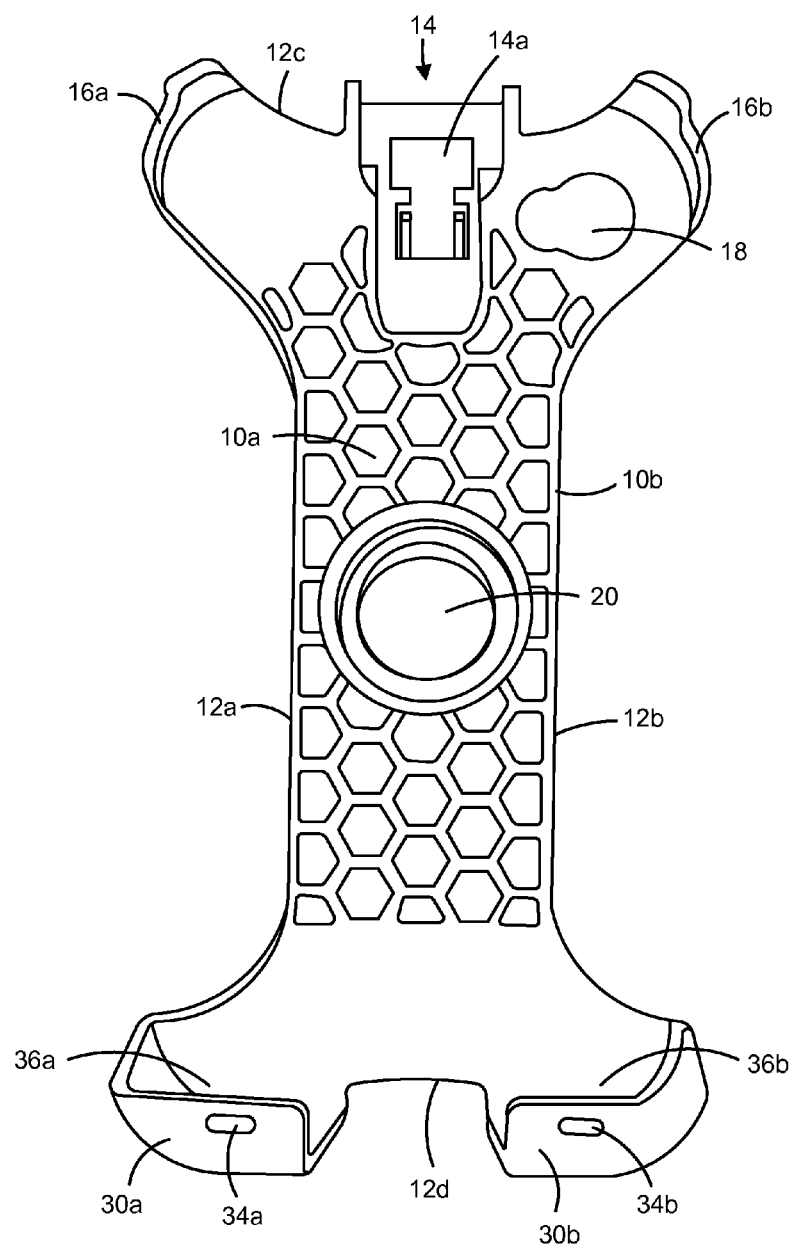
FIGS. 1A-1C are directed to a sled of the disclosure, wherein the sled is configured for retaining an electronic device and/or a housing therefor.

The present disclosure is directed to an apparatus and system for more easily transporting a housing of an object, such as a device and/or the components thereof, as well as methods for using the same, in a manner that offers both protection for the device from adverse environmental conditions, inclement weather, mishandling and/or damage, such as from contacting a fluid, such as water, at the same time as increasing its usability while being transported. The present disclosure is also directed to systems and methods for charging an electronic device within a housing, preferably as the electronic device is fully enclosed within the housing, for example, induction or electrical adapters.

In one aspect, the present disclosure is directed to a device or a system of devices for one or more of protecting, retaining, and/or transporting an object, such as a device, for instance, an electronic device. In one embodiment, such as provided with respect to FIG. 1A, in its most basic form, a device 1 of the disclosure may be configured as a sled 1. The sled 1 may be adapted for retaining an object such as a device. The sled may be adapted for retaining a device, such as an electronic device, either directly and/or may be adapted for retaining an electronic device that has been housed within a housing such as a ruggedized housing. The retaining sled 1 itself may then be adapted in various manners so as to be easily transported in one or more of a multiplicity of ways.

Although, in one instance, a sled for retaining an electronic device is provided, in various instances, the sled is adapted for retaining a housing, which housing is adapted for housing the electronic device. Accordingly, for the purpose of clarity only, the description provided herein below is directed to a sled 1 that is configured for retaining a housing 100 which housing is adapted for housing an electronic device 110. However, it is understood that such description applies equally well to the sled 1 being adapted for retaining the electronic device 110 directly without the electronic device 110 first being fit within a housing 100.

Accordingly, in various embodiments, an object, such as an electronic device, to be retained within a sled of the disclosure may be provided in conjunction with a housing, such as a waterproof and/or shockproof housing. In such embodiments, the sled may be configured for interfacing with and retaining the housing, which housing houses the electronic device. Such a housing, therefore, may be configured such that the electronic device may be fitted within the housing, so as to be protected thereby, and the sled may be configured for receiving and retaining the housing therein.

As the object to be retained, e.g., electronic device, may differ in its configuration, e.g., form factor and/or function, so to the configuration of the sled may differ so as to accommodate the different form factors and/or functions of the electronic device and/or housings for such electronic devices that are meant to be retained within the sled. A suitable electronic device for retention within the sled may be, for example, one or more of a mobile computing device, such as a personal computer, a notebook computer, a tablet computer, an electronic reader, a mobile telephone, a personal digital assistant, and other such electronic devices and/or a combination of the same. In certain instances, the object is a housing configured to house a device, such as an electronic device.

As can be seen with respect to FIG. 1A, the sled 1 includes an elongated member 10 having a front surface 10a and a back surface 10b. The elongated member 10 is circumscribed by a perimeter portion 12, which perimeter portion includes a proximal portion 12c and a distal portion 12d as well as first and second sides 12a and 12b, respectively.

The elongated member 10 is configured for interfacing with a surface of an electronic device or a housing that is capable of housing the electronic device. For instance, a front surface 10a of the sled 1 is configured for interfacing with a front or back surface of an electronic device 100 or a housing 110 therefore and/or for supporting the same. For example, one or both of the elongated member 10 or the perimeter portion 12 are configured for supporting the electronic device 100 or housing 110 while in the sled 1.

Accordingly, in certain instances, therefore, the sled 1 may include one or more support elements, such as 16 or 30, for instance, positioned along a perimeter portion 12 of the sled 1. The support members may have any suitable configuration so long as they are capable of supporting and/or retaining the housing 110 and/or electronic device 100 within the sled 1. One or more support elements may be provided such as along one or more perimeter edges and/or corners. For instance, as depicted, two supporting elements 16a and 16b may be provided, such as at the corners of the proximal portion 12c of the elongated member 10, and/or two supporting elements 30a and 30b may be provided, such as at the corners of a distal portion 12d of the elongated member 10. In other instances, one or more sides or edges, e.g., 12a or 12b, of the sled 1 may include suitable supporting or attachment elements.

The support element may have any suitable configuration so long as it is capable of interacting with a housing 110 and/or electronic device 100 and supporting and/or retaining the same within the sled 1. For instance, in certain embodiments, a suitable supporting element may be configured as a dead stop, such as 16a and 16b, and/or in other instances, suitable supporting elements, such as 30a and 30b, may be configured as a pocket. For example, in certain instances, a plurality of sets of support members may be provided, such as at the proximal 12c and/or distal 12d corners of the sled 1, wherein some of the support members are configured as hard stops, 16a and 16b, such as at the proximal 12c corners, and some of the support members are configured as pockets, 30a and 30b, such as at the distal 12d corners the support members, or vice versa. Additional or alternative support members may also be provided, such as along one or more of the side edges 12a and/or 12b of the sled 1.

The sled 1 may further include at least one clasping mechanism 14 that is configured for retaining and/or releasing an electronic device, and/or a case therefore, within the sled 1. Any suitable clasping mechanism may be employed so long as such clasping mechanism is capable of interfacing with a portion of the electronic device, and/or a housing therefore, as well as the sled in such a manner that by said interaction the electronic device and/or housing is retained within the sled 1. The clasping mechanism may be positioned anywhere along the sled, and in some instances, is positioned along the perimeter portion, such as at the proximal portion 12c and/or the distal portion 12d of the elongated member 10. In other instances, the clasping mechanism may be positioned along one or more sides 12a and/or 12b of the elongated member 1.

Figure 1B:
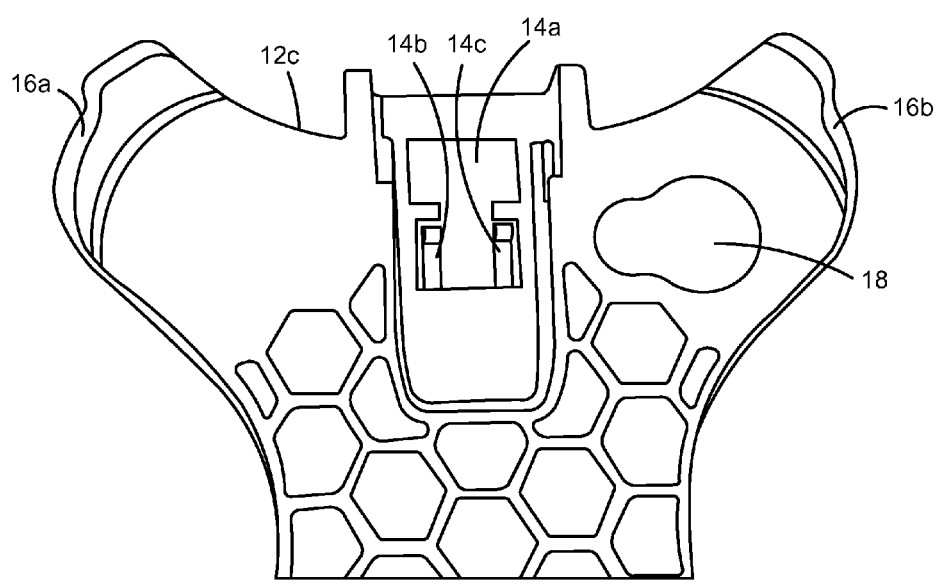
Figure 1C:
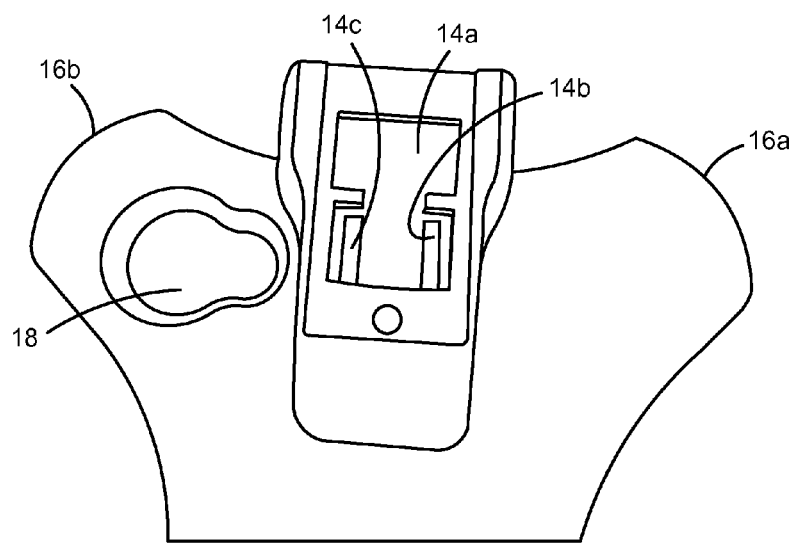

Hence, in certain embodiments, as can be seen with respect to FIGS. 1B and 1C a portion of the sled 1, such as the proximal portion 12c, may be configured for being coupled with a clasping mechanism, which clasping mechanism functions to engage a device, such as an electronic device or a housing therefore, and thereby to retain the device within the sled 1. As depicted the proximal portion 12c of the sled 1 is adapted so as to be functionally associated with a clasping mechanism 14, which clasping mechanism 14 is configured for being coupled to a device to be retained within the sled and is therefore configured for moving from a first clasped position to a second unclasped or released position or vice versa.

For instance, as shown in FIG. 1B, the front side 10a of the proximal portion 12c of the elongated member 10 of the sled 1 of FIG. 1A is illustrated. The front surface 10a of the sled 1 includes a cavity into which the clasping mechanism 14 is fitted. This cavity is useful in that it allows for a smooth, flat interface between the top surface 10a of the elongated member 10 and the contacting surface of the electronic device and/or housing to be retained by the sled 1 despite the presence of the clasping mechanism 14 within the cavity.

Additionally, FIG. 1B provides a view of the back side 10b of the proximal portion 12c of the elongated member 10 of the sled 1 of FIG. 1B. The back surface 10b of the sled 1 includes an extended portion that forms the boundaries of the cavity into which the clasping mechanism 14 is fitted. This extended portion is useful in that it allows for the smooth, flat interface between the top surface of the sled and the contacting surface of the device to be retained by the sled 1, e.g., despite the presence of the clasping mechanism and/or the locking member within the cavity.

Accordingly, in this instance, the proximal portion 12c includes a cavity configured for receiving one or more of the elements that together form the clasping mechanism 14. The clasping mechanism 14 is configured for being fit within the cavity and therein is adapted for being capable of movingly engaging a device so as to retain the device within or to release and/or eject the device from the sled. In this configuration, to effectuate these purposes, the clasping mechanism 14 is configured for rotating from a first position to a second position, whereby a device to be retained may be engaged within and/or released from the sled. In certain instances, it may be useful to lock the clasping mechanism in a released or a retained position. Therefore, the cavity of the proximal portion of the sled and/or the clasping mechanism may further be configured for being coupled to a locking element as well.

Accordingly, the cavity of the proximal portion 12c of the sled 1 may be configured for interfacing with a locking element 15, which locking element 15 is adapted for interacting with the clasping mechanism 14 within the cavity so as to lock the clasping mechanism 14 in the clasped or released position. For instance, the cavity may include an opening 14a into which the locking element 15 may be fitted so as to engage one or more portions of the clasping mechanism 14 thereby effectuating the locking or the releasing of the clasping mechanism 12. For example, the locking element 15 is configured for being fit through the opening 14a of the proximal portion 12c of the sled 1 and into a portion of the cavity wherein it couples to one or both of the sled 1 and the clasping mechanism 14. Within the cavity, the locking element 15 is capable of moving proximally and distally such as from an unlocked to a locked position.

More specifically, as depicted in FIG. 1B, for effectuating the interaction, e.g., locking, of the locking element 15 with the clasping mechanism 14, the clasping mechanism cavity may include one or more, e.g., a plurality, of locking member stops 14b and/or 14c that are positioned on opposite sides of the opening 14a and configured for engaging the locking element 15. For instance, a portion of the locking element 15 impinges through the opening 14a and into the cavity. In the cavity the locking element 15 is capable of moving, e.g., laterally, so as to engage one or both of the clasping member 14 and/or the locking member stops 14b and/or 14c within the cavity of the sled 1 in a manner sufficient to lock the clasping mechanism 14 in a locked position.

For instance, as can be seen with respect to FIG. 1C, the cavity includes an opening 14a through which a portion of the locking member 15 is fitted so as to interface with a corresponding portion of the clasping member 14. Also depicted are the locking member stops 14b and 14c, which stops function to stop the movement of the locking member 15 within the cavity once in a locked position. The cavity is further bounded by a plurality of opposing stop posts, which stop posts function to further effectuate the locking of the clasping mechanism 14 such as by engaging a locking portion of the locking member 15 and preventing movement of the locking member 15 in a manner that is normal to the plane of the cavity. For example, as the locking member 15 moves within the cavity into a locked position it contacts the locking member stops 14b and 14c which stops act to prevent the further movement of the locking member 15. The locking member stops 14a and 14b and a corresponding feature of the clasping mechanism 14 are adapted for interfacing with a corresponding surface on the locking member 15 as the locking member 15 moves distally from an unlocked to a locked position, thereby locking the clasping mechanism into a fixed, e.g., retained position.

Also depicted are support members, e.g., dead stops, 16a and 16b positioned at the corners of the perimeter portion of the elongated member 10 as well as a camera aperture 18, which camera aperture is positioned so as to be aligned with a corresponding camera portion of a retained electronic device or housing therefore.

As described above, a clasping mechanism for use in conjunction with the elongated member and/or support members of the sled for retaining an electronic device and/or housing therefore may have any suitable configuration so long as it is capable of functioning to retain the device within the sled. The clasping mechanism may be integral to the sled or it may be a separate element meant to be coupled to the sled, such as by clipping thereto. For instance, a suitable clasping mechanism may be an external clip, clamp, band or fastener, such as a hook and loop fastener, or adhesive, a combination of the same and the like that is a separate unit from but added to the sled.

Figure 1D:
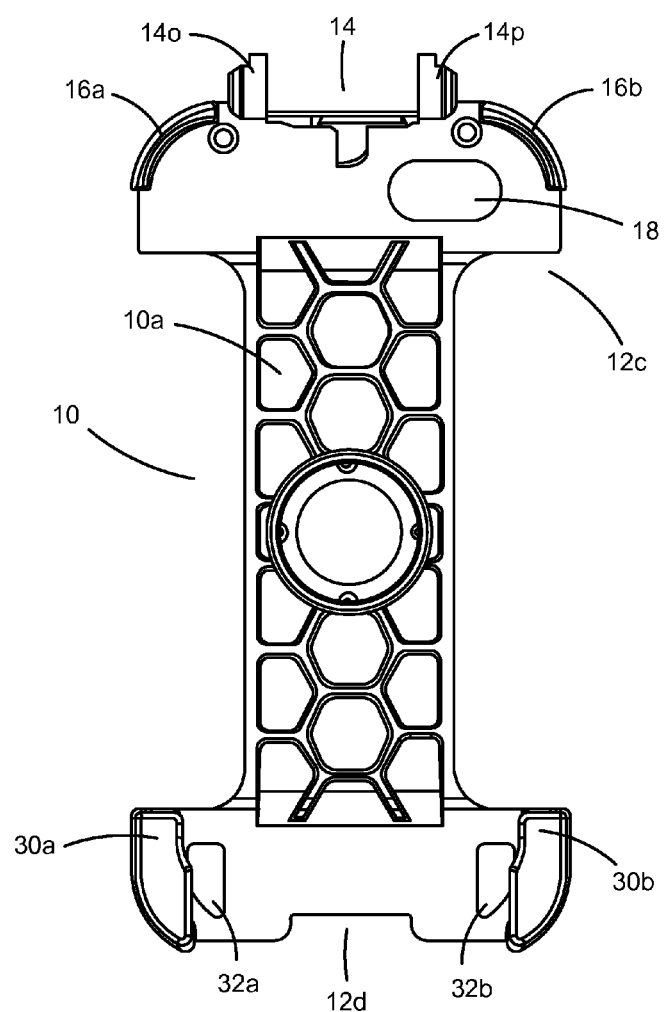
FIGS. 1D-1I are directed to an alternative embodiment of the sled of the disclosure, wherein the sled is configured for retaining an electronic device and/or a housing therefor.

An alternative embodiment of sled 1 is depicted in FIGS. 1D-1I. FIG. 1DH depicts a front view of an alternative embodiment of sled 1, including extended portion 10, a proximal portion 12c, distal portion 12d, front surface 10a, pockets 16a and 16b, supporting elements 30a and 30b, clasping mechanism 14, camera aperture 18, and cutout portions 32a and 32b positioned on the front surface near the supporting elements 30a and 30b, which cutout portions function for transmitting sound to and/or away from a retained device. The pockets 16a or 16b are present in some embodiments to help secure the housing to the sled 1. Likewise, the supporting elements 30a and 30b can be present in certain embodiments. These supporting elements 30a and 30b allow access to the speakers of the electronic device while allowing the housing encasing the electronic device to be secured to the sled 1. Also, the cutout portions 32a and 32b are present in certain embodiments to improve sound transmission from the encased portable electronic device through the housing and the sled 1.

Figure 1E:
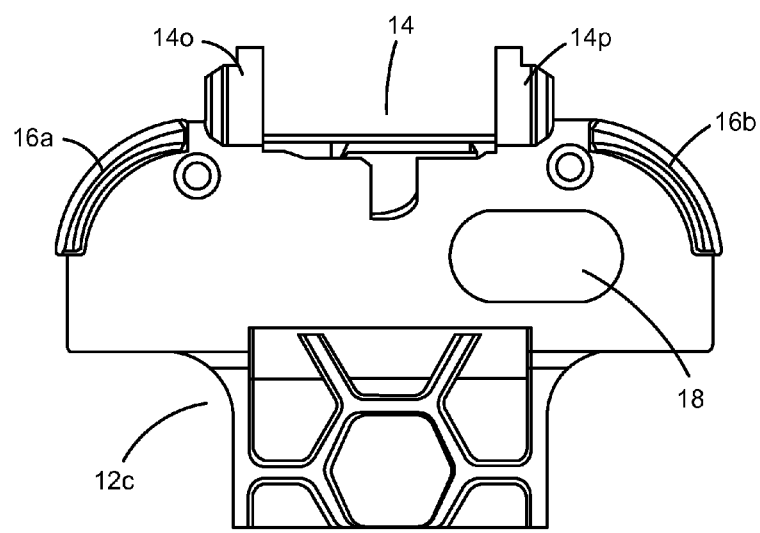
Figure 2A:
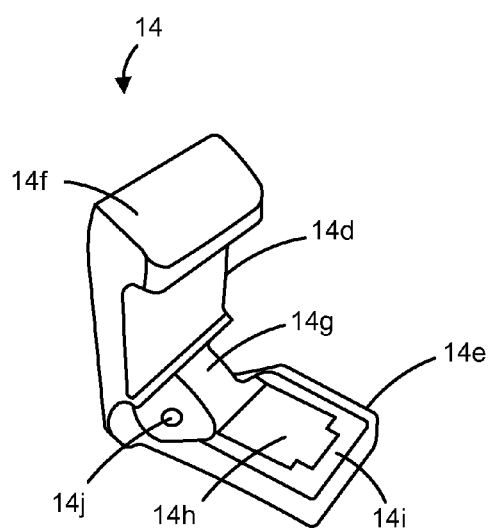
FIGS. 2A-2G are directed to implementations of a clasping and/or locking mechanism for use in conjunction with the sled of the disclosure.
Figure 2B:
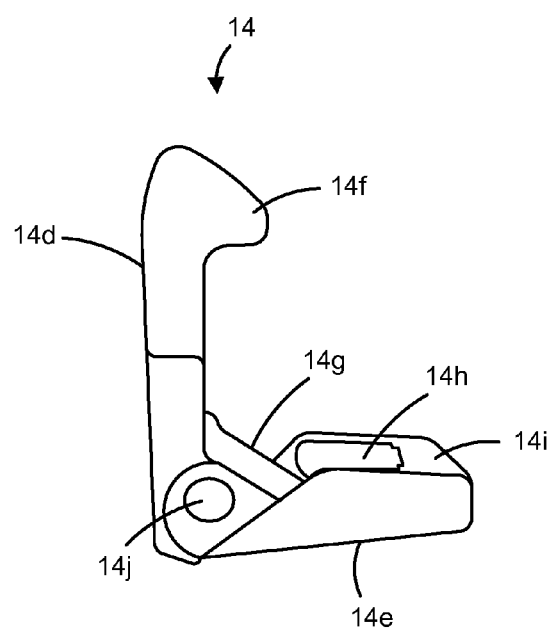
Figure 2C:
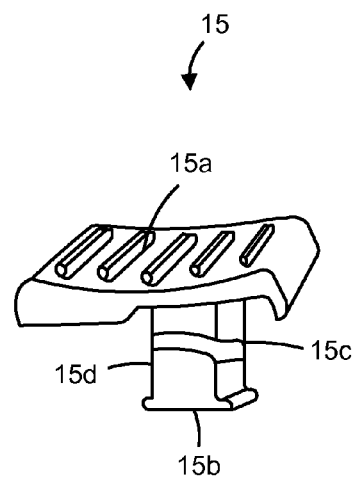
Figure 2D:
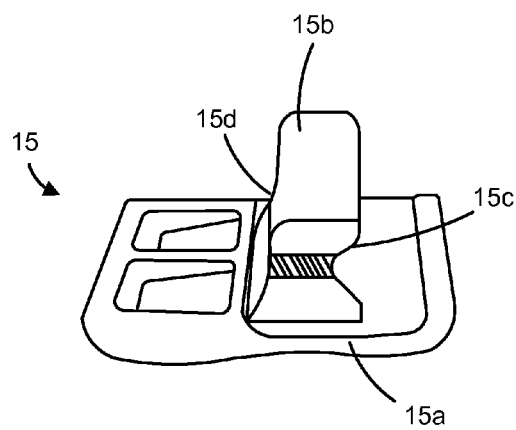
Figure 2E:
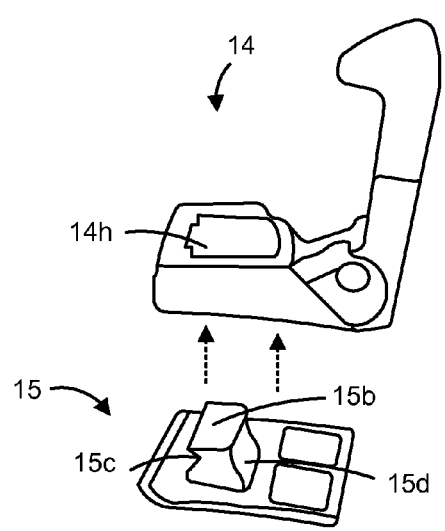
Figure 2F:
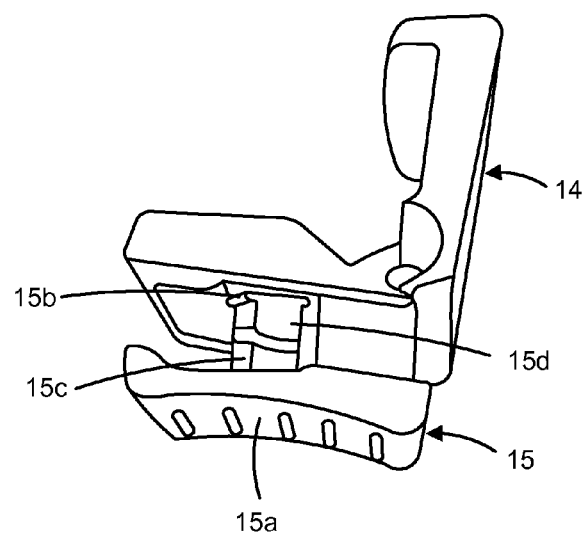
Figure 2G:
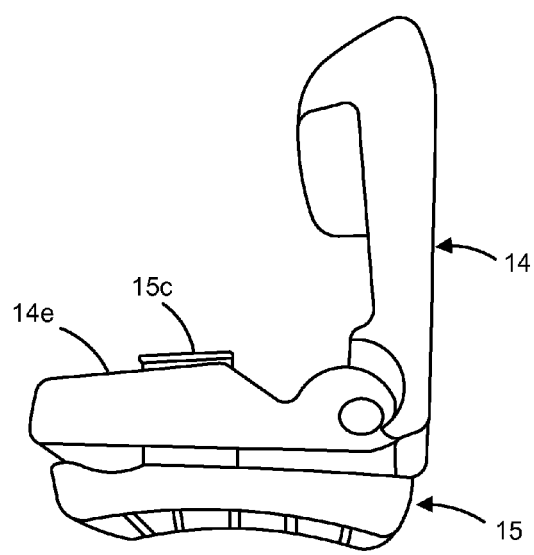
Figure 2H:
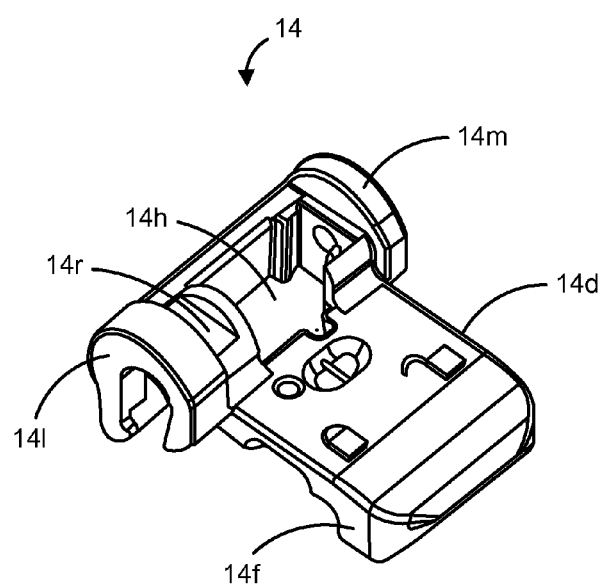
FIGS. 2H-2M are directed to alternative embodiments of a clasping and/or locking mechanism for use in conjunction with the sled of the disclosure.
Figure 2I:
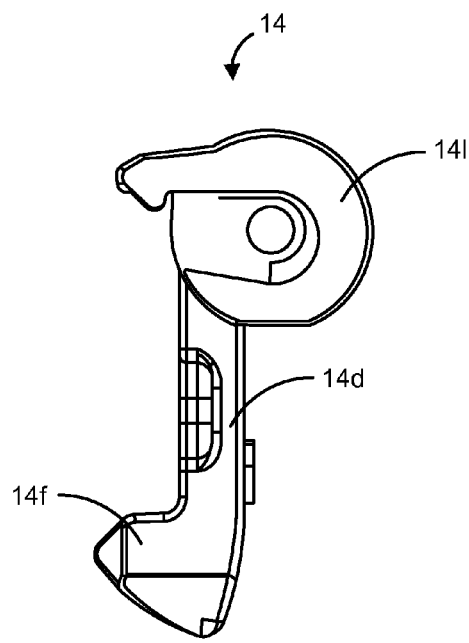
Figure 2J:
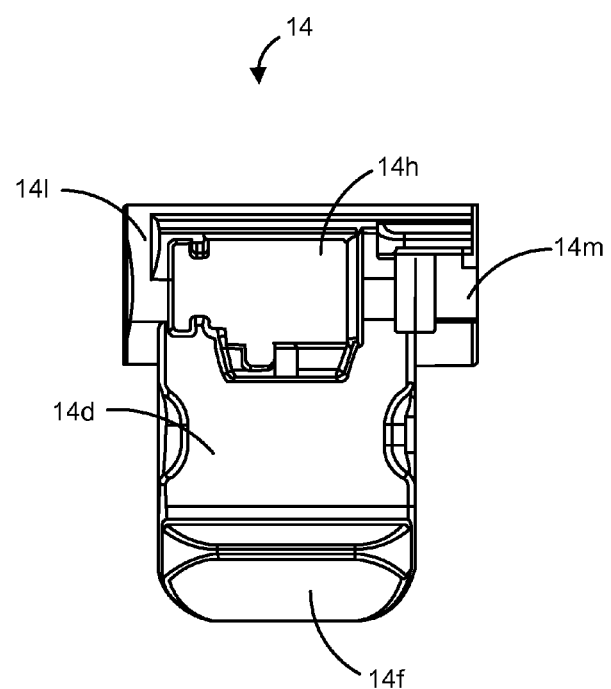

In certain embodiments, clasp retaining elements 14o and 14p shown in FIG. 1D, can be used to mate with an alternative embodiment of a clasping element described infra and shown in FIGS. 2H-2J. FIG. 1E shows a front view of the proximal portion 12c of the alternative embodiment of sled 1 in FIG. 1D, including the clasping mechanism 14, pockets 16a and 16b, and camera aperture 18. The camera aperture 18 can be any shape as long as it allows a camera on an electronic device encased in a housing secured to the sled, access to take pictures or video. The camera aperture can be an oval as show in FIG. 1D, but it can also be a circle, square, rectangle, parallelogram, trapezoid or 5, 6, 7, 8, 9, 10, 11, 12, 13, 14, 15, 16, 17, 18, 19, or more sided aperture.

Figure 1F:
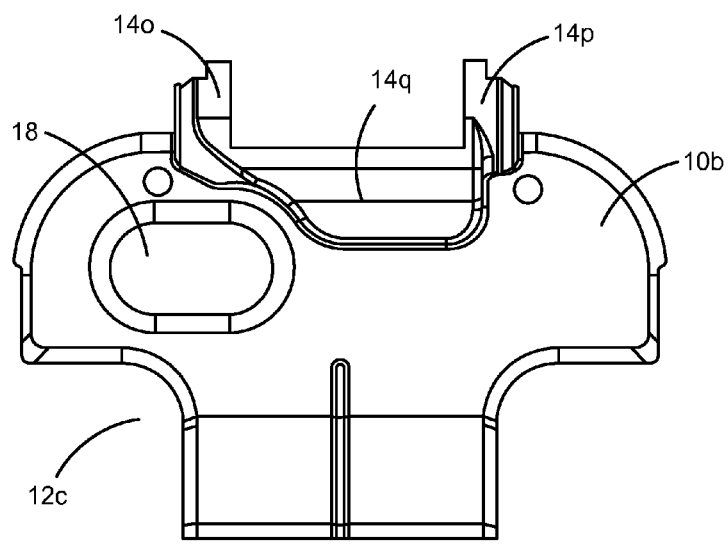
Figure 1G:
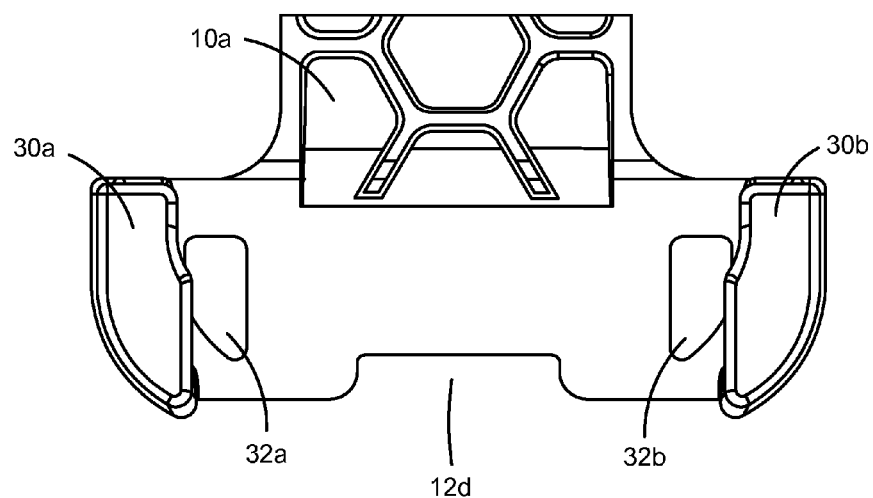

FIG. 1F shows a rear view of the proximal portion 12c of the alternative embodiment of sled 1 in FIG. 1D, including the rear surface 10b, 14q that allows for attachment of a clasping element (clasping element described infra and shown in FIGS. 2H-2J), and camera aperture 18. FIG. 1G shows a front view of the distal portion 12d of the alternative embodiment of sled 1 in FIG. 1D, including front surface 10a, supporting elements 30a and 30b, and cutout portions 32a and 32b. The supporting elements 30a and 30b can be any shape as long as they hold the housing for an electronic device securely to the sled while allowing access to the sound apertures in the housing so that sound can be transmitted through the housing and allow for access to the door at the proximal end of the housing for accessing the power and data ports of the portable electronic device.

Figure 1H:
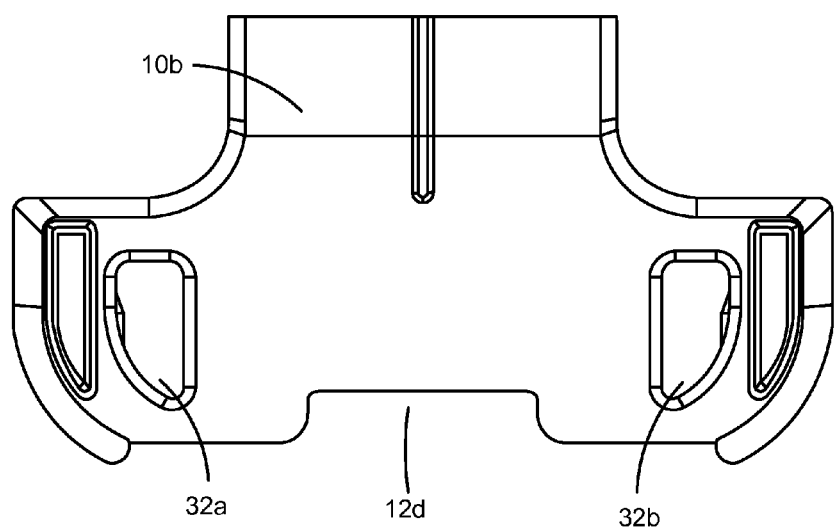
Figure 1I:
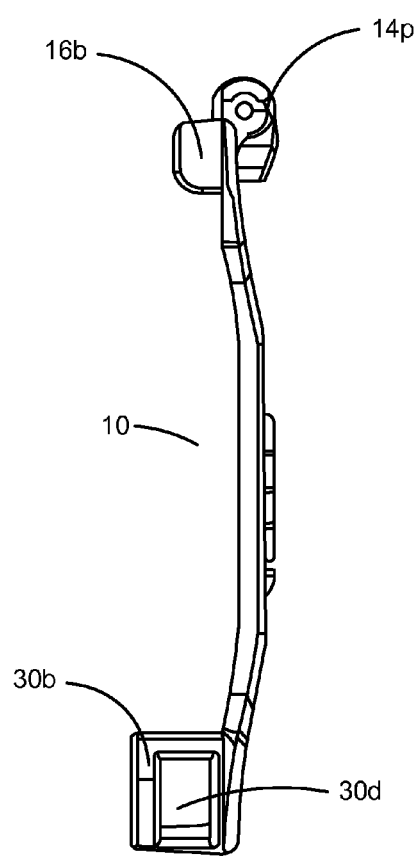

FIG. 1H shows a rear view of the rear surface 10b of the distal portion 12d, including cutout portions 32a and 32b. FIG. 1I shows a side view of an alternative embodiment of sled 1 (as shown in FIG. 1D), including pocket 16b, supporting element 30b, supporting element cutout 30d, and clasp retaining element 14o. The elongated element 10 is curved slightly, such that when a case containing an electronic device is inserted into the sled, the elongated element curves away from the body of the case. Element cut out 30d can be any shape that allows for transmission of sound through the housing secured in the sled. The curvature of the elongated member of the sled is configured to aid in the removal of a case from the sled. In addition, the curvature of the elongated member improves retention of a case coupled with the sled, as the force retaining the case in the sled is concentrated at the four corners of the sled, hard stops 16a and 16b (hard stop 16b not shown), and supporting elements 30a and 30b (supporting element 30b not shown). The curvature of the sled also improves shock resistance of the sled, as it allows the sled to flex if dropped or struck.

As depicted in FIGS. 2A-2B, the clasping mechanism 14 is an internal clasping mechanism that is configured for being integral with the sled 1. The clasping mechanism 14 is configured so as to include a locking and/or ejection portion 14e as well as a retaining portion 14d, which portions are joined together at a junction portion 14g so as to form an "L" shape. For instance, the locking and/or ejection portion forms the base of the "L" shape and is adapted so as to be fit within the cavity of the sled 1. The retaining portion 14d forms the extended portion of the "L" shape, which portion extends away from the plane of the surface 10a of the elongated member 10. The retaining portion 14d ends in a retaining element or catch 14f, which retaining catch is configured for contacting a top surface of the electronic device or housing therefore and retaining the same within the bounds of the sled 1.

The clasping mechanism 14 is configured for moving from a first, e.g., retained, position to a second, release, position such as by rotating with respect to the plane of the top surface 10a of the elongated member 10a. For example, the junction 14g where the retaining portion 14d meets the ejection portion 14e may include an axle orifice through which an axle, such as a pin, may be fit. Such axle may function not only to join the clasping mechanism 14 to the sled 1, but may also function as a pivot point about which the clasping mechanism 14 rotates.

Specifically, in the retained position, the catch 14f of the clasping mechanism 14 is engaged with a top surface of a retained device, e.g., electronic device, housing device, or other object, and functions to retain the device, within the sled 1. When ejection of the device from the sled 1 is desired, a releasing pressure is applied to the catch 14f so as to disengage the catch 14f from the top surface of the device. Such force causes the retaining portion 14d to rotate backwards, which rotation further causes the ejection portion 14e to rotate upwards out of the cavity away from the plane of the top surface 10a of the elongated member 10 and against the bottom surface of the retained device thereby assisting in the effectuation of the ejection of the device.

In certain instances, it may be desired that the clasping mechanism 14 be locked so as to prevent its rotation and thereby prevent the ejection of the retained device from the sled 1. Accordingly, as described above, the proximal portion 12c of the sled and/or the clasping mechanism 14 may be configured for interacting with the locking element 15 so as to be locked into place, e.g., within the cavity of the sled 1. The locking element may have any suitable configuration so long as it is capable of interacting with one or both of the sled and the clasping mechanism so as to lock the clasping mechanism in an engaged and/or released position.

Consequently, the proximal portion 12c of the sled 1 may have an opening 14a and the locking and ejection portion 14e of the clasping mechanism 14 may include a corresponding locking aperture 14h through which a portion of a locking element 15 may be fitted. Additionally, to effectuate the locking of the clasping mechanism 12, such as in an engaged position, the cavity of the sled 1 may include one or both locking element stops 14b and 14c as well as one or more opposing stop posts, which stops function to further effectuate the locking of the clasping mechanism 14 such as by engaging corresponding portions of the locking element 15 and/or clasping mechanism 14.

For instance, the clasping mechanism 14 may include a locking engagement element 14i, which engagement element 14i is adapted for engaging a portion of the locking element 15 in such a manner that when engaged the locking element 15 prevents the clasping mechanism 14 from rotating thereby preventing the disengagement of the catch 14d from the retained device, e.g., from a top surface of the retained device, and the ejection of the same. Further, one or both of the locking element stops and/or stop posts are configured for engaging a portion of the locking element 15 to additionally ensure the locking of the clasping mechanism.

FIGS. 2C and 2D depict a locking element of the disclosure. As described above, the sled 1 of the disclosure, e.g., a proximal portion thereof, may be configured so as to include a locking element 15. For instance, the sled 1 includes a proximal portion 12c having a front surface 10a, in which a cavity for receiving a clasping mechanism 14 is positioned, and having a back surface 10b, in which an extended structure adapted to receive a locking mechanism 15 is positioned. The cavity includes an opening through which a portion of the locking element 15 may be fitted. Consequently, the locking element 15 includes a portion that is configured for being inserted through the opening in the cavity and additionally through the locking aperture 14a so as to couple to a portion of the clasping mechanism 14 and thereby being able to lock and/or release the clasping mechanism 14.

Accordingly, as can be seen with respect to FIGS. 2C and 2D, to effectuate the locking of the clasping mechanism, the locking element 15 includes a top portion 15a, in this instance, having a gripping feature, and a bottom portion 15b, in this instance, having an extended engagement portion 15d, which extended engagement portion 15d includes a locking groove 15c. The extended engagement portion 15d is configured for being inserted through the opening 14a of the sled 1, and further configured for extending through the locking aperture 14h of the clasping mechanism 14.

The extended engagement portion 15d further includes a locking groove 15c, which groove is configured for being coupled with one or more of: the locking member stops 14b and 14c, which function to stop the movement of the locking member 15 within the cavity once in a locked position; stop posts, which function to effectuate the locking of the clasping mechanism by engaging the locking groove 15c of locking member 15; and the locking engagement element 14i of the clasping mechanism 14, which locking engagement element 14i functions for engaging the locking groove 15c of the locking element 15, thereby locking the clasping mechanism in a fixed position.

For example, as can be seen with respect to FIGS. 2E to 2G, the locking element 15 is configured for being coupled to the clasping mechanism 12, e.g., by being fit through the opening 14a of the cavity. Specifically, the extended engagement portion 15d of the locking element 15 is configured for being inserted through the opening 14a of the sled 1, and further configured for extending through the locking aperture 14h of the clasping mechanism 14. The extended engagement portion 15d further includes a locking groove 15c which groove is capable of being engaged with one or both of a corresponding locking post stop, within the cavity, and/or the locking engagement element 14i of the clasping mechanism 14, which engagements function for locking the clasping mechanism in a fixed position, e.g., by the distal translation of the locking element 15, within the back surface 10b boundaries of the channel.

FIG. 2E depicts the clasping mechanism 14 and the locking element 15 prior to being coupled together (without the intervention of the sled 1). FIG. 2F depicts the clasping mechanism 14 and the locking element 15 in the process of being coupled together. FIG. 2G depicts the clasping mechanism 14 and the locking element 15 after having been coupled together. Additionally, FIG. 2G depicts the clasping mechanism 14 and the locking element 15 after being coupled together in conjunction with the intervening sled 1.

For instance, FIG. 1B provides a depiction of a top surface 10a of the proximal portion 12c of a sled 1 of the disclosure. The proximal portion 12c is configured to include a cavity into which a clasping mechanism 14 is inserted. A back surface 10b of the cavity includes an opening 14a through which an extended portion 15d of a locking element extends. The extended portion 15d not only extends through the opening 14a but further it extends through an opening 14h positioned in the locking and engaging portion 14e of the clasping mechanism 14. In this position, the locking element 15 may be slid, e.g., downward from a released to a locked position.

For example, an electronic device and/or a housing therefore may be inserted into the sled 1. In order to accomplish this, the engagement portion 14e of the clasping mechanism 14 may be moved freely upwards, e.g., rotated, away from the top surface 10a of the elongated member 10, thereby allowing a space to be created into which the device may be fitted. The clasping mechanism 14 may additionally include a biasing member 14j, e.g., a spring, that biases the clasping mechanism 14 into an engaged position such that once the clasping mechanism 14 has been rotated backwards allowing a device to be inserted into the sled 1, the biasing member 14j biases the clasping mechanism 14 such that it returns clasping mechanism back to its rest, e.g., engaged, position, whereby the inserted device is capable of being retained within the sled 1. The biasing member 14j may be coupled to both the sled 1 and the clasping member 14 by any suitable mechanism, such as by a pin 14k that extends from one side of the cavity, through a retaining element aperture 14l in the clasping mechanism 14 and the biasing member 14j, to the other side of the cavity, where the pin 14k is further received within corresponding apertures within the bounds of the cavity.

It is to be noted that given the "L" shaped configuration of the clasping mechanism 14, as the engagement portion 14 extends away from the sled 1, such as in releasing a retained device, the ejection portion 14 also moves away from the cavity and top surface 10a of the elongated member 10 not only engaging a surface, e.g., back or front surface (depending on how the device is inserted into the sled, but also applying a force, e.g., an ejecting force, to the inserted device thereby in assisting in its ejection from the sled.

Further, in certain instances, it may be desirable to prevent such ejection, and therefore, in certain instances, the clasping mechanism 14 may be removably coupled to a locking element 15, as described above, which locking element 15 is capable of moving from a released position, such as where the locking element 15 is not coupled to the clasping mechanism 14, to a locked position, wherein the locking element 15 is engaged with and/or coupled to the clasping mechanism 14, thereby locking the clasping mechanism 14 in place. The locking element 15, for instance, may be configured such that as it moves into coupling alignment with the clasping mechanism 14, the locking groove 15e slides over the locking engagement element 14i of the clasping mechanism 14 and may further contact the locking member stops, 14b and 14c, and/or the stop posts, thereby locking the clasping mechanism in a fixed position.

Accordingly, as can be seen with respect to FIG. 2 in various instances, the sled 1 may include a clasping mechanism 14, such as at its proximal portion 12c, which clasping mechanism 14 may include one or both of a moveable retaining 14d and/or ejecting element 14e as well as a locking element 15. The retaining portion 14d may include a retaining element 14f that includes a hook or catch interface, which catch interface is adapted for engaging a retaining surface, e.g., a top or bottom surface, of an electronic device or housing therefore, thereby retaining the electronic device within the sled.

The clasping mechanism 14 may additionally include an ejection portion 14h, which ejection portion may further include a switch receiving interface, e.g., an opening configured for receiving an extended portion of the locking mechanism 15 there through. Hence, the clasping mechanism 14 may include two legs 14d and 14e that are joined at a joint 14g so as to from an "L" shape, wherein one leg comprises the retaining portion and one leg comprises an ejection and/or lock receiving portion.

The retaining 14d and ejection 14e portions may therefore be coupled together by a joint 14g, which joint may include an axle aperture 14k that is configured for receiving a retaining element 14i, e.g., an axle or pin, there through, which axle 14i functions to couple the clasping mechanism 14 to the elongated member 10 of the sled 1. The clasping mechanism 14, therefore, is configured for rotating about the axle element 14i, e.g., with respect to the stationary elongated member 10.

The rotation of the retaining and ejecting portions about the pin from a first position to a second position allows for the insertion of an electronic device into the sled. Additionally, the rotation back from the second position to the first position results in the engagement of the hook interface 14*f* of the retaining portion 14*d* with a retaining surface of the device and retention of the device within the sled 1.

Once the device is engaged with the hook portion 14*f* and retained within the sled 1, rotation of the retaining element 14*d* about the axle 14*g* results in the disengagement of the hook portion from the retaining surface of the device, and engagement of the ejecting portion with an ejection surface of the device, which continued rotation results in the ejection of the device form the sled 1 by the movement of the ejection element 14*e* away from the top surface 10*a* of the sled 1. The clasping mechanism 14 may further include a biasing, e.g., a spring, element 14*h*, that is configured for biasing the rotating retaining portion in the first, e.g., engaged position. The biasing element 14*h* therefore may be functionally associated with both the axle 14*g* and the retaining portion 14*f* so as to bias the retaining portion in the engaged position.

Additionally, as indicated above, in certain instances it may be useful to lock the clasping mechanism in place and in such instances a locking mechanism may be included as part of the sled. Although the locking mechanism may have any suitable configuration, so long as it is capable of locking the device into the sled thereby preventing the removing of it there from, in certain instances, the locking mechanism is an element that functions to lock the clasping mechanism in the engaged position. Accordingly, in certain instances, the sled 1 includes a locking element that is configured for engaging the clasping mechanism, which locking element is configured for preventing the movement of the retaining and/or ejection element in place thereby locking the clasping mechanism in place, such as in the retained position.

In certain instances the locking element includes a sliding latch member. The sliding latch member includes an elongated member having a front and a back surface, wherein the front surface may include a gripping feature, and the back surface includes an extended portion, extending away from the back surface, and a latching element, such as a locking groove, or the like, which latching element is configured for interfacing with a portion of the clasping mechanism so as to lock the clasping mechanism in place. For instance, where the clasping mechanism includes a retaining portion and an ejection portion, e.g., coupled at a junction portion, the ejection portion may include a switch interface, such as an extended rail member configured to be fit within the locking groove, that when engaged with the latching element prevents the clasping mechanism from moving thereby locking the retained device within the sled.

As indicated above, the perimeter portion 12 of the sled 1 may include one or more support elements, which support elements may be adapted for supporting the electronic device, or housing therefore, within the sled. Accordingly, in certain embodiments, the perimeter portion 12 includes a plurality of support elements positioned on one or both of the proximal 12*c* and/or distal 12*d* portions of the elongated member 10, such as at the corners of the elongated member 10. For instance, as can be seen with respect to FIG. 2, the sled 1 may include a plurality of support elements, such as support elements 16*a* and 16*b* positioned at the corner of the proximal portion 12*c*.

As described above, a support element, such as support elements 16*a* and 16*b*, may have any suitable configuration so long as it is capable of engaging a portion of the device to be retained and supporting the same within the sled. As depicted, support elements 16*a* and 16*b* are configured as dead stops, each of which dead stop engages a corner of the device, and thereby supports the device within the sled. The dead stop may engage the entire proximal or distal portion, an entire corner region, or substantial portions thereof, and likewise the support element may circumscribe the entire corner region or a substantial portion thereof. As depicted, the dead stops 16*a* and 16*b* engage a substantial portion of the corner regions of the proximal portion 12*c* so as to form an edge that curves around the corner portion of the sled 1 and thereby supports an end portion of the device to be retained.

Figure 2K:
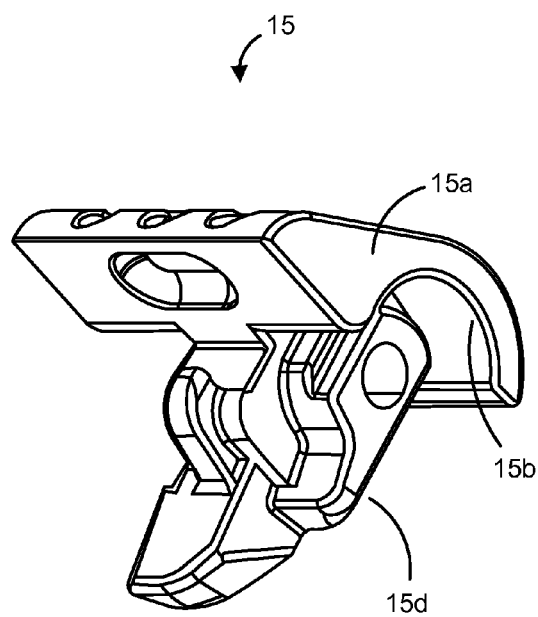

In an alternative embodiment of a clasping mechanism, the locking element is inserted through the top of a clasping element and both the locking element and clasping element are mated to the sled. FIG. 2H shows a perspective view of an alternative embodiment of a clasping element 14. The clasping element 14 has two clasp alignment elements 14*l* and 14*m* that allow the clasping element to be attached to the proximal portion 12*c* between the clasp retaining elements 14*o* and 14*p* and over cutaway portion 14*q* (e.g. see FIGS. 1E and 1F). The clasping element 14 also has a locking aperture 14*h*, retaining portion 14*d*, and catch or retaining element 14*f*. FIG. 2I shows a side view of clasping element 14, with clasp alignment element 14*l*, retaining portion 14*d*, and catch or retaining element 14*f*. FIG. 2J shows a bottom view of clasping element 14, with clasp alignment elements 14*l* and 14*m*, locking aperture 14*h*, retaining portion 14*d*, and catch or retaining element 14*f*. FIG. 2K shows a perspective view of a locking element 15 that attaches to the clasping element 14 (shown in FIGS. 2H-2J) and the sled of FIG. 1D. The locking element 15 includes a top portion 15*a*, an extended engagement portion 15*d*, and clasp alignment recesses 15*e* and 15*f* (not shown). The extended engagement portion 15*d* of locking element 15 is inserted through the locking aperture 14*h* of clasping element 14, and the combination of the locking element 15 and clasping element 14 is fit over the proximal portion 12*c* of the sled 1, such that clasp alignment elements 14*l* and 14*m* are in between clasp retaining elements 14*o* and 14*p* and over cutaway portion 14*q*.

In this assembled configuration, the retaining portion 14*d* extends perpendicular to the elongated element 10 such that a case inserted into the sled 1 is held in place by the retaining portion 14*d* and catch 14*f*. In certain embodiments, locking element 15 can be slid along the axis defined by the two clasp retaining elements by applying lateral pressure on the top portion 15*a* of locking element 15 and sliding the locking element back and forth. When the locking element 15 is slid in one direction, for example, to the right, towards clasp retaining element 14*p*, the locking element is unlocked from the sled and can be removed from the locking mechanism. When the locking element is slid in the other direction, for example, to the left, towards clasp retaining element 14*o*, the locking mechanism is locked in place and cannot be removed from the locking mechanism without sliding the locking element to the right. Clasping element 14 also has a locking indicator element 14*r*. When locking element 15 is attached to clasping element 14 and slid to the right, locking indicator element is visible and indicates to a user that the locking mechanism is not locked. The locking indicator element is preferably a different color from the locking element and clasping elements. For example, the locking indicator element may be red, orange, green, blue, white, black, purple or pink.

Figure 2L:
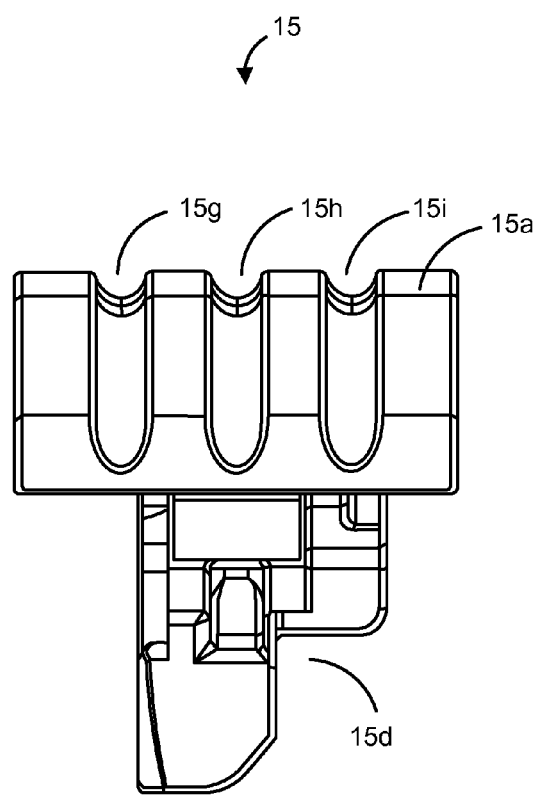
Figure 2M:
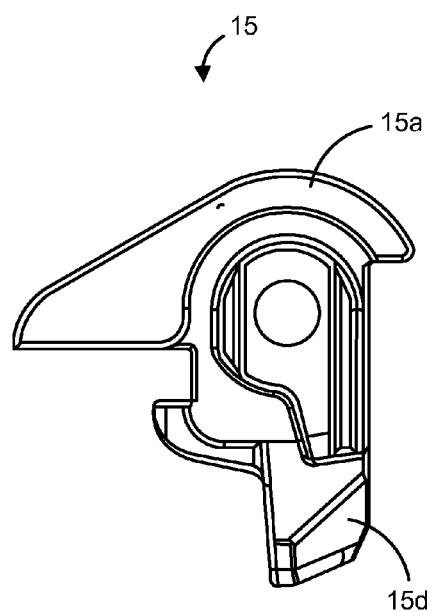

FIG. 2L shows a front view of locking element 15, including top portion 15*a*, extended engagement portion 15*d*. Top portion 15*a* includes handling grooves 15*g*, 15*h*, and 15*i* that allow a user to apply lateral force and slide locking element back and forth. In some embodiments of locking element 15, handling grooves 15g-i are replaced with one or more ridges that extend upwards beyond the top portion 15a. FIG. 2M is a side view of locking element 15, including top portion 15a, and extended engagement portion 15d.

Figure 3A:
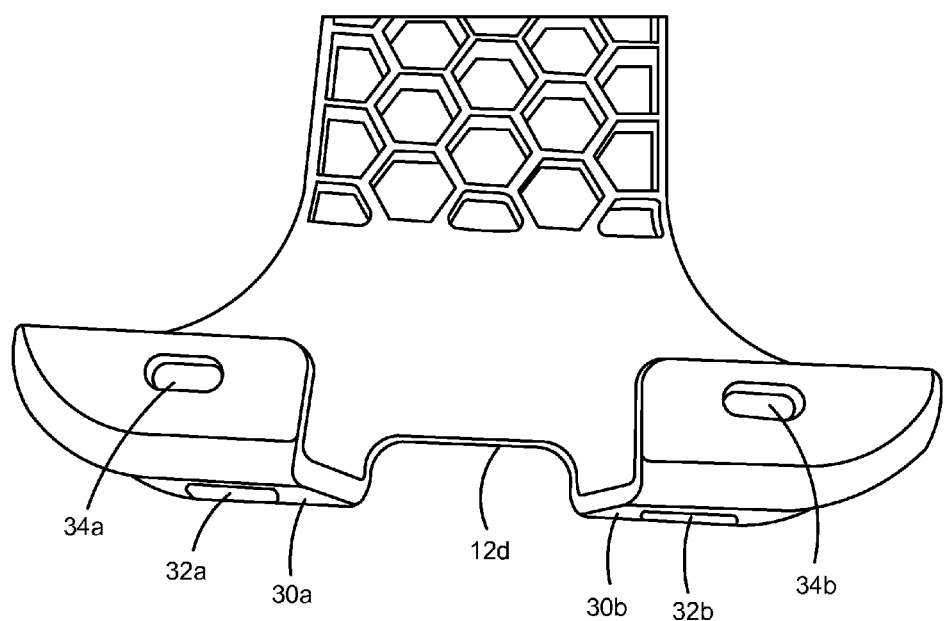
FIGS. 3A and 3B provide various perspective views of a distal portion of the sled.
Figure 3B:
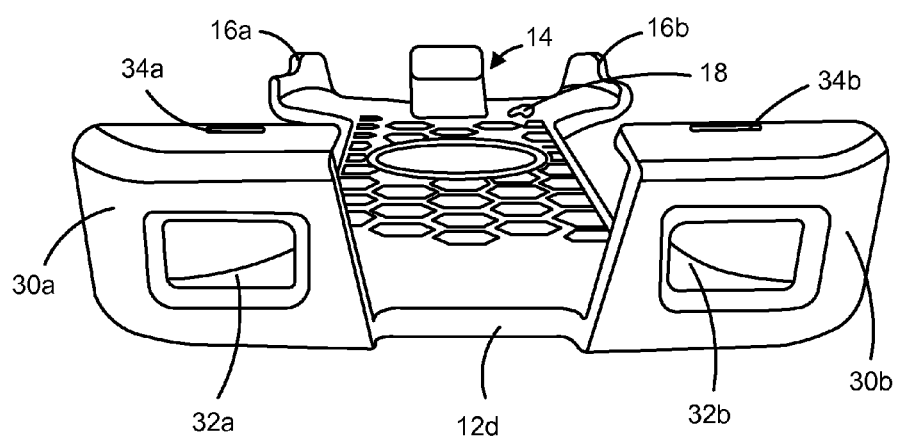

FIGS. 3A and 3B provide another configuration of a support element of the disclosure. In this instance, the support element is configured as a plurality of pockets 30a and 30b positioned at the corners of the distal portion 12d of the elongated member 10. As depicted, the support pockets 30a and 30b are configured as cups that engage the entire portion of the corner region of the distal portion 12d so as to form a pocket that curves around the corner portion of the sled 1 and thereby supports an end portion of the device to be retained. In this instance, there is a gap between the two support pockets 30a and 30b. This gap may be useful for allowing access to a portion of a retained device, such as a port portion of the retained device.

The gap can be of any suitable size and/or dimension, such as of a size and dimension so as to allow a port of a retained device to be accessed, such as a charge port, which charge port may be accessed directly or through a charge port door positioned in a housing in which an electronic device is contained. Accordingly, in certain instances, a plurality of support elements are positioned at the corners of the distal portion of the sled, wherein there is a gap between the two support elements, which gap is of a size so as to allow a charge port to be accessed by a charge interface of a charger for an electronic device when the device is retained within the sled. For instance, the gap is of a size so as to allow a charge port of a retained electronic device to be functionally accessed by a portion of a charger that is capable of being inserted between the support elements so as to interface with the retained device and be charged thereby.

It is to be understood that as depicted a plurality of supports are positioned on the corners of the sled, however, in various instances, the supports may extend along the entire proximal and/or distal portions or simply cover one or two corners of the device. For instance, the sled may include a plurality of support elements, such as at least one of the plurality of support elements is positioned at a corner of the proximal portion and at least one of the plurality of support elements is positioned at a corner of the distal portion. In other instances, a support element is positioned at each of the corners of the sled. In other instances, the support elements circumscribe the entire distal and/or proximal and/or side portions.

In various instances, one or more of the support elements may additionally include one or more functional features, such as one or more aperture or cutout features. For instance, as can be seen with respect to FIG. 3A, the support elements 30a and 30b may include a cutout portion 34a and 34b. Such a cutout portion may have any configuration, however, in certain instances, the cutout portion is of a size, shape, and dimension that is capable of transmitting sound toward or away from a retained device. Accordingly, in such instances, the apertures may be positioned so as to align with a speaker or microphone portion of a retained device. In this embodiment, the cutout apertures 34a and 34b are positioned on a top surface of the pockets 30a and 30b.

Further, as can be seen with respect to FIG. 3B, in certain instances, the pockets 30a and 30b may include cutout portions 32a and 32b positioned on a side surface of the pockets, which cutout portions function for transmitting sound to and/or away from a retained device. It is noted that although the depicted pockets 30a and 30b include two sets of pockets, in various instances, the pockets may not include any cutout portions, one, two, three, or more cutout portions and/or the pockets and/or cutout portions may have a different configuration as that embodied with respect to FIGS. 3A and 3B.

In certain instances, it may be useful for the sled to include one or more attachment elements. For instance, the sled 1 may include an interface that is configured for allowing the sled to be coupled to an attachment element, such as a utility element that further allows the sled to function in a particular useful way. For example, in various embodiments, the sled is configured for receiving a utility attachment.

Accordingly, the sled may be adapted for being coupled to a utility member such as a belt clip member, a bike clip member, an armband member, a universal mounting member, a car mounting system, a windshield mounting system, an external or internal battery charging system, a solar panel system, an external speaker system, and the like. For instance, a portion of the sled may be configured for being removably or non-removably coupled to one or more utility members the coupling of which converts the sled into one or more accessories for use with an electronic device or a housing therefore, more specifically for use in transporting and/or using an electronic device during transportation. In certain embodiments, the one or more accessory attachments may be interchangeable with the sled making the sled and attachments an interchangeable system, in other embodiments, once an attachment is coupled to the sled it is coupled in a non-removable fashion.

Figure 4A:
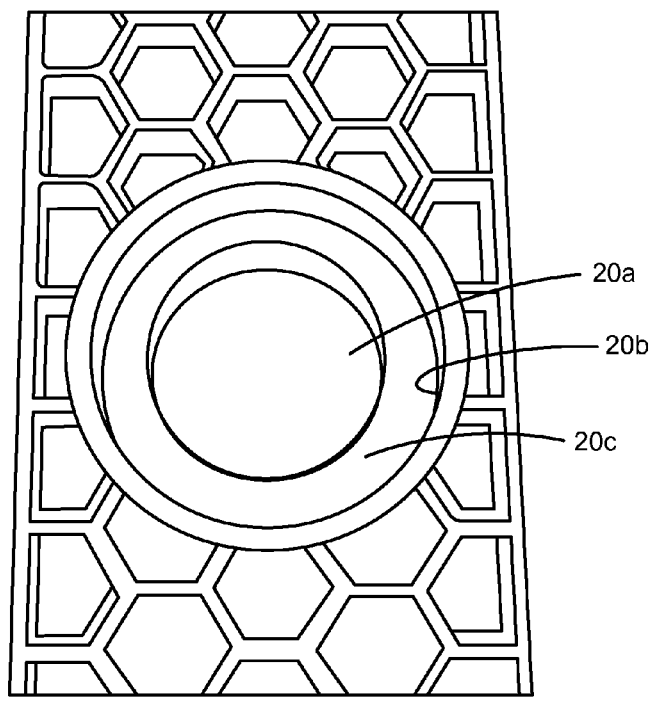
FIGS. 4A-4H provide various implementations of a mechanism for coupling the sled with a number of utility attachments, and FIGS. 4I-4N provide an alternative embodiment of a sled for implementing coupling to utility attachments.
Figure 4B:
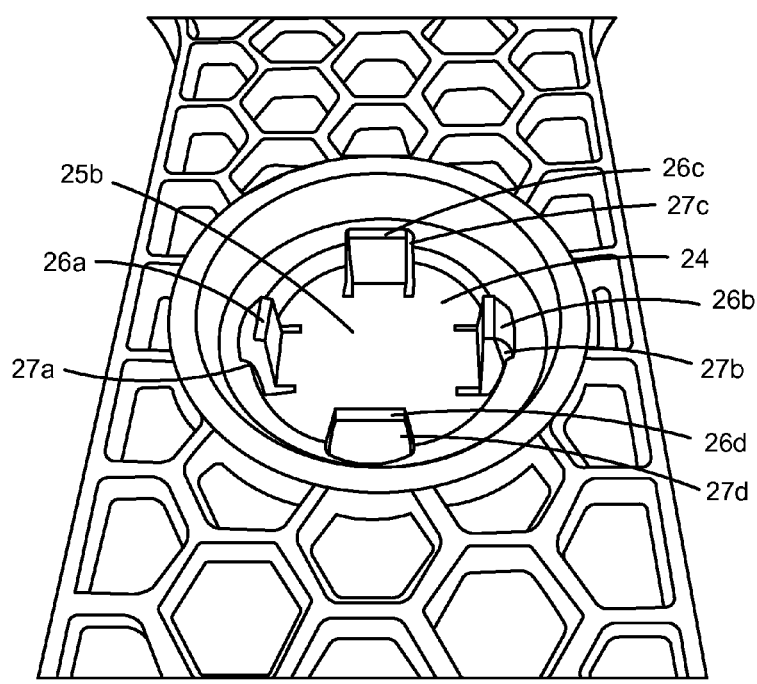
Figure 4C:
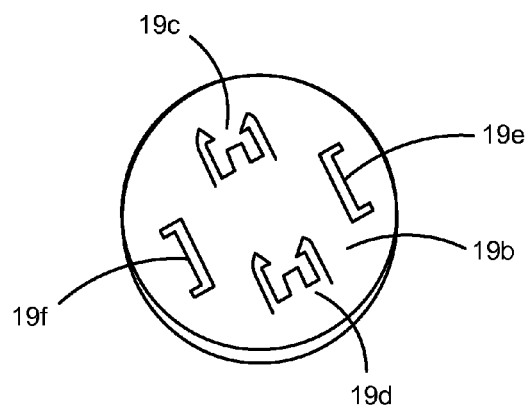

Although the sled 1 may be coupled to a utility attachment in any suitable manner that allows for said coupling, FIGS. 4A-4C provide a particular exemplary embodiment of a mechanism for coupling the sled 1 with a plurality of utility attachments. For instance, FIG. 4A provides a depiction of an attachment aperture 20 of the sled 1, which attachment aperture 20 is configured for receiving a portion of a utility attachment and being coupled therewith. In this embodiment, the attachment aperture 20 of the sled is configured as a circular aperture, however, the shape and the size of the aperture may differ so long as it is capable of facilitating the coupling of the sled 1 with the utility attachment.

Figure 9A:
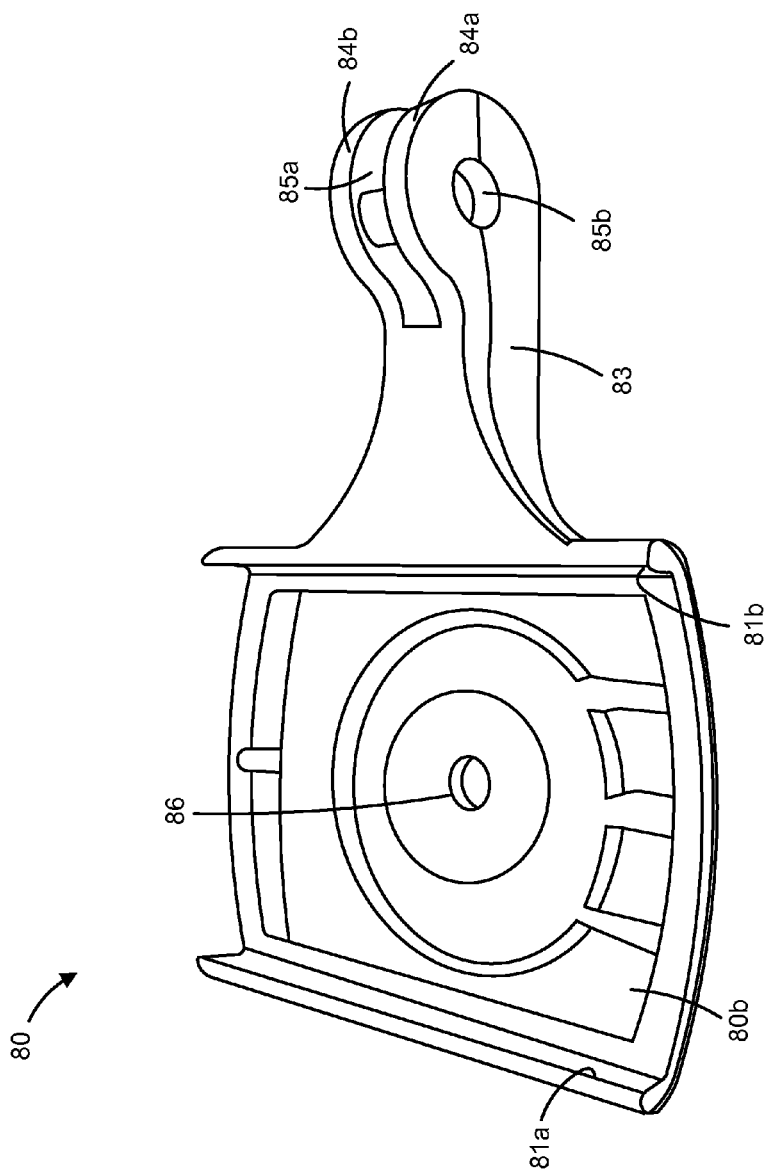
FIGS. 9A-9G are directed to implementations of a mount adapter that may be coupled to a sled of the disclosure.

Accordingly, it is to be understood that although the descriptions herein provide an exemplified manner in which the utility attachment is to be coupled to the sled 1 via the attachment aperture 20, the particular coupling mechanism employed may differ from that set forth herein in many various suitable manners. For instance, in various instances, a utility attachment as herein described may be coupled to a sled through a corresponding bolt or screw-like interface, as depicted in FIG. 9A, a corresponding hinge interface, also depicted in FIG. 9, a corresponding clip interface, a differently configured snap interface, an adhesive interface, a hook and loop interface, a bolt or rivet interface, a slide and catch interface, and the like.

As depicted, the sled 1 includes an attachment aperture 20, which aperture 20 is configured for receiving a snap interface 25 of a utility attachment. This particular attachment aperture 20 includes a snap-tooth receptacle portion 20b, configured for receiving a portion of a snap 25 therein, such as snap teeth 26. Additionally, the attachment aperture 20 includes an attachment ledge 20c which ledge 20c is configured for engaging a portion of a snap interface 25 so as to prevent the snap interface 25 from being removed from the aperture once inserted therein and coupled thereto.

For instance, as can be seen with respect to FIG. 4B, a utility attachment to be coupled to the sled 1 may include a snap-tooth interface 25, which snap-tooth interface includes one or more teeth 26, each of which teeth may include an attachment ledge interface 27, which ledge interface 27 is configured for being coupled to the attachment ledge 20c in either a removable or non-removable manner.

For example, as depicted in FIG. 4B, the snap-tooth interface 25 includes a plurality of snap-teeth, such as 26a, 26b, 26c, and 26d, each of which snap-teeth includes an attachment ledge interface 27a, 27b, 27c, and 27d that is configured for being coupled to the attachment ledge 20c. Specifically, each tooth member 26 may be fabricated so as to be at least partially flexible such that as the tooth portion 26 of the snap-tooth interface 25 is inserted into the attachment aperture 20, the tooth body flexes and/or otherwise bends inwards toward the center of the snap-tooth interface such that the attachment ledge interface 27 moves from a first, rest position to a second retracted position while being inserted, and once completely inserted the snap-tooth body snaps back into its first, rest position and in such process the snap-tooth ledge interface 27 couples to the ledge 20c thereby preventing the snap-tooth interface 25, and the utility attachment having said interface 25 from being removed from the sled 1 while the teeth ledge interfaces 27 are engaged with the ledge 20c.

The snap-tooth interface 25 may be configured to be moveable and/or removable or may be configured for being stationary and non-removable. For instance, as depicted in FIG. 2B, the teeth 26 of the snap-tooth interface 25 can be decoupled from the ledge 20c by applying inward pressure against the teeth 26 thereby causing the ledge interface 27 to withdraw from its engagement from the ledge 20c and thereby allowing the attachment to be decoupled from the sled 1. Such inward force may be applied by the fingers or other such tool. Further, the teeth 26 are capable of being moved circumferentially around the aperture 20 so as to change the orientation of the utility attachment.

However, if desired, the teeth can be permanently fixed by the addition of an adhesive and/or by preventing the inward movement of the teeth once coupled to the ledge 20c. In certain embodiments, a further attachment, e.g., a snap-interface cap 19, may be provided, wherein the cap 19 is capable of attaching to a front surface of the elongated member 10a at the attachment aperture 20a, such as by attaching to the teeth 26 of the snap-tooth interface 25.

Figure 4D:
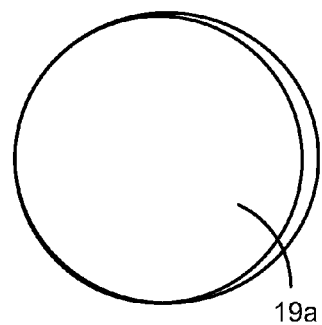

For instance, as can be seen with respect to FIG. 4C, a cap 19 may include one or more snap-tooth attachment elements, e.g., 19c, 19d, 19e, and 19f that are configured for being coupled to one or more of the teeth 26 of the interface 25. Such a cap 19 may include a top surface 19a and a bottom surface 19b having one or more tooth attachment elements. The cap 19 may serve one or more of a number of functions; the cap covers the aperture 20 so as to make the front surface 10a of the elongated member 10 smooth, flat and/or planar. Further, it can prevent access to the snap-teeth 26, thereby preventing their removal, e.g., movement planar to elongated member 10, but not preventing their movement, e.g., circumferentially within the aperture 20. Additionally, it can be configured to prevent circumferential movement of the teeth 26, such as by being locked into place within the aperture 20, such as by an adhesive, having an additional groove or receptacle and extended catch configuration, and the like. FIG. 4D provides a top surface 19a of the cap 19 of FIG. 4B.

As depicted, the teeth 26 of the snap-tooth interface 25 are configured for being inserted into the aperture 20 and being coupled thereto, and yet moveable, e.g. circumferentially, therein, so as to allow a utility attachment element having the snap tooth interface 25 positioned thereon to change its orientation. Accordingly, the attachment aperture 20 on the front 10a or back surface 10b of the elongated member 10 may further have a configuration adapted to modulate this movement.

Figure 4E:
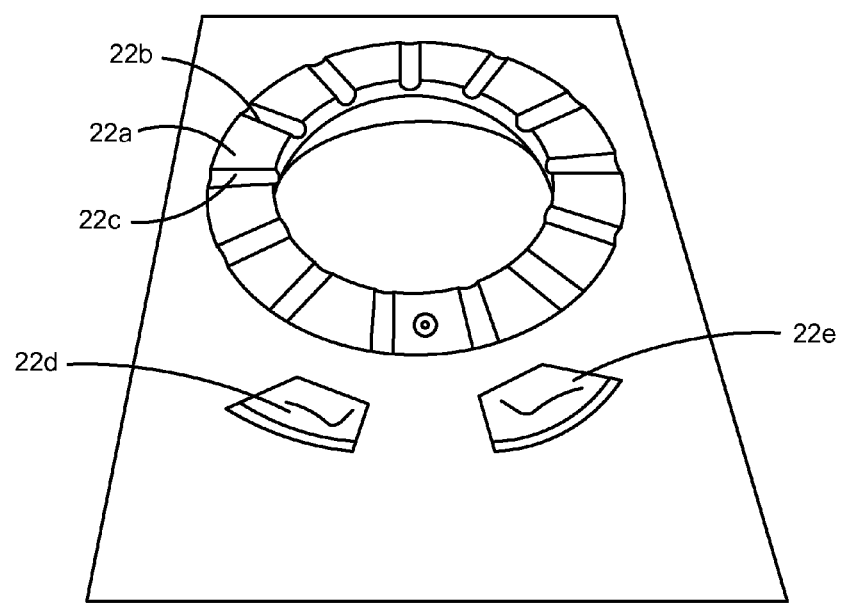

As can be seen with respect to FIG. 4E, a surface of the elongated member 10, such as that surrounding the aperture 20 may include articulating members 22, which members are adapted to modulate the rotation of the interface 25 circumferentially within the aperture 20 so as to modulate the orientation of an associated accessory containing the snap-tooth interface 25. In a manner such as this the position of a utility attachment may be changed with respect to the elongated member. A suitable articulating member 22 may have any suitable configuration so long as it is capable of modulating the movements of the utility attachment with respect to the elongated member. However, in this embodiment, the articulating members include a plurality of raised blocks 22a that surround the aperture 20, have a height indicated by 22b and are separated from one another by troughs 22c. Also included are home articulating members 22d and 22e which are positioned on a surface of the elongated member 10 so as to orientate a utility attachment in a home position, such as a position wherein an elongated plane of the utility attachment is parallel to a corresponding elongated plane of the elongated member 10.

Figure 4F:
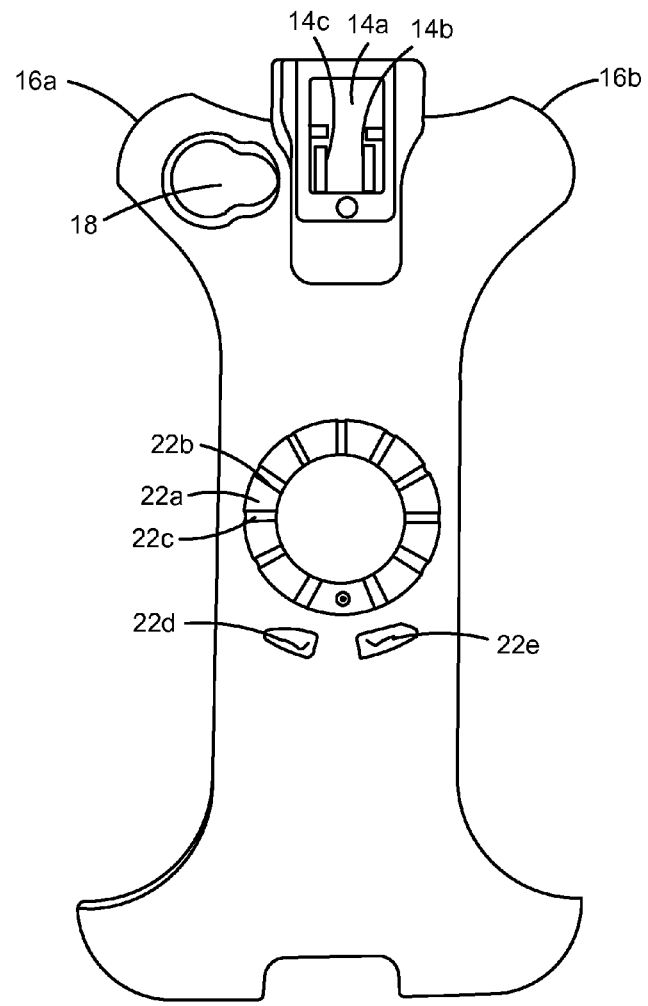
Figure 4G:
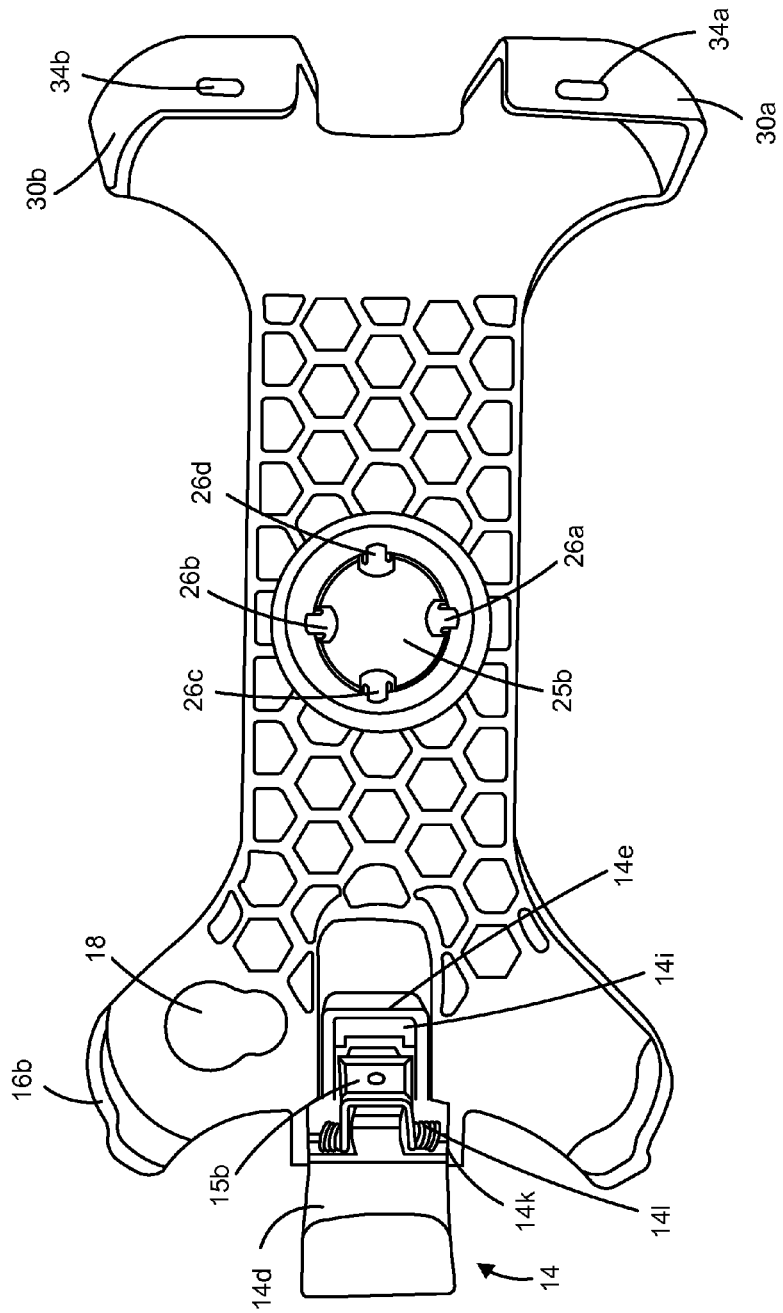
Figure 4H:
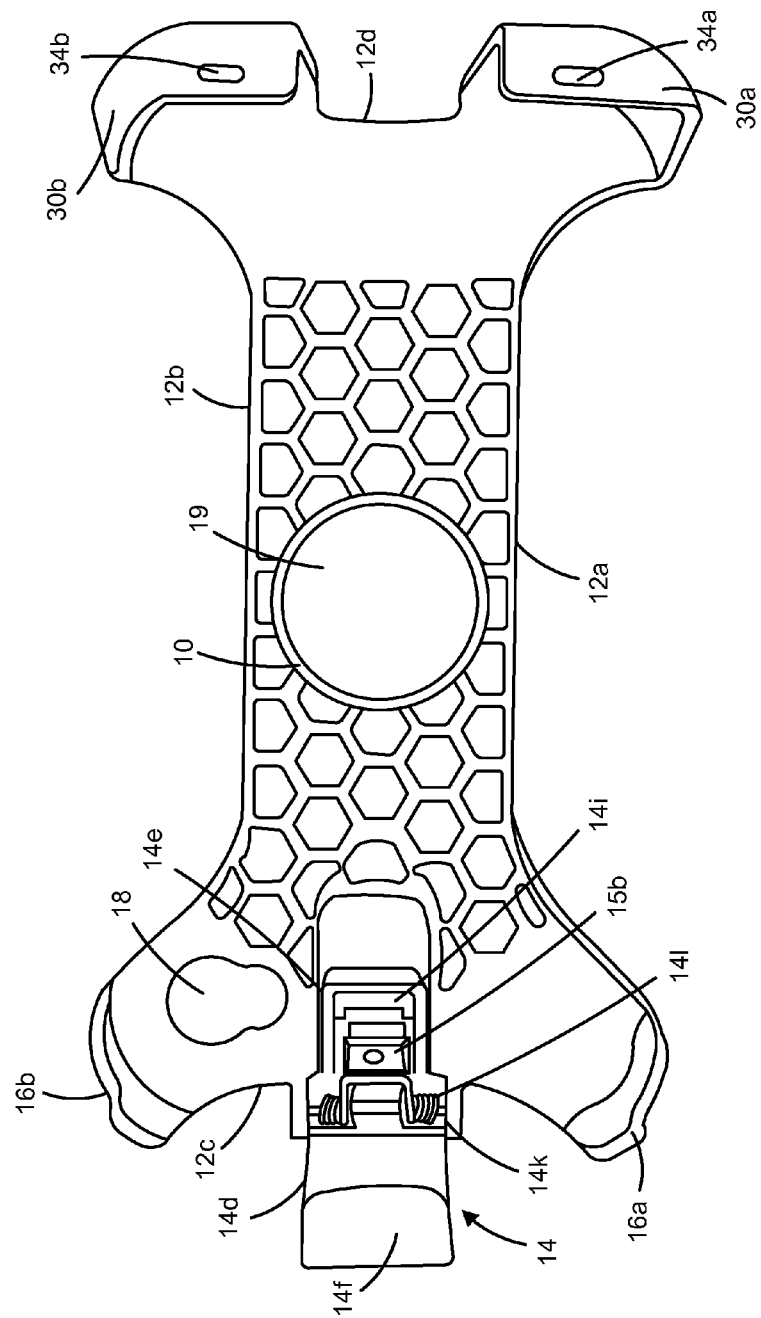

FIG. 4F depicts a sled 1 of the disclosure having a utility attachment coupled thereto via the association of a snap-tooth interface 25 with an attachment aperture 20. As can be seen, the snap-teeth 26 are affixed within the aperture 20 by the coupling of the snap-tooth ledge interface 27 with the attachment ledge 20c. FIG. 4F depicts the sled 1 without the snap-tooth cover 25 coupled thereto, and FIG. 4G depicts the sled 1 with the snap-tooth cover 25 associated with the snap-teeth 26 and the front surface 10a of the elongated member 10 of the sled 1. Also depicted are the dead stops 16a and 16b, the clasping mechanism 14, and camera orifice 18, as well as distal portion pockets 30a and 30b. FIG. 4H depicts a front view of a sled 1 with a snap interface cap 19 attached at the attachment aperture 20a (not shown).

Figure 4I:
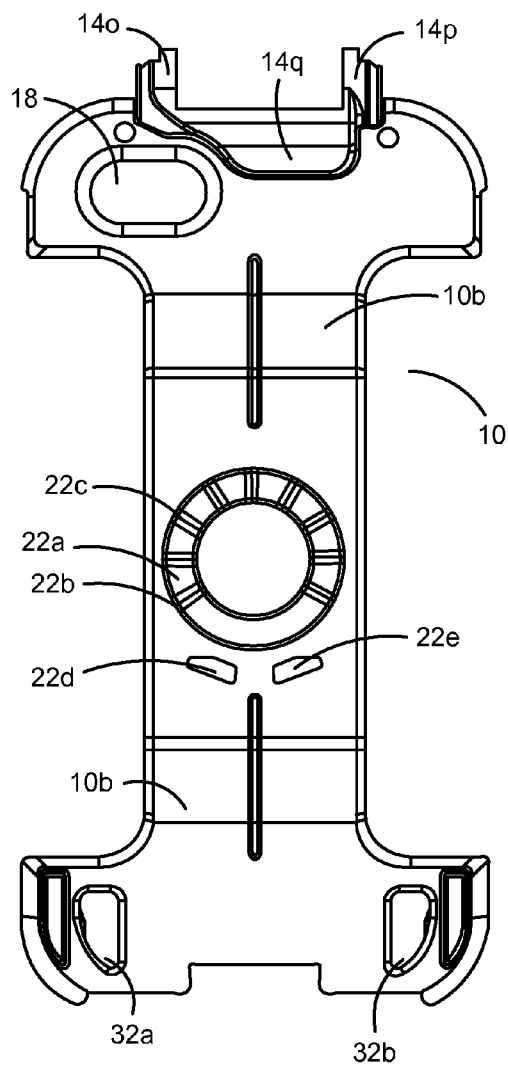
Figure 4J:
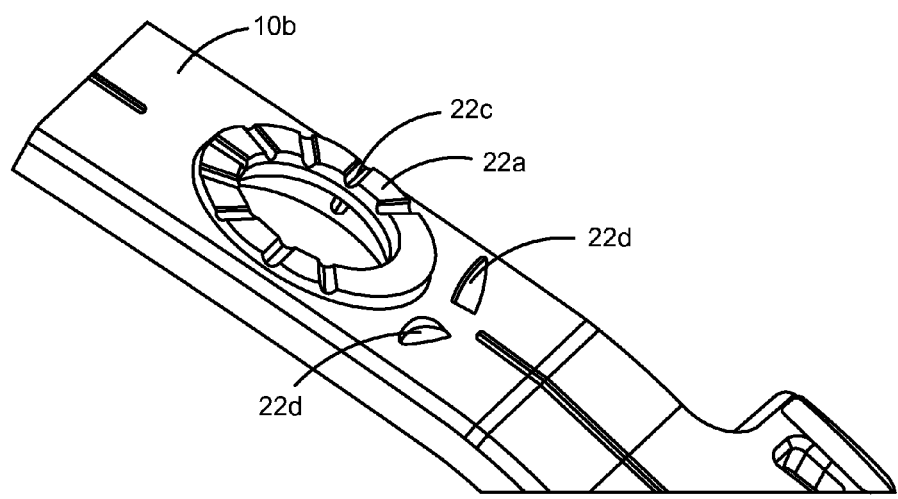

FIG. 4I provides an alternative embodiment of sled 1 of the disclosure without a snap tooth cover 25 applied, wherein the proximal and distal portions of the sled are configured as shown in FIGS. 1D-1I. FIG. 4I shows a rear view of the rear surface 10b of sled 1, including elongated member 10, locking mechanism 14, clasp retaining elements 14o and 14p, camera aperture 18, raised blocks 22a, height 22b, troughs 22c, home articulating members 22d and 22e, and cutout portions 32a and 32b. FIG. 4J is a perspective view of the rear surface 10b of sled 1, including raised blocks 22a, troughs 22c, and home articulating members 22d and 22e. In certain embodiments, the raised blocks 22a and troughs 22c allow for the space interface cap or any apparatus attached to such a cap to be rotated in relation to the sled and held at various angles to the sled based on the positioning of the troughs 22c.

Figure 4K:
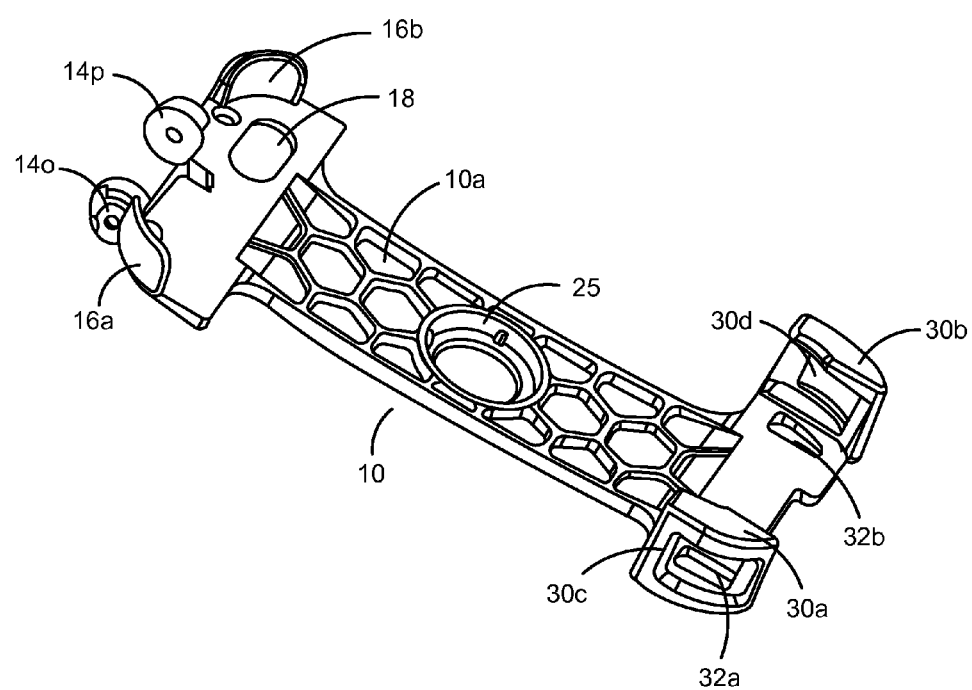
Figure 4L:
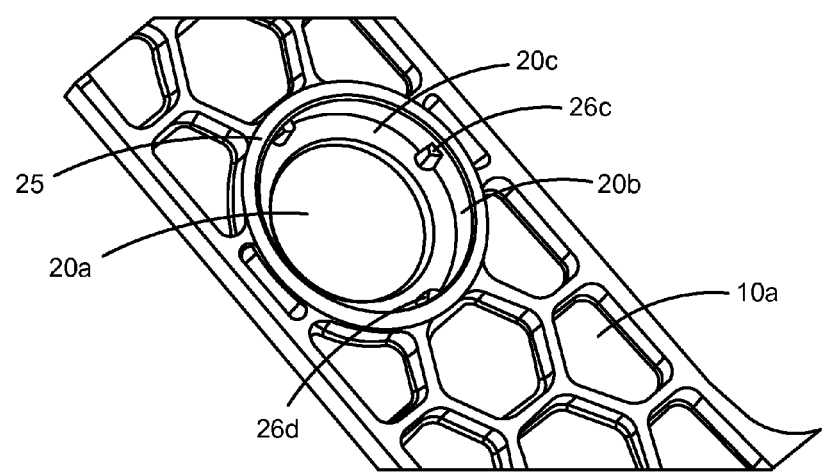
Figure 4M:
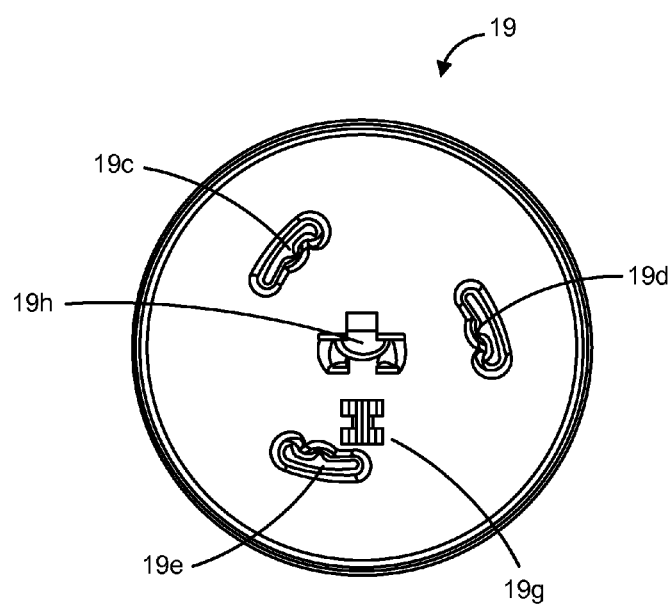
Figure 4N:
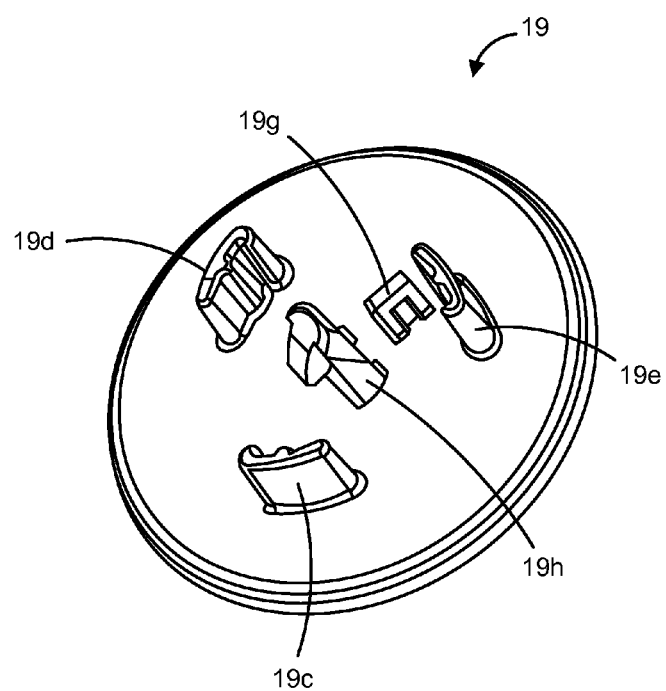

FIG. 4K is a perspective view of the front surface 10a of an alternative embodiment of sled 1, as configured in FIG. 1D. The sled includes including extended portion 10, a proximal portion 12 c, distal portion 12d, front surface 10a, pockets 16a and 16b, supporting elements 30a and 30b, supporting element cutouts 30c and 30d, clasp retaining elements 14o and 14p, camera aperture 18, cutout portions 32a and 32b, and snap interface 25. FIG. 4L is a perspective view of the front surface 10a of a sled 1, including a snap interface 25. The snap interface 25 includes a snap aperture 20a. In certain embodiments, snap teeth 26a-d are sitting on attachment ledge 20c and abutting the snap tooth receptacle 20b. FIG. 4M shows an alternative embodiment of a snap-interface cap 19 that can be attached to the snap interface shown in FIG. 4L. The exemplary snap-interface cap 19 of FIG. 4L includes snap-tooth elements, e.g. 19c, 19d, and 19e, configured for being coupled to the snap teeth 26a-d of the snap interface 25. Snap tooth stop 19g prevents the snap-interface cap 19 from rotating, while the accessory tooth 19h connects the snap-interface cap directly to an accessory associated with the sled. For instance, the accessory could be a belt clip or any of a variety of mounting apparatus described herein. FIG. 4N shows a perspective view of snap-interface cap 19, including snap-tooth elements 19c-d, snap tooth stop 19g and accessory tooth 19h.

FIG. 5 provides an exemplary embodiment of a utility attachment 40 for attachment to the sled 1. This particular utility attachment is configured as a clip, such as a belt clip. The belt clip 40 can have any suitable size and any suitable shape so long as it is capable of being coupled to the sled 1 and further capable of attaching the sled 1 to a belt. For instance, in certain instances, the length of the belt clip 40 may be about 0.5 inches, 1 inch, 1.5 inches, 2 inches, and the like.

Figure 5A:
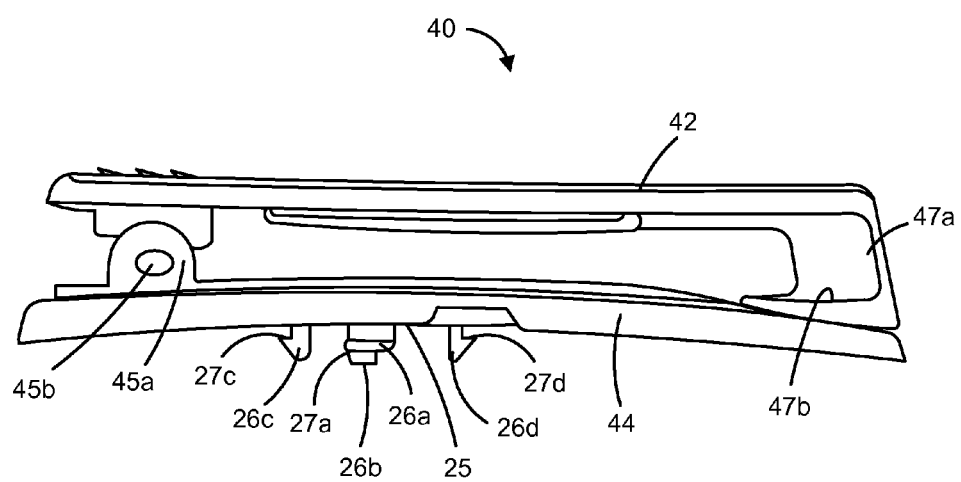
FIGS. 5A-5F are directed to a suitable belt-clip accessory that may be coupled to the sled of the disclosure.

As can be seen with respect to FIG. 5A, an exemplary belt clip 40 to be attached to a sled 1 of the disclosure may include a top member 42 and a bottom member 44, wherein the bottom member 44 includes a snap-tooth interface 25 configured for being fit within a utility attachment aperture 20 of the sled 1 as described above. Accordingly, the snap-tooth interface 25 includes a plurality of, e.g., four, snap teeth, 26a-26d, each snap tooth including an attachment ledge interface 27a-27d for being coupled with an attachment ledge 20c of an attachment aperture 20. In a manner such as this, the belt clip 40 may be either removably or non-removably attached to the sled 1, as described above. In this embodiment, the belt clip 40 is configured for being removably attached to the sled 1, and thus, when coupled with other utility accessory attachments, as described herein below, may form a kit of interchangeable utility attachments, each of which removable utility attachments may be interchanged with one another in their coupling to the sled 1.

The bottom member 44 and top member 42 of the clip 40 are capable of being associated with one another. Although the top member 42 may be coupled to the bottom member 44 in any suitable manner, in this instance, this coupling is in such a manner that the top member 42 is capable of moving, e.g., rotating, relative to the bottom member 44. Thus, the top member 42 is moveably coupled to the bottom member 44, such as at an axle 45 interface. For instance, the top and bottom members 42 and 44 may have corresponding axle receptacle 45a and 45b, which axle interfaces are configured for receiving an axle 45 there through such that when coupled together via the axle 45 the top member 42 is capable of rotating away from the bottom ember 44 about the axle 45.

The top member 42 further includes a belt retention element 47. The belt retention element 47 includes an extended member 47a that displaces the top member 42 away from the bottom member 44 a distance suitable such that a belt may be received in between the top 42 and bottom 44 members. The extended member 47a further includes a belt retention member 47b, which belt retention member is configured for interfacing with a belt such that the sled 1 may not be removed from its attachment to a belt until the belt retention member 47 is disengaged from the belt. It is to be noted that the belt clip 40 includes a circular snap-tooth interface 25, which snap-tooth interface 25 is associated with the attachment aperture 20 in such a manner that the belt clip 40 is capable of rotating about the sled 1, such as in an articulated manner.

Figure 5B:
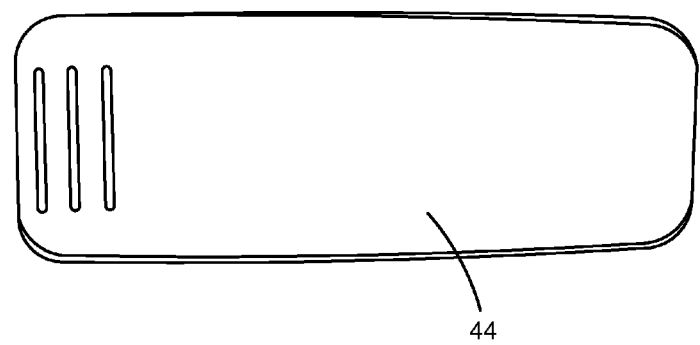

FIG. 5B depicts a top surface 42a of the top member 42 of a belt clip 40. Also depicted is a grip feature that is positioned on a proximal portion of the top member 44 and designed to facilitate the rotation of the top member relative to the sled 1.

Figure 5C:
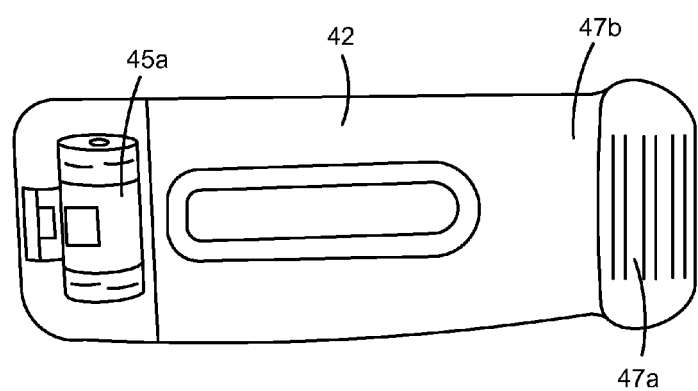

FIG. 5C provides a depiction of a bottom surface 42b of a top member 42, which top member 42 is configured for being rotatably coupled to a bottom member 44, such as at an axle interface 45a. The axle interface 45a is configured as a receptacle that is adapted to receive an axle member 45, e.g., a pin, there through. Also depicted are the extended member 47a and belt retention member 47b of the top member 42.

Figure 5D:
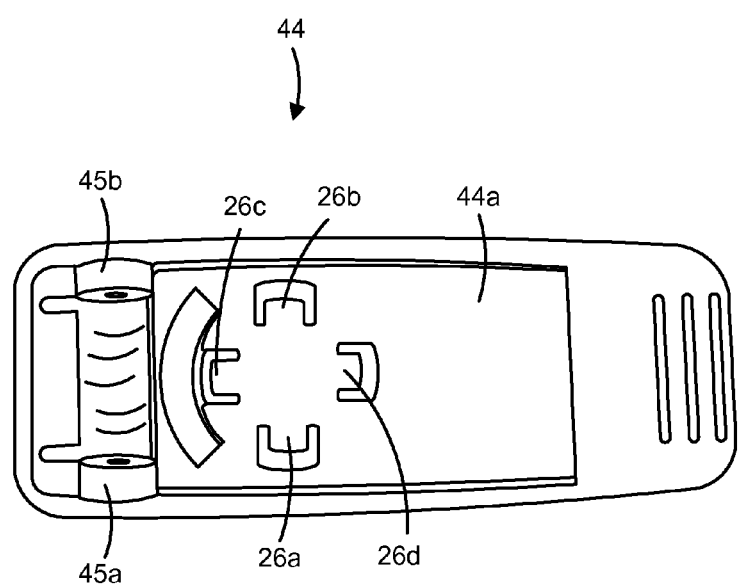

FIG. 5D depicts a top surface 44a of a bottom member 44 of the belt clip 40. The bottom member 44 is configured for being coupled to a top member 42, such as at an axle interface 45b. The axle interface 45b is configured as a receptacle that is adapted to receive an axle member 45, e.g., a pin, therethrough. Also depicted are the base members for snap teeth 26a-26d.

Figure 5E:
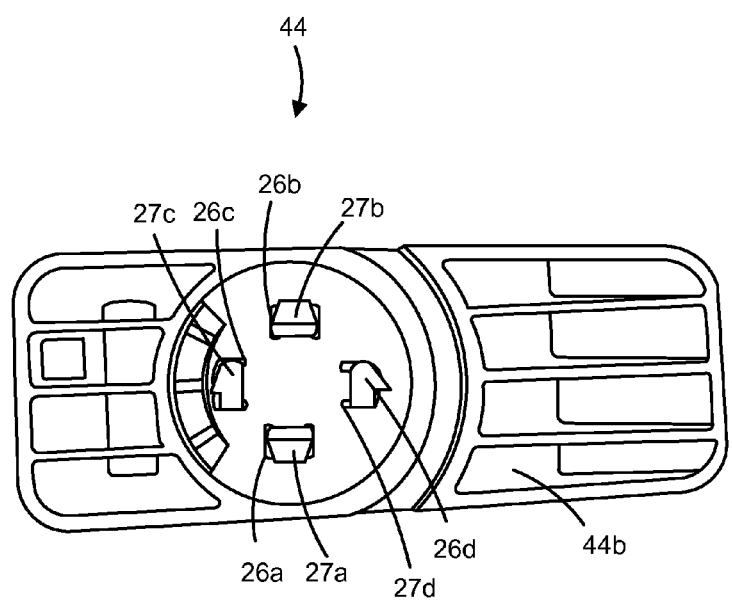
Figure 5F:
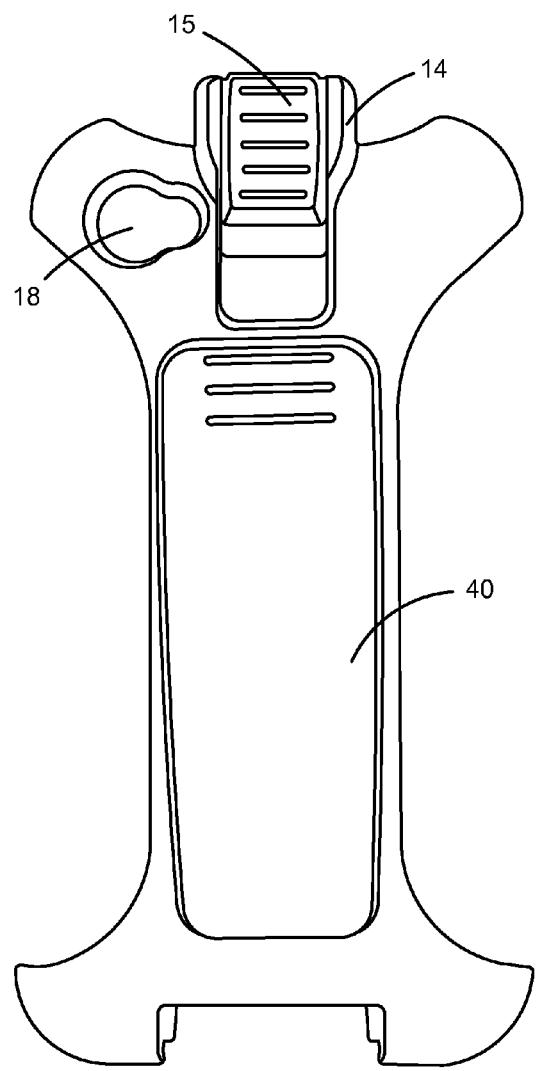

FIG. 5E depicts a bottom surface 44b of the bottom member 44 of the clip 40. The bottom surface 44b of the bottom member 44 includes a snap-tooth interface 25, which snap-tooth interface includes a plurality of, e.g., four, snap teeth, 26a-26d. FIG. 5F depicts a back surface 10b of the elongated member 10 of the sled 1 with a belt clip accessory 40 attached thereto. Also depicted is a camera feature 18 and a locking slide 15, which locking slide 15 is coupled to a clasping mechanism 14. Further depicted are the back surface of the support pockets 30a and 30b, which pockets are separated from one another by a gap, such as a gap sized so as to allow a charger port interface to be inserted there between thereby allowing a retained electronic device to be charged while within the sled 1.

Figure 5G:
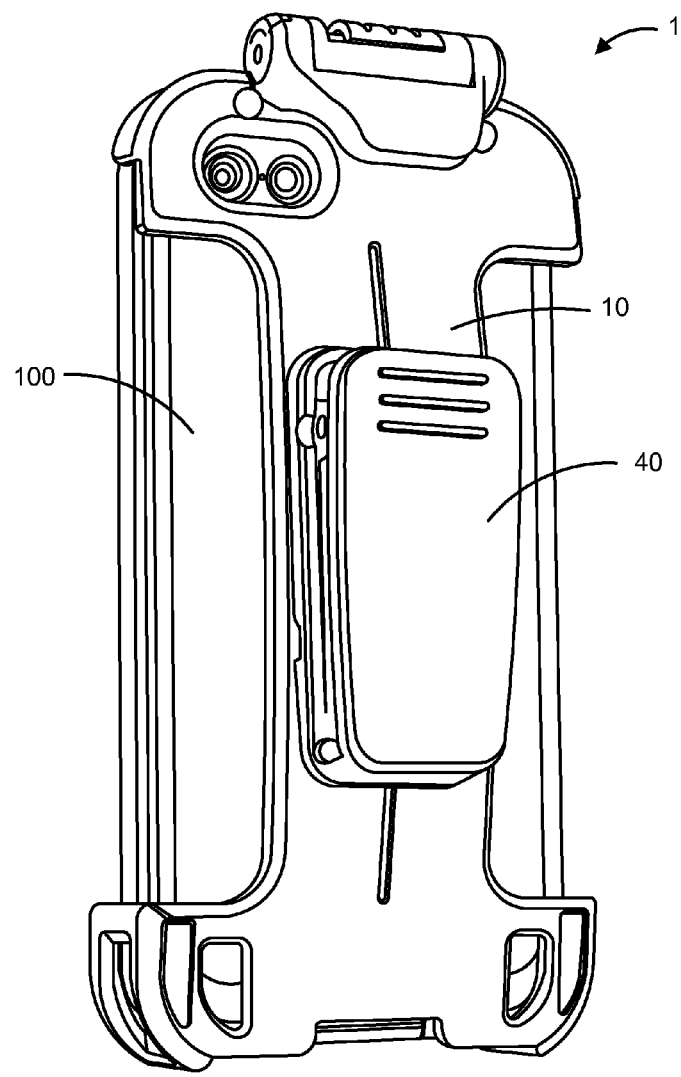
FIGS. 5G-5J are directed to an alternative embodiment of a sled of the disclosure coupled to an alternative embodiment of a belt clip accessory.
Figure 5H:
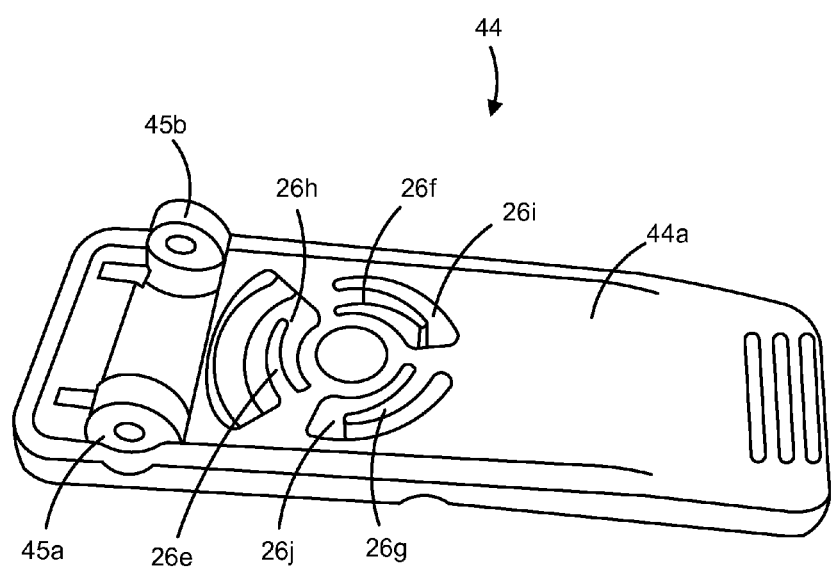
Figure 5I:
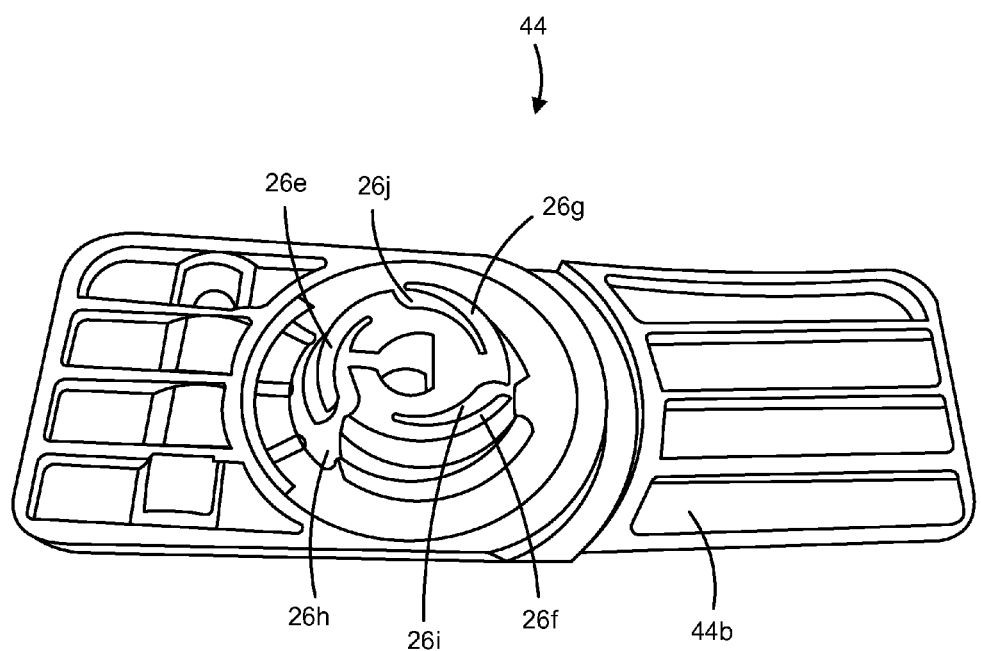
Figure 5J:
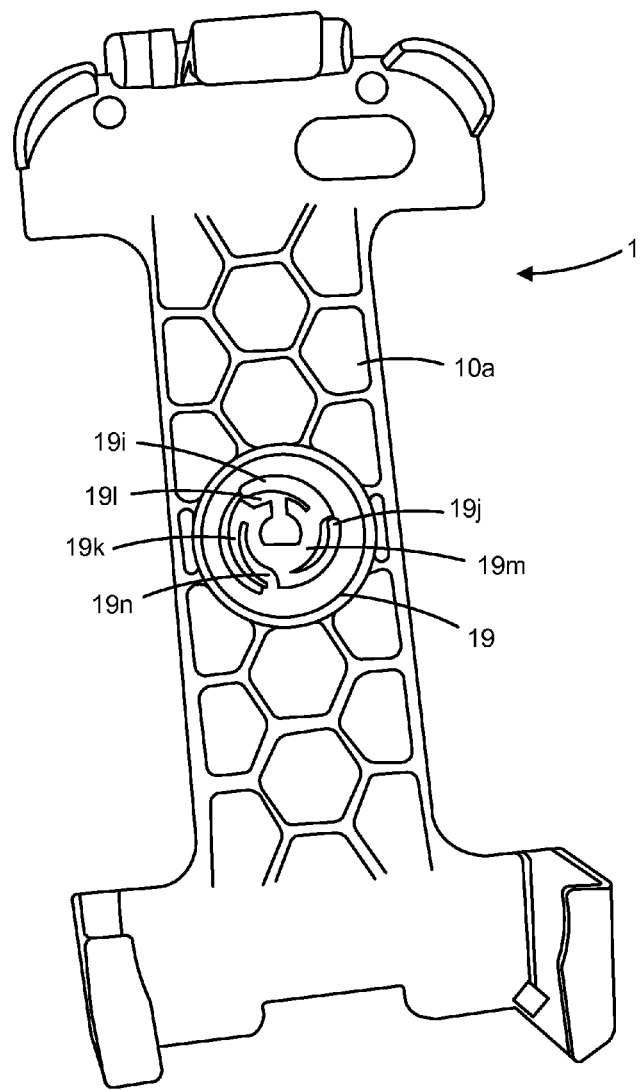

FIG. 5G provides an alternative embodiment of a sled attached to a belt clip, as described supra and in FIGS. 1D-1H. FIG. 5G depicts a perspective view of the rear side of a sled 1, including belt clip 40, and a housing 100. FIG. 5H provides a perspective view of an alternative embodiment of a bottom member 44 of a belt clip, including: top surface 44a; axle receptacle 45a; axle interface 45b; belt clip attachment tongues 26e, 26f, 26g; and belt clip attachment grooves 26h, 26i, 26j. FIG. 5I depicts a perspective view of an alternative embodiment of a bottom member 44 of a belt clip, including: bottom surface 44b; axle receptacle 45a; axle interface 45b; belt clip attachment tongues 26e, 26f, 26g; and belt clip attachment grooves 26h, 26i, 26j. The belt clip attachment tongues and belt clip attachment grooves are formed from an attachment pedestal 26k that extends outward from the bottom surface 44b of the bottom member 44. The bottom member is configured so that the belt clip attachment tongues 26e-g mate with cap grooves in a cap attached to a sled (described infra and depicted in FIG. 5J). Similarly, belt clip attachment grooves 26h-26j are configured to mate with cap tongues that extend outward from the rear surface of a cap attached to a sled (see FIG. 5J infra). The bottom member of the belt clip can then be rotated to secure the bottom member into the cap. FIG. 5J depicts a perspective view of the front surface 10a of a sled 1 with a cap 19, including cap tongues 19i, 19j, 19k, and cap grooves 19l, 19m, 19n. The cap tongues extend towards the rear surface of the sled and are not seen in their entirety.

FIG. 6 provides another utility accessory attachment this time configured as a bike mount sled attachment 60. As can be seen with respect to FIG. 6A, a sled 1 of the disclosure may be coupled to a bike mount sled attachment 60, so as to allow the sled 1 to be removably attached to a portion of a vehicle, such as a bar portion of a bicycle, motorcycle, hang glider, and the like. Accordingly, the bike mount accessory includes a sled attachment base member 60 having a top 60a and a bottom surface 60b. In a manner similar to that described above, a back surface 10b of a sled 1 may be coupled to a back surface 60b of the bike mount sled attachment base 60 via a suitable snap-tooth interface 25, which interface is capable of being coupled to the sled 1, as described above.

The snap-tooth interface 25 of the bike accessory attachment base 60, however, is configured a bit differently than the snap-tooth interface of the belt clip attachment 50, because in this embodiment, the snap-tooth interface 25 includes eight separate snap-teeth 25a-25h, which snap teeth are configured for engaging an attachment ledge 20c of the attachment aperture 20 of the sled 1 as described above. The additional teeth function in part to prevent the bike mount attachment from rotating about the aperture 20, and further function to provide a firmer coupling between the bike mount sled attachment base 60 with the sled 1. The bottom surface 60b of the bike mount sled base 60 additionally includes attachment edge rails 61a and 61b that are configured for engaging the edges 12a and 12b of the sled 1 in a manner such that the rails 61a and 61b wrap at least partially around the edges 12a and 12b so as to further prevent the bike mount sled attachment base 60 from rotating with respect to the sled 1. The bike mount sled attachment base 60 need not move with respect to the sled 1 because a top surface 60a of the bike mount sled attachment base 60 includes a rotatable ball member receptacle 62, which rotatable ball member receptacle 62 includes a plurality of joint walls 62a-62d, which joint walls are configured for forming the receptacle 62 adapted for receiving a rotatable ball attachment member 67b that forms a rotatable ball joint 66.

Figure 6A:
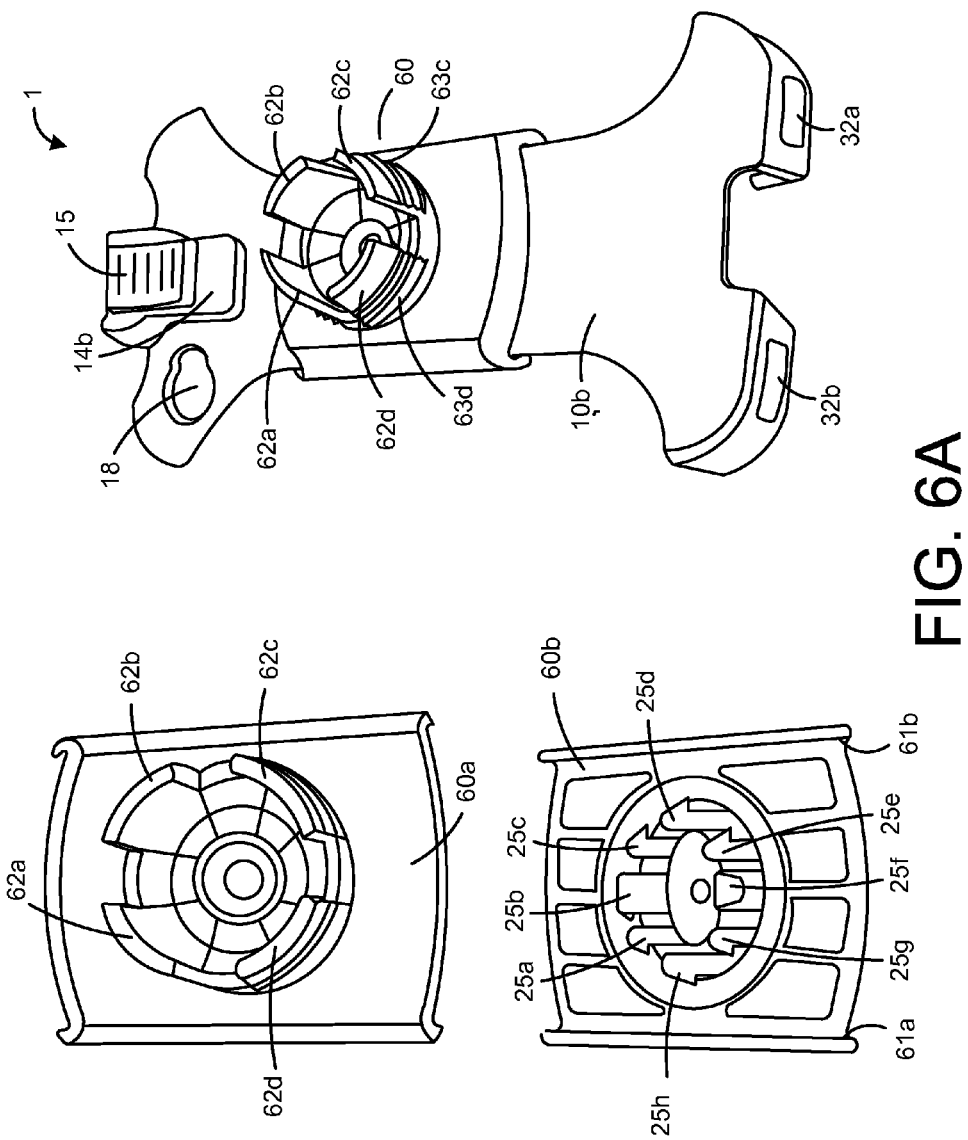
FIGS. 6A-6I are directed to implementations of a bike mount adapter and assembly that may be coupled to a sled of the disclosure.
Figure 6B:
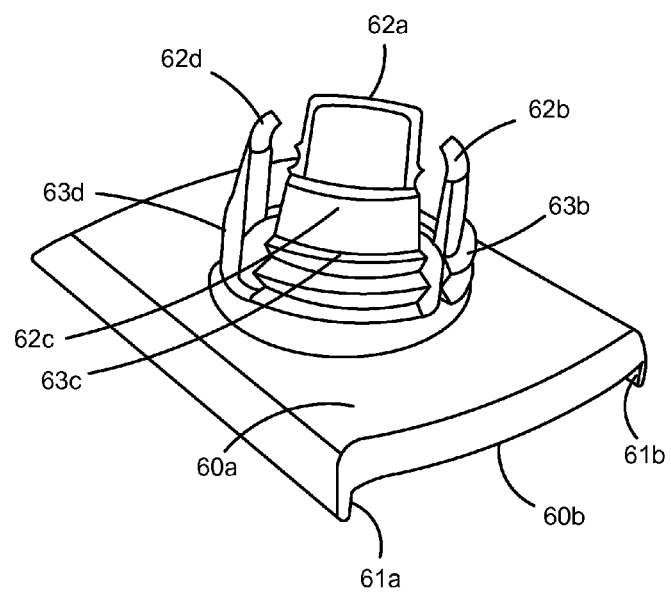
Figure 6C:
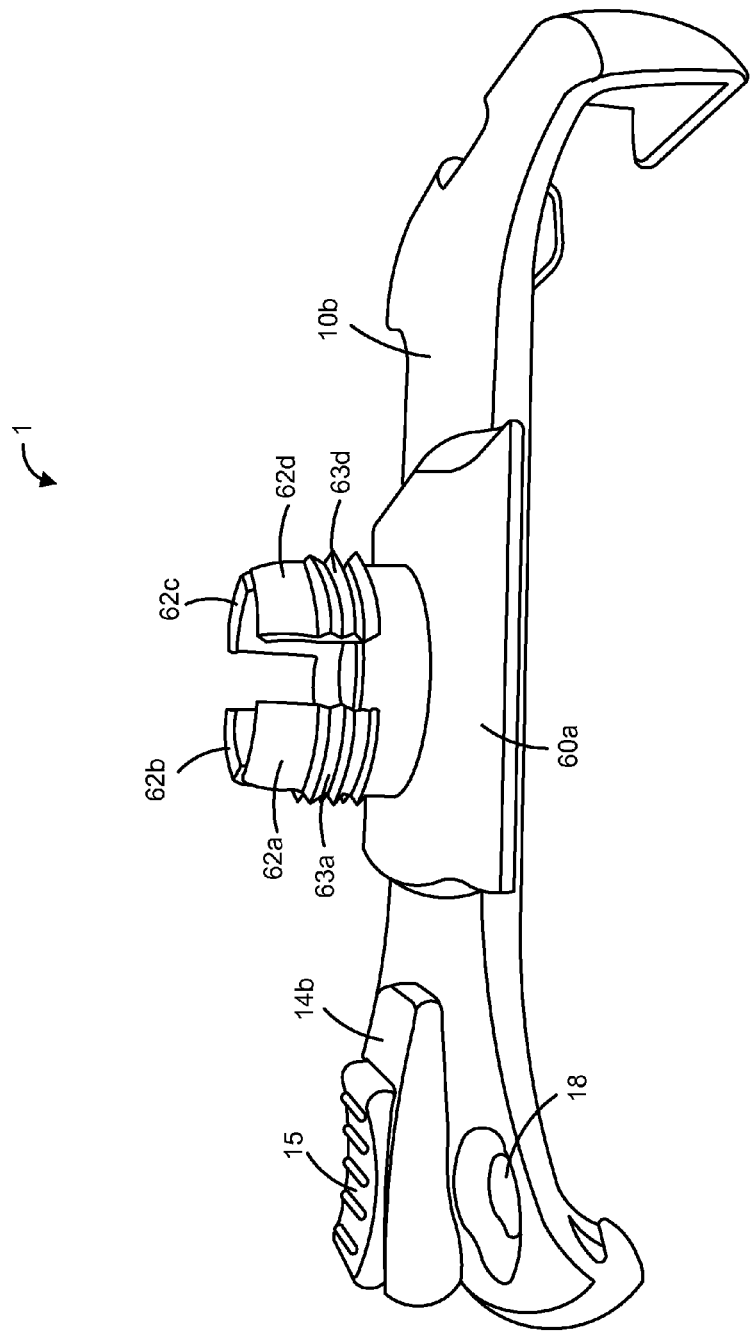
Figure 6D:
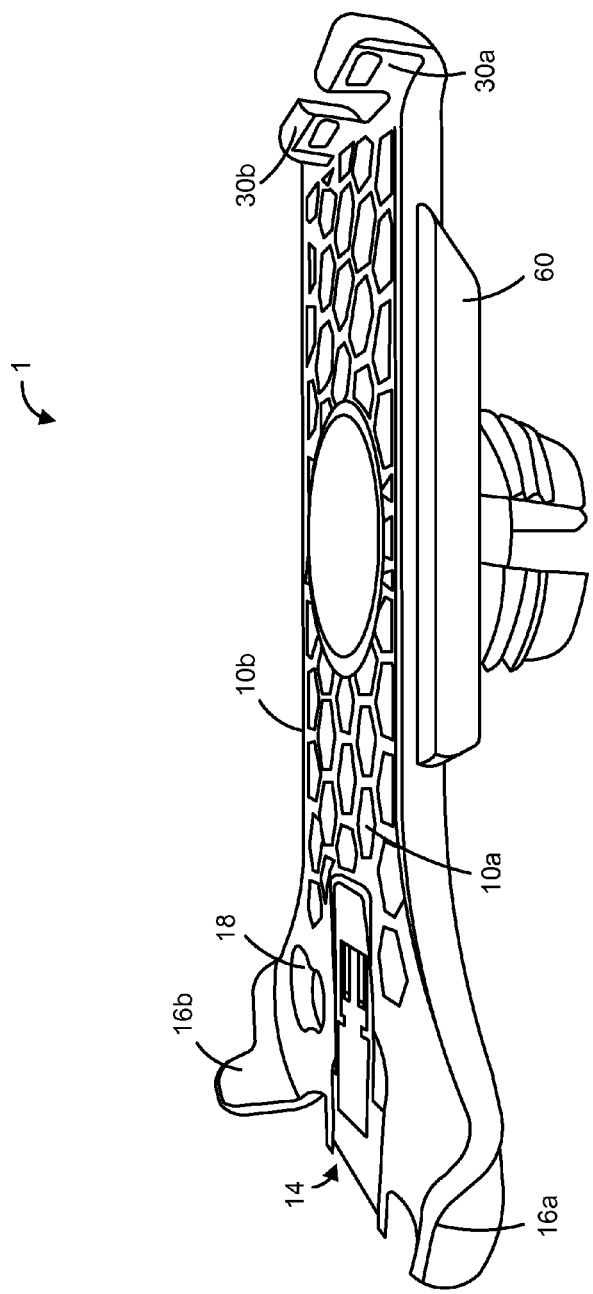

Specifically, FIG. 6B provides a top surface 60a of a bike mount sled attachment base member 60, which top surface includes a ball member receptacle 62, which ball member receptacle includes four receptacle walls 62a, 62b, 62c, and 62d, which walls are configured to define a cavity 62 within which a corresponding ball attachment member 67b may be positioned therein. Accordingly, the bike mount sled attachment includes a base member 60, which base member 60 is configured for being coupled to a sled 1 of the disclosure, and further includes ball member receptacle walls 62a-62d defining a ball member receiving receptacle 62 that is configured for being coupled with a ball attachment member 67b so as to form a rotatable ball joint. The walls of the ball attachment member receptacle 62a-62d include threads 63a-63d, which threads are configured for being removably coupled to corresponding threads 68f of a tensioning member 68, which tensioning member 68 functions to tighten the ball joint 66 and thereby locking it down and preventing its movement. FIG. 6C provides a side view of a bottom surface 10b of a sled 1 of the disclosure wherein the sled 1 is coupled to a base 60 of a bike mount sled attachment member. FIG. 6D provides a side view of a top surface 10a of a sled 1 of the disclosure wherein the sled 1 is coupled to a base 60 of a bike mount sled attachment member.

Figure 6E:
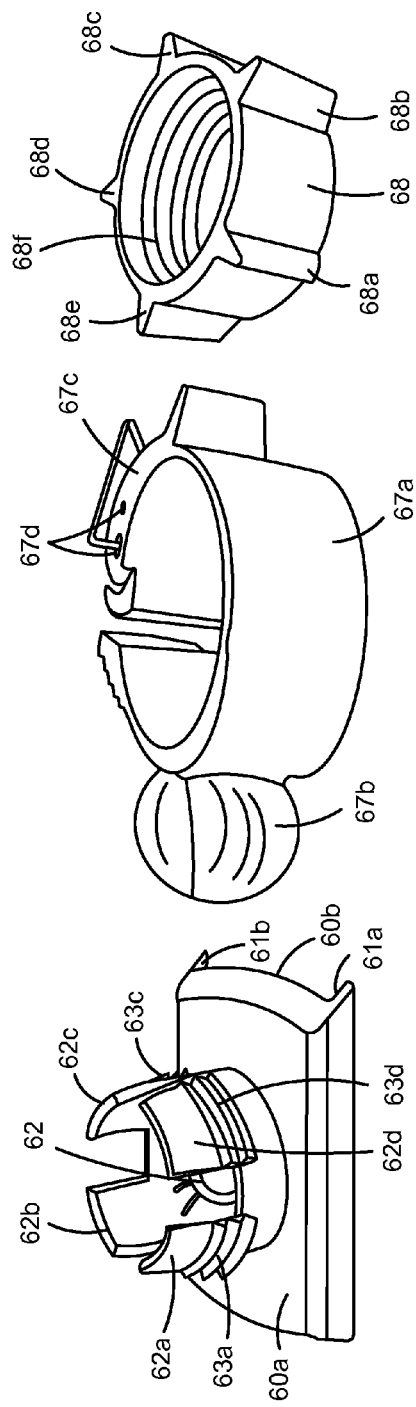
Figure 6F:
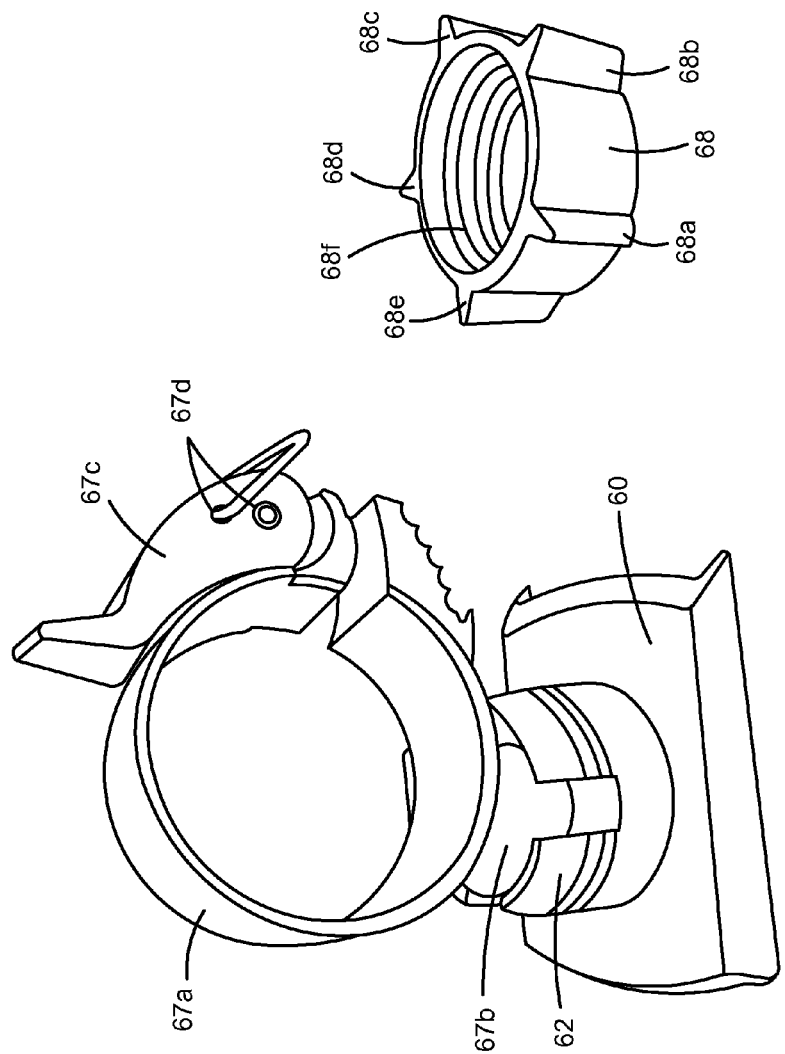

FIG. 6E depicts exemplary elements of a bike accessory sled attachment element 60 having a ball member assembly 67 and tensioning element 68 capable of being associated therewith so as to form a ball joint attachment member 66. The ball joint assembly 66 therefore includes a ball member assembly 67 and a tensioning element 68, both of which are configured for being moveably associated with the bike accessory sled attachment base 60. Accordingly, as depicted, the bike accessory sled attachment element 60 includes a ball attachment member receiving receptacle 62, which ball attachment member receiving receptacle 62 is configured for receiving a ball member 67b of a ball member assembly 67, wherein the ball assembly 67 allows for an electronic device to be retained within the sled 1 and further to be attached to a bar member, such as a bar member of vehicle, such as a bicycle, and yet be allowed to rotate despite being attached thereto.

The ball member assembly 67 includes a bar attachment member 67a, a ball member 67b, and a clasping mechanism 67c. The bar attachment member 67a is configured so as to be attached to a portion, such as a bar portion, of a bicycle, a motorcycle, or other such vehicle, or any object having a bar member to which the ball member assembly 67 may be attached, and the like. In one instance, the bar attachment member 67a is composed of a flexible or semi-flexible member that is configured to form an orifice into which orifice a substrate, e.g., a bar member, may be positioned, and thus, the bar attachment member 67a is configured for being fit around a substrate.

Further, the bar attachment member 67a is configured to be coupled to a clasping mechanism 67d, which clasping mechanism 67d is adapted for locking the bar attachment member 67a down into position around the substrate to which it is attached. This clasping mechanism 67d may have any suitable configuration so long as it is capable of locking the bar attachment member 67a in place.

In this instance, the bar attachment member 67a includes a clasping mechanism interface that corresponds to a similar interface on the clasping mechanism 67c, which interfaces are designed to interface with one another so as to couple the attachment member 67a to the clasping mechanism 67c. A suitable interface includes an extended member positioned on an end of the attachment member 67a, and an indented portion positioned on an end of the clasping mechanism 67c, wherein the indented portion has a "Y" configuration that is configured for receiving the extended portion in between the legs of the "Y". Both the extended member and indented portion may include orifices through which an axle, e.g., a pin, may be inserted so as to couple the two together. The clasping member 67c, therefore, may be configured for rotating about the axle so as to effectuate the locking of the attachment member 67a.

The clasping member 67c may further include a locking unit 67d, which locking unit 67d is configured for interfacing with a ridged locking region on the attachment member 67a so as to be able to lock the attachment member 67a in place. For instance, the clasping member 67c is rotates about the axle from a first, unengaged position, to a second, engaged position, so as to allow the locking unit 67d to engage the ridged locking region of the attachment member, e.g., between the ridges. Once engaged, the clasping member 67c is rotated back from its second engaged position to a third, locked, position, thereby locking the attachment member 67a in a locked position, e.g., around a bar member of a vehicle. The first and third positions may be the same general position.

Further, in this instance, the bar attachment member 67a further includes a ball member 67b. As can be seen with respect to FIG. 6F, the ball member 67b is configured for being attached to a ball attachment member receiving receptacle 62 of a bike accessory sled attachment element 60. Specifically, in this instance, the ball member 67b is configured for being received within the ball attachment member receiving receptacle 62 of the sled attachment element 60. This engagement allows the bar attachment member 67a to be coupled to the sled 1 via the ball member 67b being coupled to the sled attachment element 60 via the ball attachment member receiving receptacle 62, in a moveable engagement. For example, the ball member 67b may move and/or rotate within the receiving receptacle 62 around the ball of the ball member 67b. This, therefore, allows the sled 1 to move through a variety of orientations once attached to a bar portion of a vehicle.

In various instances, it may be useful to lock the sled 1 into a given orientation once positioned on a suitable substrate via the bar attachment member 67. Accordingly, in such an instance, a locking element may be included to lock the sled 1 into a given orientation. Such a locking element may have any suitable configuration so long as it is capable of engaging the attachment member 67 and/or the sled attachment member 60 in such a manner so as to lock the orientation of the sled into a desired orientation.

For instance, in this instance, a tensioning element 68 may also be included. The tensioning element 68 may have any suitable configuration, and in this instance, the tensioning element 68 includes an orifice, which orifice is configured for receiving the walls of a ball attachment member receiving receptacle 62 therein. For example, the interior boundary 68f of the tensioning element 68 and the walls of the receiving receptacle 62 may have corresponding threadlike interfaces so as to allow them to be "screwed" together.

Accordingly, the tensioning element 68 is configured for interfacing with the wall members of the ball attachment member receiving receptacle 62, so as to decrease the aperture of the receptacle 62, e.g., by moving the walls 62 inwards via screwing, and thereby engage the ball member 67b in such a manner that the ball member 67b is no longer capable of moving within the receptacle 62, consequently locking the sled 1 into a desired orientation. To facilitate this coupling, the tensioning element 68 may include grip features 68a-68e, for increasing the grip-ability of the tensioning element 68. The tensioning element 68 further includes thread feature 68f, which threads correspond to a like threaded region on the sled attachment member 60.

Figure 6G:
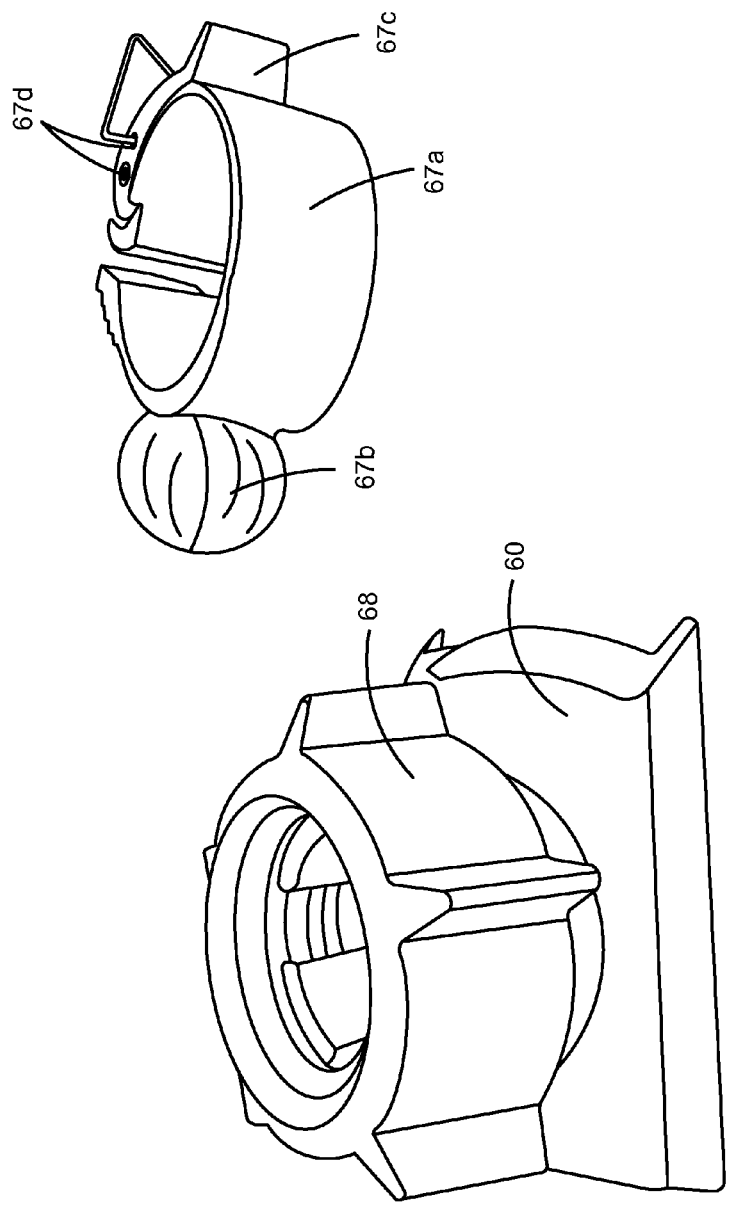

As can be seen with respect to FIG. 6G, the tensioning element 68 may engage the wall members 62a-62d of the ball attachment member receiving receptacle 62 of the sled attachment element 60, in any suitable manner. However, in this instance, this engagement is configured as corresponding screw-threads, which threads allow the tensioning element 68 to be screwed around the wall members 62a-62d thereby modulating the dimensions of the aperture 62, so as to lock the orientation of the ball member 67b in place. The wall members 62a-62d include thread features 63a-63d, which thread features correspond to thread features 68f of the tensioning member 68.

Figure 6H:
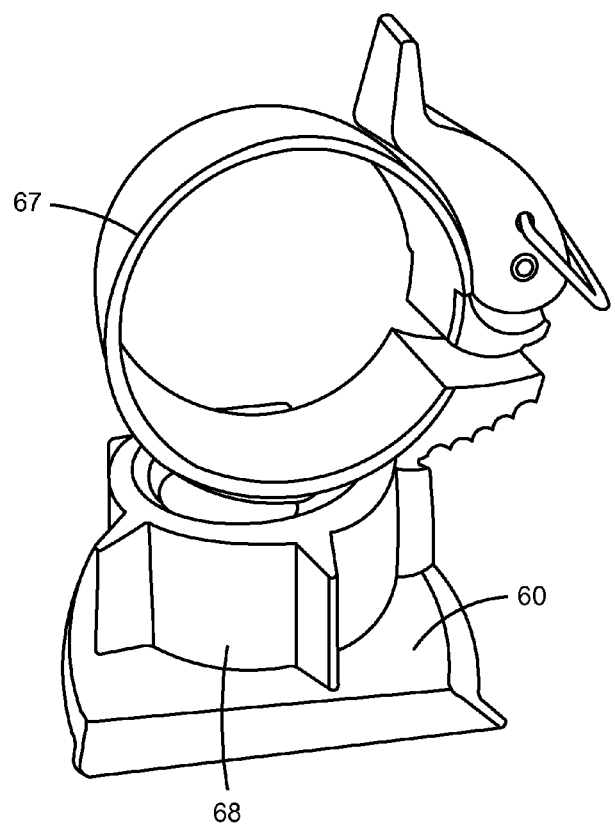
Figure 6I:
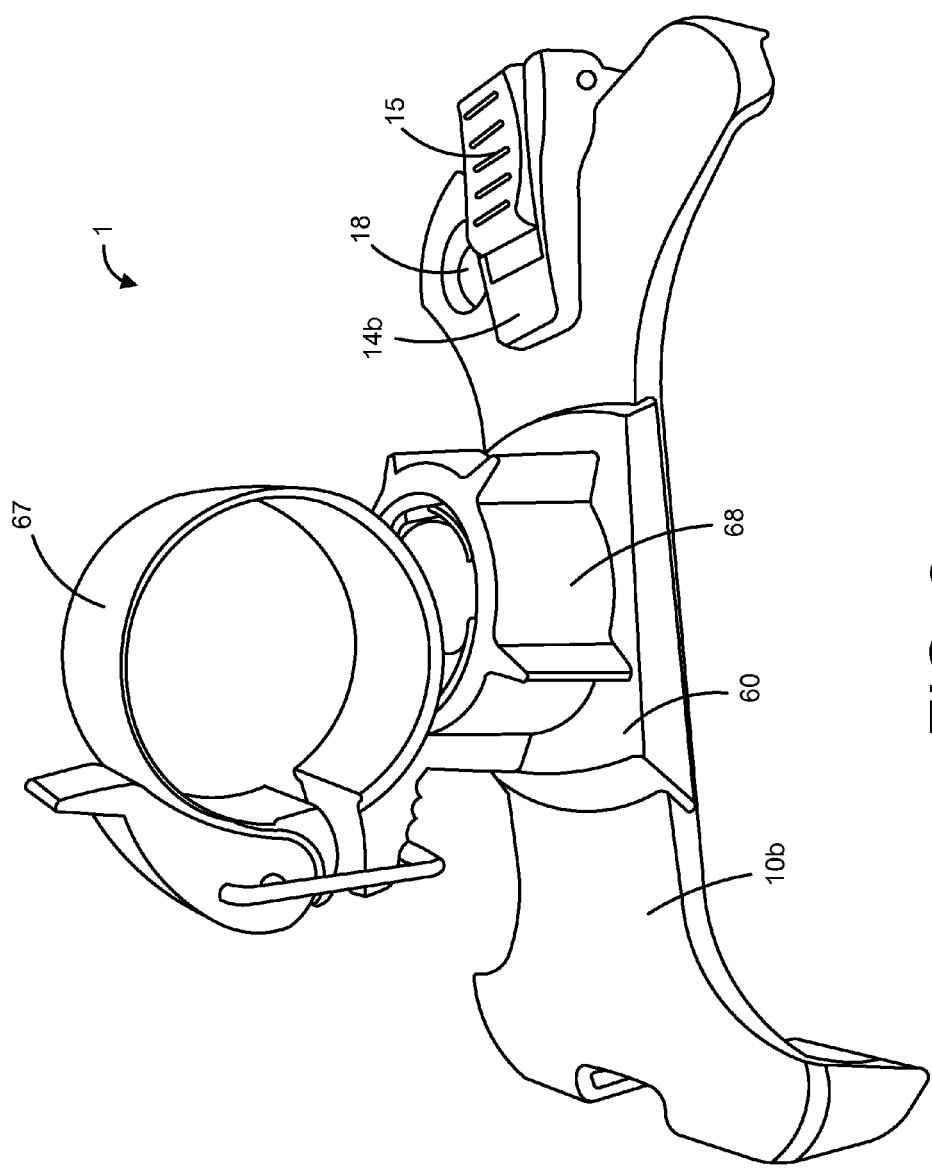

FIG. 6H provides a suitable a bike mount sled attachment, wherein a bike mount sled attachment base member 60 is attached to a bar attachment member 67, wherein the two members are locked into place by tensioning member 68. FIG. 6I provides the bike mount sled attachment as it is when coupled to a suitable sled 1.

FIGS. 6J-6T provide several preferred ball assemblies for removably attaching a utility accessory attachment according to any of FIGS. 6A-6I to a threadless bicycle headset (not shown) using a headset bolt or stem cap screw.

As those in the art will appreciate, the representative embodiments illustrated in FIGS. 6J-6T may be readily adapted for use with other vehicles, including bicycles having threaded headsets, motorcycles, hang gliders, and the like. In such embodiments, the use of a ball and socket, or "rotatable ball member receptacle", 62, as shown in these figures forms an adjustable ball joint that allows the user to manually adjust the sled's position in relation to the bicycle in order to mount the sled at a desired position. When the desired position is achieved, the user can secure the ball in the receptacle 62 or cavity by adjusting the tensioning member (e.g., element 68, FIG. 6G) to tighten the ball joint and thereby lock it down so as to prevent movement of the ball in the socket, thereby securing the user-selected position of the sled in relation to the bicycle's headset.

Figure 6J:
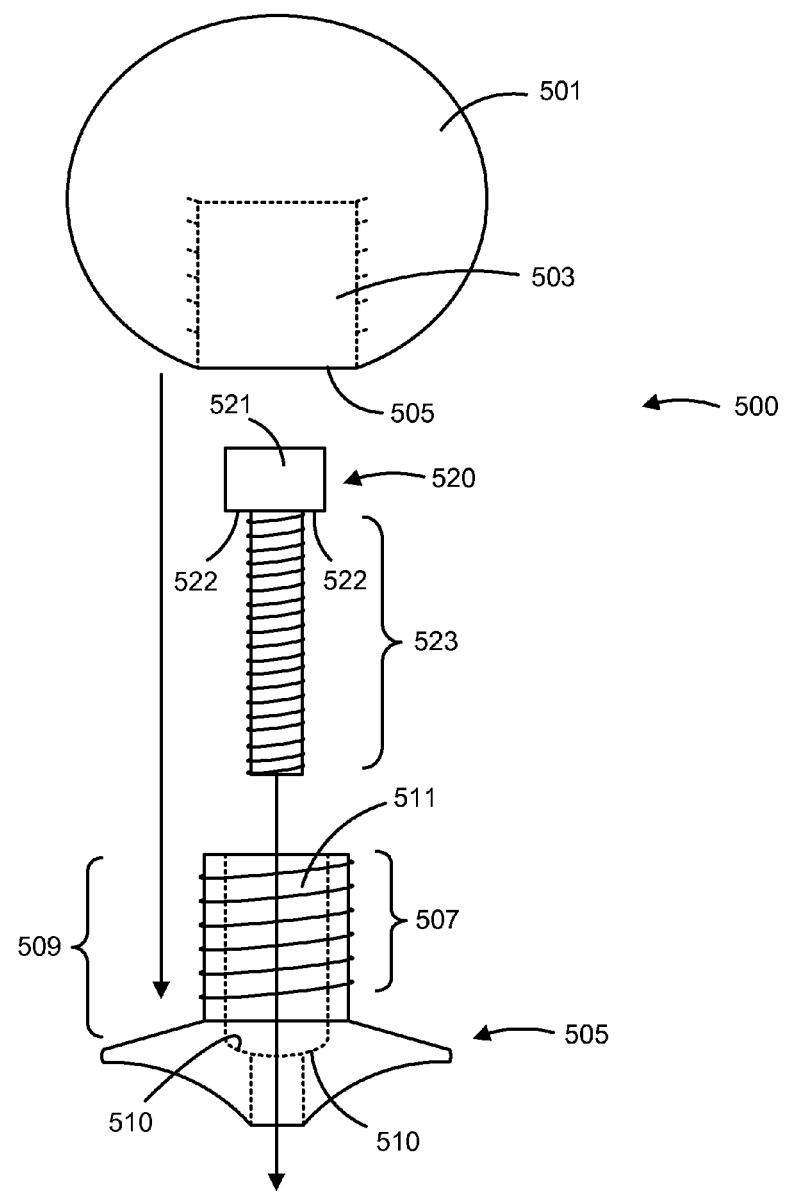
FIGS. 6J-6T are directed to implementations of a bike-mounted ball assembly for coupling to a sled of the invention having a bike mount assembly attached to or integrated therewith.

Turning to the figures, FIG. 6J shows an exploded view of one embodiment of a ball assembly 500 according to the invention. The ball 501 contains a threaded bore 503 accessible through an opening 505 in its underside. The threaded bore 503 is adapted to receive the threaded portion 507 of a stem cap having an integrated post 509. The stem cap and post 505 has a through-bore 511 having two diameters. The diameter "x" of the upper portion of the through-bore is larger than the diameter "y" of the upper portion of the through-bore, as lower portion of the must be sufficiently sized to accommodate the threaded portion 523 of the stem cap screw 520, while the upper portion of the through-bore 511 must be sufficiently sized to accommodate the head 521 of the stem cap screw 520. The intersection of the upper and lower portions of the through-bore 511 is bounded by a seat 510 configured to engage the lower engaging surface 522 of the head 521 of a stem cap screw 520.

Figure 6K:
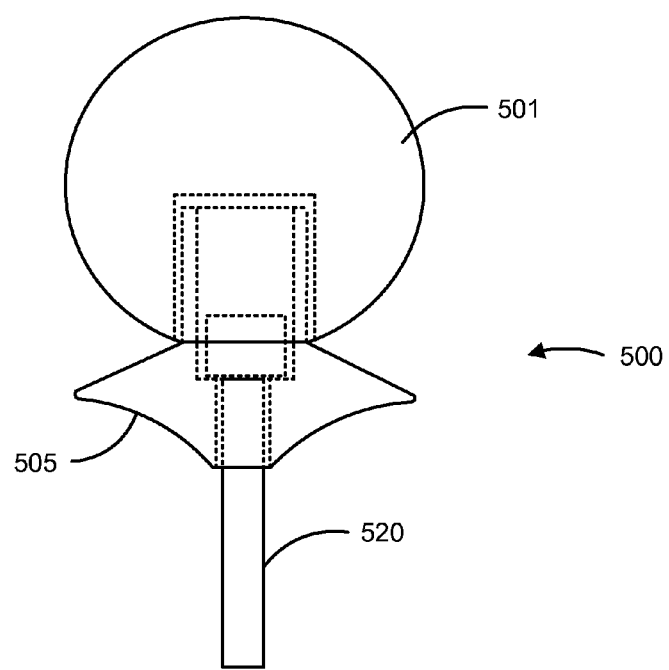

The ball assembly shown in FIG. 6J is assembled onto a threadless bicycle headset (not shown) by positioning the stem cap and post 505 atop a threadless bicycle headset, inserting the stem cap screw 520 into the through-bore 511, tightening the stem cap screw 520, and then screwing the ball 501 onto the stem cap and post 505. A cross-section of such an assembled ball assembly 500 is shown in FIG. 6K. A utility accessory attachment as shown, for example, in FIG. 6D, can then be securely yet removably attached to the bicycle-mounted ball assembly using a tensioning element (e.g., element 68, FIG. 6G) capable of being associated therewith. A bicycle having such a utility accessory attachment so mounted is then suited to retain a portable electronic device, e.g., a cellular phone, in the sled, with the sled, and hence the electronic device, positioned in manner determined by the particular user.

Figure 6L:
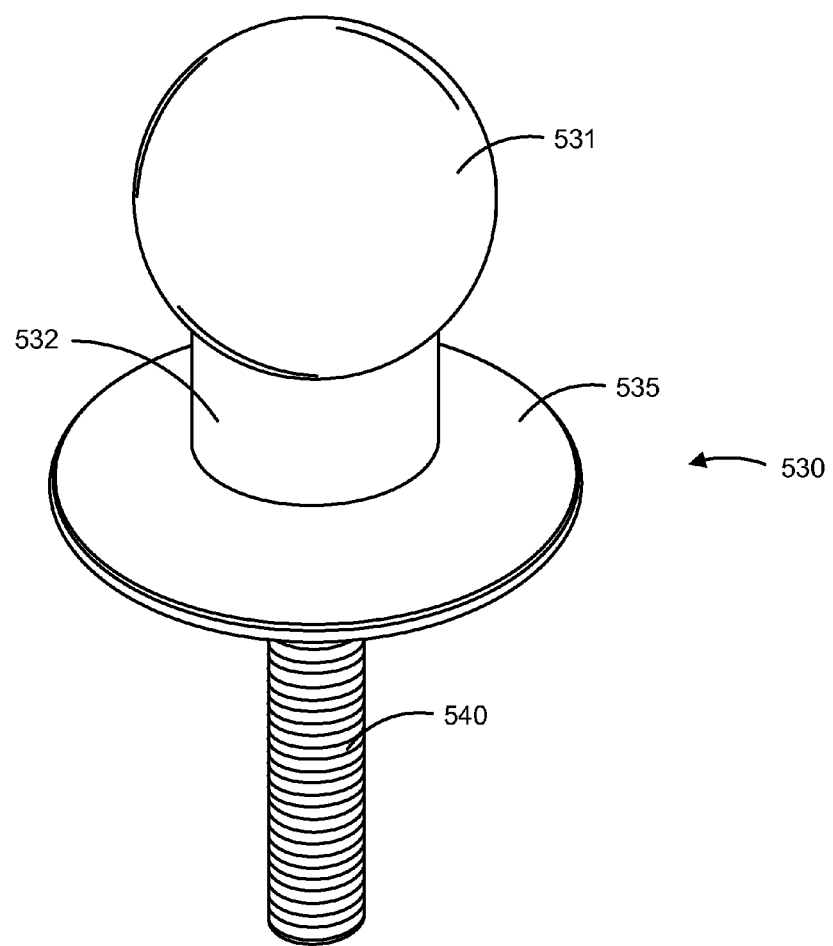
Figure 6M:
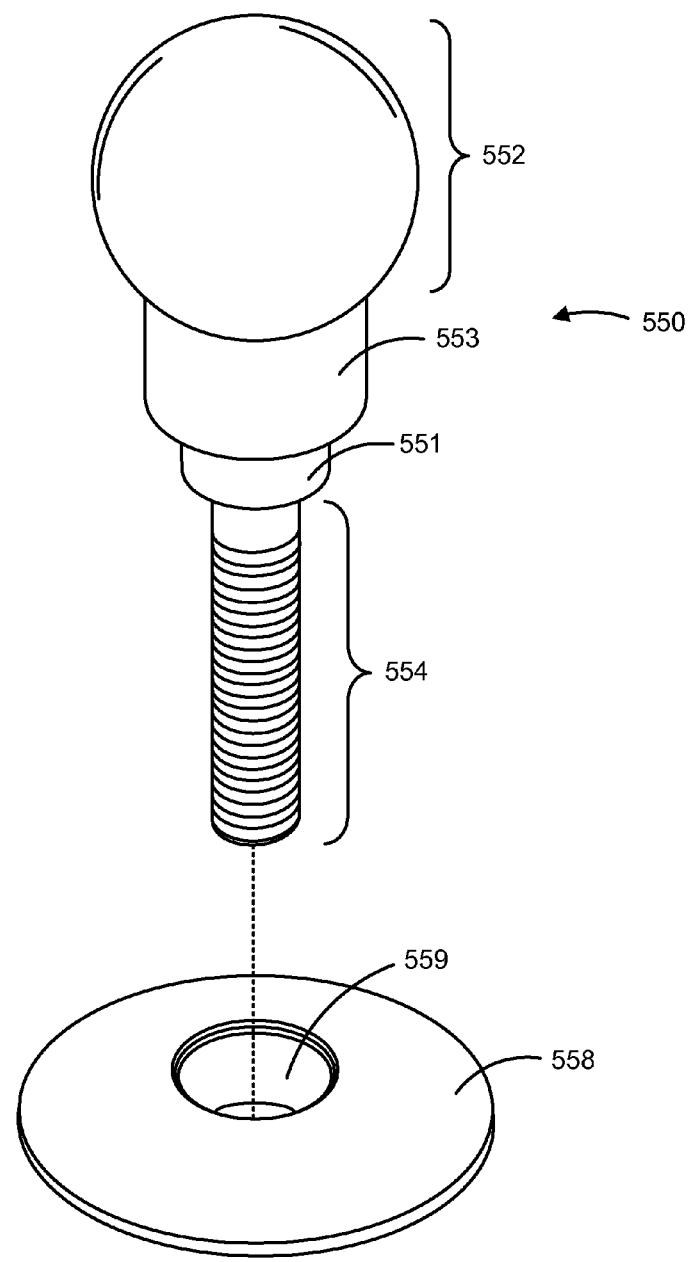
Figure 6N:
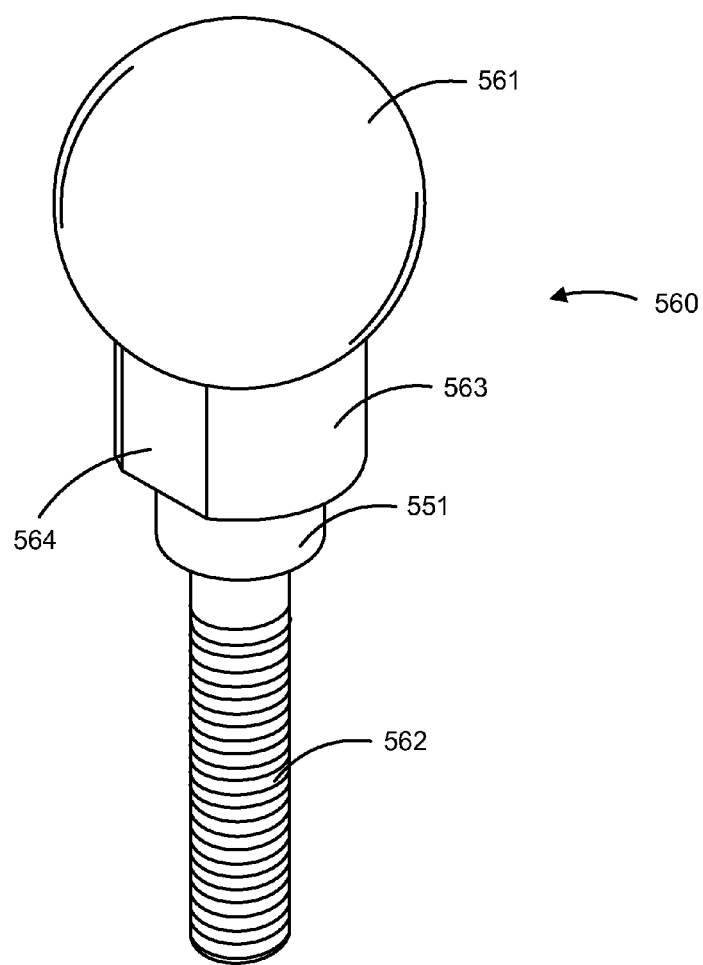
Figure 6O:
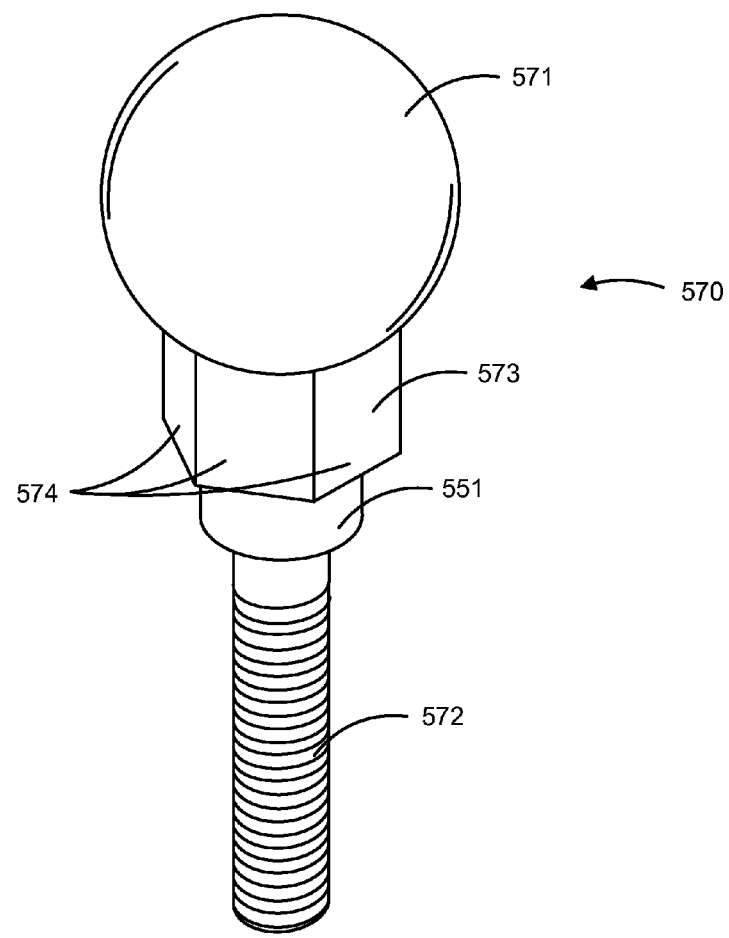

FIG. 6L shows an alternative embodiment of an integrated ball assembly 530 according to the invention. Here, the ball 531, stem cap 535, and threaded stem cap screw 540 are unitary, single piece. In this embodiment, the ball 531 is elevated above the stem cap portion 535 by a post 532, which can be any suitable height. FIG. 6M shows a similar alternative embodiment, wherein a conventional stem cap screw (not shown) is replaced by a ball-topped stem cap screw 550 have a ball portion 552 opposite its threaded portion 554. Such an embodiment does not require replacement of the stem cap 558, which, if desired, can be reused. In this embodiment, the original stem cap screw (not shown) is removed and replaced with the ball-topped stem cap screw 550 shown in FIG. 6M. The ball portion 552 is positioned above a post region 553, which is disposed on top of a spacer 551 which, when the ball-topped stem cap screw 550 is screwed into position in the headset (not shown), fits within and closely associates with the wall of cylindrical bore 559 in the stem cap 558.

FIGS. 6N-6T show further alternative embodiments of a ball-topped stem cap screw (560, 570, 580, 590, 600, 610, 620, respectively) that can be used, for example, to replace an existing stem cap screw on a threadless bicycle headset (not shown). These embodiments are interchangeable with the embodiment shown in FIG. 6M, and thus the stem cap (558) is not shown. In these embodiments, the ball portion (561, 571, 581, 591, 601, 611, 621, respectively) is disposed opposite the threaded portion (562, 572, 582, 592, 602, 612, 622), with the ball portion (561, 571, 581, 591, 601, 611, 621, respectively) positioned above a post region (563, 573, 585, 593, 603, 613, 623, respectively), which is disposed on top of a spacer (551) that again fits within and closely associates with the wall of the cylindrical bore that extends through the stem cap.

Figure 6P:
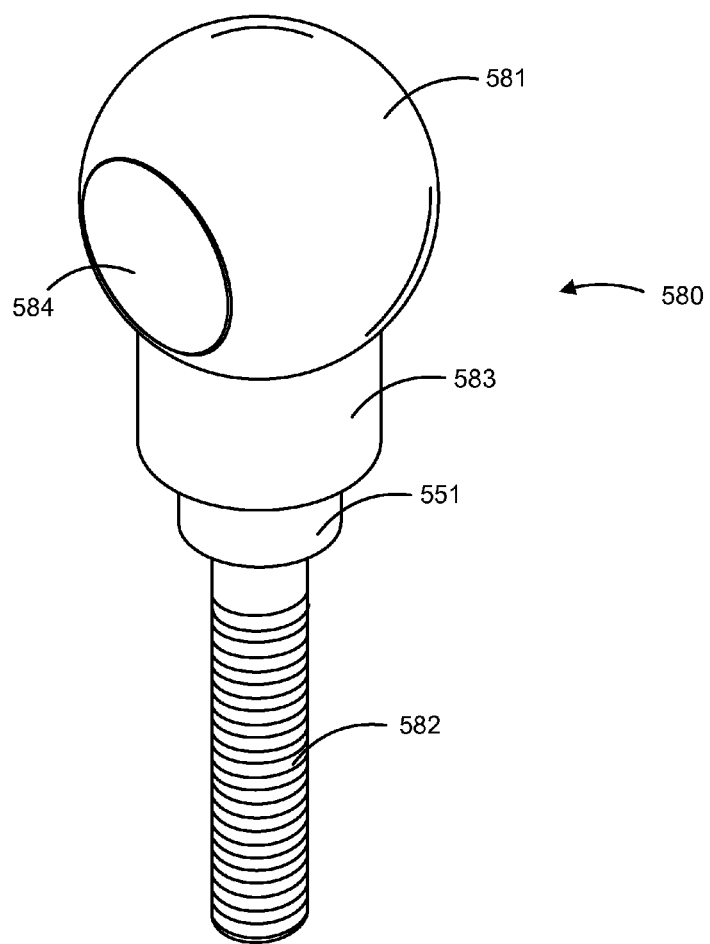
Figure 6Q:
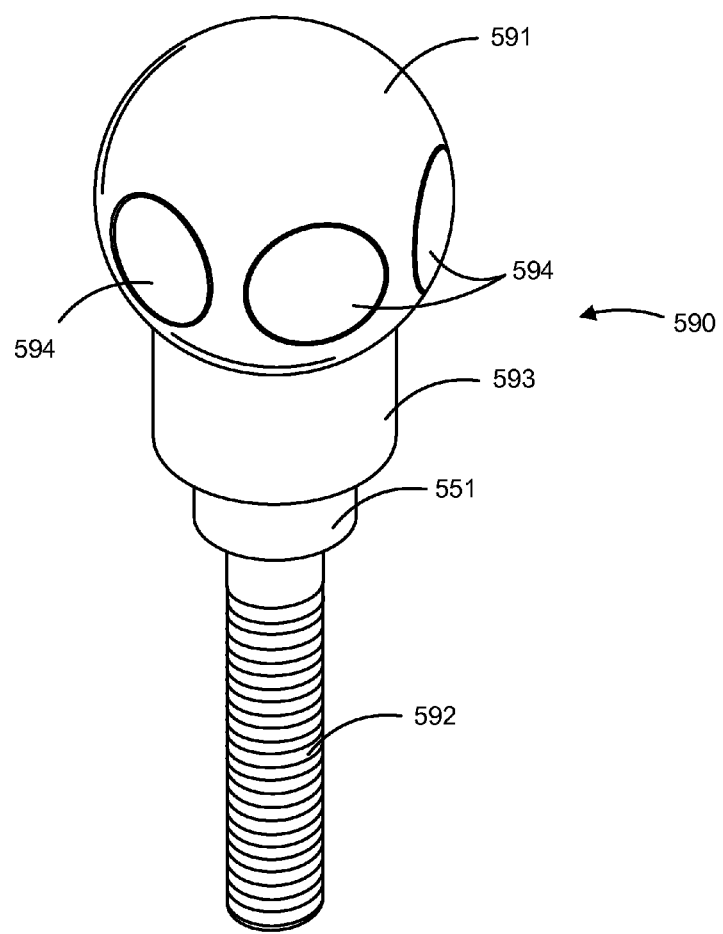
Figure 6R:
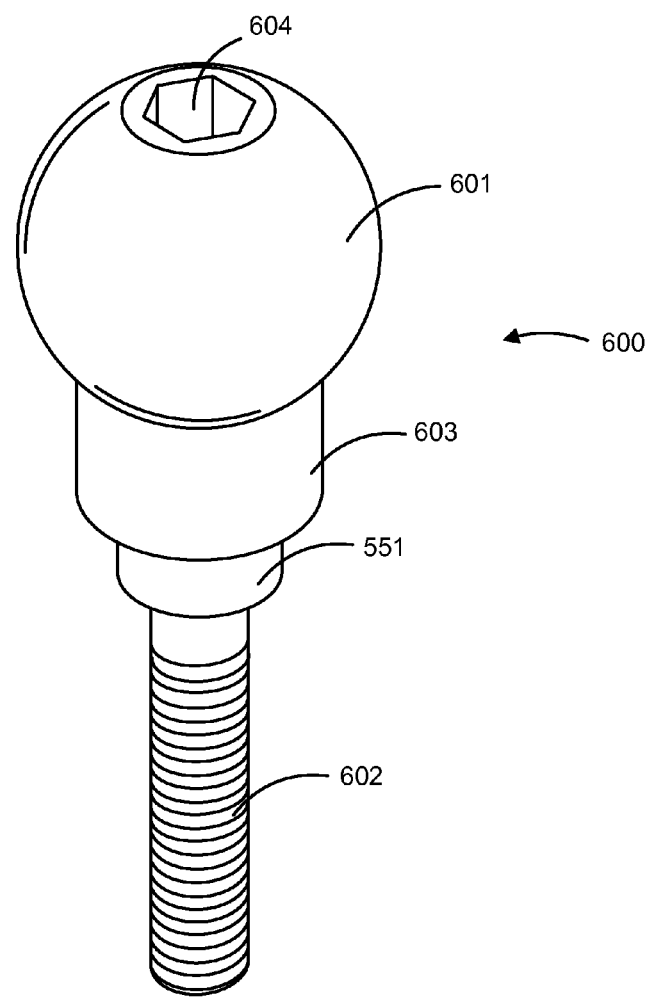
Figure 6S:
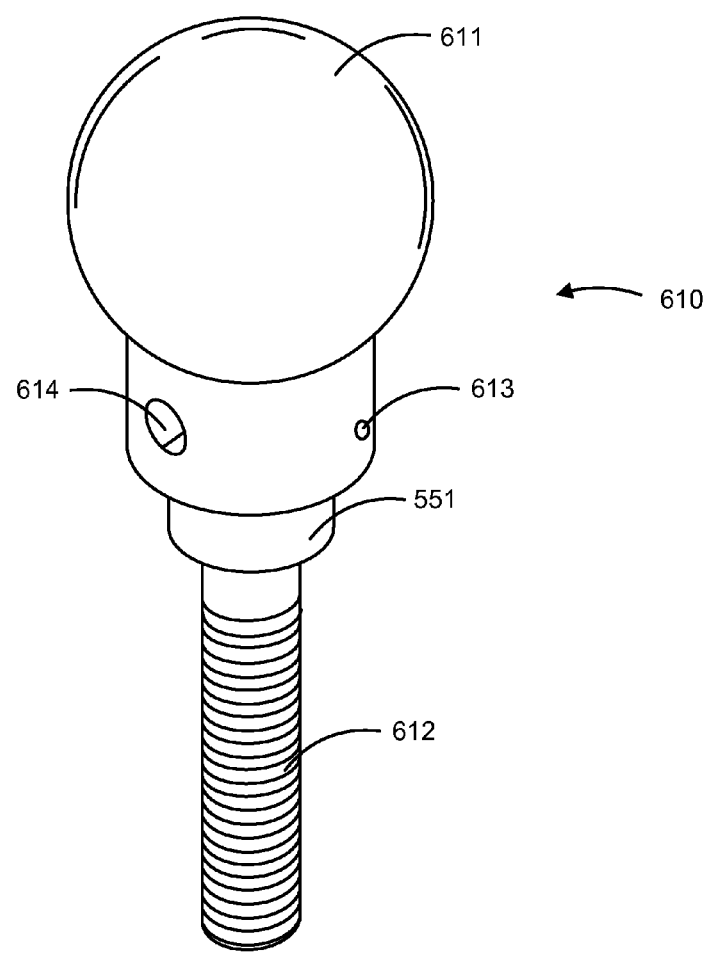
Figure 6T:
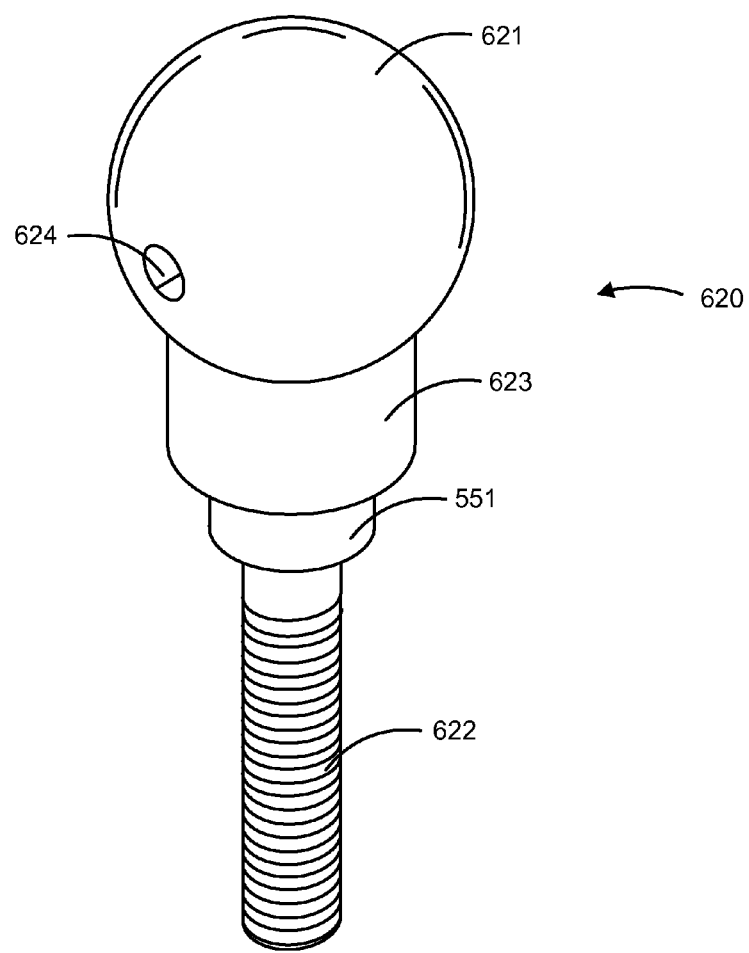

The differences between the embodiments shown in FIGS. 6N-6T (560, 570, 580, 590, 600, 610, 620, respectively) concern features useful in securing the ball-topped stem cap screw to a threadless bicycle headset. The embodiments shown in FIGS. 6N and 6O include a plurality of wrench flats (2 or 6, for example; elements 564, 574, 584, 594) on the post regions 563, 573. Alternatively, as shown in FIGS. 6P and 6Q, wrench flats (for example, 2 or 6) can be included in the ball portion 581, 591. The embodiment depicted in FIG. 6R includes a wrench socket (604 disposed on the top of the ball portion 601. In the embodiments shown in FIGS. 6S and 6T, the post region (613, FIG. 6S) or ball region 621 includes a cylindrical spanning bore 614, 624 (which may or may not extend through the entire post region so as to be accessible from either side) into which a spanner wrench, bar, or pin can be inserted for tightening the ball-topped stem cap screw 610, 620.

Figure 6U:
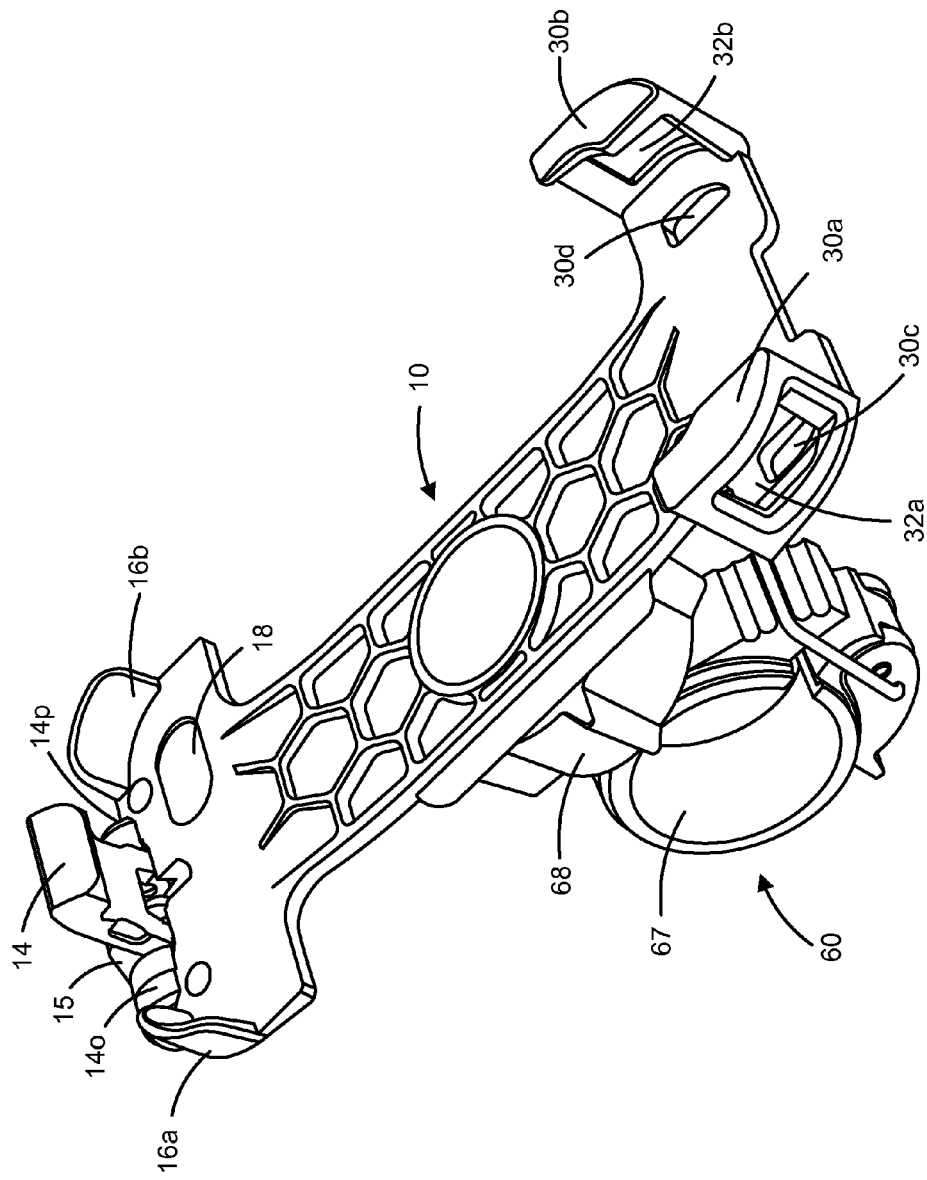
Figure 6V:
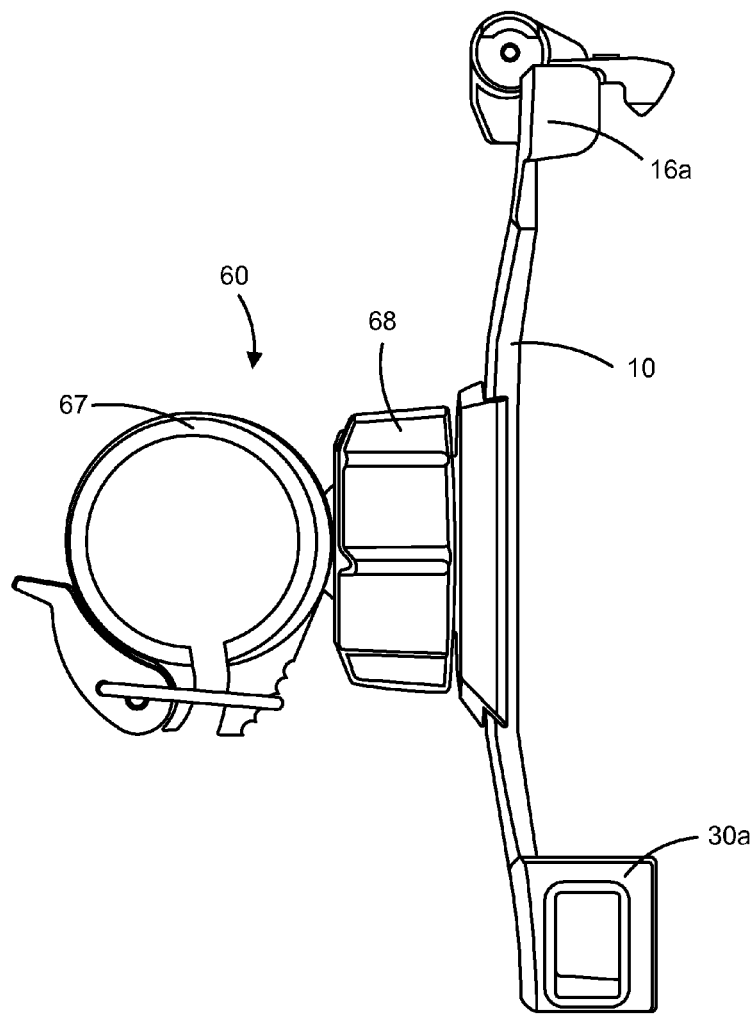
Figure 6W:
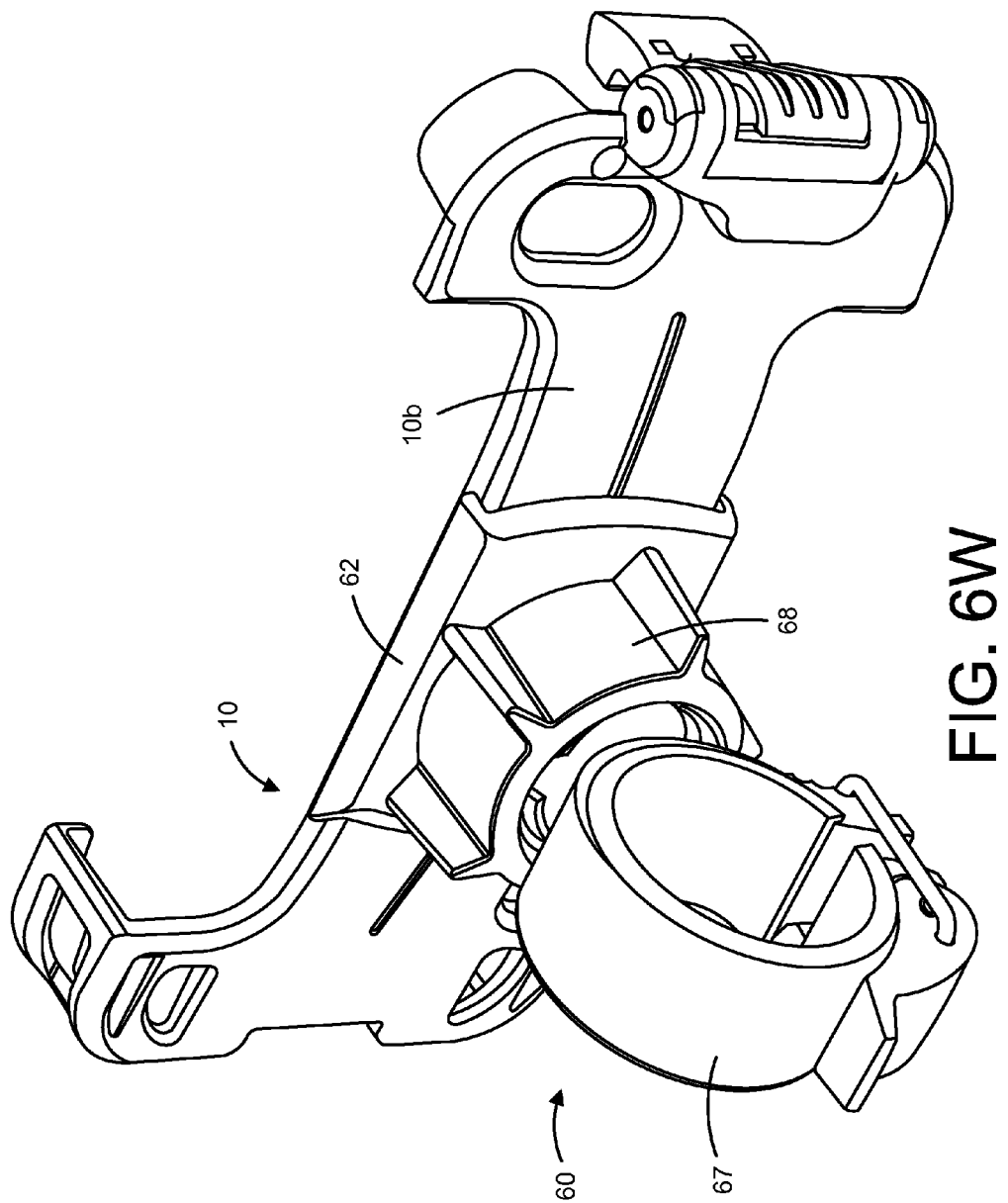

FIG. 6U shows an alternative embodiment of a sled attached to a bike mount incorporating the sleds of 1D-1I and the clasping and locking elements of FIGS. 2H-2M. In certain embodiments, the sled includes a clasping element 14 and locking element 15 held between clasp retaining elements 14o and 14p. The sled also includes hard stops 16a and 16b, supporting elements 30a and 30b, cutout portion 32b (cutout portion 32a not shown), and supporting element cutouts 30c and 30d. The bike mount 60 is attached to the sled at elongated member 10, the bike mount 60 including bar attachment member 67 and tensioning member 68. FIG. 6V provides a side view of the sled attached to a bike mount of FIG. 6U, including bike mount 60, bar attachment member 67, tensioning member 68, and elongated member 10 The curvature of the elongated member of the sled is configured to aid in the removal of a case from the sled. In addition, the curvature of the elongated member improves retention of a case coupled with the sled, as the force retaining the case in the sled is concentrated at the four corners of the sled, hard stops 16a and 16b (hard stop 16b not shown), and supporting elements 30a and 30b (supporting element 30b not shown). The curvature of the sled also improves shock resistance of the sled, as it allows the sled to flex if dropped or struck. FIG. 6W provides a perspective view of the rear side of the sled attached to a bike mount of FIG. 6U, including rear surface 10b, bike mount 60, bar attachment member 67, tensioning member 68, rotatable ball member receptacle 62, and elongated member 10. The sled is rotated horizontally relative to the bar attachment member 67. FIG. 6X provides a perspective view of the rear side of the sled attached to a bike mount of FIG. 6W, including and a case or housing 100 partially contained in the sled at supporting elements 30a and 30b (supporting element 30a not shown), and includes bike mount 60, bar attachment member 67, tensioning member 68, rotatable ball member receptacle 62, and elongated member 10.

FIG. 7 provides another embodiment of a sled 1 of the disclosure this time configured for being coupled with a band such as an arm band, a leg band, a waist band, wrist band, a head band, and the like. The sled 1 is similar to that described above in that it includes an elongated member 10 having front and back surfaces 10a and 10b, which elongated member 10 is surrounded by a proximal portion 12. The elongated member 10 further has a proximal portion 12c and a distal portion 12d, wherein the proximal portion includes a plurality of dead stops 16a and 16b, configured for supporting a device to be retained in the sled 1, and further includes a clasping mechanism 14 that is adapted for clasping onto a device to be retained within the sled 1 and thereby retaining it therein. The distal portion 12d also includes a plurality of support members configured as pockets 30a and 30b, which pockets are configured for associating with the corners of a retained device so as to support and facilitate the retention a distal portion thereof.

Figure 7A:
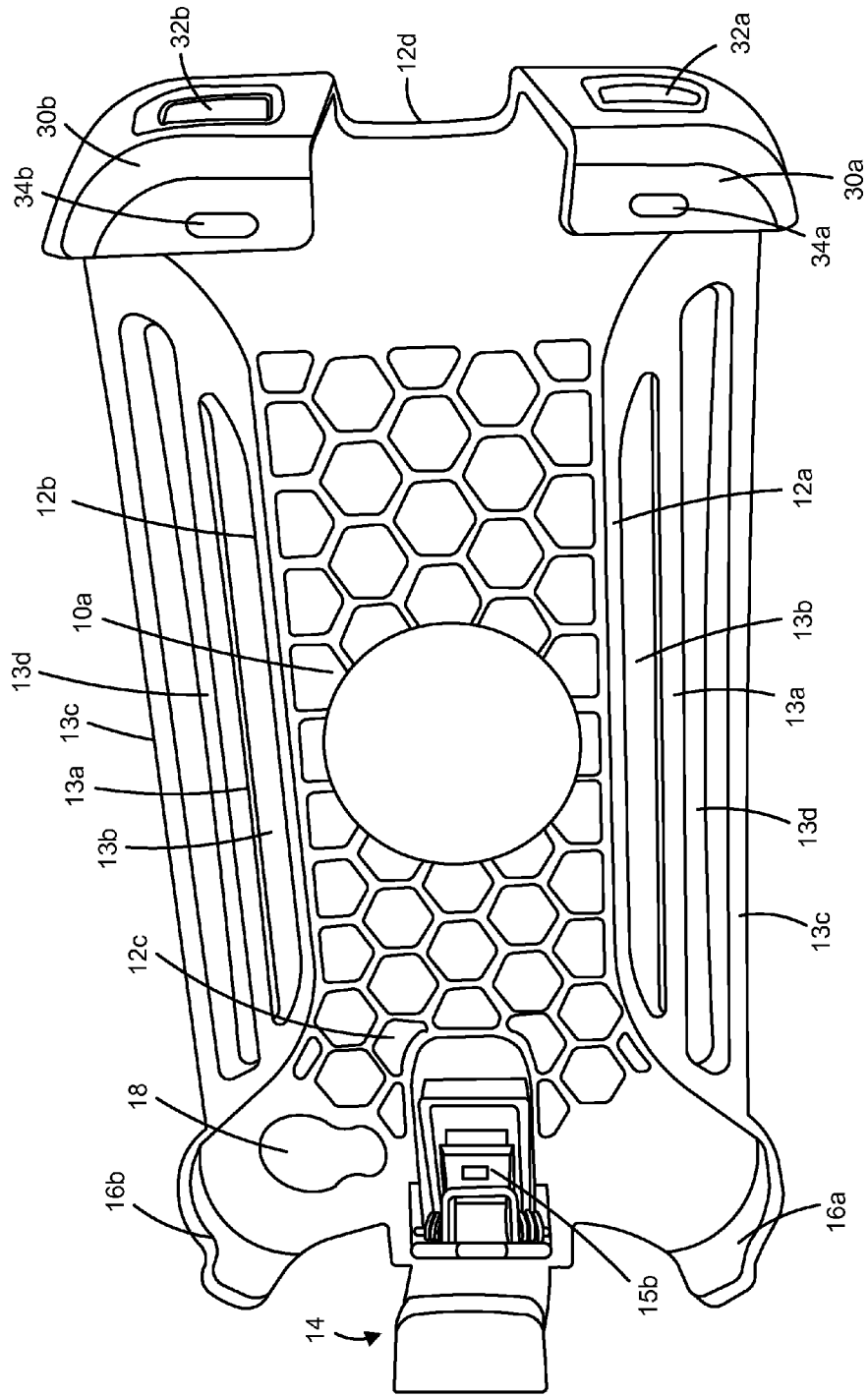
FIGS. 7A-7T are directed to implementations of an armband assembly that may be coupled to a sled of the disclosure.
Figure 7B:
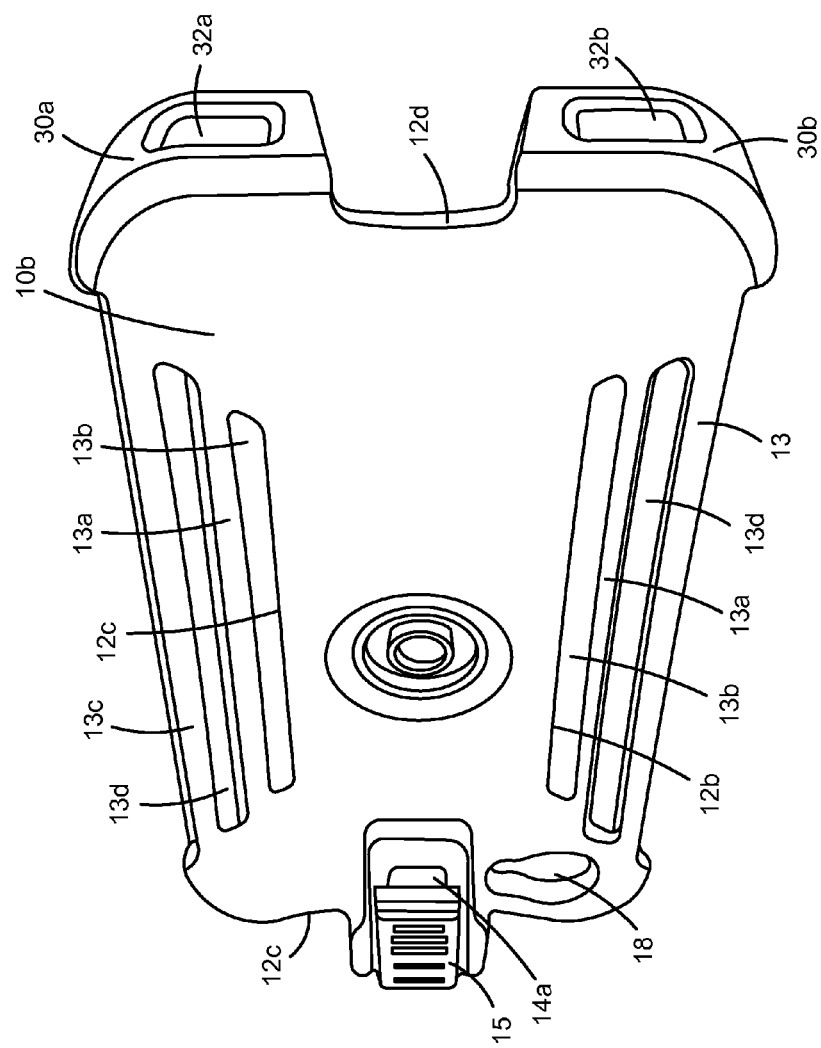

With respect to FIG. 7, however, instead of depending on an attachment element 20, which allows the sled 1 to be coupled to a clip-like attachment element, such as provided in FIGS. 5 and 6, the sled 1 of FIGS. 7A and 7B includes retaining apertures 13, which apertures are configured for being coupled with a band 215, such as an arm band, etc., that is configured for allowing the sled 1 to be removably attached to an object, such as a user's arm, leg, wrist, waist, head, or the like. FIGS. 7A and 7B provide one instance of a sled 1 of the disclosure, wherein the sled 1 is configured for being coupled with a band 215. FIG. 7A provides a front surface of the sled 1, and FIG. 7B provides a back surface of the sled 1. The sled 1, therefore, includes retaining apertures 13 on its opposing sides 12a and 12b, which apertures 13 are configured for receiving a portion of the band 215 therethrough so as to allow the sled 1 to be attached to an object. It is to be understood, however, that this configuration may be modified without departing from the spirit of the disclosure, such as by changing the number, size, shape, dimensions, and positions of the receptacles 13 and/or bands 215. In this embodiment, two sets of receptacles 13b and 13d are provided on opposite sides 12a and 12b of the sled 1. The receptacles 13b and 13d are bounded by bounding members 13a and 13c. The receptacles 13b and 13d are configured for receiving there through a portion of a band 215, such as the band provided in FIGS. 7C and 7D.

Figure 7C:
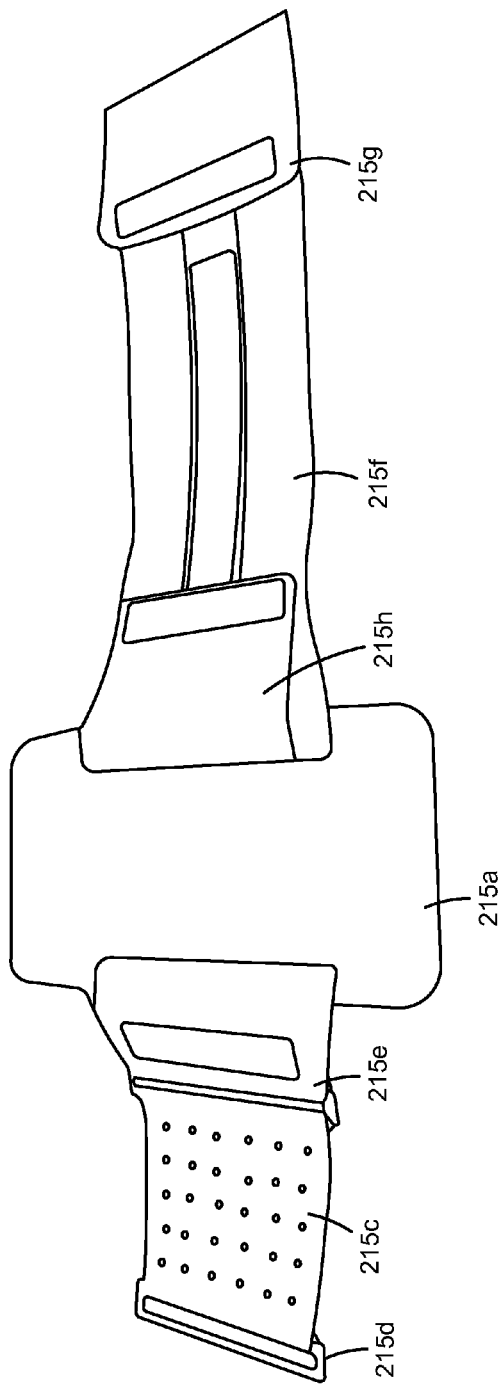
Figure 7D:
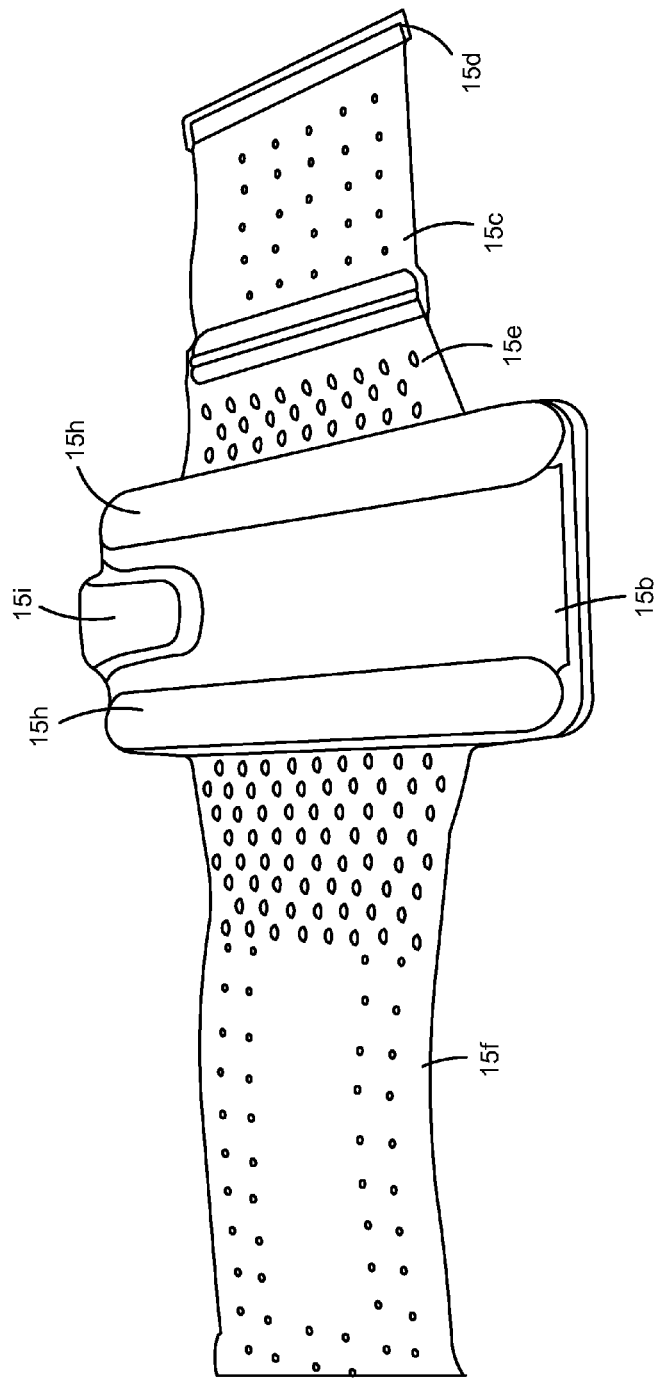

FIGS. 7C and 7D provide a front 215a and a back 215b surface of a band 215 of the disclosure. The band 215 includes central portion front and back surfaces 215a and 215b, having two side portions stretching therefrom, which side portions are configured for being inserted through corresponding side receptacles 13 of the sled 1, in such a manner that the front surface 215a aligns up with the back surface 10b of the sled 1, and the corresponding sides spread out laterally therefrom, see, for instance, FIG. 7E. The side portions may then be wrapped around an object and removably coupled to one another so as to be attached around the object.

For instance, a left hand side portion may be composed of a single or multiple materials, and in this instance, is composed of a plurality of materials. The left hand side portion therefore includes a middle portion 215c, which middle portion may be comprised of a stretchable material, an opposing band attachment portion 215d, e.g., a buckle, configured for attaching the left hand side of the band 215 with the right hand side of the band 15, and a central portion attachment portion 215e, which in this instance is also a buckle that is configured for attaching the middle portion 215c of the left hand strap with the central portion 215a.

The right hand side strap portion may be composed of a single material or a plurality of materials, and in this instance, includes a single material having three portions. For example, the right hand strap includes a middle portion 215f, which middle portion may be comprised of a stretchable material and may further have an attachment member included thereon; an opposing band attachment portion 215g, e.g., a hook and loop fastener member, configured for engaging the left hand side of the band 215, and further configured for engaging the attachment member of the middle portion 215f; and a side receptacle engagement portion 215h configured for attaching the right hand side portion to the sled 1 of FIGS. 7A and 7B.

For instance, the right hand strap may include a middle portion 215f having the loop portion of a hook and loop attachment element. The opposing band attachment portion 215g may include the hook portion of a hook and loop fastener element, and may be configured for being fed through the buckle 215d of the left hand side portion and then folded back upon itself so as to fasten with the loop fastening element of the middle portion 215f and in a manner such as this, the band 215 may be wrapped around an object, thereby effectuating the coupling of the sled 1 with the object. Additionally, the side receptacle engagement portion 215h may have the hook portion of a hook and loop attachment element, and may be configured for being fed through the retaining apertures 13b and 13d of the right hand side 12b of the sled 1 and then folded back upon itself so as to fasten with the loop fastening element of the middle portion 215f, and in a manner such as this, the band 215 may be coupled to sled 1. It is to be understood that the various elements of the described configurations of the left and right hand strap portions of the band 215 may be mixed and matched or modified to enhance the various attachment features of the band, without departing from the spirit of the disclosure.

FIG. 7C provides a front surface 215a of the band 215. FIG. 7D provides a back surface 215b of the band 215 of FIG. 7C. As can be seen, the back surface 215b of the band 215 includes a raised locking mechanism receiving receptacle 215i and a plurality of raised cushion members 215r positioned at the side perimeter portions of the back surface 215b. Also depicted are raised grip features positioned on the two opposing central member attachment portions 215e and 215h, which raised features function to secure the attachment of the band 215 to the sled 1 by making it more difficult for side members to slip out of engagement with the receiving receptacles 13 once threaded there through. Also depicted are various apertures positioned on the various band portions which serve the function of both increasing elasticity of the band and air vents.

Figure 7E:
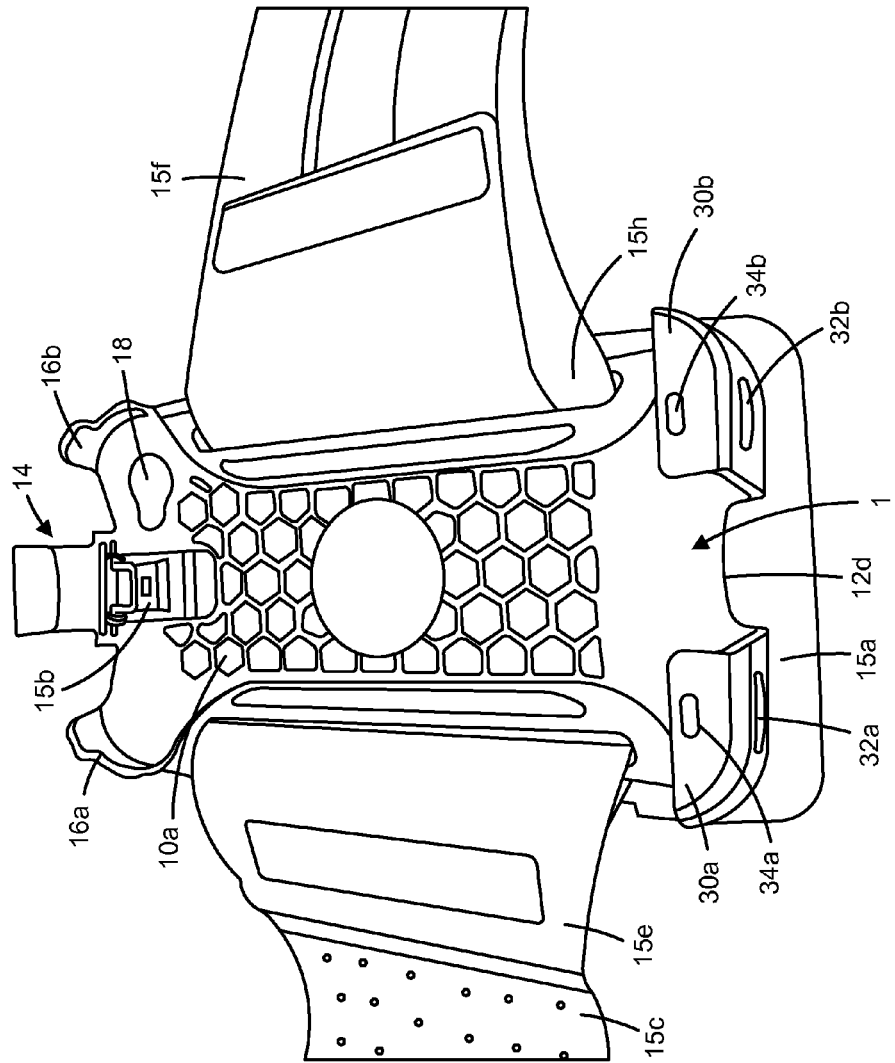

FIG. 7E provides a front view of another embodiment of a strap system for the sled 1. According to this system the opposing band attachment portion 215d, e.g. a buckle, is attached to the middle of the left hand portion of the strap 215c via a post and aperture system 215j. Also, in some embodiments, instead of having a central portion attachment portion 215e as shown in FIG. 7C, the middle portion 15c attached directly to the central portion of the strap 215. Likewise, in certain embodiments, the side receptacle attachment portion on the right side of the strap 215h is found on the front side 215a. FIG. 7F shows a back view 215b of the strap.

Figure 7G:
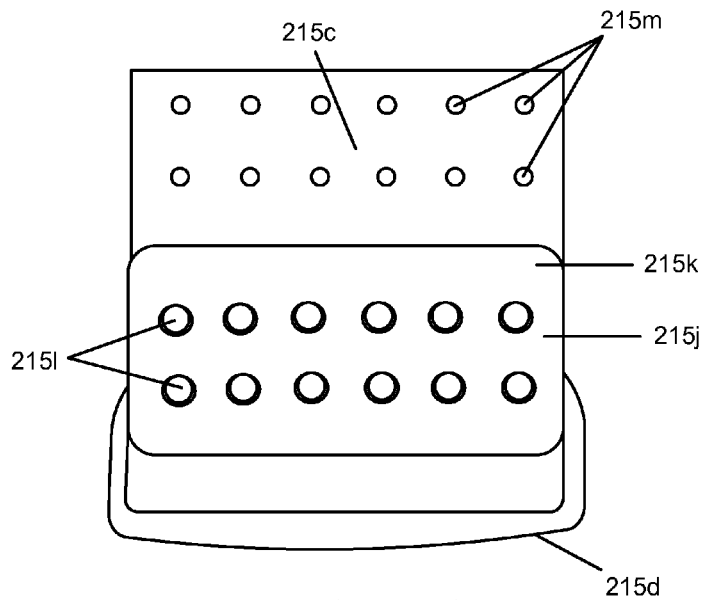

FIG. 7G shows a front view of the post and aperture system 215j connecting the opposing band attachment portion 215d, e.g. a buckle, to the middle portion of the left hand portion of the strap 215c. The end of the middle portion of the left hand strap 215c is sandwiched between a connector 215k and the opposing band attachment portion 215d. The posts 215l are shown extending from the opposing band attachment portion 215d through the middle of the left hand portion of the strap 215c and through the connector 215k.

Figure 7H:
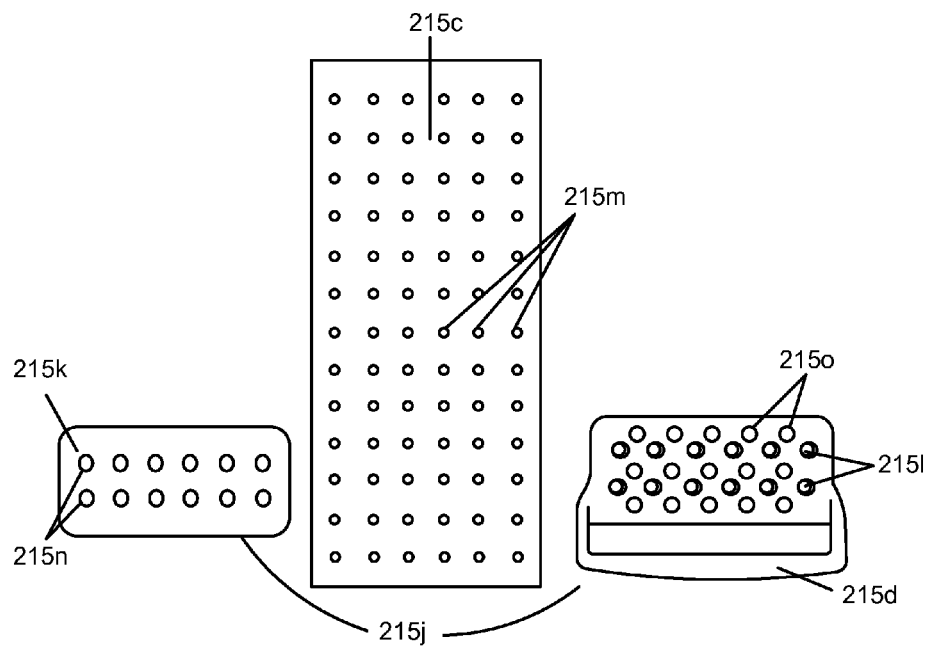

FIG. 7H shows a front view of the disassembled post and aperture system 215j. The middle portion of the left hand portion of the strap 215c has apertures 215m through it throughout its length. These apertures can be any size or shape or in any configuration as long as they allow the opposing band attachment portion 215d to be locked into the connector 215k using the posts 215l found on the opposing band attachment portion 215d. These apertures also serve the function of both increasing elasticity of the band and air vents. Of course, the connector 215k could also have posts that lock into apertures 215o found in the opposing band attachment portion 215d. In the embodiment shown in FIG. 7H, the connector 215k contains apertures 215n that allow the posts 215l on the opposing band attachment portion 215d to pass through the middle portion of the left hand portion of the strap 215c and the connector 215k. This locks the opposing band attachment portion 215d.

It should be noted that the post and aperture system 215j allows the opposing band attachment portion 215d to be attached to any set of apertures 215m found in the middle portion of the left hand portion of the strap 215c. The end of the middle portion of the left hand portion of the strap 215c can either be folded back or cut to shorten the strap and allow the opposing band attachment portion 215d to be attached to the shortened end of the strap. This allows for the length of the strap 215 to be adjusted depending on the appendage or object the strap is intended to fit around.

Figure 7I:
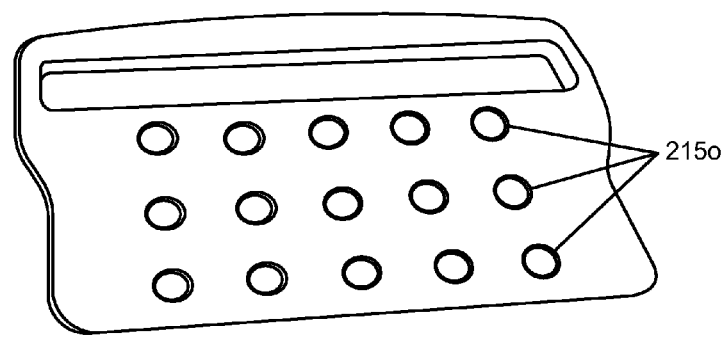
Figure 7J:
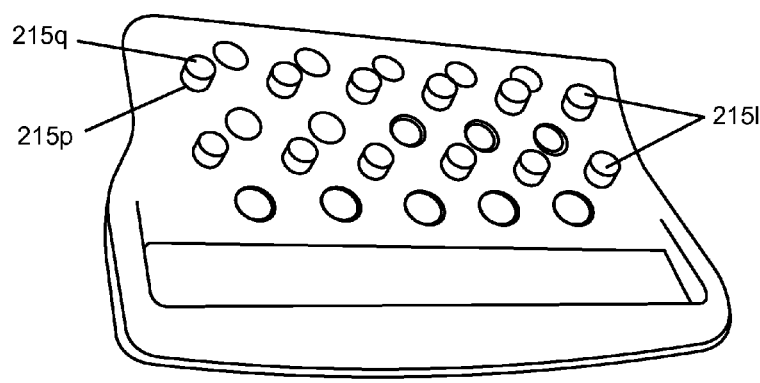

FIG. 7I provides a back view of the opposing band attachment portion 215d. This back view shows the apertures 215o found in the attachment portion 215d. These apertures are optional, and could be solid if desired. FIG. 7J provides a front view of the opposing band attachment portion 215d. In this view, the posts 215l of the attachment portion 215d are shown. The posts 215l are shaped so that they have a broader tip 215q than base 215p. In certain embodiments, the broader tip 215q is about the same or slightly larger than the apertures in the strap 215m and/or the apertures 215n in the connector 215k. This allows for the posts 215l to lock into the apertures and hold the attachment portion 215d to the strap 215c and the connector 215k.

Figure 7K:
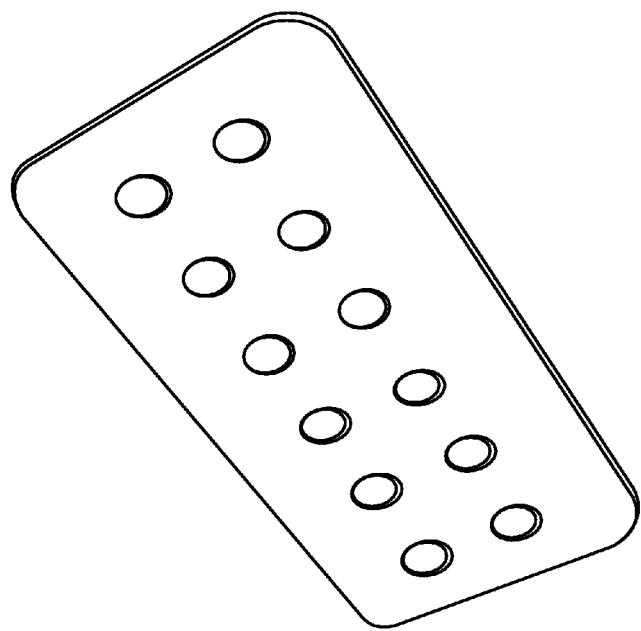

FIG. 7K is a view of the connector 215k. In certain embodiments, the connector is symmetrical and could be applied to the middle portion of the left hand portion of the strap 15c to lock the opposing band attachment portion 215d on either surface.

Figure 7L:
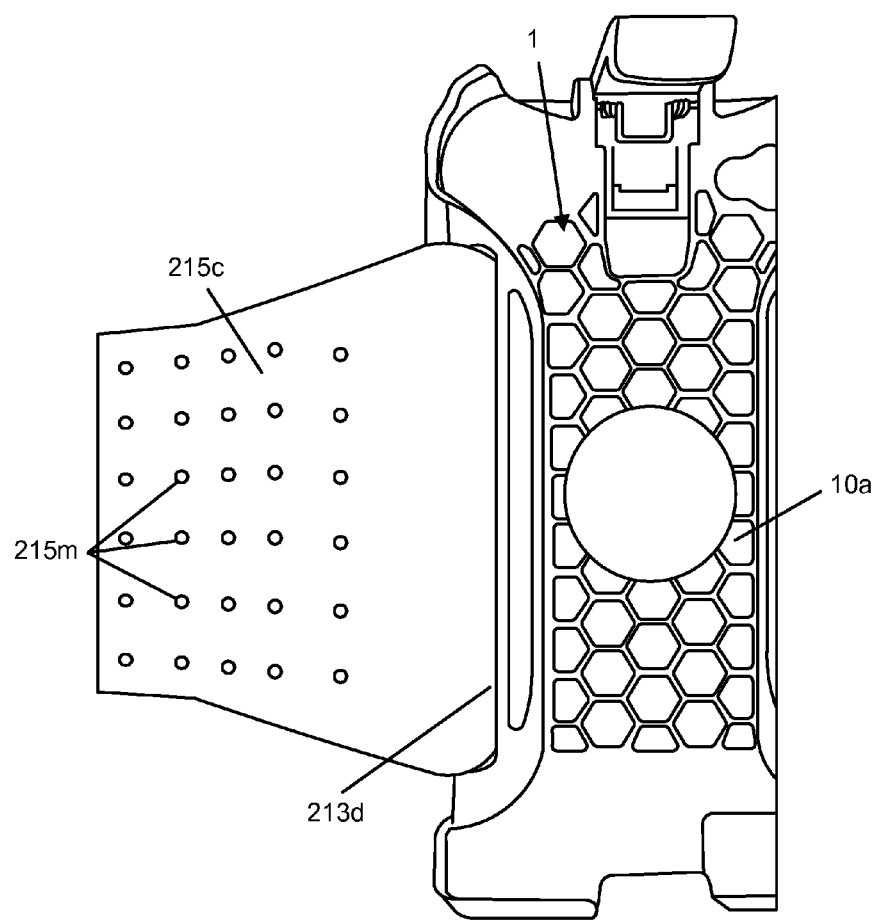
Figure 7M:
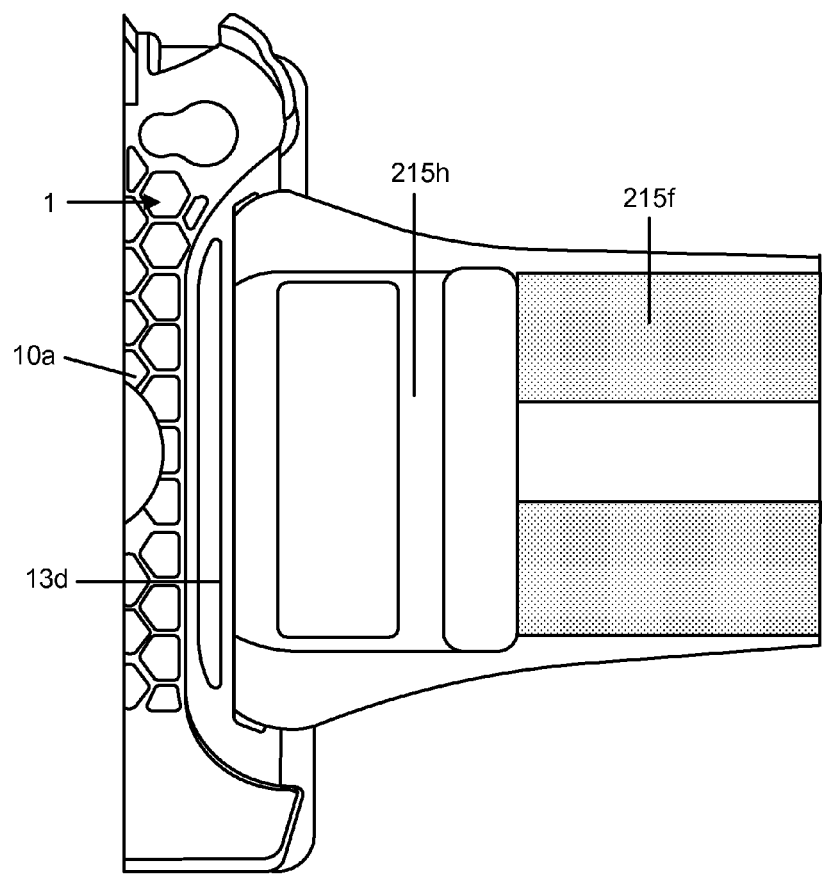

FIG. 7L is a view of where the middle portion of the left hand portion of the strap 15c joins the central part of the strap 215 and the sled 1. The middle portion of the left hand portion of the strap 215c enters the retaining aperture 13d of the sled 1. Similarly, FIG. 7M is a view of where the middle portion of the right hand portion of the strap 215f joins the central part of the strap 215 and the sled 1. The middle portion of the right hand portion of the strap 215f enters the retaining aperture 13d of the sled 1. The receptacle engagement portion 215h is found on the front face of the strap in this embodiment.

Figure 7N:
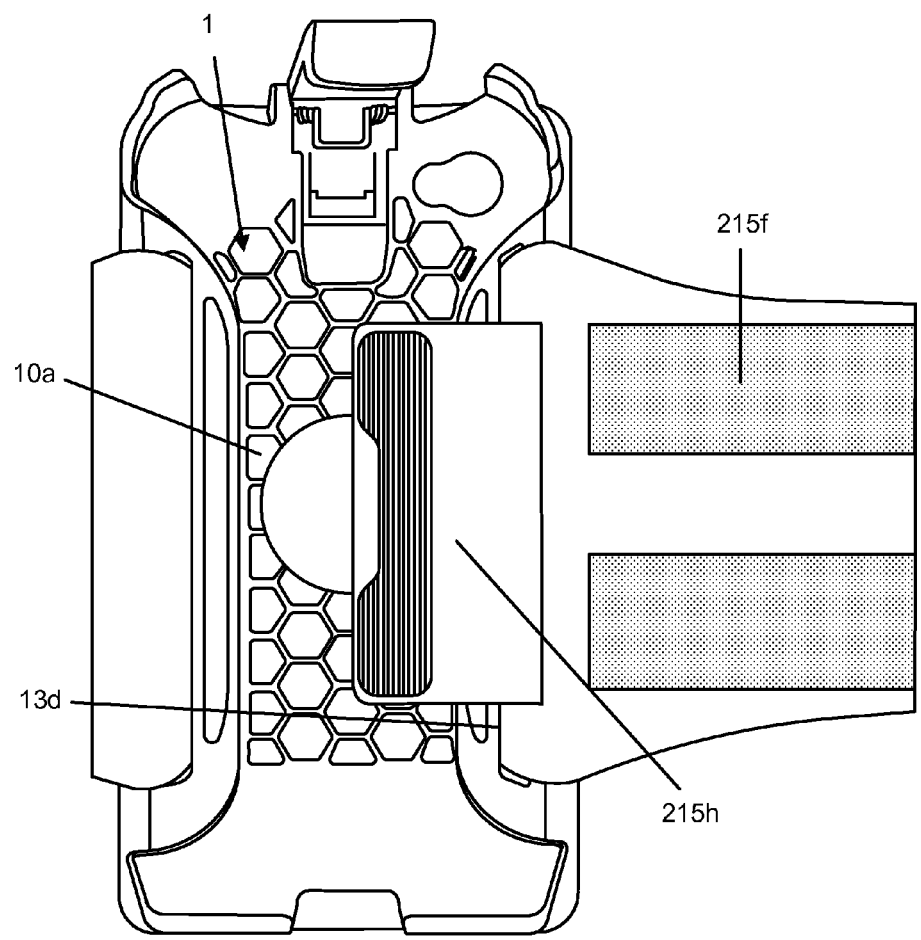

FIG. 7N is a view of the same perspective as FIG. 7M, with the receptacle engagement portion 215h lifted up to show the underside. As shown, the underside of the receptacle engagement portion 215h has a hook and loop connector system that engages the corresponding part of the system on the front face of the middle portion of the right hand portion of the strap 215f. Also, the receptacle engagement portion 215h is directly attached to the middle portion of the right hand portion of the strap 215f before the strap enters the retaining aperture 13d of the sled 1.

Figure 7O:
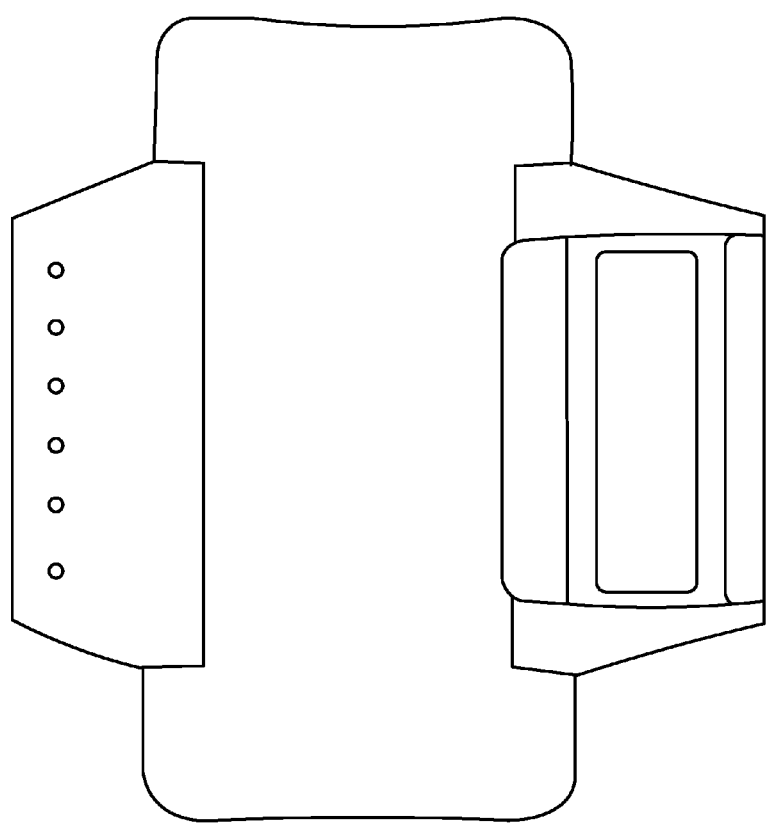

FIG. 7O shows a view of the left 215c and right 215f portions of the strap and where they join the front surface of the strap 215a. As shown, the left 215c and right 215f portions of the strap are fixedly attached to the front surface 215a of the strap. Thus, there is no need for a functional central portion attachment portion 215e or receptacle engagement portion 215h as shown in FIG. 7E. The strap in this embodiment is all one piece.

Figure 7P:
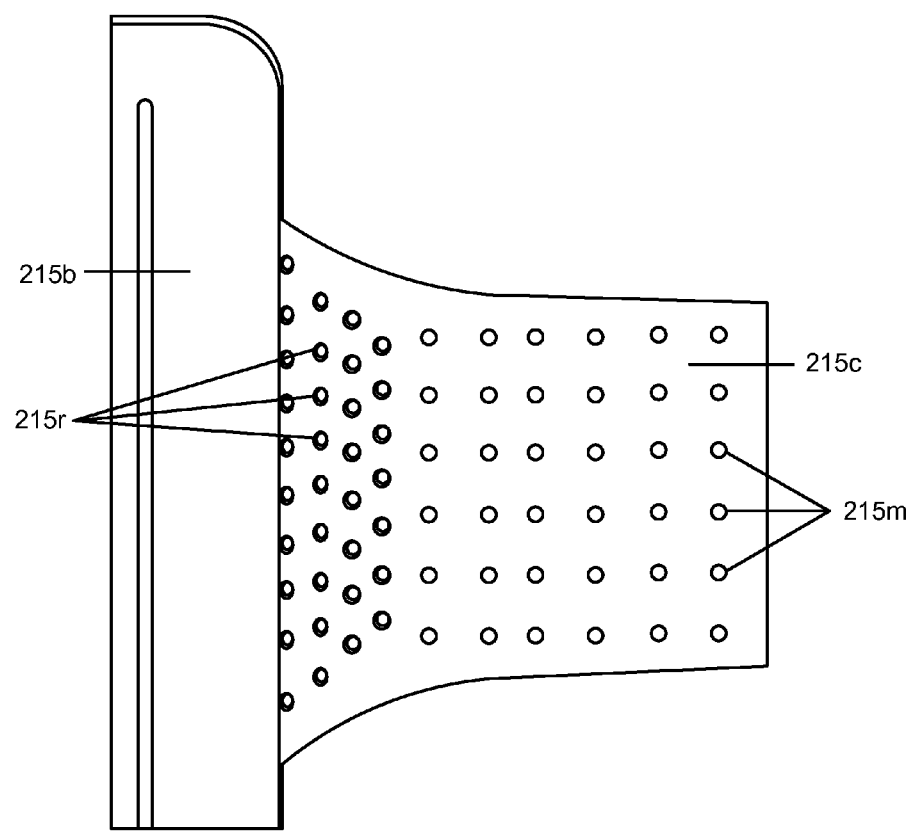
Figure 7Q:
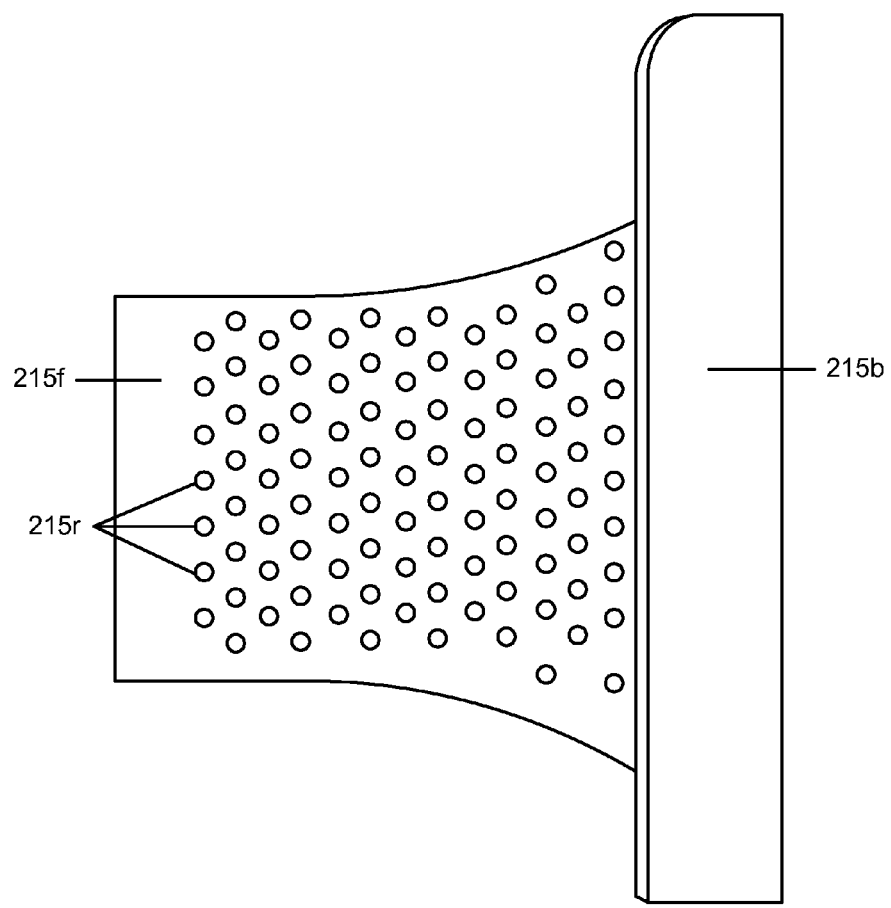

FIG. 7P shows a back view of the left side 215c of the strap 215. The middle portion of the left hand portion of the strap 215c contains a plurality of raised cushion members 215r positioned at the side perimeter portions of the back surface of the strap. Likewise, FIG. 7Q shows a back view of the right side 215f of the strap 215. The middle portion of the right hand portion of the strap 215f contains a plurality of raised cushion members 215r positioned at the side perimeter portions of the back surface of the strap.

Figure 7R:
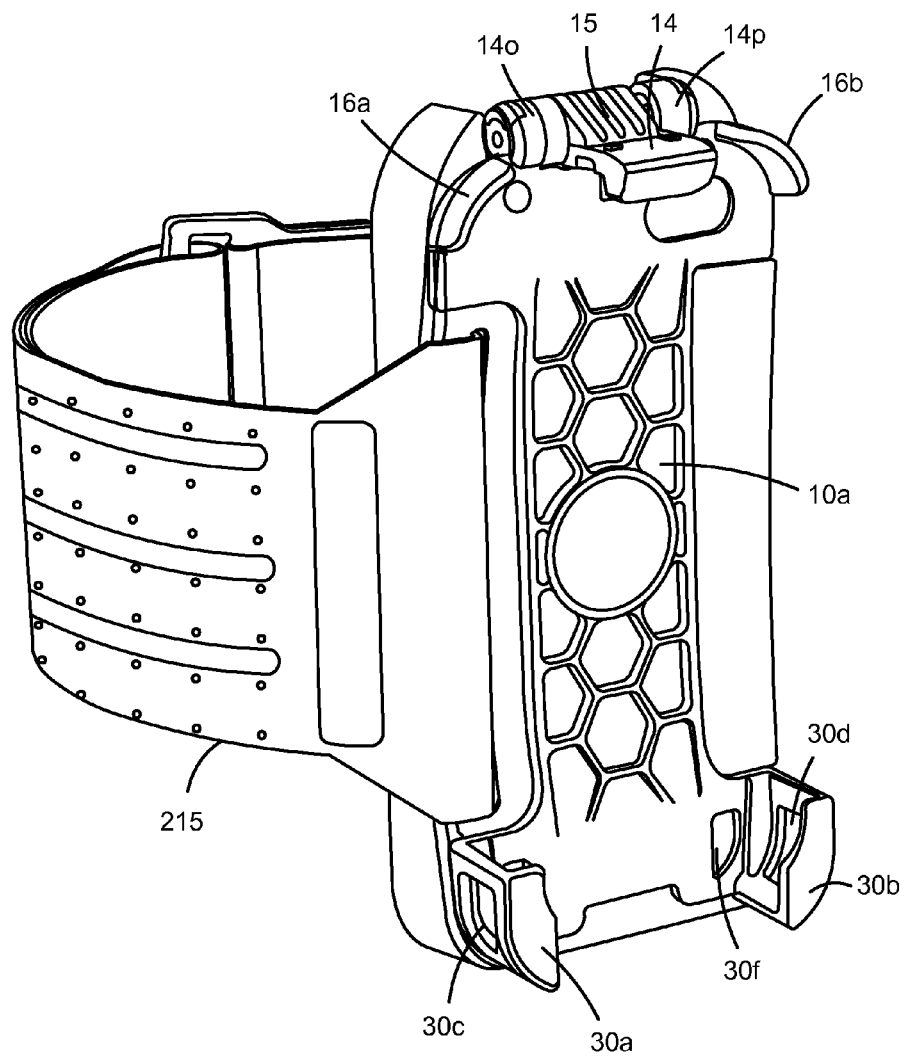
Figure 7S:
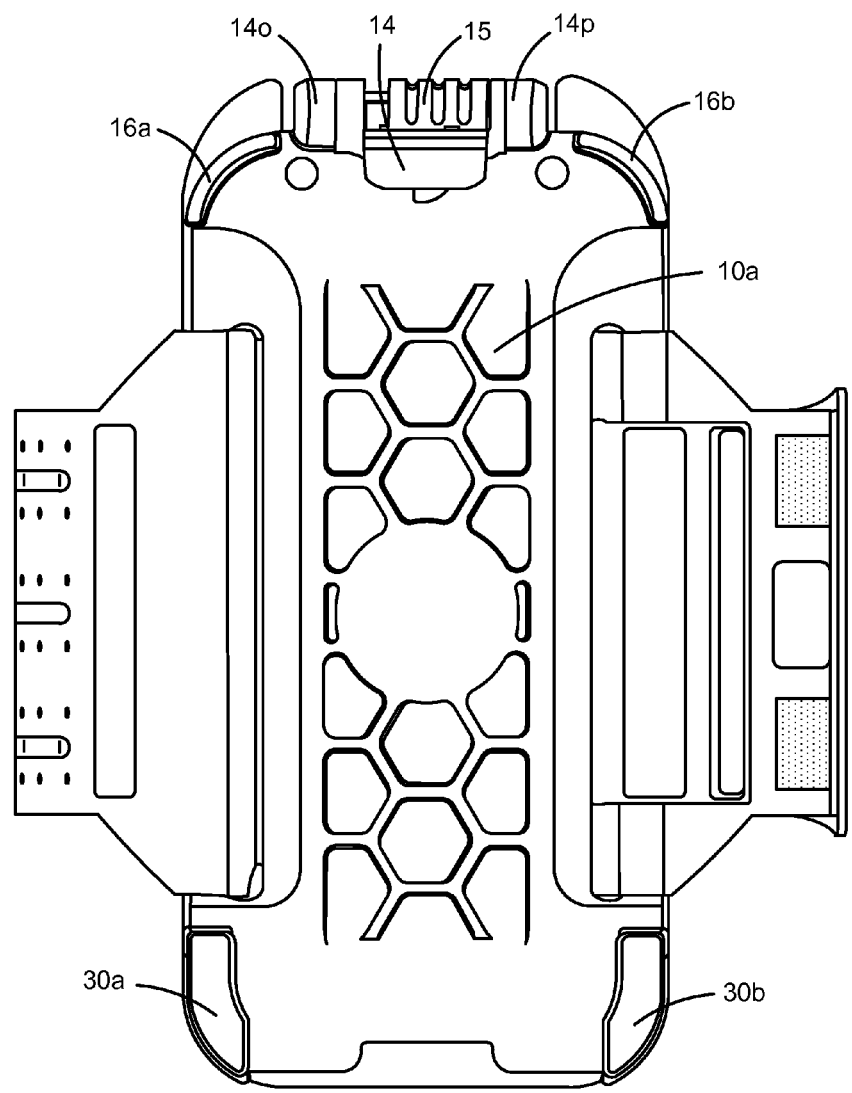
Figure 7T:
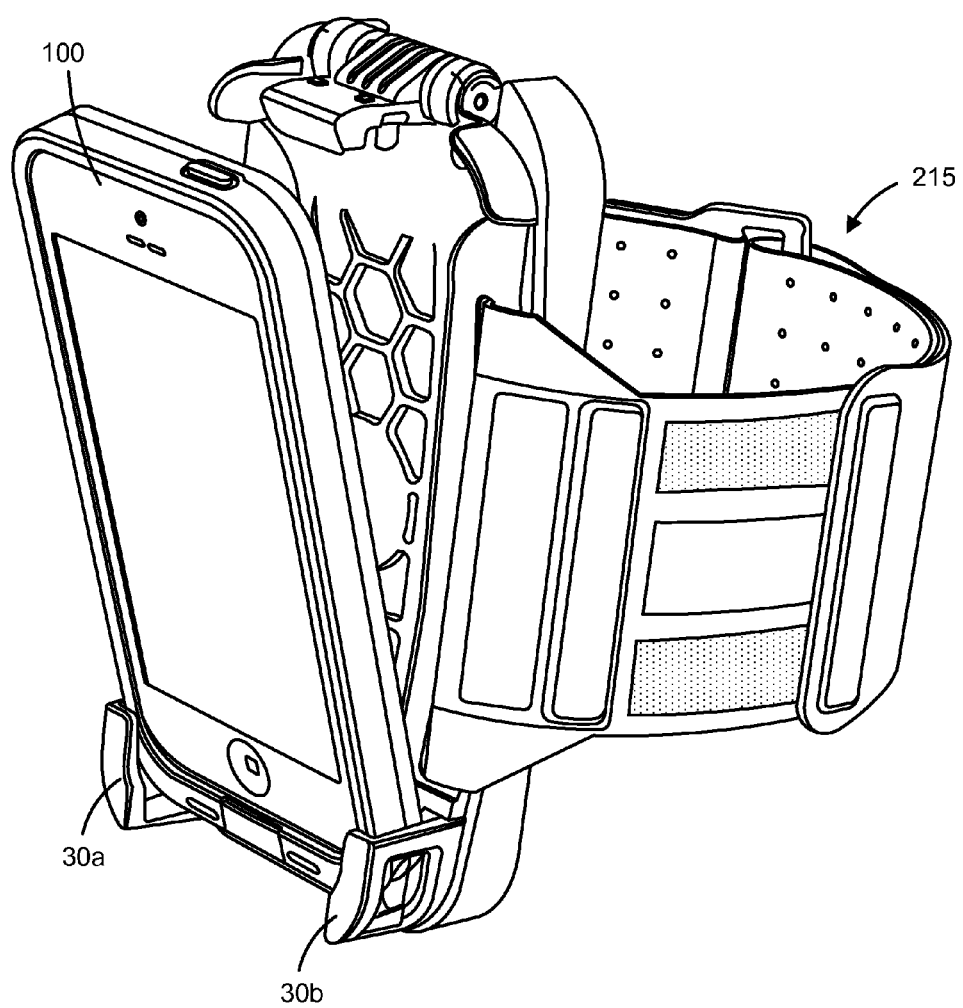

FIG. 7R shows an alternative embodiment of a sled that includes retaining apertures coupled with a band, wherein the locking mechanism is that described supra and shown in FIGS. 2H-2M. In the illustrated embodiment, the sled 1 is connected with a band 215, the sled including a clasping element 14 and locking element 15 held between clasp retaining elements 14o and 14p. The sled also includes hard stops 16a and 16b, supporting elements 30a and 30b, supporting element cutouts 30c and 30d. The sled also includes raised support elements 30e and 30f (30f not shown). A portion of the front surface 10a of the sled is curved such that when a case containing a mobile device is inserted into the sled, a portion of the front surface 10a does not touch the entire back surface of the case. The curvature of the front surface of the sled is configured to aid in the removal of a case from the sled. In addition, the curvature of the sled improves retention of a case coupled with the sled, as the force retaining the case in the sled is concentrated at the four corners of the sled (hard stops 16a and 16b, and supporting elements 30a and 30b). The curvature of the sled also improves shock resistance of the sled, as it allows the sled to flex if dropped or struck. The strap 215 associated with the sled and locking mechanism as shown in FIG. 7R can encompass any of the embodiments described above. FIG. 7S provides a front view of the sled of FIG. 7R, including front surface 10a, hard stops 16a and 16b, supporting elements 30a and 30b, clasping element 14, clasp retaining elements 14o and 14p, and locking element 15. FIG. 7T provides a perspective view of the sled of FIG. 7R and a case or housing 100 partially contained in the sled at supporting elements 30a and 30b, and includes strap 215.

Figure 18A:
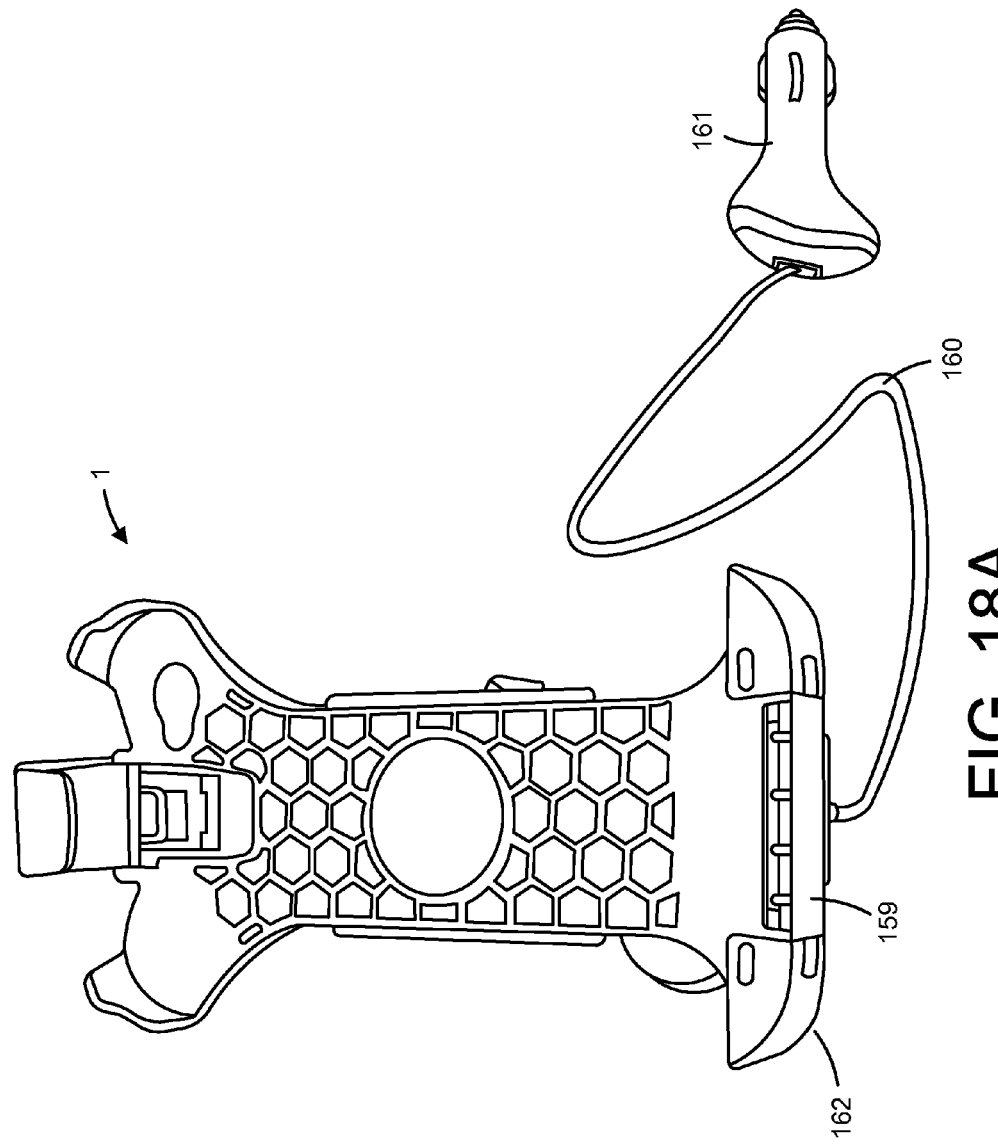
FIGS. 18A-18D are directed to other implementations of an electrical device charging system for charging the electrical device as it is enclosed.

In some embodiments, part of the back surface of the sled contains a sensor, such as a galvanic sensor, that is in communication with posts that correspond with the connectors in the case (see, for example, supra and FIG. 18A). When the case containing the device is installed in the sled, software in the device can be used to detect signals received from the sensor. When used in conjunction with the sled, the case, and the mobile device, the sensor can be used to detect the blood pressure, pulse rate, temperature, carbon dioxide levels, or hemoglobin saturation of the user. In some embodiments, the sensor may be in communication with the sled, either with wires or wirelessly, but is not attached to the sled; for example, the sensor may be attached to another armband or chestband. A microcontroller may be attached to the band, or to the sled, to allow processing of data sent to and/or from the sensor.

FIG. 8 provides various perspective views of a float for use to house an electronic device and/or a housing or case for the same. The float disclosed herein may also be used to house an electronic device attached to sleds disclosed herein. Accordingly, the float is of a size and dimension so as to receive an electronic device or a housing for said device, and is further configured for protecting the device from shocks, such as from falls, and for protecting the device from sinking when subjected to a body of water. Consequently, the float is composed of a material that is capable of floating when subjected to a body of water. Hence, the float may be of any suitable size and dimension, such as a size to fit over a mobile phone, such as an Apple iPhone®, or a case therefore, or it may be sized to fit a tablet PC, such as an Apple iPad®, or a case therefore. For instance, in certain embodiments, the float may be configured for receiving therein a housing, which housing houses a mobile electronic device, such as a mobile telephone, and in such an instance, the float may have a width that ranges from about 40 mm to about 250 mm, such as from about 100 mm to about 200 mm, for instance, from about 150 mm to about 200 mm, including about 88 mm in width, and may have a length that ranges from about 50 mm to about 300 mm, such as from about 100 mm to about 250 mm, including from about 150 mm to about 200 mm, such as about 175 mm in length, and may have a thickness that ranges from about 5 mm to about 100 mm, such as from about 10 mm to about 50 mm, including from about 20 mm to about 40 mm, such as about 30 mm thick. In other instances, the float may be configured for receiving therein a housing, which housing houses a tablet computing device, such as a tablet PC or an electronic reader, and in such an instance, the float may have an exterior width that ranges from about 50 mm to about 500 mm, such as from about 100 mm to about 450 mm, including from about 150 mm to about 400 mm, such as from about 200 mm to about 350 mm, including from about 250 mm to about 300 mm, including about 242 mm in width, and may have an exterior length that ranges from about 50 mm to about 600 mm, such as from about 100 mm to about 550 mm, including from about 150 mm to about 500 mm, such as from about 200 mm to about 450 mm, including from about 250 mm to about 400 mm, for instance, from about 300 mm to about 350 mm in length, and may have an exterior thickness that ranges from about 5 mm to about 50 mm, such as from about 10 mm to about 45 mm, including from about 15 mm to about 40 mm, such as from about 20 mm to about 35 mm, including from about 25 mm to about 30 mm, including about 38 mm in thickness. It is understood that the float's interior dimensions will vary with the dimensions of the electronic device or housing therefore that is configured for being received within the float, and hence, both the exterior and interior dimensions will vary accordingly. The preceding description is not meant to be unduly limiting.

For instance, the interior dimensions of a float of the disclosure, such as for receiving a mobile telephone housing therein, may vary, and in certain instances may have an interior width that ranges from about 30 mm to about 225 mm, such as from about 40 mm to about 150 mm, for instance, from about 50 mm to about 100 mm, including about 66 mm in width, and may have an interior length that ranges from about 40 mm to about 250 mm, such as from about 60 mm to about 200 mm, including from about 75 mm to about 200 mm, such as from about 100 mm to about 150 mm, including about 131 mm in length, and may have an interior thickness that ranges from about 5 mm to about 75 mm, such as from about 10 mm to about 50 mm, including from about 15 mm to about 30 mm, such as about 20 mm thick. Additionally the interior dimensions of a float of the disclosure, such as for receiving a tablet computer housing therein, may vary, and in certain instances may have an interior width that ranges from about 25 mm to about 450 mm, such as from about 75 mm to about 400 mm, including from about 100 mm to about 350 mm, such as from about 150 mm to about 300 mm, including from about 200 mm to about 250 mm, including about 210 mm in width, and may have an interior length that ranges from about 30 mm to about 550 mm, such as from about 50 mm to about 500 mm, including from about 100 mm to about 450 mm, such as from about 150 mm to about 400 mm, including from about 200 mm to about 350 mm, for instance, from about 250 mm to about 300 mm, including about 266 mm in length, and may have an interior thickness that ranges from about 5 mm to about 45 mm, such as from about 10 mm to about 40 mm, including from about 15 mm to about 35 mm, such as from about 20 mm to about 30 mm, including from about 22 mm to about 25 mm in thickness. In certain embodiments, the thickness of a wall of the float may be from about 5 mm to about 50 mm, such as from about 10 mm to about 40 mm, including from about 15 mm to about 35 mm, for instance, from about 20 mm to about 30 mm, including about 25 mm for a proximal, distal, side walls, and/or a bottom wall.

Figure 8A:
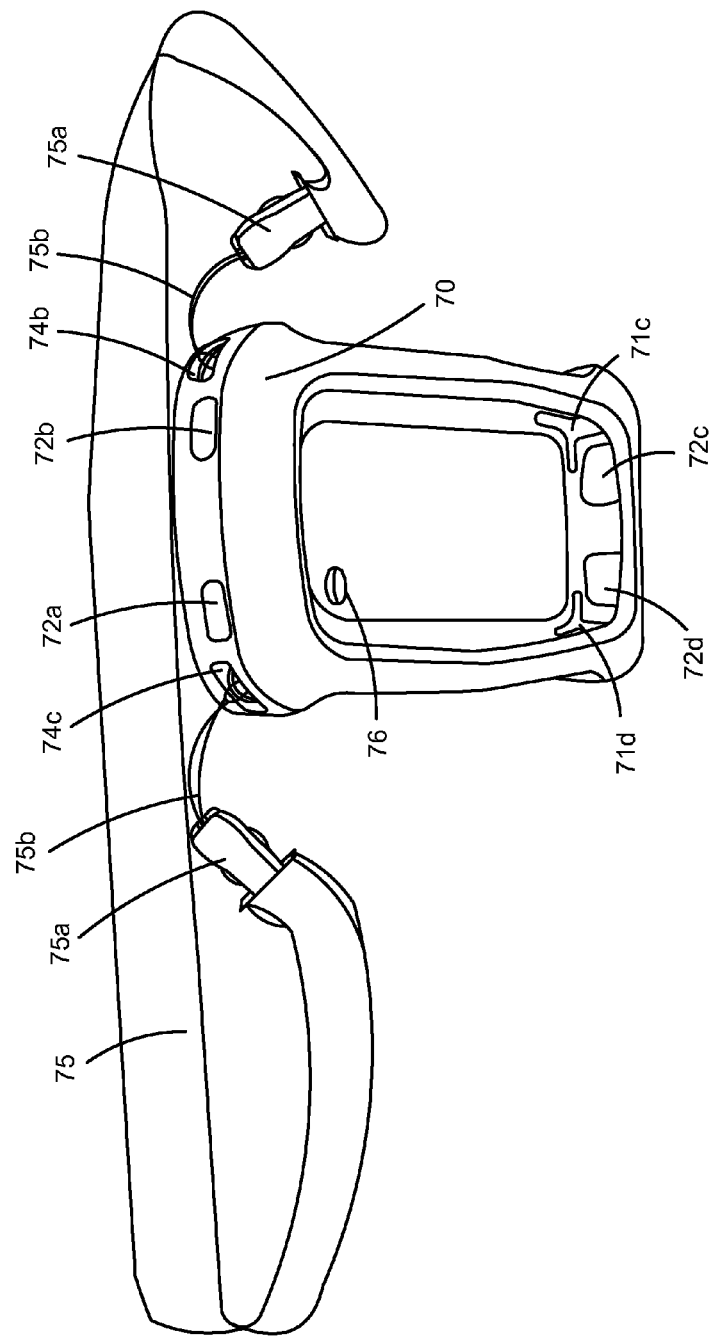
FIGS. 8A-8E are directed to implementations of a float adapter that may be coupled to sleds and cases of the disclosure.
Figure 8B:
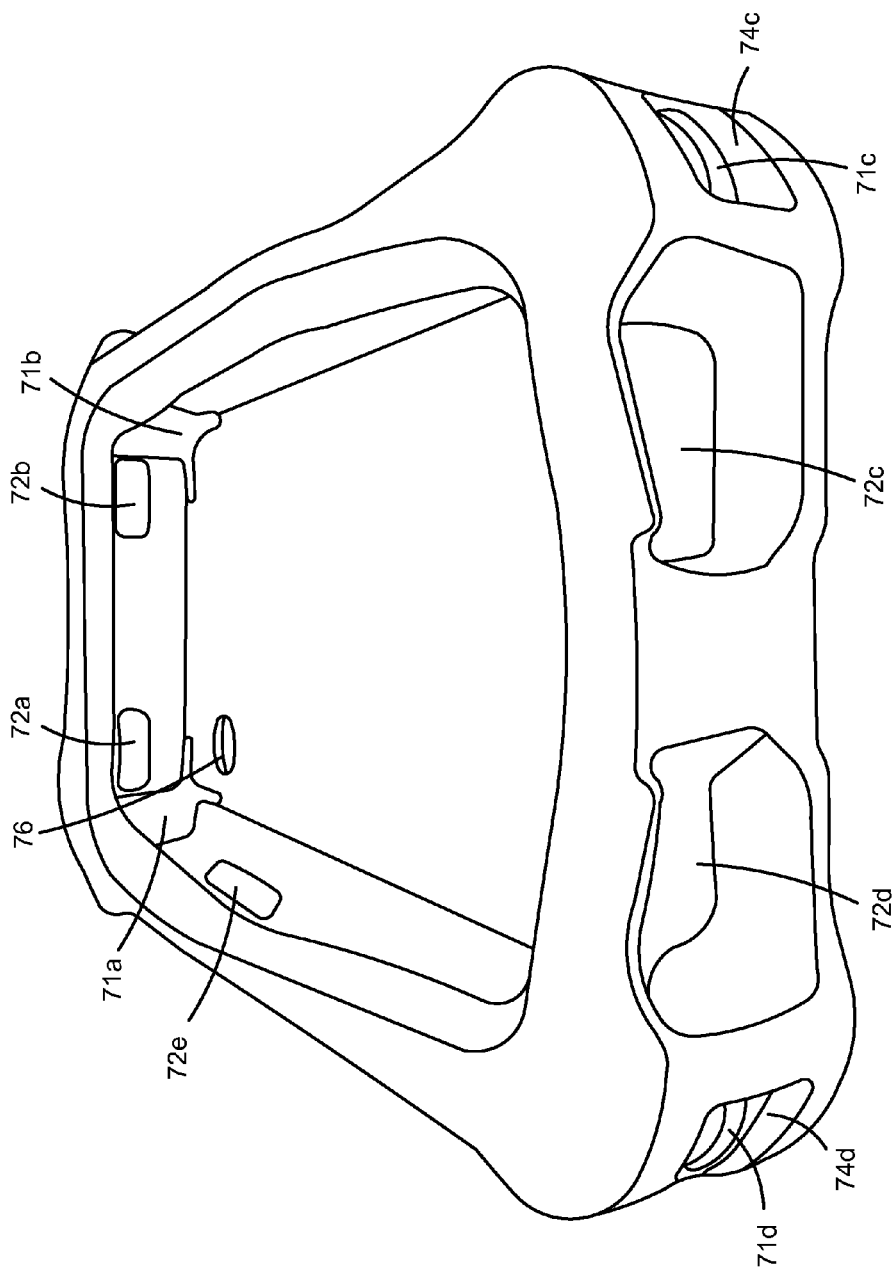

FIG. 8A provides a view of a float 70 of the disclosure wherein the float is coupled with a lanyard 75 which lanyard is configured for allowing the float 70 to easily be carried such as by being strung about a users head, neck, wrist, waist, or other object. Like the sled 1, the float 70 includes an elongated member having a perimeter portion, wherein the perimeter portion includes perimeter walls. The float 70 further includes a cavity defined by the perimeter walls into which cavity an electronic device or a housing therefore may be inserted. The float 70 includes four corners, and each of the corners may include a structural feature 71 that serves one or more functions. As depicted the structural features 71a-71d function to give structural support to the corners of the float 70, as well as to provide an element by which the float 70 to be connected to a carrying mechanism 75, such as a lanyard.

As depicted in FIG. 8A, the lanyard 75 includes an elongated body ending in two opposing connector interfaces 75a, which interfaces are coupled to a connector 75b that is configured for engaging a portion of the float 70 or a portion thereof. As depicted the connectors 75b are configured for engaging a hook portion of a support member 72, which support members are positioned at the proximal corner hook receiving portions 74a and 74b.

In this implementation, the supports 71a-71d are positioned at each corner and are configured for engaging an interior corner portion and passing through the interior corner portion to the exterior corner portion and forming a receptacle at the exterior corner so as to be capable of being coupled to a carrying mechanism so as to be carried thereby. As depicted four supports 71a-71d are provided at each of the corners thereby allowing the carrying device 75 to be connected to any of the corners and consequently allowing the housed device to be carried in a variety of orientations, e.g., horizontally and/or vertically. The corners, therefore, are configured for receiving a hook element portion of the support member, and consequently the corners include indented receiving portions 74a-74d. In various instances, three, or two, or even just one corner may be coupled to a support element 71, or the support member may be positioned not in a corner but at one or more sides, and/or the support member 71 will have a different configuration then provided herein so long as it is capable of supporting a side or a corner of the float and/or allowing for a carrying device to be connected thereto for carrying the float.

The float also includes several apertures, such as along its perimeter and/or its elongated surface. For instance, there may be one or a plurality of apertures positioned along its perimeter portion and/or one or more apertures on its elongated surface member. For example, exemplified in FIG. 8B, there are two apertures 72a and 72b positioned on its proximal portion, e.g., so as to align with an earphone jack port and/or on on/off button of an underlying housed device thereby allowing access thereto, and there are two apertures 72c and 72d positioned on its distal portion, e.g., so as to align with a microphone and/or speaker portion of an underlying housed device. There is also an aperture 72e on one of its side portions, e.g., so as to align with a volume control and/or silence toggle, as well as an aperture 76 positioned on its elongated member, e.g., so as to align with a camera feature of an underlying housed device. Also depicted are support apertures 74c and 74d that receive the hook portion of the support members 72c and 72d.

Figure 8C:
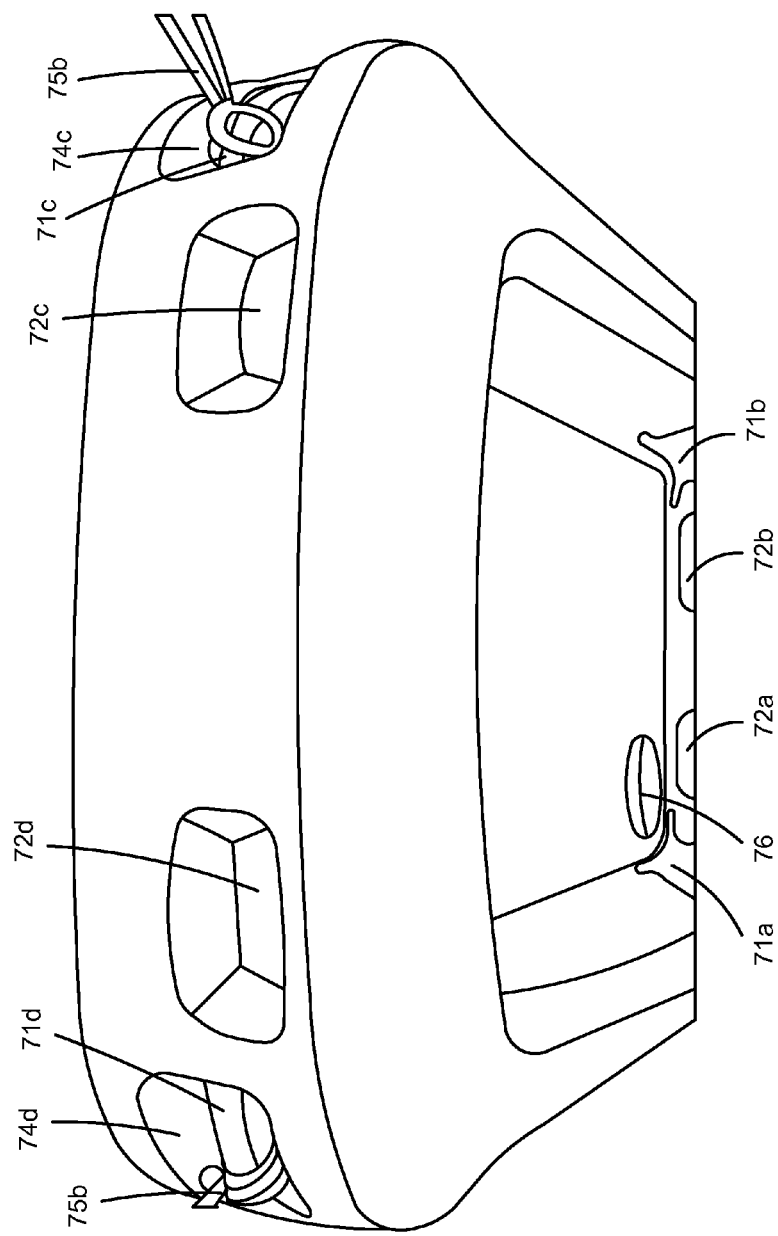
Figure 8D:
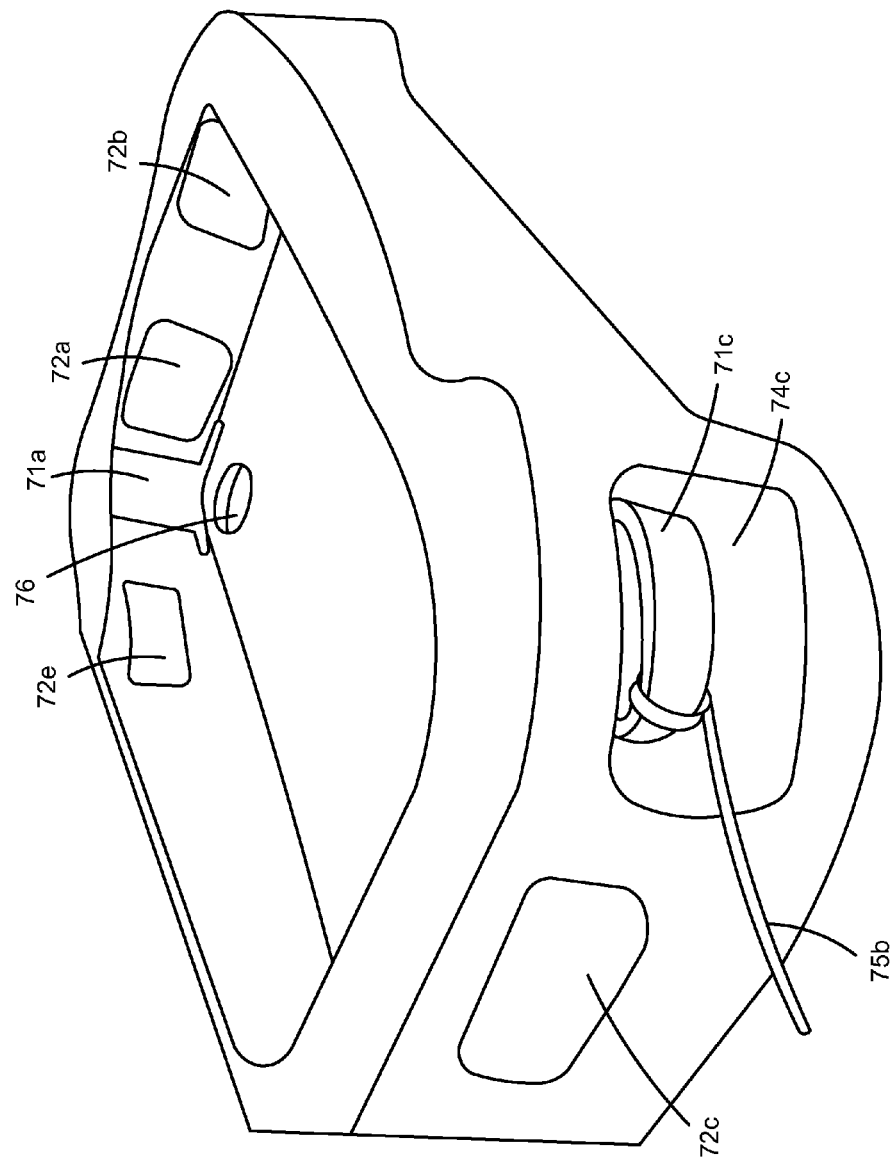
Figure 8E:
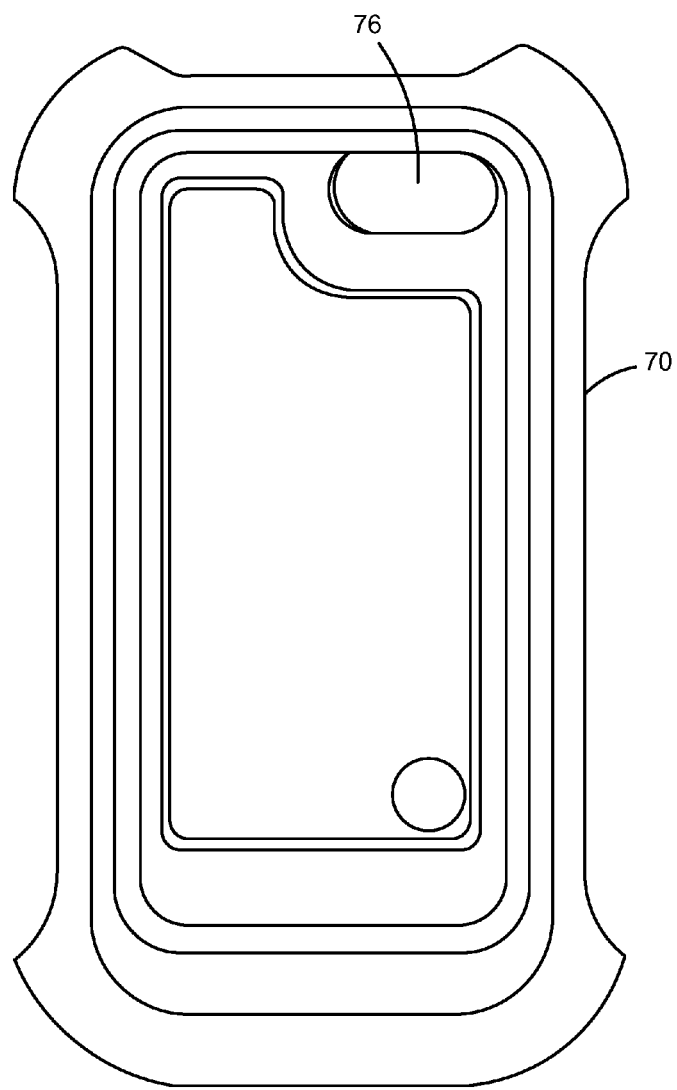

FIG. 8C provides a distal portion of the float 70 wherein the lanyard connectors 75b are configured for engaging the hook portion of the support members 71c and 71d, which support members are positioned at the distal corner hook receiving portions 74c and 74d. FIG. 8D provides a distal corner of the float of FIG. 8C showing in detail the hook element portion of the support member 71c as well as its attachment to the lanyard connector 75b. FIG. 8E provides a front view of an alternative embodiment of a float 70, including aperture 76. The aperture for the camera of the underlying portable electronic device can be any shape that allows for operation of the camera but does not interfere with the buoyant properties of the float.

FIGS. 9A-9G provides various perspective views of a mount adapter 80 for use in conjunction with a sled 1 of our disclosure. The mount adaptor 80 is configured on one end so as to be coupled with a sled 1 of the disclosure, such as via association with an attachment aperture 20 of the sled 1, and on the other end the mount adapter 80 is configured so as to be coupled to a mounting system, such as the one described herein. The mount adapter 80 may have any suitable configuration so long it is capable of coupling to a sled 1 of the disclosure and then coupling the sled 1 with one or more other tertiary mounting members.

As can be seen with respect to FIG. 9A, in this embodiment, the mount adapter 80 is configured for being associated with the sled 1 via coupling with the attachment aperture 20. For instance, the mount adapter 80 includes a base member having a top surface 80a and a bottom surface 80b, wherein the bottom surface 80b of the mount adapter base 80 is configured for being associated with the sled 1 via the attachment aperture 20. The base member 80 further includes sled attachment edge rails 81a and 81b, such as on the perimeter portion of the bottom surface 80b of the base member 80, which are configured for engaging a perimeter edge portion of the sled 1 to which the mount adapter 80 is to be attached. The base member 80 may have any suitable configuration so long as it is capable of associating the mount adapter 80 with the sled 1.

Accordingly, in this embodiment, the base member 80 includes attachment edge rails 81a and 81b that are configured for engaging the edges 12a and 12b of the sled 1 in a manner such that the rails 81a and 81b wrap at least partially around the edges 12a and 12b so as to further prevent the mount adapter attachment base 80 from rotating with respect to the sled 1. The mount adapter attachment base 80 need not move with respect to the sled 1 because it includes a mount adapter element 83, which mount adapter element 83 is configured for interfacing with a suitable mount element in a moveable engagement.

Accordingly, although the moveable engagement of the mount adapter element 83 with the mount element may be configured in any suitable form so long as the engagement allows for the coupling of the sled 1 with the mount element, such as in a moveable engagement, in this embodiment, the engagement is accomplished via hinge element 84. Specifically, the adapter base 80 includes a projection 83, e.g., a mount adapter element, which projection includes on its distal portion a mount engagement member 84 that in this embodiment is configured as a hinge member. The hinge member 84 may include one or more prong elements, which in this instance includes two prong elements 84a and 84b, however it is understood that one, two, three, or more prong elements could be included.

Further, as can be seen with respect to FIG. 9A, the adapter base member 80 includes an aperture 86a, which aperture 86a is configured for receiving a bolt member 86b, e.g., a screw, a rivet, or other attachment mechanism, there through, which bolt member 86b may be employed to attach the adapter base member 80 to the sled 1, such as at the attachment aperture 20, which aperture 20 in this instance is a corresponding aperture sized to snuggly receive the bolt member 86b there through.

It is to be understood, however, that this attachment configuration may be configured in any suitable manner. For instance, although the descriptions herein provide an exemplified manner in which the adapter base member 80 is coupled to the sled 1 via corresponding attachment apertures 20 and 86a by a suitable bolt member 86b, the particular coupling mechanism employed may differ from that set forth herein in many various suitable manners. For example, in various instances, the adapter base member 80 may be coupled to a sled 1 through a corresponding snap interface, as depicted with reference to FIG. 4G, a corresponding clip interface, corresponding hinge interfaces, a snap interface, an adhesive interface, a hook and loop interface, a bolt or rivet interface, a slide and catch interface, and the like. Specifically, in certain instances, instead of having a bolt-receiving interface 86, the adapter base member 80 may include a snap-tooth interface 25, as depicted in FIG. 4B, which snap-tooth interface may include one or a plurality of snap-teeth, each of which snap-teeth may includes an attachment ledge interface that is configured for being coupled to an attachment ledge, e.g., 20c, of an attachment member 20.

Figure 9B:
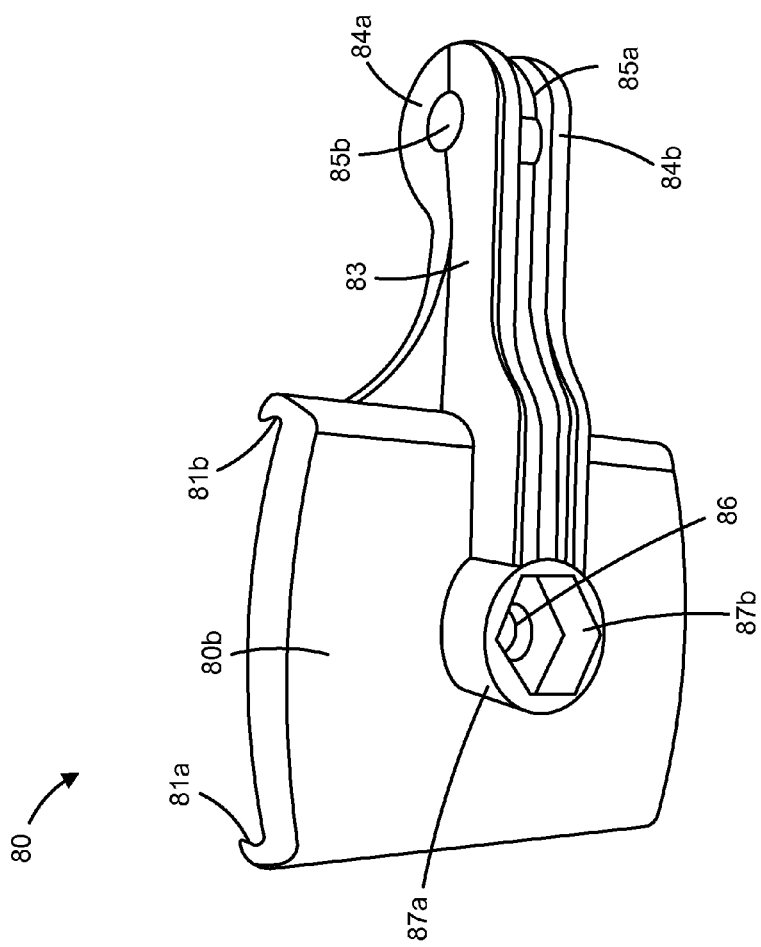

FIG. 9B provides a perspective view of a back surface 80b of the mount adapter 80. The adapter base member 80 includes an aperture bolt retaining member 87a, which retaining member forms a boundary around a bolt receiving aperture 86a. As indicated above, the aperture 86a is configured for receiving a bolt member 86b, e.g., a screw, a rivet, or other attachment mechanism, there through. The mount adapter 80 includes a projection 83 that is configured as a mount adapter element that is configured as a hinge member 84. The hinge member 84 includes two prong elements 84a and 84b, which hinge prong elements 84a and 84b define a hinge receiving aperture 85a that is configured for receiving corresponding hinge prong elements from a mounting member. The mount adapter element 83 also includes an aperture 85b, such as a pin receiving aperture that is configured for receiving a connection element, such as a pin, which pin may be inserted through the corresponding hinge apertures of the mount adapter member and mounting member so as to couple the two together in a moveable alignment. Also depicted are attachment edge rails 81a and 81b.

Figure 9C:
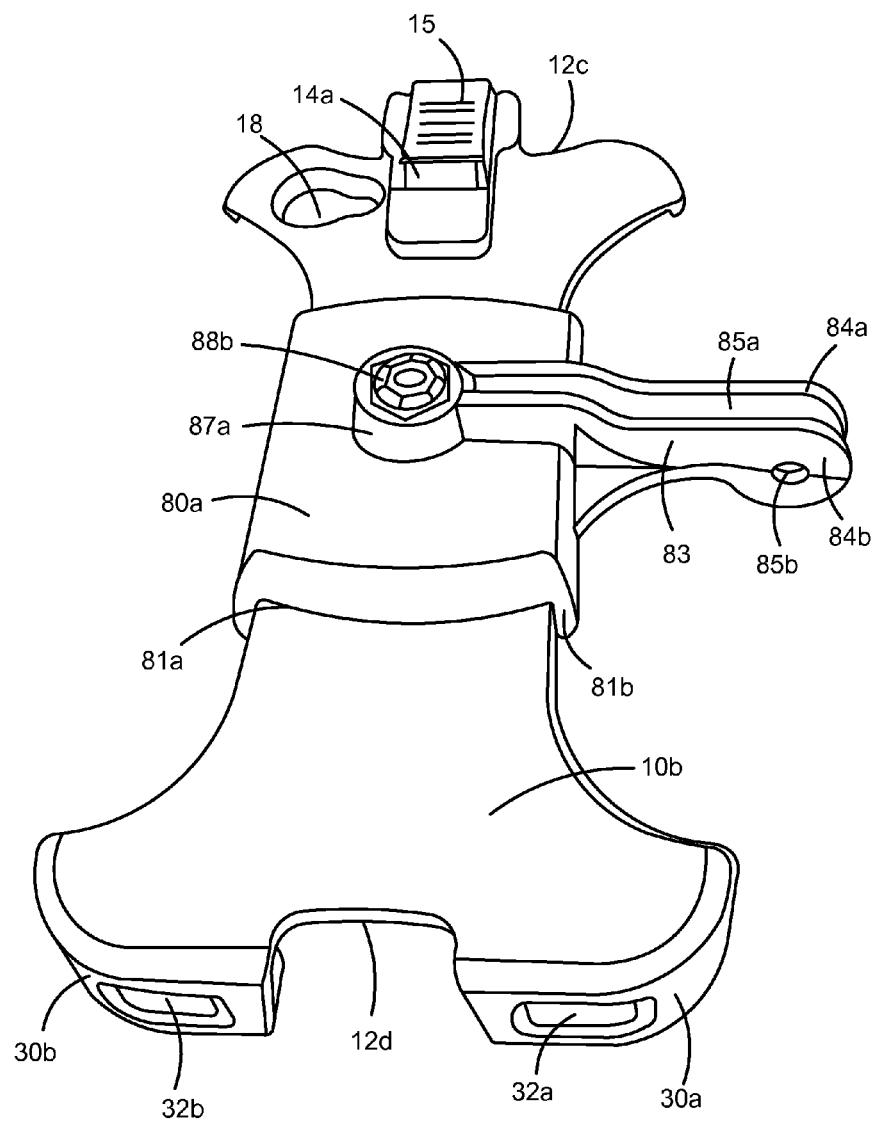

FIG. 9C provides a perspective view of the mount adapter 80 attached to a sled 1 of the disclosure. The front surface 80a of the mount adapter 80 is contacted with a back surface 10b of the sled 1. The bolt receiving aperture 86a of the adapter is aligned with the attachment aperture 20 of the sled and a connector 86b, e.g., a bolt, is inserted there through so as to couple the sled and adapter together. A connector retaining element 87b, e.g., a nut, is then positioned in the connector retaining member 87a and the nut is applied to the bolt so as to secure the coupling of the sled 1 with the adapter. In this embodiment, this connection is a fixed connection, wherein the adapter is fixed to the sled in a non-moveable coupling. However, in other instances, such as that provided with respect to FIG. 9E-9G, the mount adapter may be configured for being coupled to the sled in a moveable manner.

Figure 9D:
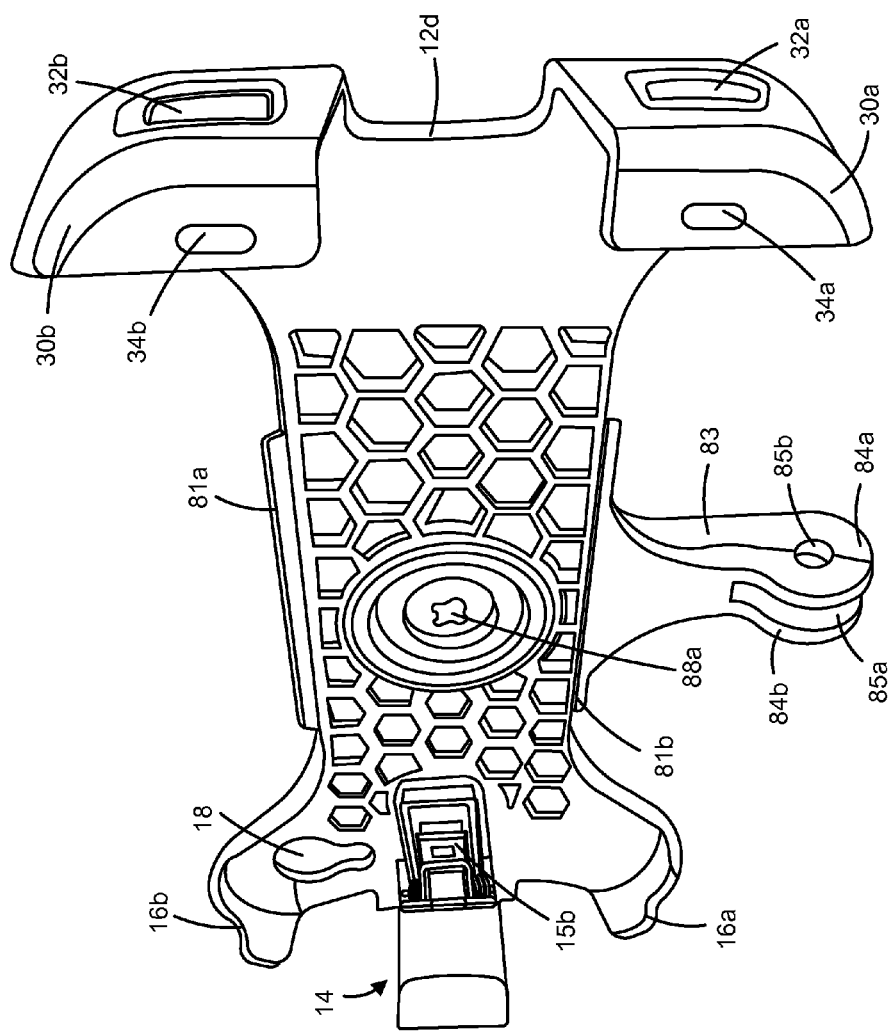

FIG. 9D provides a perspective view of the front surface 10a of the sled 1 of FIG. 9C with the adapter 80 coupled thereto.

Figure 9E:
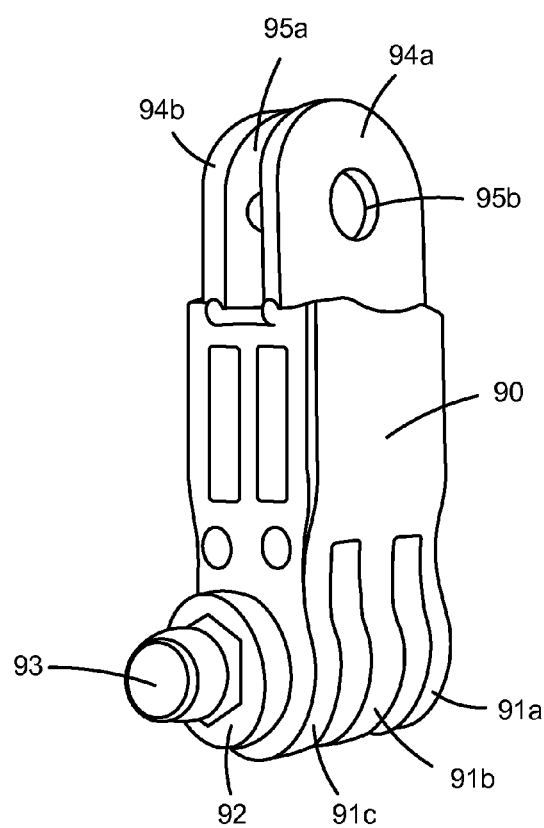

FIG. 9E provides another embodiment of a mount adapter 90 for use in conjunction with a sled 1 of the disclosure so as to enable the sled 1 to be coupled to a suitable mounting member. In this embodiment, the mount adapter 90 is configured as an elongated member, which elongated member is defined by front and back opposed surfaces that are offset from one another by opposed side surfaces. The elongate member is further defined by a proximal portion and a distal portion, which portions each include a coupling interface 91 and 94, respectively. The coupling interfaces of the proximal and distal portions of the elongated member may have any suitable configuration so long as they are capable of interfacing in a coupled engagement with the sled 1 and/or with a mounting member or an accessory therefore.

As can be seen with respect to FIG. 9E, in this embodiment, the proximal and distal coupling portions of the elongated member 90 are configured as hinge interfaces 91 and 94. The proximal hinge interface 91 in this instance includes three prong members 91a, 91b, and 91c that are separated from one another by a space 92a, which space is sized so as to receive corresponding prong members of another mount adapter, sled, or mounting member so as to be coupled therewith. It is to be understood however that less or more than three prong members may be included. The prong members each include a connector, e.g., pin, interface 92b, which interface is configured as an aperture through which a connector 93, e.g., a pin, may be inserted so as to couple the adapter 90 to the other adapter, sled, or mounting member.

The distal hinge interface 94 also includes prong members. In this instance, the distal hinge interface 94 includes two prong members 94a and 94b, however, it is understood that said interface may include one, two, three, or more prong members dependent upon the desired configuration. The prong members 94a and 94b are separated from one another by a space 95a, which space is sized so as to receive corresponding prong members of another mount adapter, sled, or mounting member so as to be coupled therewith. Accordingly, the prong members each include a connector, e.g., pin, interface 95b, which interface is configured as an aperture through which a connector, e.g., a pin, may be inserted so as to couple the adapter 90 to the other adapter, sled, or mounting member.

Figure 9F:
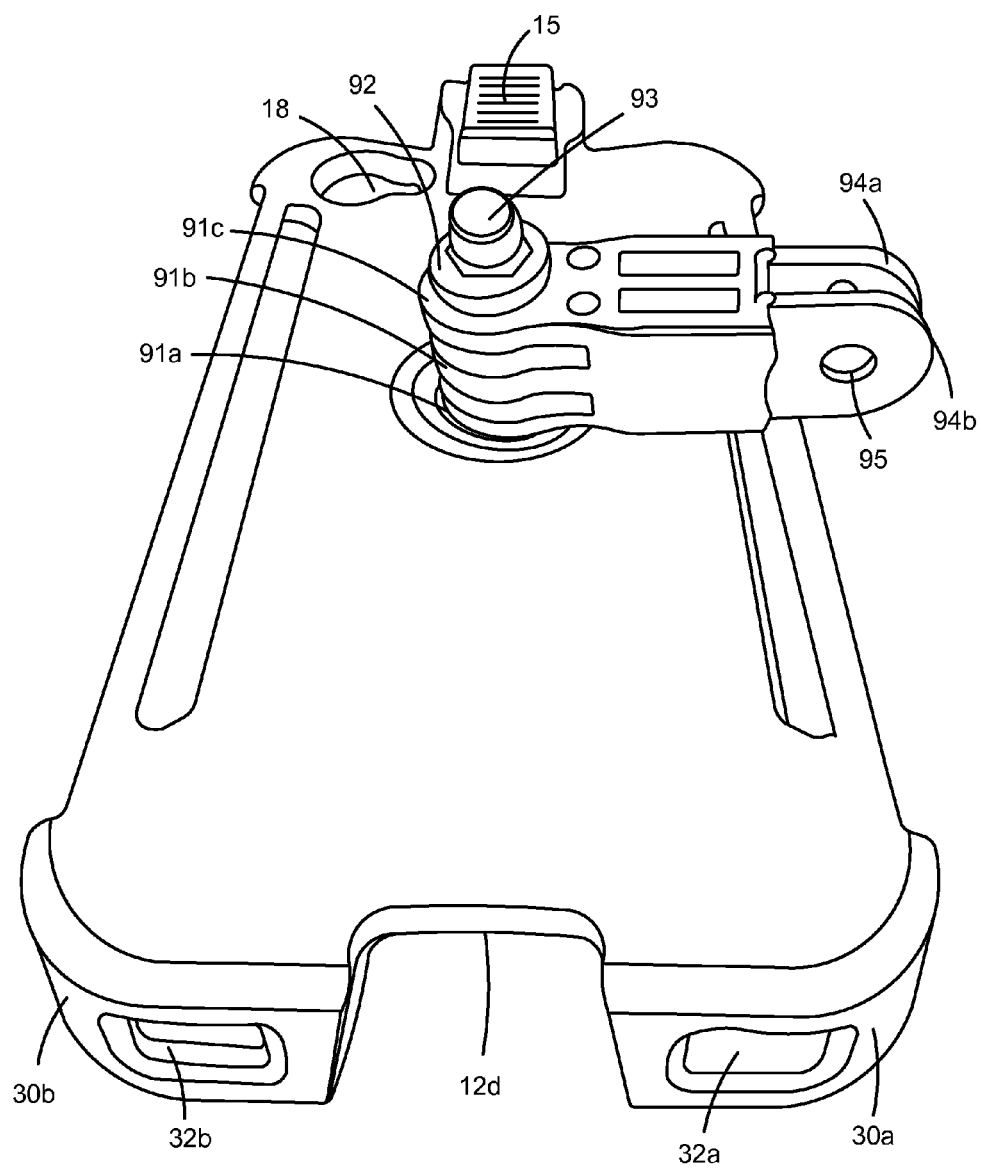
Figure 9G:
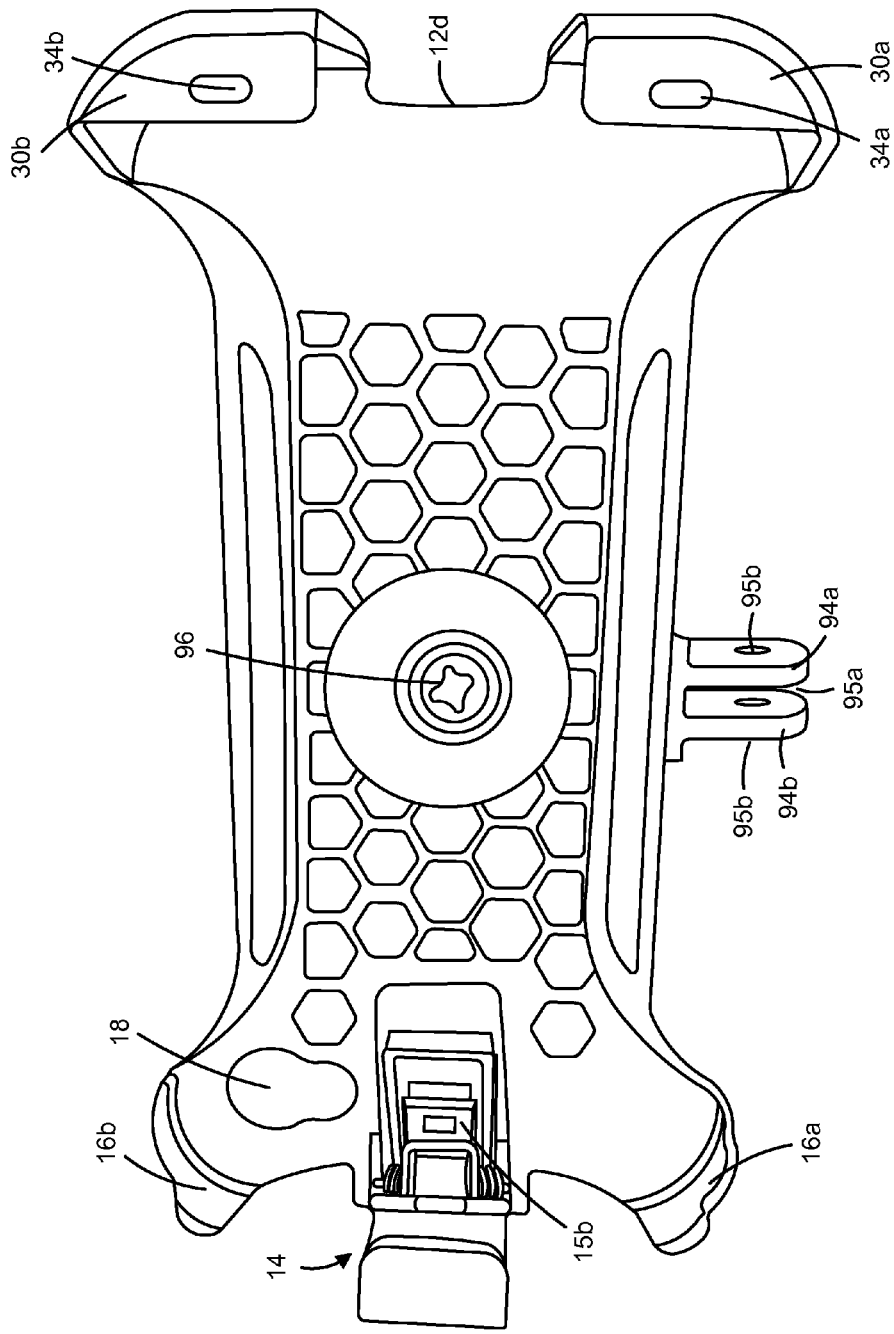

FIGS. 9F and 9G provide a perspective view of the mount adapter 90 of FIG. 9E coupled to a sled 1. Specifically, FIG. 9F provides a perspective view of a mount adapter 90 coupled to a back surface 10b of a sled 1 of the disclosure. The connection interface 91 of the proximal portion of the mount adapter 90 is aligned with the aperture 20 of the sled 1 so that the adapter 90 is contacted with a back surface 10b of the sled 1. The sled aperture 20 has a connector, e.g., a pin, such as a screw or bolt or the like, inserted there through, which pin passes through the connector interface 92a, e.g., the pin aperture of the prong members 91. A locking member, e.g., a nut, is further coupled to the connector so as to couple the adapter 90 to the sled 1. In this embodiment, this connection is not a fixed connection, because the mount adapter 90 may rotate around the bolt or pin member. If a fixed connection is desired, an additional connection member, e.g., a screw may be inserted, such as through the distal interface portion, so as to pass through the sled 1 and thereby lock the alignment of the adapter member 90. FIG. 9G provides a perspective view of the front surface 10a of the sled 1 of FIG. 9F with the adapter 90 coupled thereto.

Figure 10A:
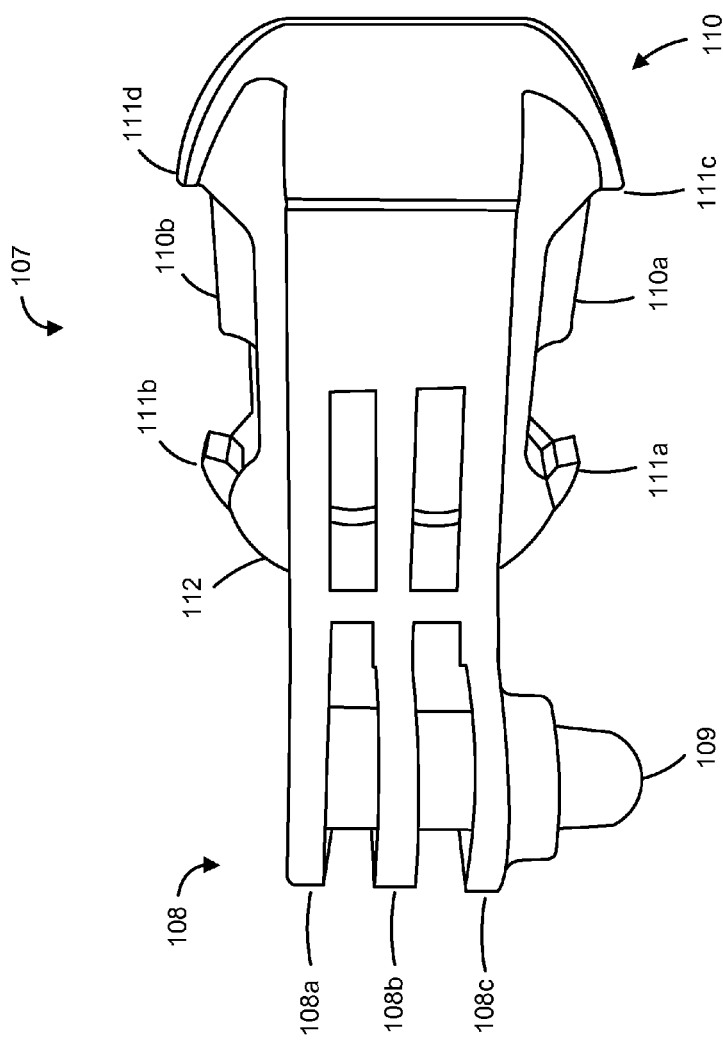

FIG. 10A provides a perspective view of a mount 107 for the sled 1 using the adapters 80, 90 shown in FIGS. 9A-9G. The proximal end of the mount 107 includes a hinge region 108 with three hinge regions, 108a, 108b and 108c that interact with one of the hinge regions of the adapters 80 or 90, joined by a pin 109. The distal end of the mount includes a base attachment region 110. The base attachment region includes a left 110a and a right slot 110b for connecting to a base. It also includes a left 111a and right distal hook 111b as well as a left 111c and right proximal hook 111d for removably connecting to a base. The mount 107 also includes a central region 112 that connects the proximal end of the mount 107 to the base attachment region 110 at the base attachment region connection point 113. The central region 112 then curves from this attachment point 113 to the hinge region 108. This curvature reduces the mass of the mount and provides additional flexibility.

Figure 10B:
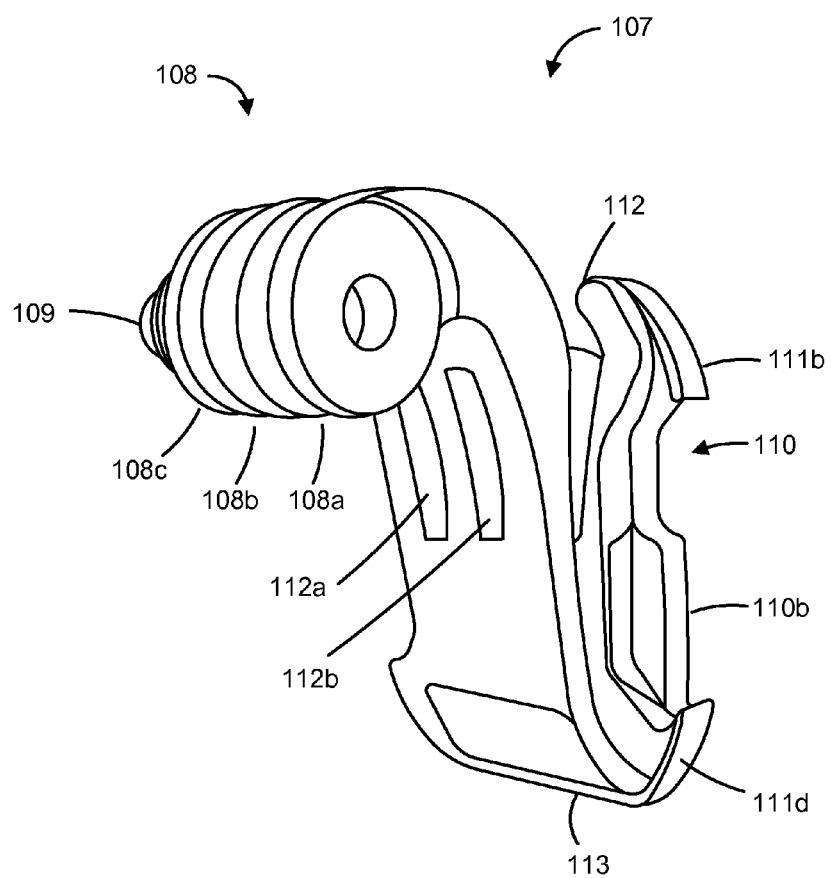
Figure 10C:
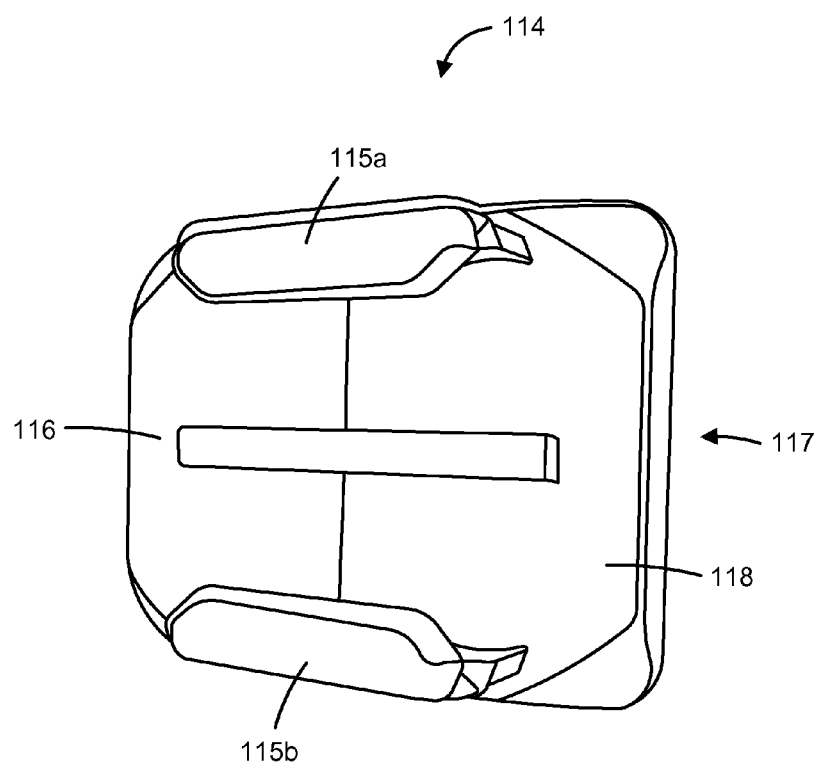

FIG. 10B provides a perspective view the mount 107. A left 112a and a right slot 112b are shown in the central region provide flexibility to the mount and reduces the mass of the mount. The central region of the mount 112 attaches to the proximal end of the base attachment region FIG. 10C provides a perspective view of a base 114 that attaches to the base attachment region 110 of the mount 107 shown in FIG. 10B. The base attachment region 110 of the mount 107 shown in FIG. 10B slides into the right 105a and left slots 105b shown on either side of the mount attachment region 118 of the base 114 shown in FIG. 10C. The center protrusion 116 shown in mount attachment region 118 of the base 114 of FIG. 10C holds the mount 107 from FIG. 10B in place when it is slid under the right 115a and left slots 115b on the base 114.

Figure 10D:
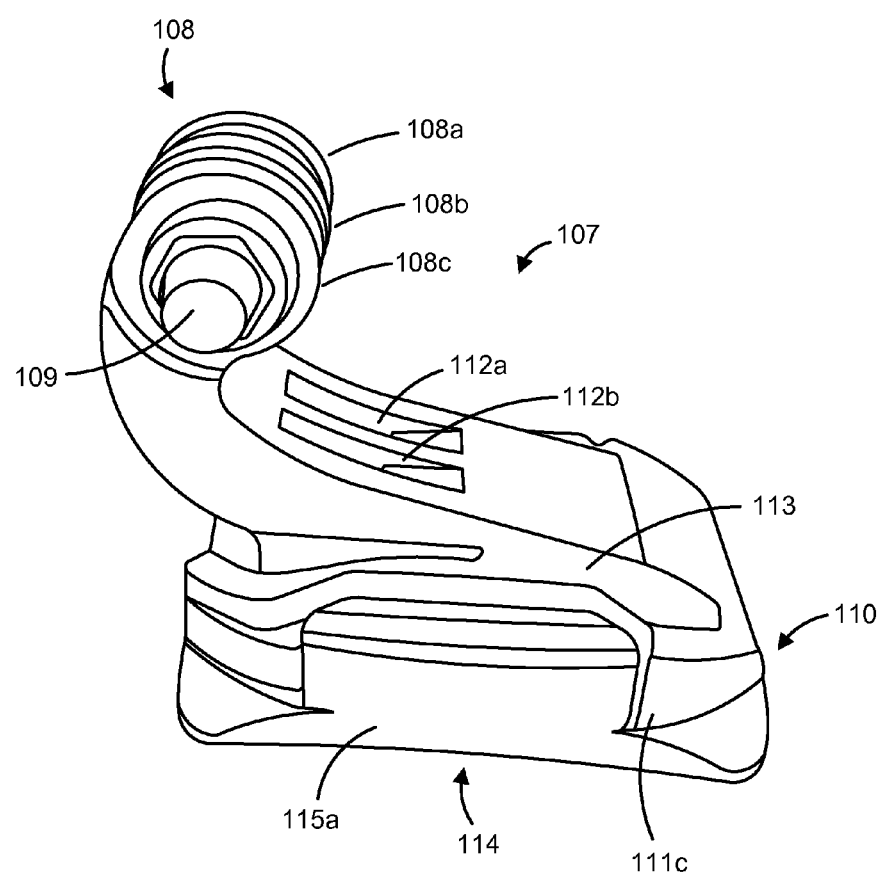

FIG. 10D provides a perspective view of the mount 107 of FIG. 10B attached to the base 114 of FIG. 10C. The base attachment region 110 of the mount 107 is slid into the mount attachment region 118 of the base 114. The right slot 115a of the base 114 is shown interacting with the right slot 110a of the mount 107. The right slot 115a of the base 114 covers the right slot 110a of the mount 107, so it cannot be seen in this perspective. In this configuration, the sled 1 can be attached to the hinges shown on the mount using the adapters 80, 90 shown in FIGS. 9A-9G. The base can be attached to an article or structure. For example, the article or structure could be a helmet, skateboard, surfboard, hat, lanyard or wall.

FIG. 10E provides a perspective view of the mounts shown in FIG. 10D and FIG. 9G. The mount attached to the sled 1 protrudes two hinges 94a and 94b that interlock with the hinges 108a, 108b and 108c. The pin 109 is inserted through the hole made when these hinges properly interlock. A mount tensioning member 116 allows for tension to be applied to the hinges across the length of the pin. This holds the sled 1 in place in relation to the mount 107 and base 114.

Figure 10F:
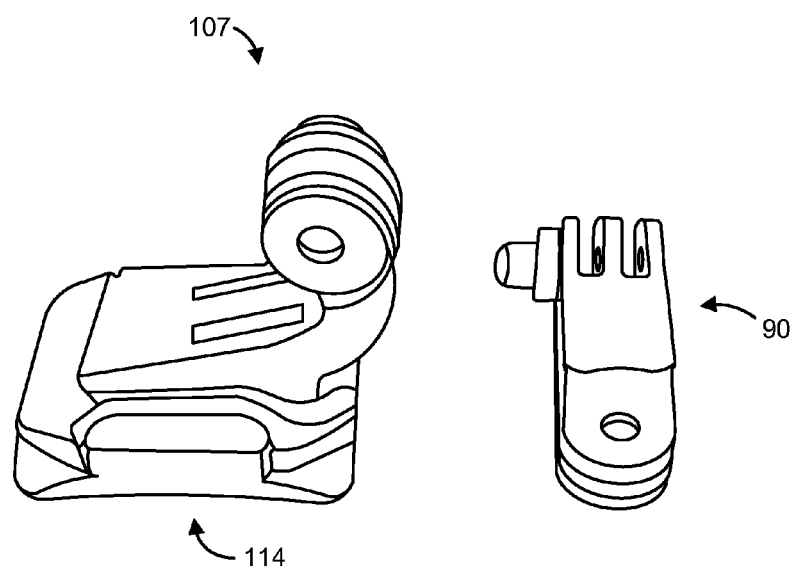
Figure 10G:
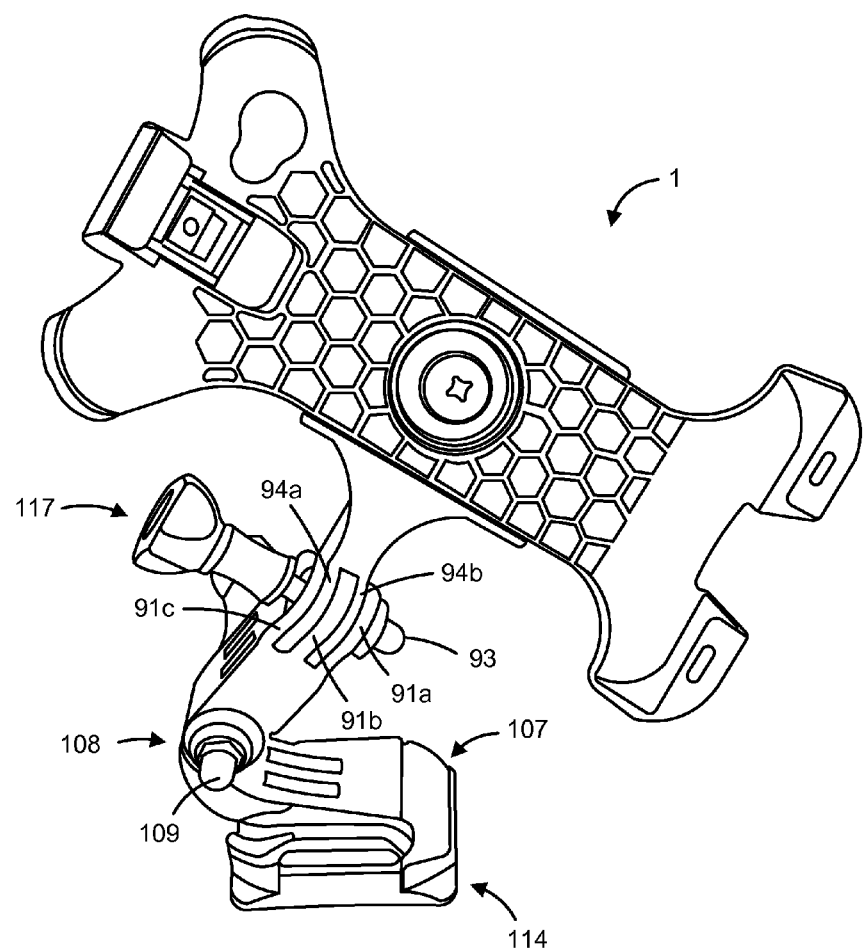

FIG. 10F provides a side perspective view of the mount 107 attached to the base 114 as well as the mount adapter 90 shown in FIG. 9E. The use of the mount 107 and mount adapter 90 together allows the sled 1 to be articulated in relation to the base 114 at two points, providing additional flexibility to the positioning of the sled 1. FIG. 10G provides a perspective view of the mount 107 and mount adapter 90 shown in FIG. 10F and FIG. 9E joined to the sled 1 and the base 114 of FIG. 10C. The hinge interfaces 91a, 91b and 91c interlock with the hinge interfaces of 94a and 94b. These form a channel that the pin 93 passes through. The assembly further includes a mount tensioning member 117 analogous to the pin tightener described above for FIG. 10E.

Figure 11A:
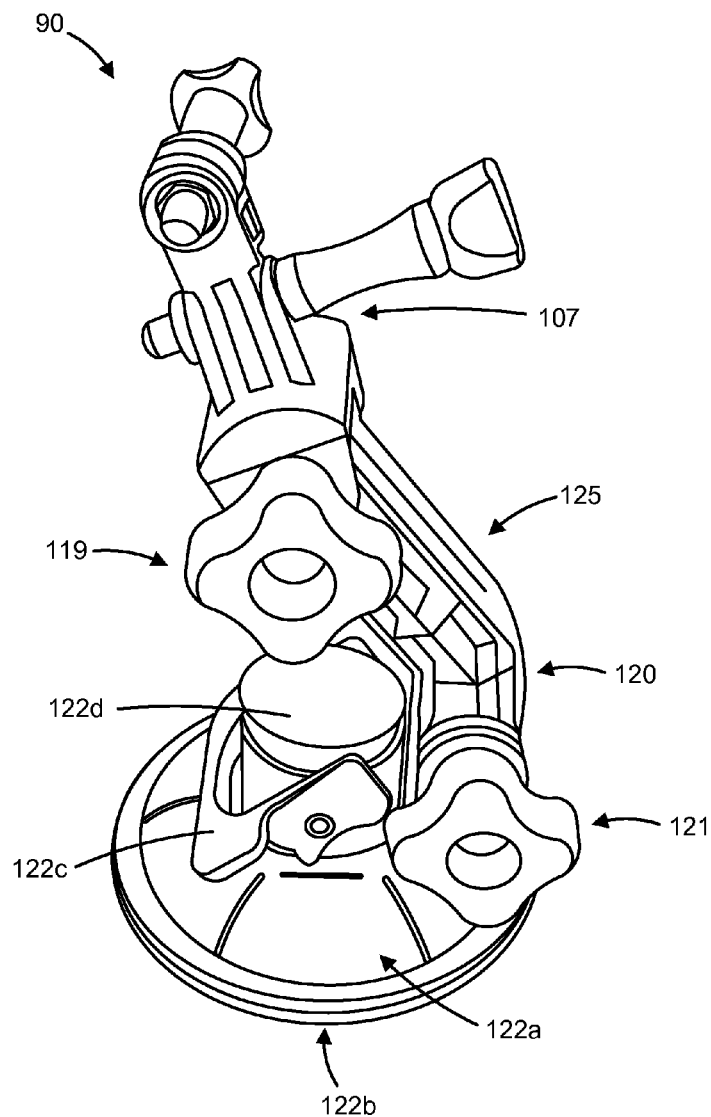
Figure 11B:
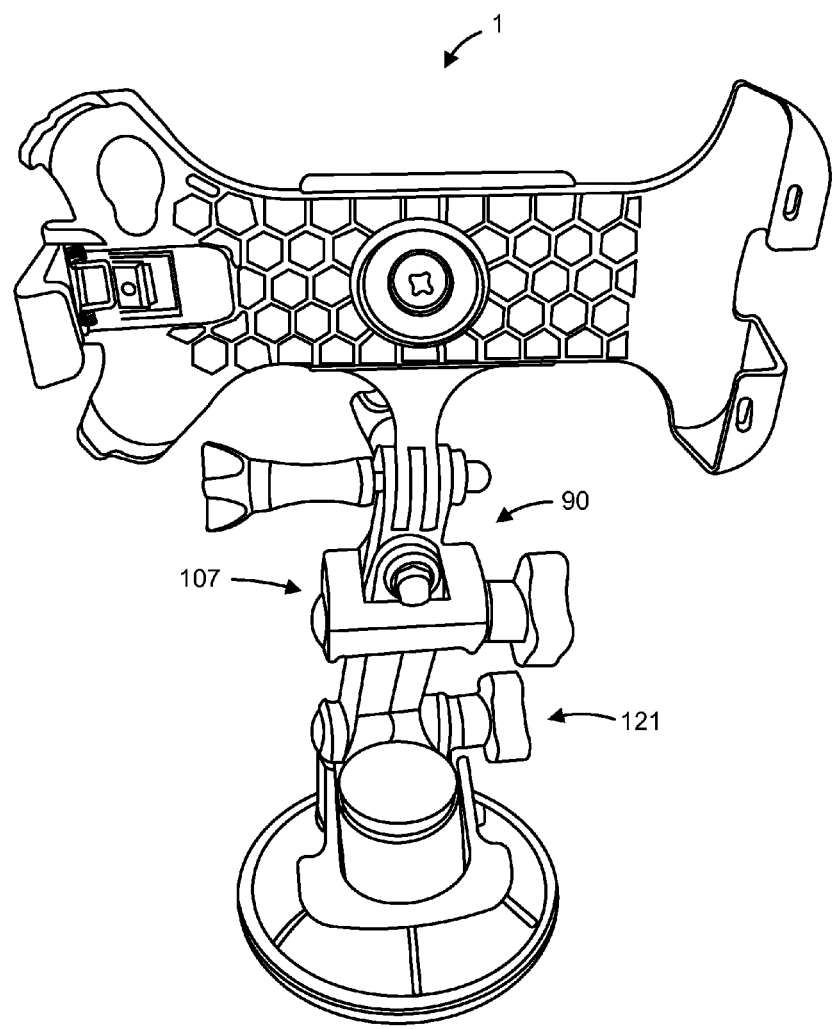

FIG. 11A provides a perspective view of the mount 107 and mount adapter 90 attached to a suction cup base 125. In the embodiment shown, two mounts are used with the sled as shown in FIG. 10G. The mount 107 shown in FIG. 10G is then attached to the suction cup base 125 instead of the base shown in FIG. 10G. The suction cup base 125 can be adjusted using the mount tensioning member 119 and/or the arm hinge tensioning member 121. Thus, the orientation of the mount with respect to the suction cup 122b can be adjusted at two points on the suction cup base 125. Vacuum is created within the suction cup 122b by manipulating the vacuum arm 122c on the top casing of the suction cup 122a. The vacuum can be release by pressing the vacuum release button 122d. FIG. 11B shows the suction cup base 125 and mounts from a different perspective with the sled 1 attached to the mount adaptor 90.

Figure 11C:
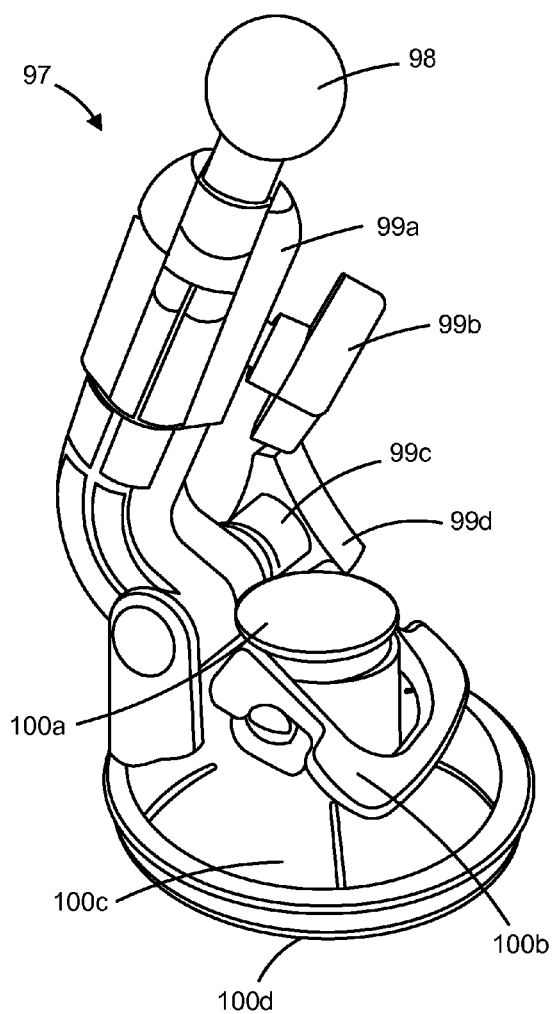

FIG. 11C shows a perspective view of a different embodiment of a base with a suction cup bottom 97. This base has a ball mount 98 for interacting with the tensioning member 68 described in FIG. 6E. This mounting system allows for the sled 1 to be articulated at the position that the tensioning member 68 interacts with the ball mount 98, but also at the ball mount hinge 99a, tightened by the ball mount hinge tensioning member 99b. Thus, a sled 1 positioned on the ball mount 98 would be able to rotate and bend via its interaction via the tensioning member 68. Also, the ball mount 98 itself can articulate from side via its ball mount hinge 99a. Further, the arm hinge 99c allows the entire arm comprising the ball mount hinge 99a and ball mount hinge tensioning member 99b to articulate along another axis, via manipulation of the arm hinge tensioning member 99d.

Vacuum is created within the suction cup 100d by manipulating the vacuum arm 100b on top casing of the suction cup 100c. The vacuum can be release by pressing the vacuum release button 100a.

Figure 11D:
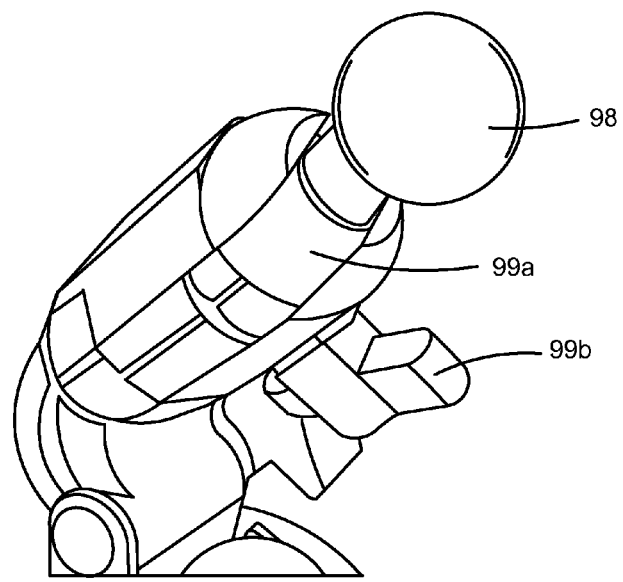
Figure 11E:
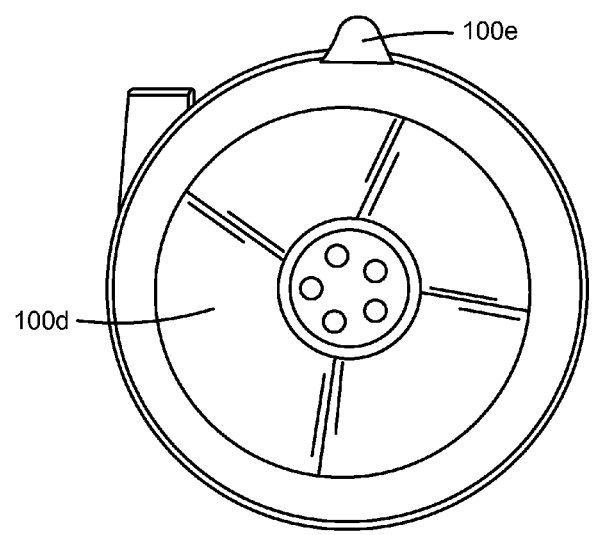

FIG. 11D shows a perspective view of the ball mount 98, as well as its ball mount hinge 99a and ball joint hinge tensioning member. FIG. 11E shows a view of the bottom of the suction cup base 97. This view shows the suction cup 100d as well as the vacuum release tab 100e. After the vacuum arm 100b and vacuum release button 100a have been manipulated, the vacuum release tab can be pulled to release the vacuum and remove the suction cup base 97 from a surface.

Figure 11F:
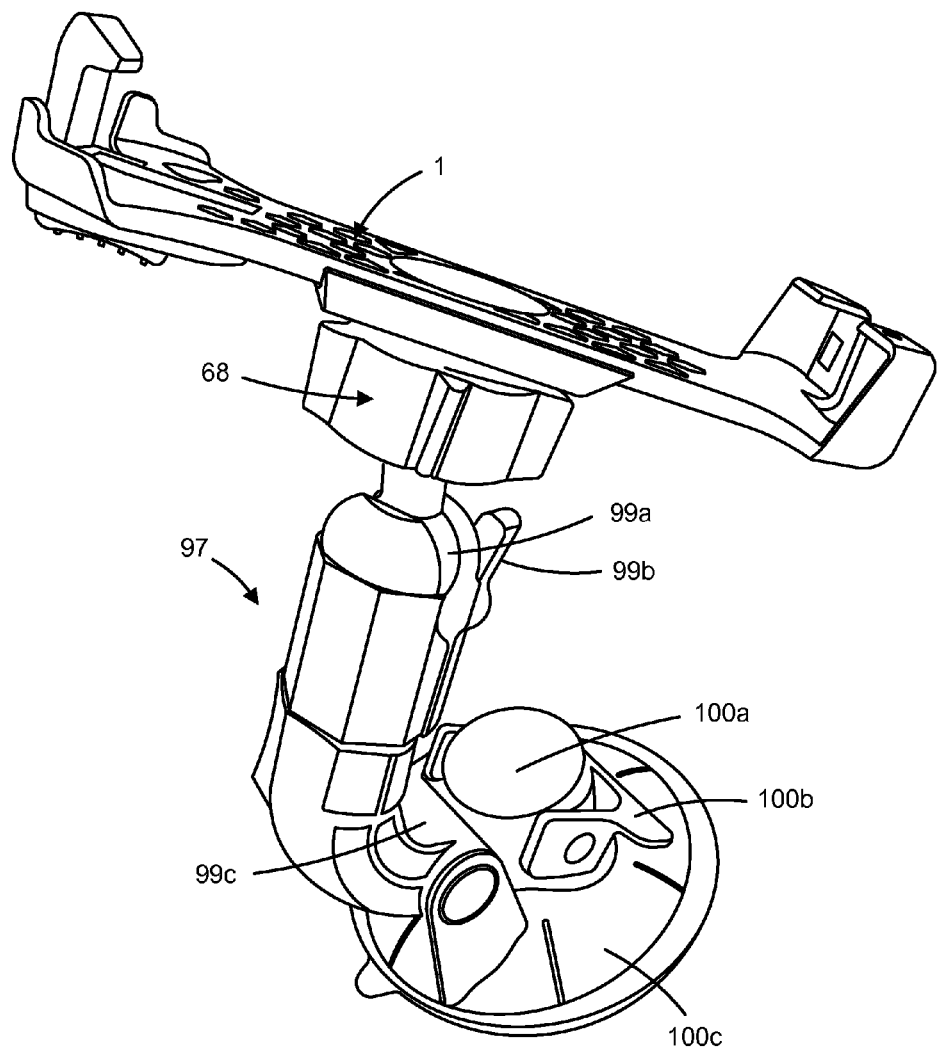

FIG. 11F shows a perspective view of the suction cup base 97 attached to a sled 1 via its tensioning member 68 at the ball mount. This allows for the sled 1 to be rotated and articulated in any direction and removes the necessity of two or more mounts as described in FIG. 11B. However, the mounts and sled described herein are compatible with either the hinged or ball joint mechanism.

Figure 11G:
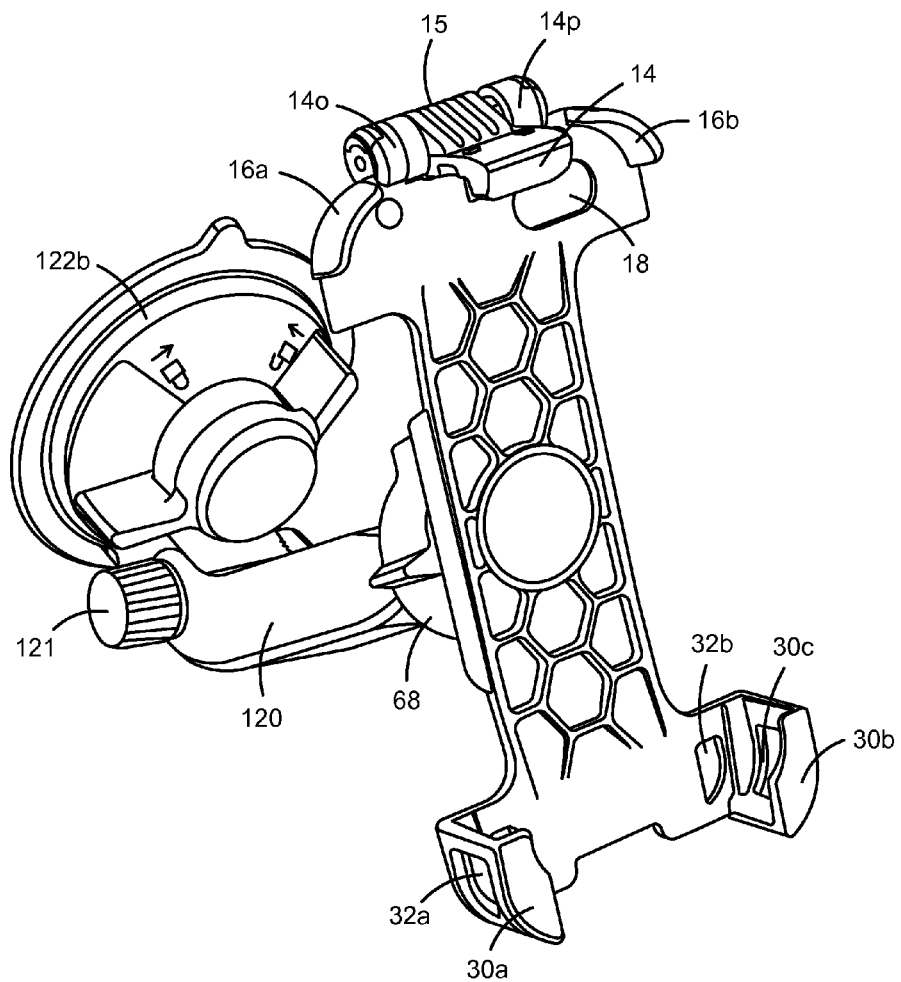

FIG. 11G shows a perspective view of an alternative embodiment of a sled attached to a suction cup base. Similar embodiments of the sled are also shown in FIGS. 1D-1H and similar embodiments of the clasping element 14 and the locking element 15 are shown in FIGS. 2H-2M. The sled includes a clasping element 14 and locking element 15 held between clasp retaining elements 14o and 14p. The sled also includes hard stops 16a and 16b, supporting elements 30a and 30b, cutout portion 32b (cutout portion 32a not shown), and supporting element cutouts 30c and 30d. The suction cup base is attached to the sled at elongated member 10, the suction cup base including a tensioning member 68, an suction cup arm 120 attached to a ball mount (not shown), an arm hinge tensioning member 121 that allows adjustment of the orientation of the suction cup arm 120. FIG. 11H provides a perspective view of an alternative configuration of the sled attached to a suction cup base of FIG. 11G, in which the sled is rotated horizontally on the ball mount (not shown) relative to the suction cup arm 120.

Figure 12A:
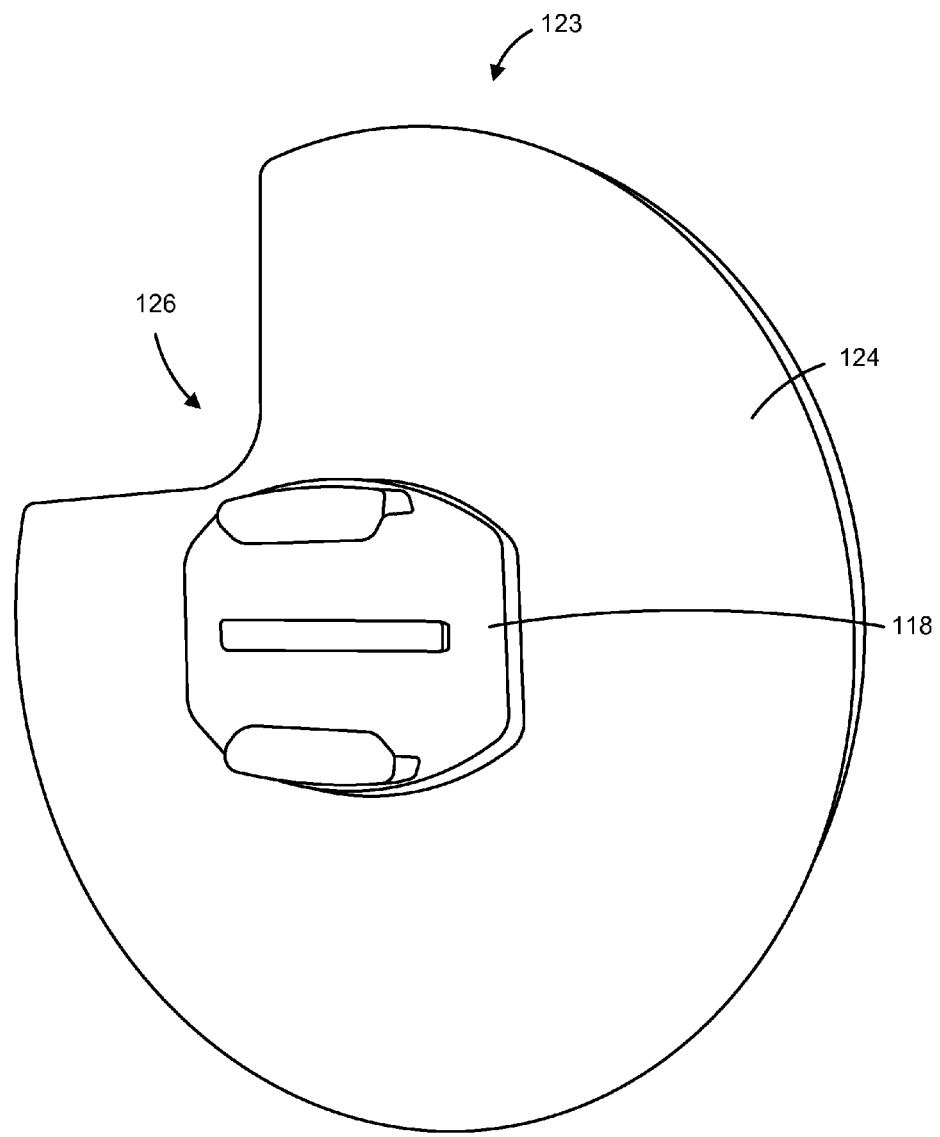
FIGS. 12A-12C are directed to other implementations of a mounting system for a sled of the disclosure.

FIG. 12A is a perspective view of a broad base 123 similar to the one described in FIG. 10C. However, the broad base 123 of FIG. 12A has a larger surface area to contact an article or structure. This surface area is made up of a skirt region 124 around the mount attachment region 118. For example, the article or structure could be a helmet, skateboard, surfboard, hat, lanyard or wall. This larger surface area allows greater stability for the base when it is attached to an article or structure. The cut out 126 on the broad base 123 allows for easier removal of the broad base 123 from an article or structure after it has been adhered to an article or structure.

Figure 12B:
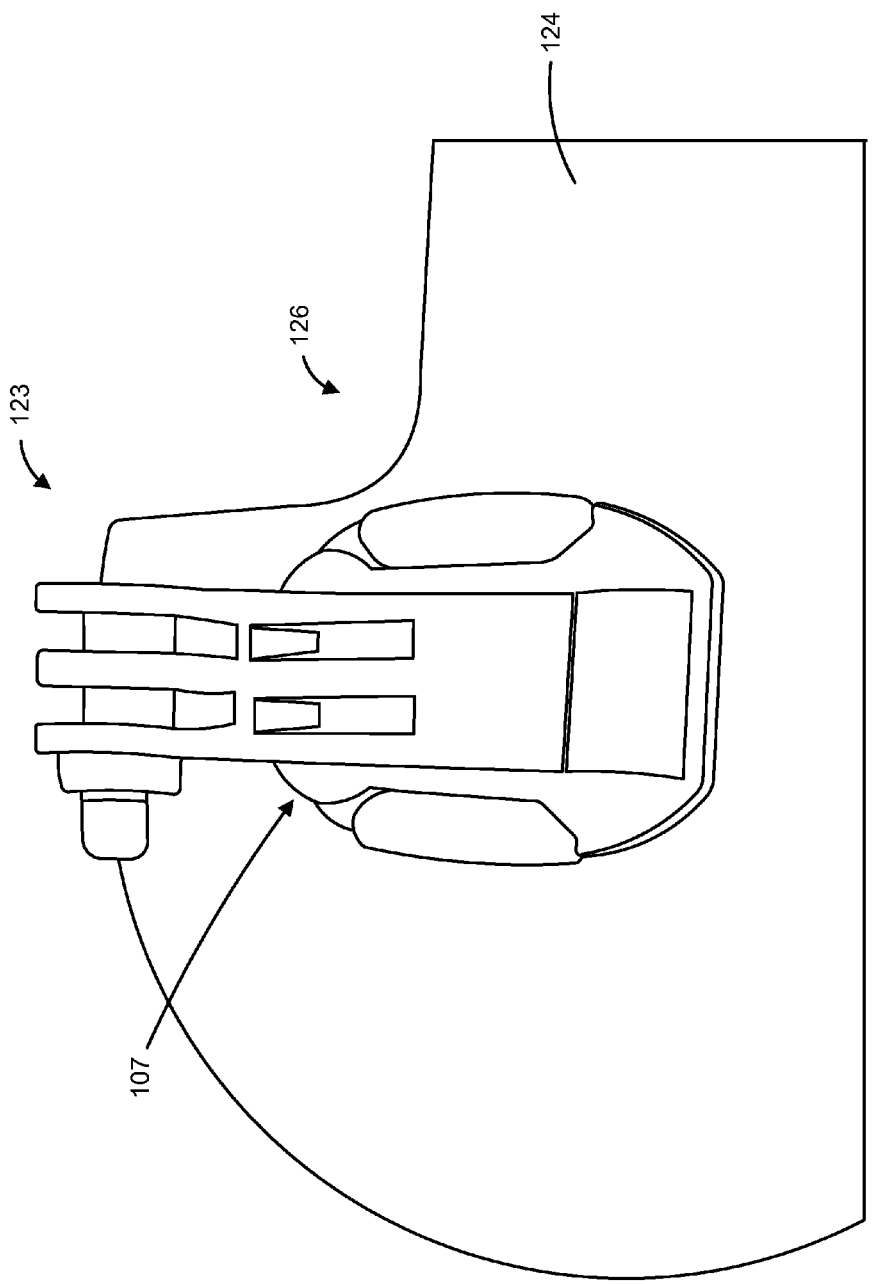
Figure 12C:
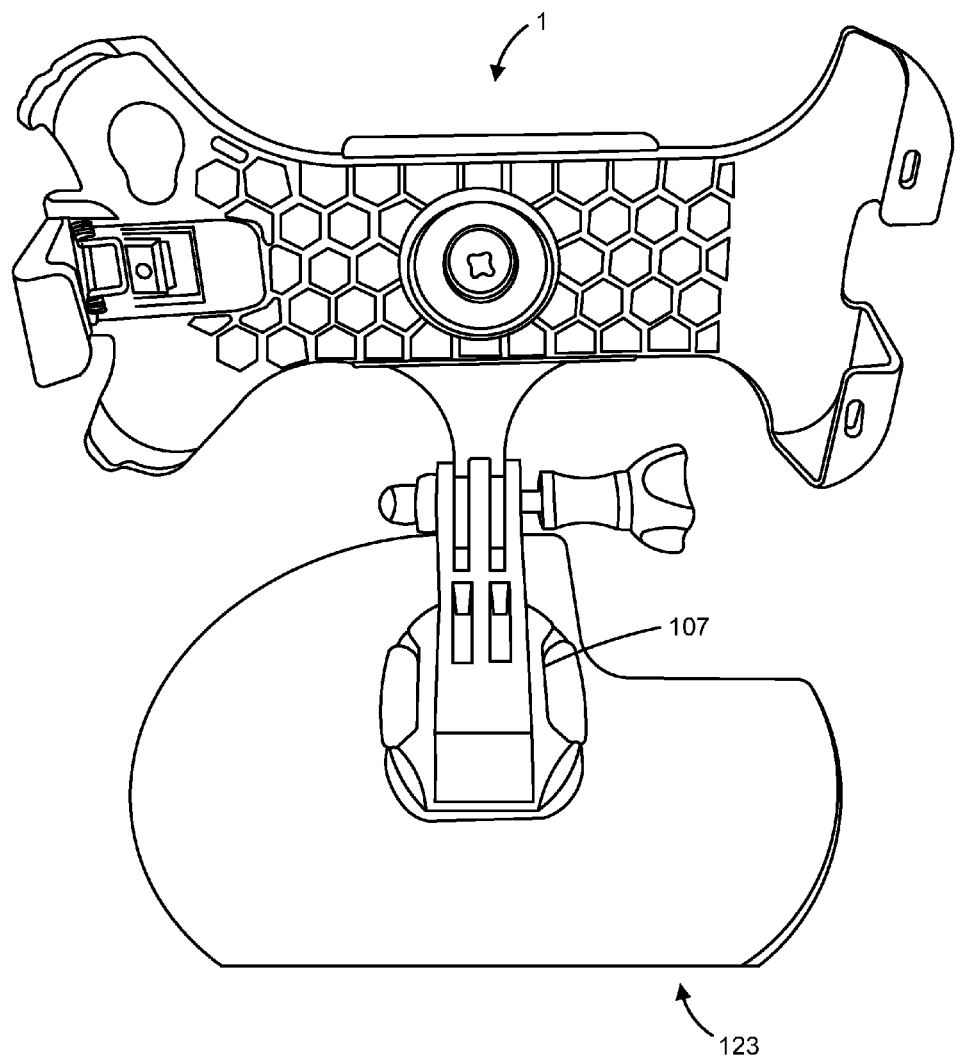

FIG. 12B shows the broad base 123 of FIG. 12A with the mount 107 shown in FIG. 10B attached. FIG. 12C shows the sled 1 attached to the same mount 107 and broad base 123. In other embodiments, the mount could include the ball mount 98 shown in FIGS. 11C-F.

Figure 13A:
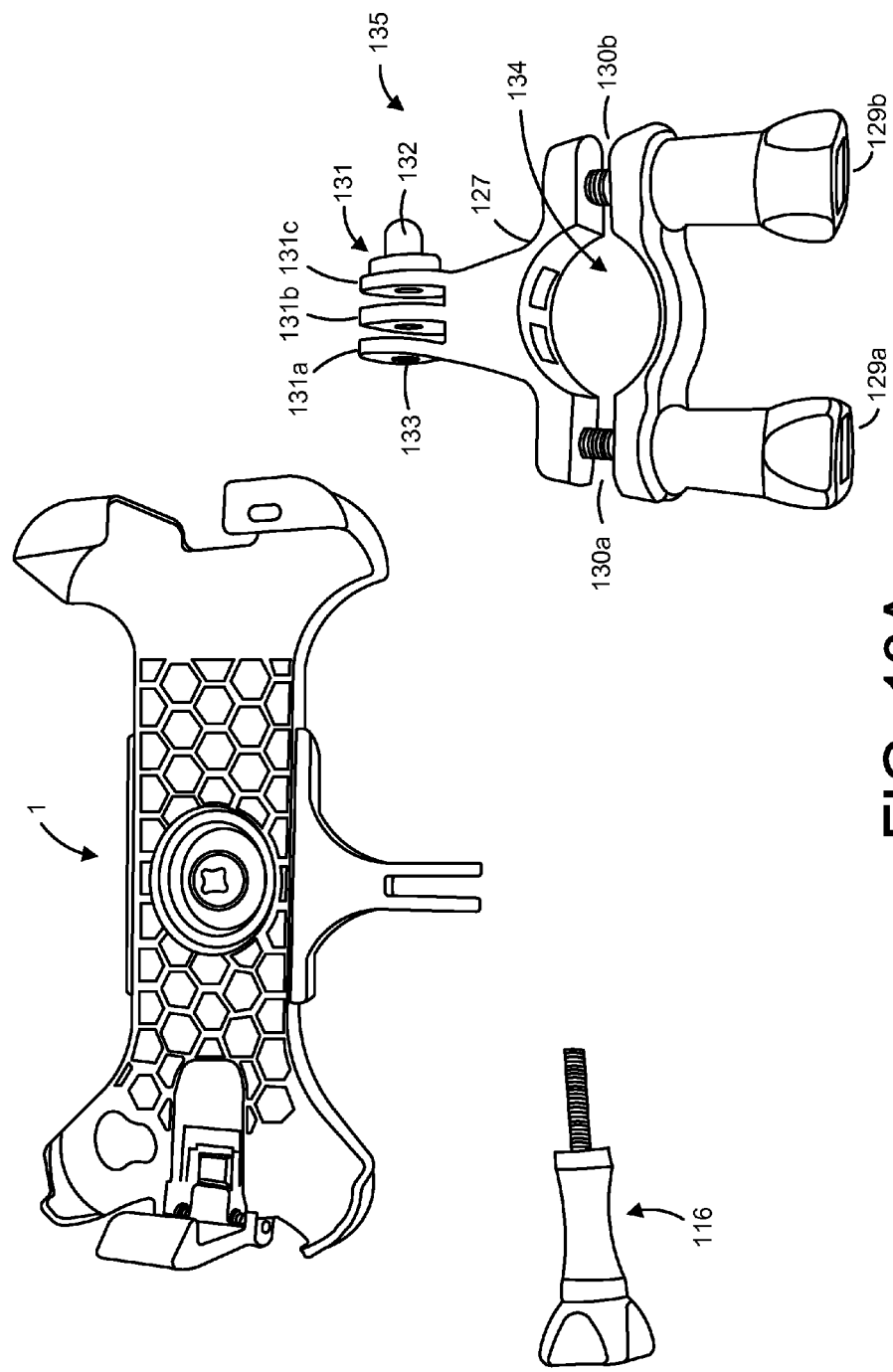
FIGS. 13A-13B are directed to other implementations of a mounting system for a sled of the disclosure.
Figure 13B:
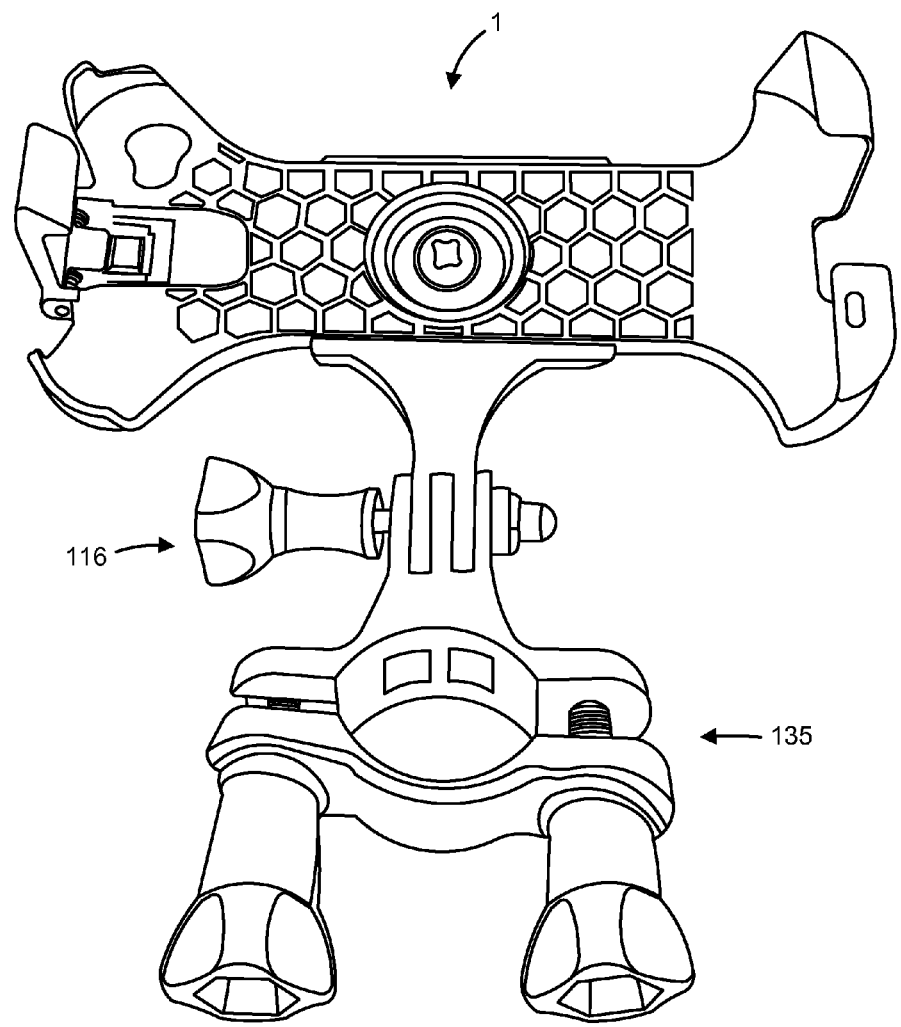

FIG. 13A shows a sled 1, mount tensioning member 116, and mounting system for a tube 135, for example, a tube on the frame of a bicycle. The mounting system for a tube 135 allows the tube to pass through its central cavity 134. The tightening screws 129a and 129b are then adjusted to decrease the size of the central cavity 134 to fit the tube. The hinge mount 131 found on the mounting system for a tube 135 can then interact with the sled like the mounts shown in FIGS. 11A-B. FIG. 13B shows the mounting system assembled with the sled 1. In other embodiments, the mount could include the ball mount 98 shown in FIGS. 11C-F.

Figure 14A:
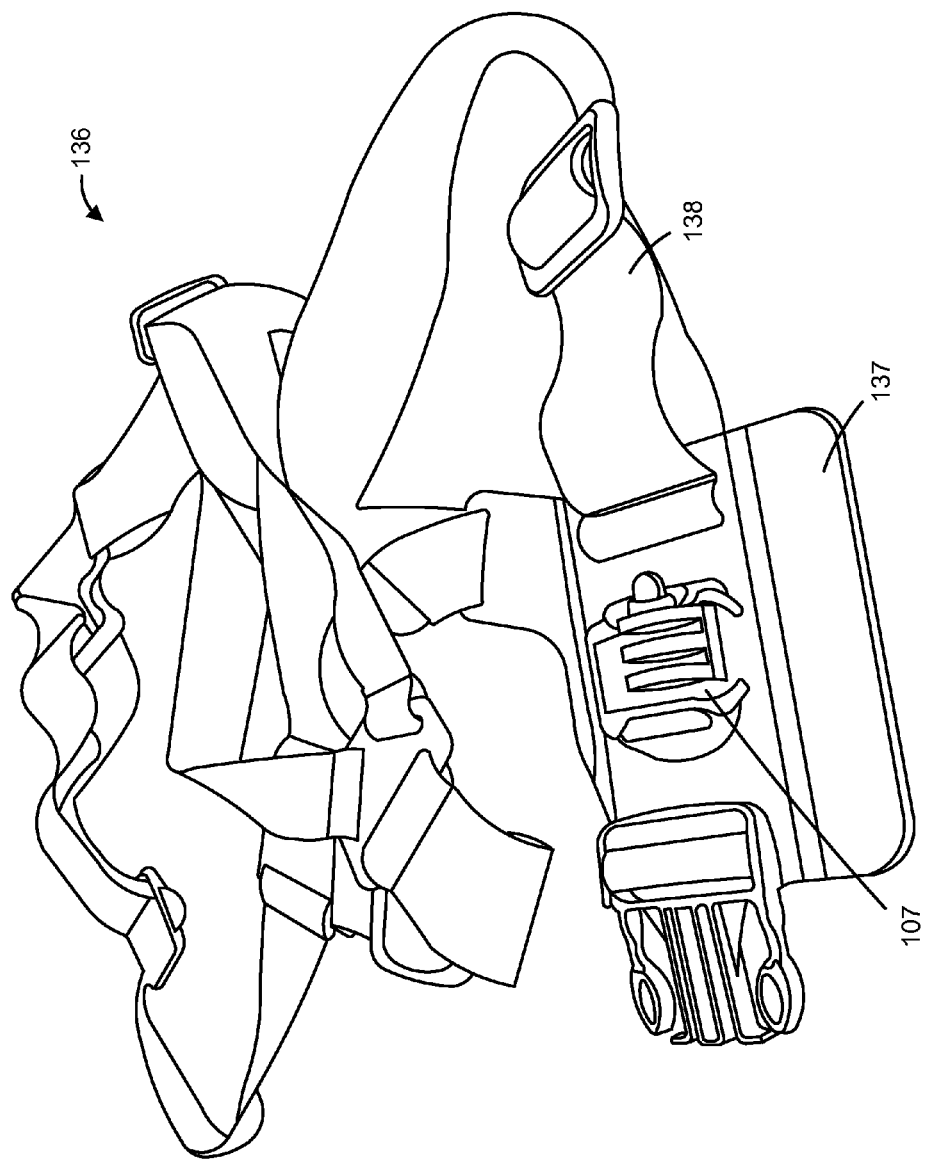
FIGS. 14A-14D are directed to other implementations of a mounting system for a sled of the disclosure.
Figure 14B:
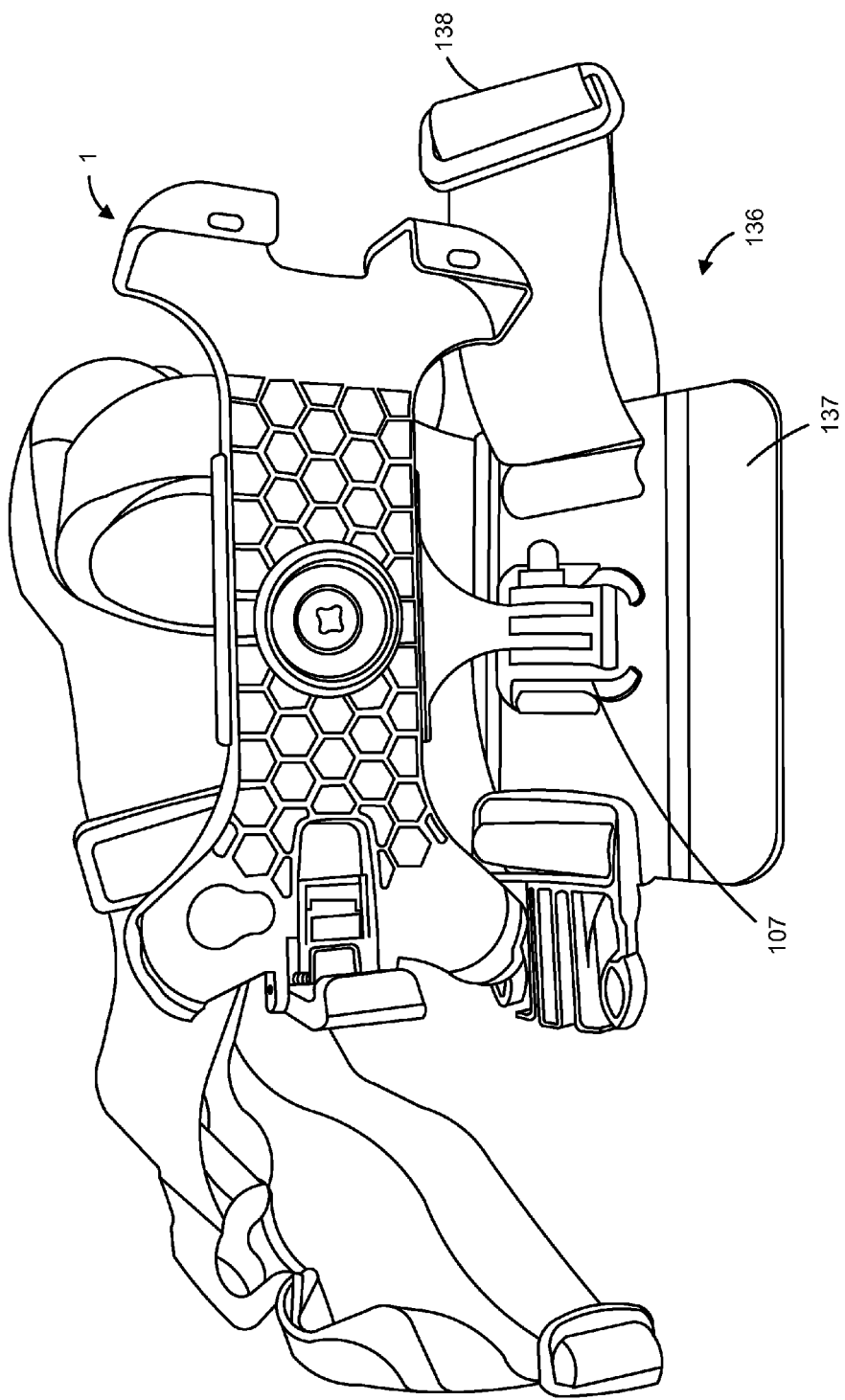
Figure 14C:
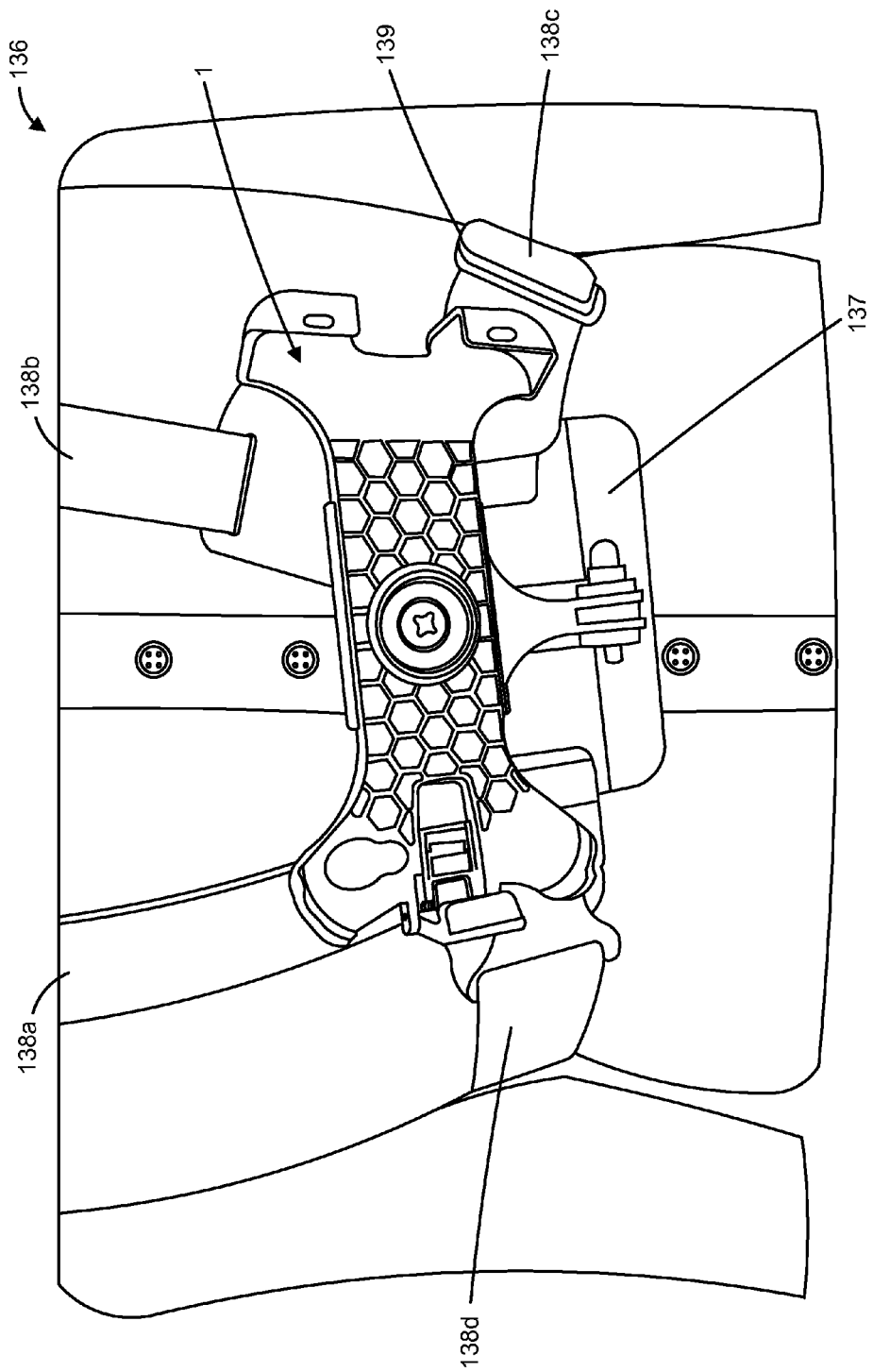
Figure 14D:
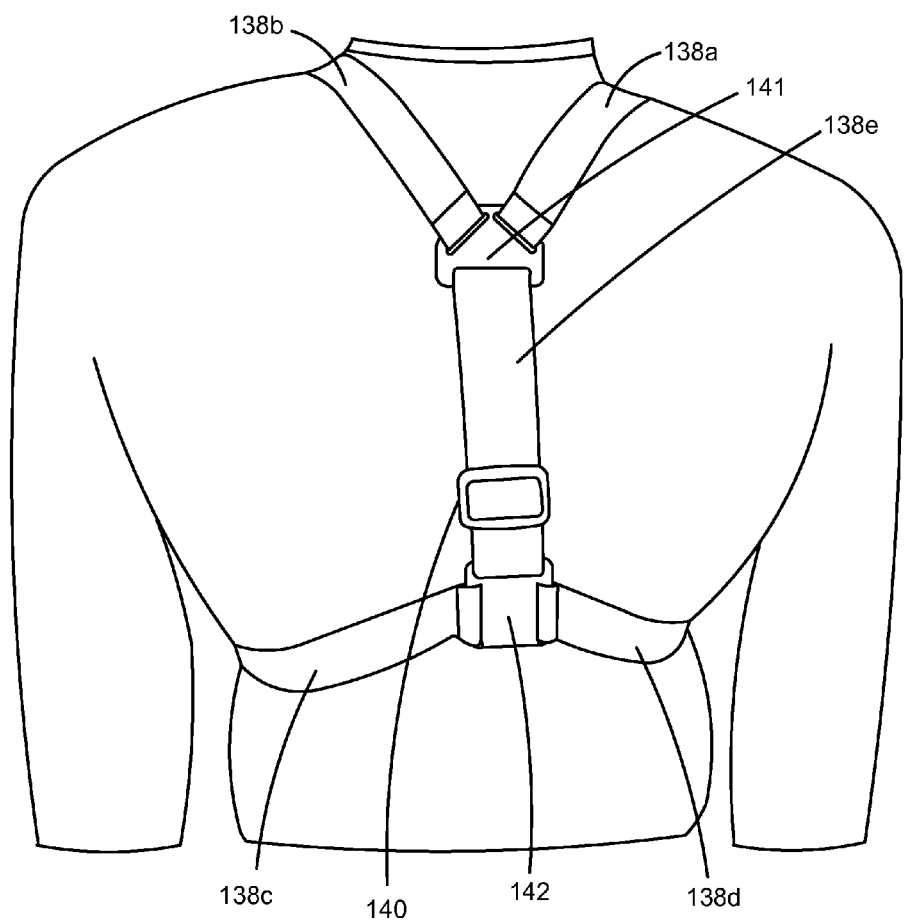

FIG. 14A shows a harness system 136 for mounting the sled 1 on a human body. The harness system 136 is attached to a mounting system 137 that is positioned on the body of the wearer. The mount 107 on the mounting system 137 is the same mount shown in FIG. 10B and can be positioned on the mounting system using a similar mount attachment region 118. However the mount could include the ball mount 98 shown in FIGS. 11C-F. FIG. 14B shows the same mounting system 136 with a sled 1 attached. FIG. 14C shows the mounting system as it would be arranged as worn by a person from the front. FIG. 14C shows how the strap system 138 is applied to a person. The right 138a and left shoulder straps 138b pass over the shoulders of the subject and attach to the top end of the mounting system. The right 138d and left waist straps 138c. The size of the straps in the strap system 138 can be adjusted using the adjustor 139 shown on the left waist strap. In other embodiments, it could be on any of the straps. FIG. 14D provides a back view. The right 138a and left shoulder straps 138b meet at the shoulder strap connector 141. The right 138d and left waist straps 138c meet at the waist strap connector 142. The back strap 138e connects the shoulder strap connector 141 and the waist strap connector 142. The strap system can be one as shown in FIGS. 14A-D or the strap system shown in FIGS. 7E-7Q could also be used.

Figure 15B:
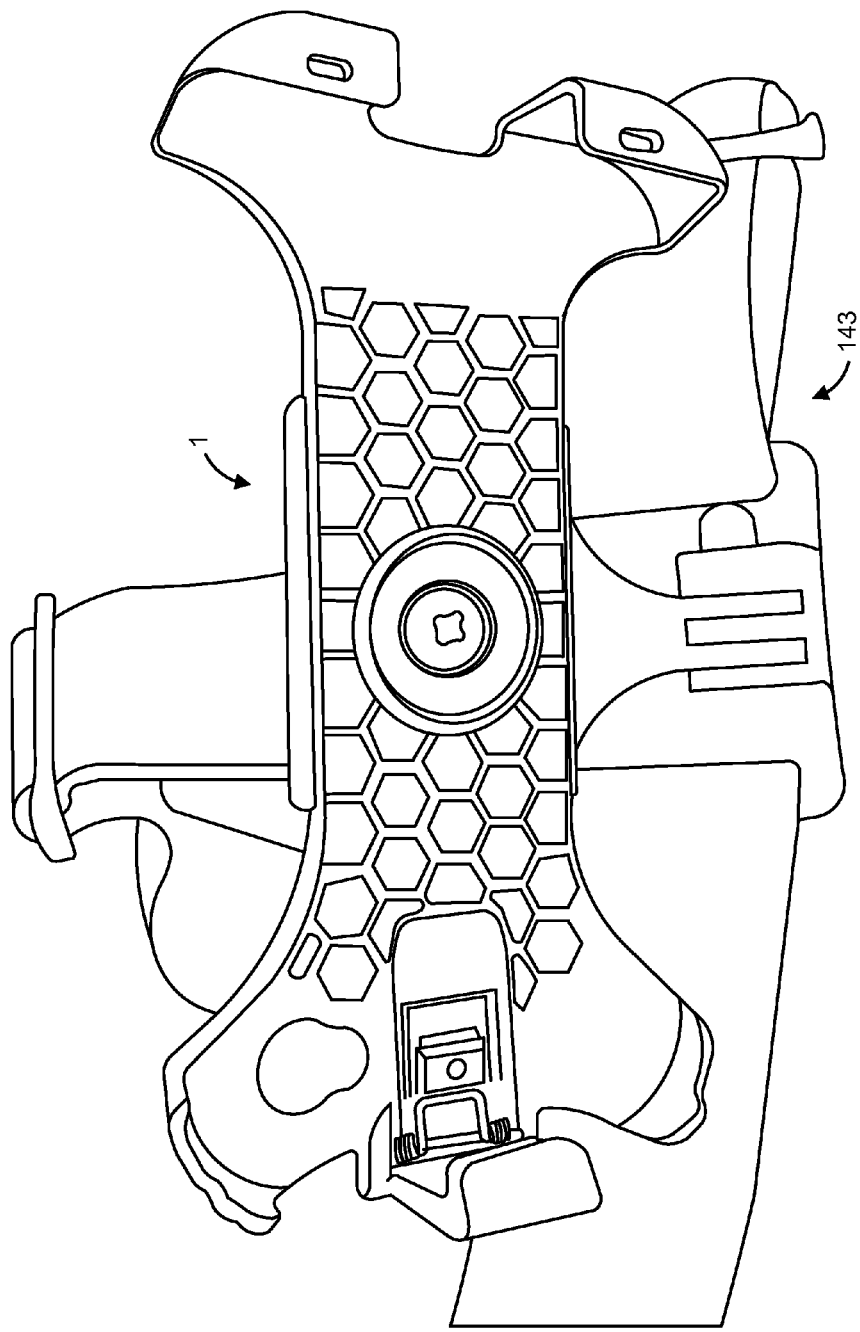
Figure 15C:
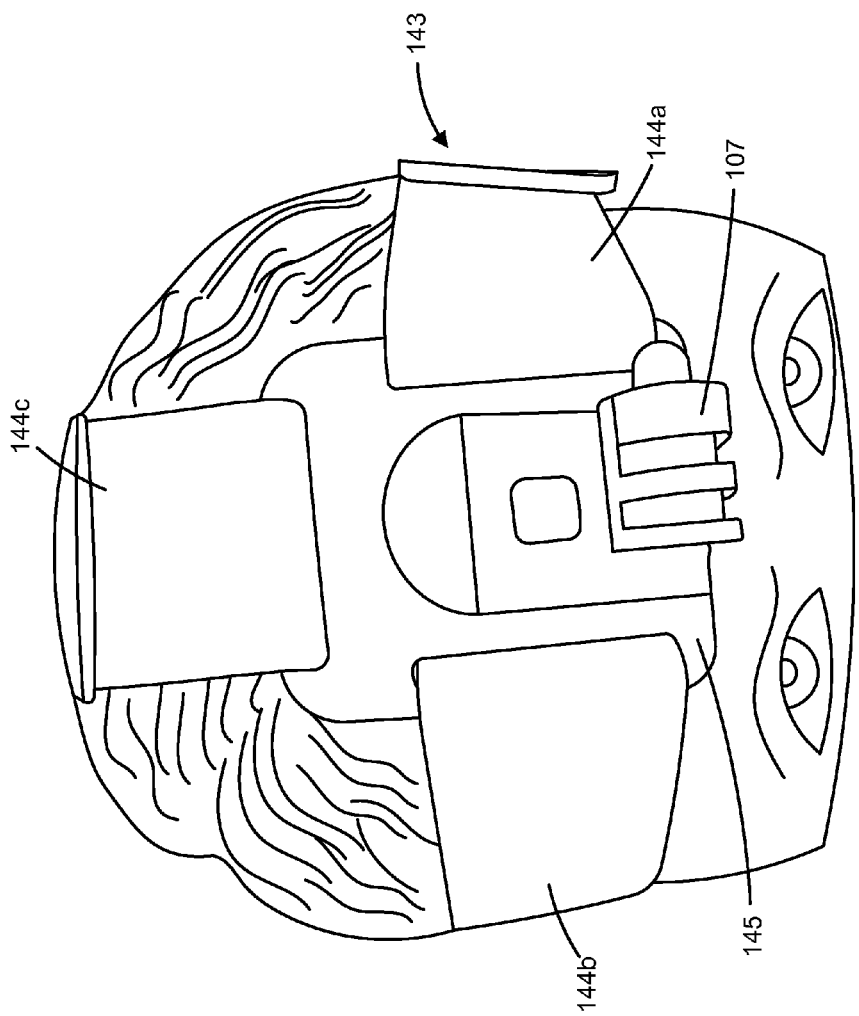
Figure 15D:
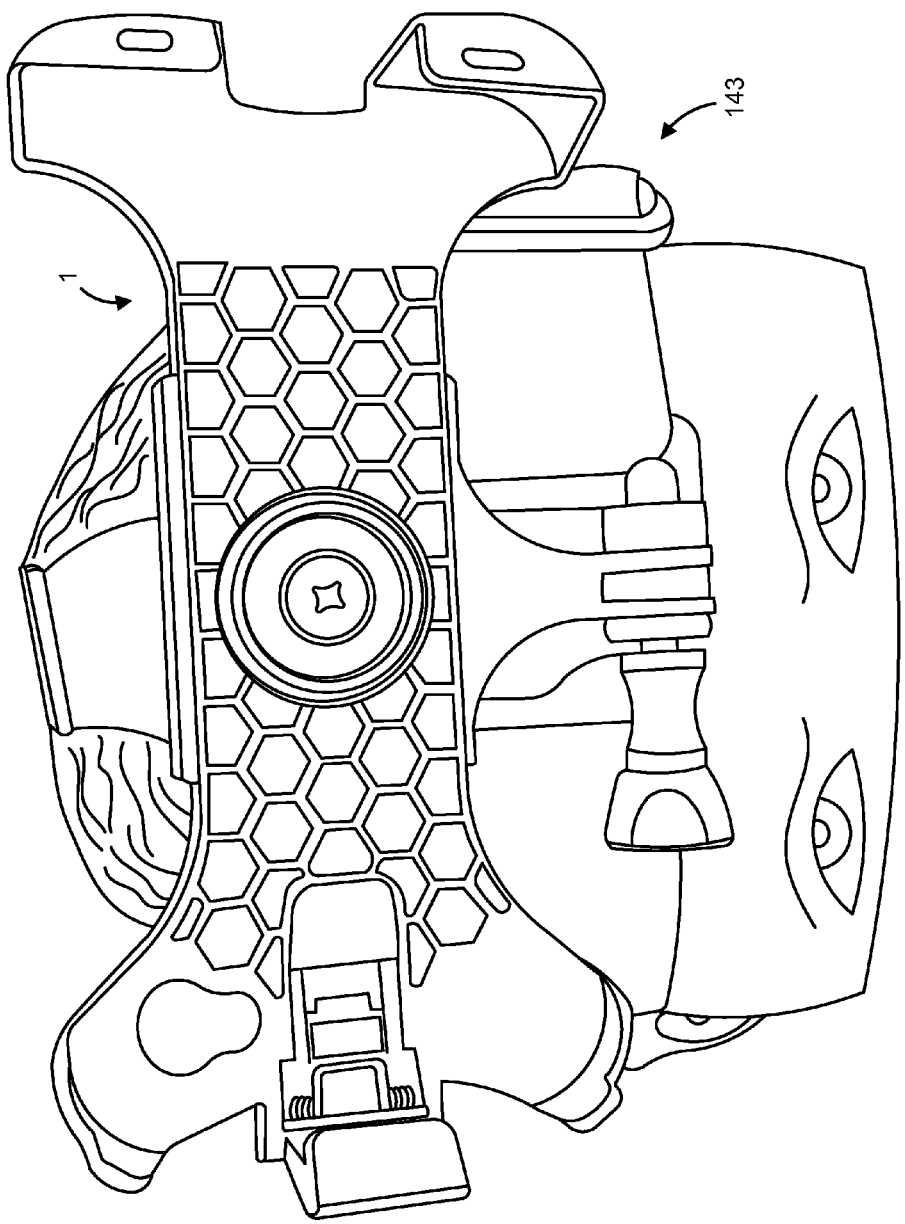

FIG. 15A shows a head harness system 143 for mounting the sled 1 to a human head. The head strap system 144 is attached to a mounting system 145 that is positioned on the head of the wearer. The mount 107 on the mounting system 145 is the same mount shown in FIG. 10B, however the mount could include the ball mount 98 shown in FIGS. 11C-F. The sled 1 is also shown in FIG. 15A. FIG. 15B shows the same head harness system 143 with the sled 1 attached. FIG. 15C shows the head harness system 143 as it would be arranged as worn by a person from the front. The left strap 144a, right strap 144b and top strap all contact the mounting system and pass to the back of the head of the wearer. FIG. 15D provides a view of the mounting system 143 with the sled 1 attached as worn by a person. The strap system 144 can be one as shown in FIGS. 14A-C or the strap system shown in FIGS. 7E-7Q could also be used.

Figure 16A:
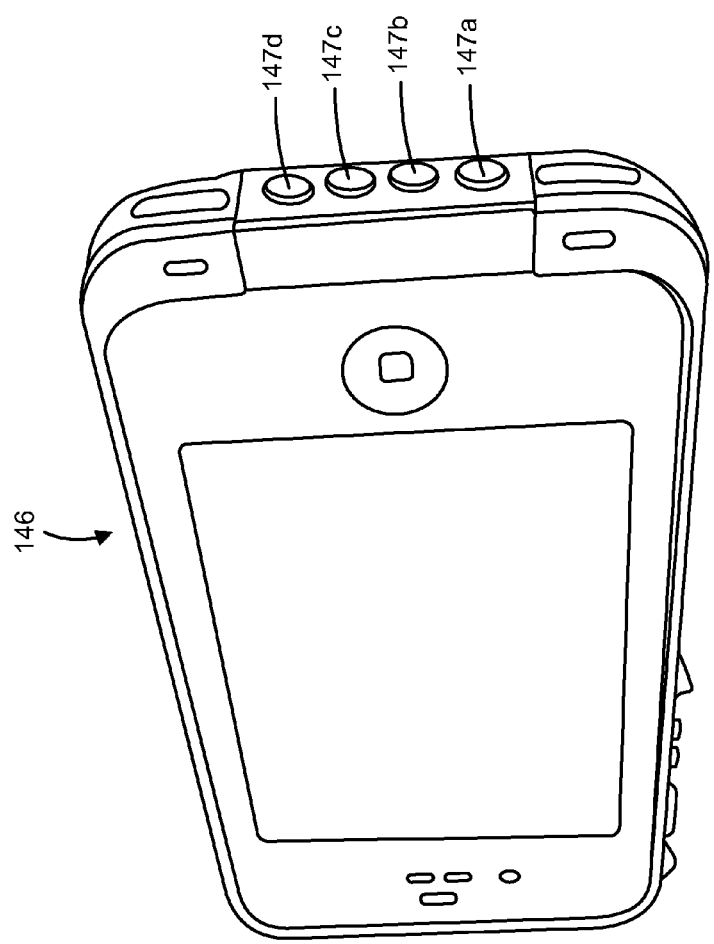
FIGS. 16A-16F are directed to implementations of an electrical device charging system for charging the electrical device as it is enclosed.
Figure 16B:
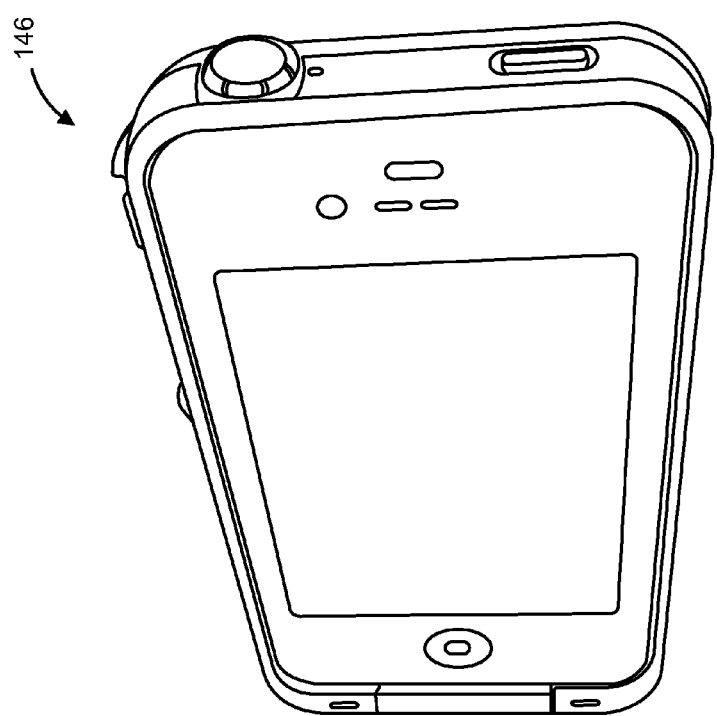
Figure 16C:
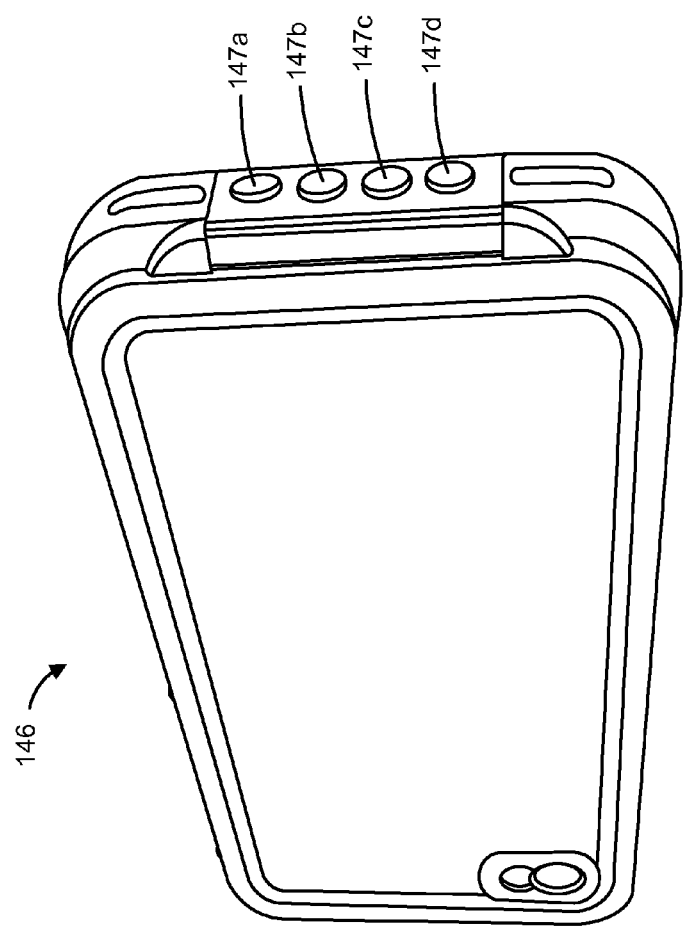
Figure 16D:
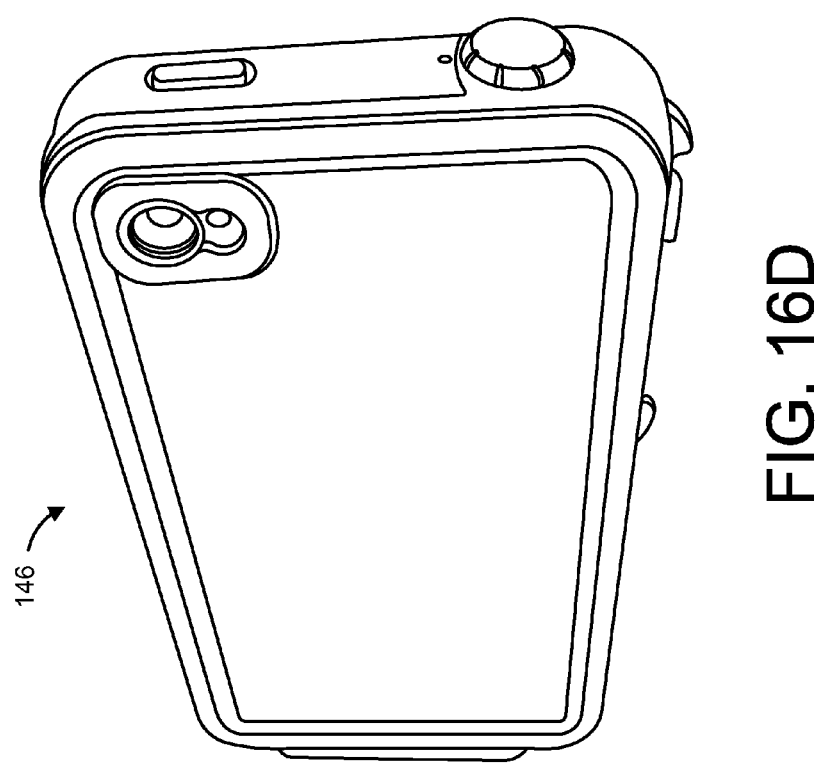
Figure 16E:
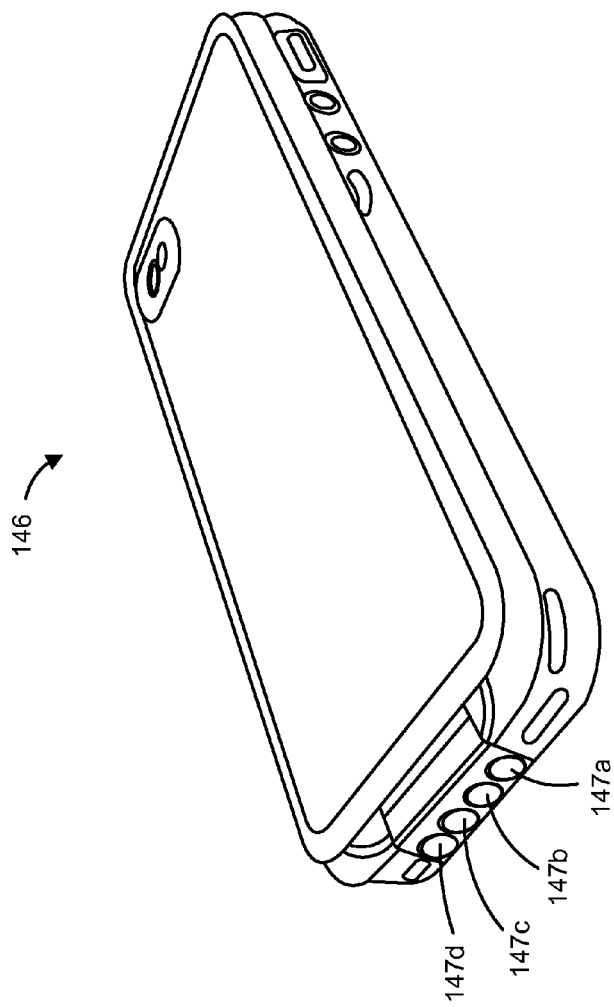
Figure 16F:
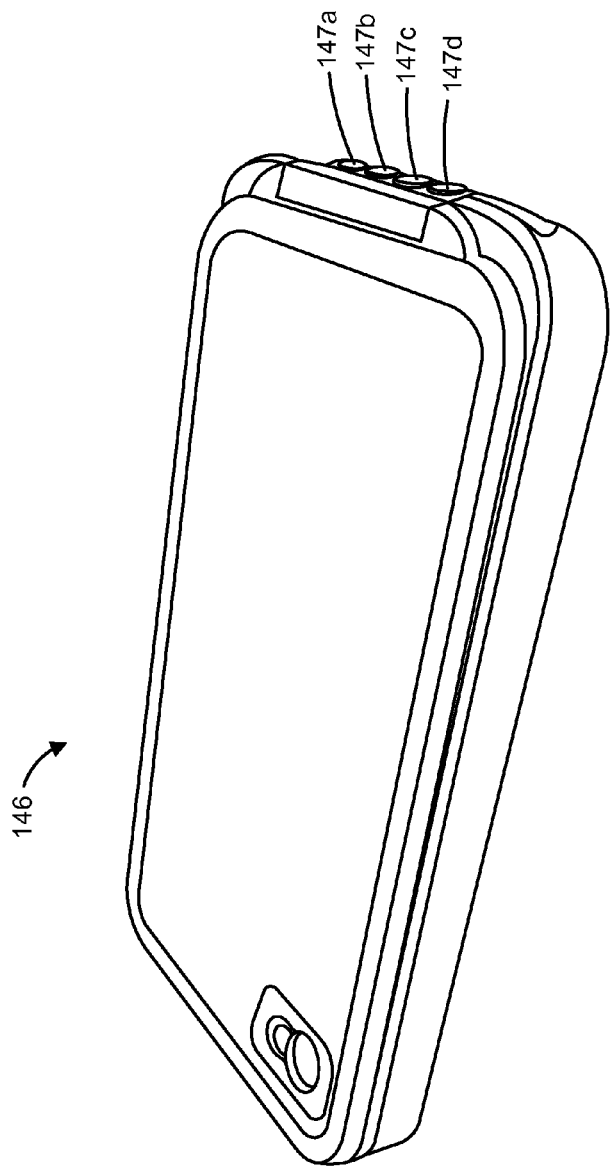

FIG. 16A provides a front proximal perspective view of a case with a charging system 146 that allows an electronic device contained within the case 146 without opening the case 146. The four connectors 147a, 147b, 147c and 147d at the bottom of the case 146 are electrically joined to the electronic device within the case 146. Two of the connectors are electrically + and − leads, while the other two connectors send and receive data. This arrangement of connectors is exemplary. Any arrangement could be used that allowed the electronic device to be charged without opening the case. FIG. 16B provides a front distal perspective view of the same case 146. FIG. 16C provides a rear proximal view of the same case 146. FIG. 16D provides a rear distal view of the same case. FIG. 16E provides a rear proximal view of the same case 146. FIG. 16F provides another rear proximal view of the same case.

Figure 17A:
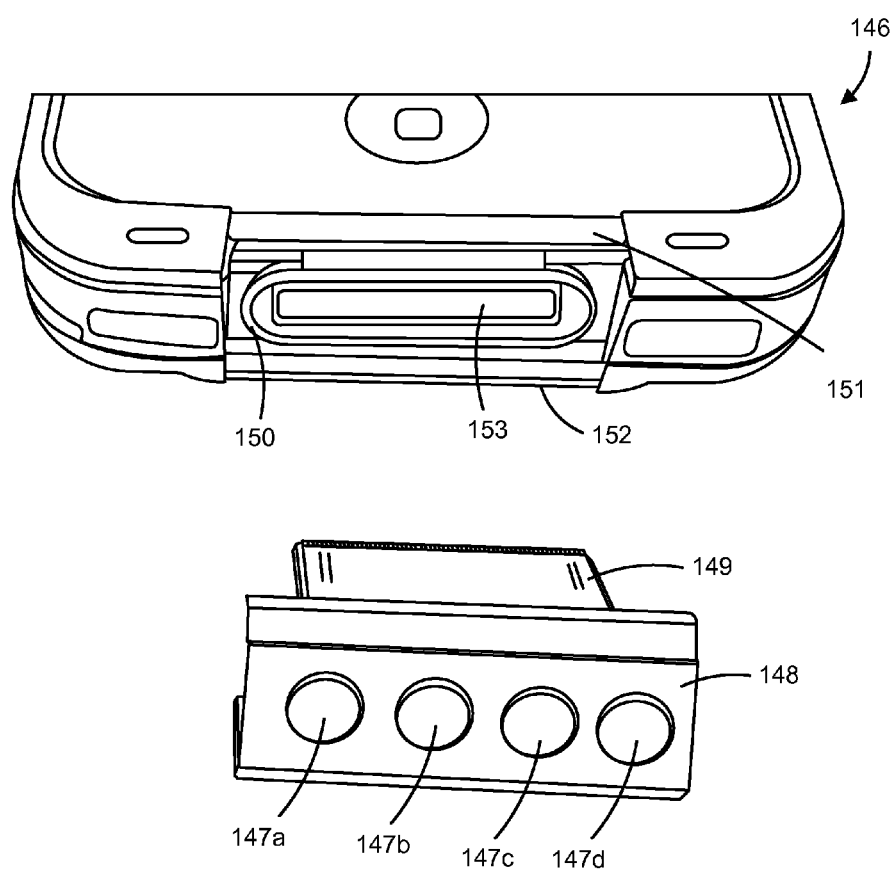
FIGS. 17A-17H are directed to other implementations of an electrical device charging system for charging the electrical device as it is enclosed.

FIG. 17A shows a front proximal view of the same case 146. Here, the proximal door 148 of the case 146 has been removed, showing the 30 pin connector 149 that interfaces with the electronic device to provide power and data syncing. The proximal aperture 150 of the case 146 is also shown. The proximal aperture 150 has a 30 pin socket 153 for insertion of the 30 pin connector 149. According to certain embodiments, the proximal aperture interacts with the proximal door 148 to create a water tight seal. Tabs on the front 151 and rear 152 sides of the case 146 allow the proximal door 148 to be attached securely to the case 146.

Figure 17B:
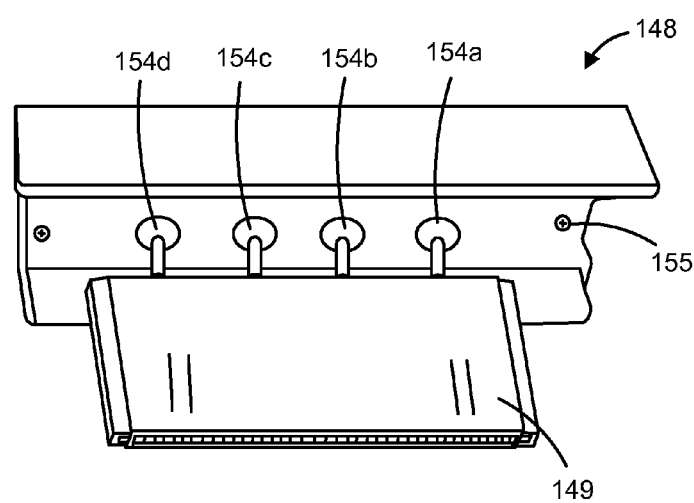
Figure 17C:
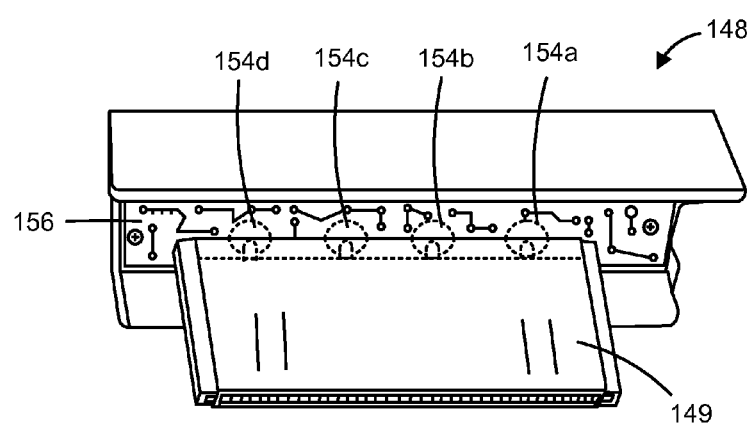
Figure 17D:
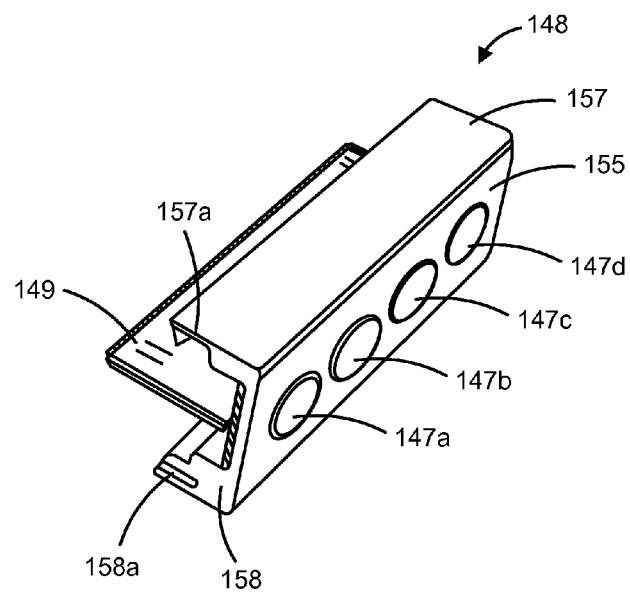

FIG. 17B shows the opposite perspective of the proximal door 148 of the case 146. The connection between the four connectors 147a, 147b, 147c and 147d that pass through the proximal wall 155 of the proximal door 148 and the 30 pin connector 149 are shown. The wires connecting the four connectors 154a, 154b, 154c and 154d with the 30 pin connector 149 are exaggerated in size to show the connection. FIG. 17C shows the same perspective with the four connectors 147a, 147b, 147c and 147d hidden behind a circuit board 156 and the wires 154a, 154b, 154c and 154d connecting the circuit board 156 and four connectors 147a, 147b, 147c and 147d with the 30 pin connector 149 are hidden behind the 30 pin connector 149. FIG. 17D provides a side perspective of the proximal door 148 of the case 146. The proximal door 148 has a U-shaped design. The front 157 and rear walls 158 of the proximal door 148 contain tabs 157a and 158a that allow the proximal door 148 to attach to the front 151 and rear 152 sides of the proximal aperture 150 and thereby attach to the case 146. These tabs 157a and 158a interact with the front 151 and rear walls 152 of the proximal opening 150 to create tension, holding the proximal door 148 in place when it is inserted into the proximal opening 150 in the case 146.

Figure 17E:
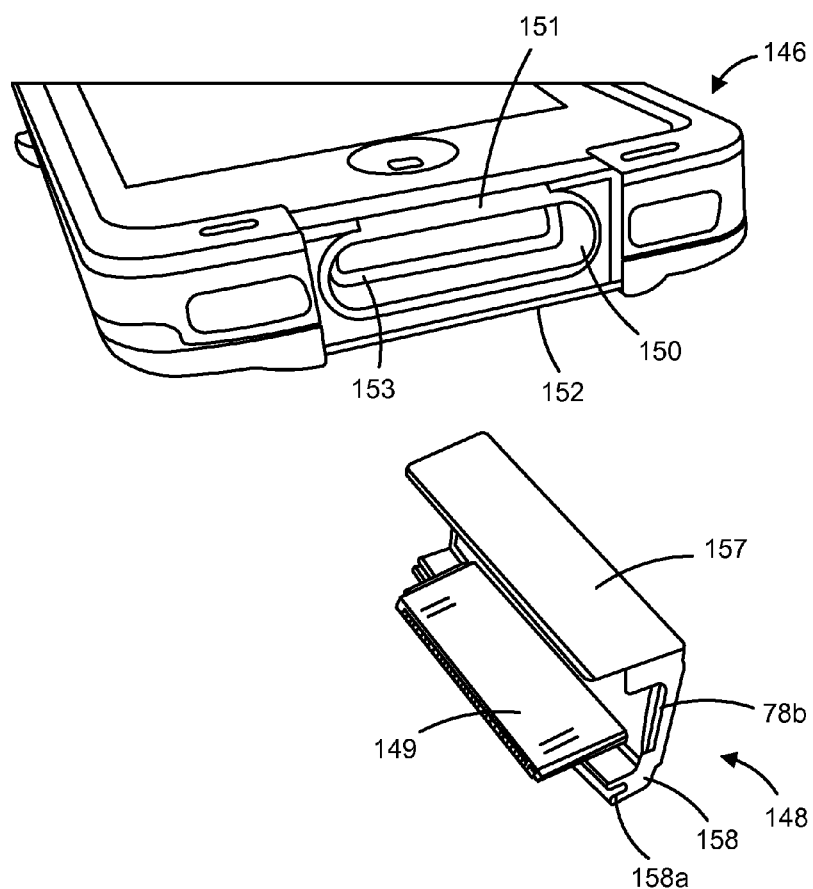
Figure 17F:
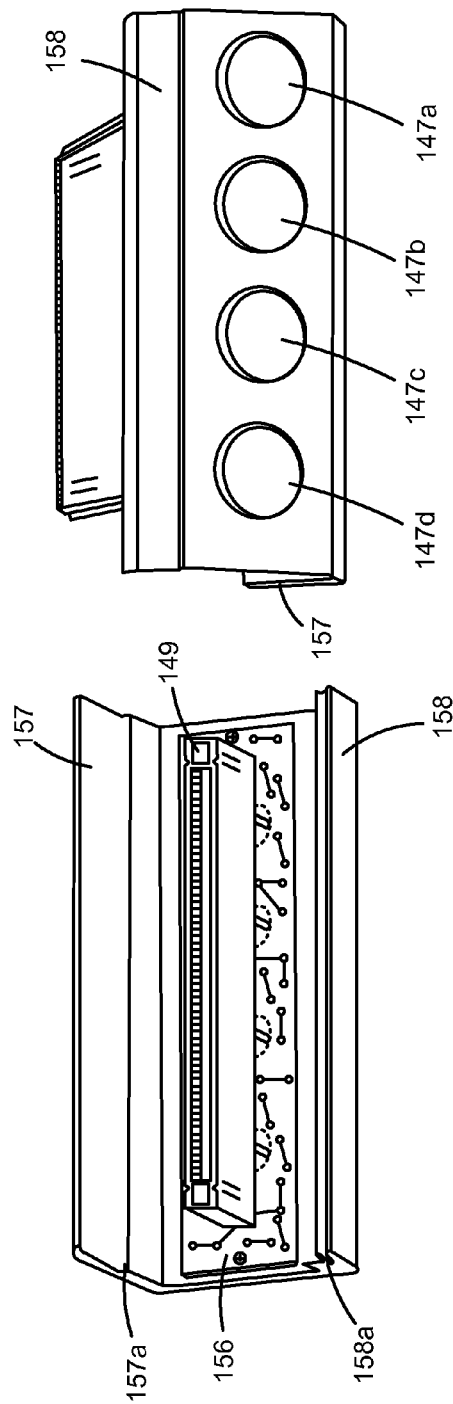
Figure 17G:
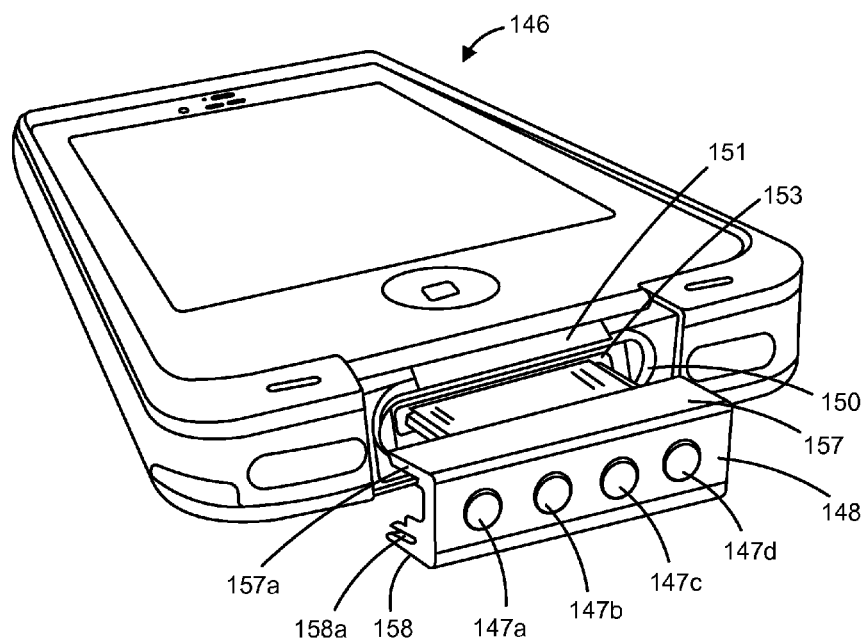
Figure 17H:
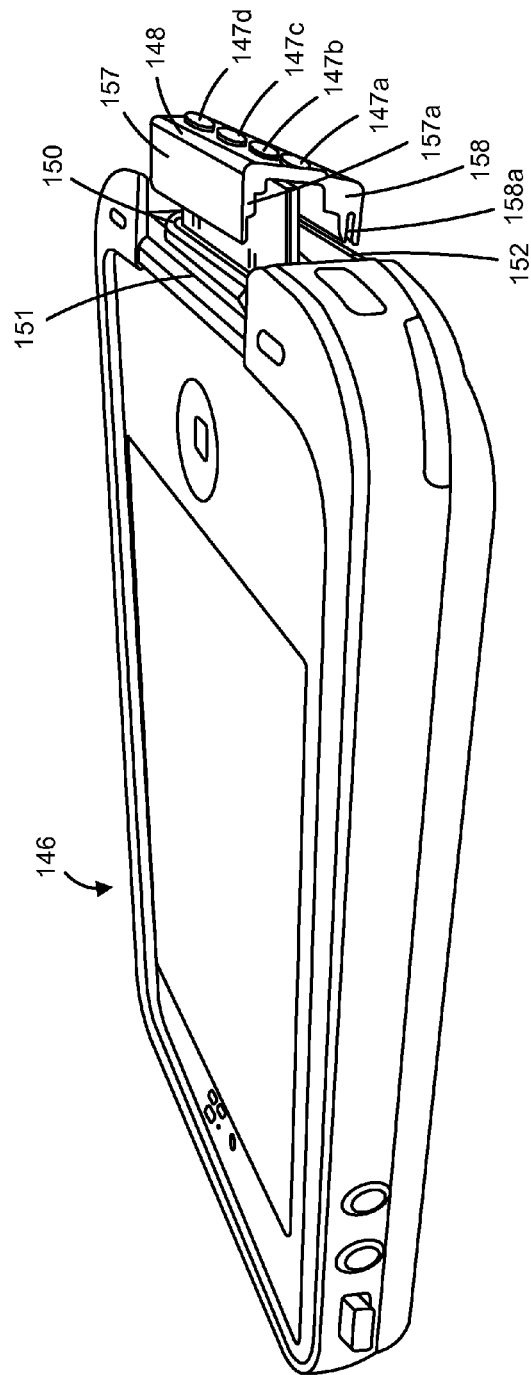

FIG. 17E provides a view of the proximal opening of the case 146 as well as a side view of the proximal door 148. FIG. 17F shows outside and inside perspectives of the proximal door 148. FIG. 17G shows the proximal door 148 being inserted into the proximal opening 150 of the case 146. FIG. 17H is a side view of the proximal door being inserted into the proximal opening of the case. The tabs 157a and 158a in the front 157 and rear walls 158 of the proximal door 148 are shown.

In some embodiments of the case, the proximal door is detachable from the case, and may or may not remain connected to the case by a tether. In some embodiments, the proximal door is attached to the case by a hinge. The proximal door may be chamfered in order to guide the door into the case and allow the interface connector (e.g. a 30 pin connector) attached to the proximal door to contact a port for a device in the case. A gasket may be affixed to either the proximal aperture or the proximal door to aid in creating a water tight seal. The circuit board in the proximal door may also aid in creating a water tight seal.

In some embodiments of the case, only two connectors may be used, for example as electrical + and − leads, or as connectors to send and receive data. In some embodiments, more than four connectors may be used. The connectors may be able to transmit digital, analog, or optical signal data, such as audio, video, control signals, security signals, biometric data, and the like. In some embodiments, the connectors may be able to transmit fluids, such as gas or liquid as part of supplying power from a fuel cell. The connectors may be proud, recessed, or flush with the edge of the case. The connectors may be tensioned or sprung.

The interface connector may be, for example, a 30 pin connector, a USB connector (standard, mini, or micro), a Lightning connector, or a DisplayPort connector (standard or mini). The connectors that pass through the proximal door are sealed to prevent liquid from passing through the proximal door. The connectors that pass through the proximal door may be constructed from any suitable material that can transmit a signal, such as beryllium copper. Preferably, the connectors are resistant to corrosion, and may be coated in a corrosion resistant substance, such as gold or gold alloy.

In some embodiments the proximal door may also contain an integrated circuit (IC) in communication with the interface connector. The IC may be an authentication IC that allows one or more software applications on the device to confirm that the case is in use with the device. The authentication IC may also confirm that the case is not a counterfeit. In some embodiments, an authentication IC is housed within the interface connector. In some embodiments, the authentication IC is housed in a sled, such as the sled shown in FIGS. 18A-C and described infra.

In some embodiments, the proximal door may also contain a sensor to ensure that a signal or electrical power only passes through when the case containing the device is actually docked. The sensor may have a transmitter, a receiver, or both a transmitter and receiver and communicates with the circuit board in the proximal door. The sensor may be any sensor suitable for detecting docking, such as an optical sensor, magnetic sensor, pressure sensor or voltage sensor. In some embodiments, a radio frequency identification chip (RFID chip) may be attached to the proximal door. The RFID chip may passive, active, or battery-assisted passive. The device inside the case, or another device, may be able to interrogate the RFID chip and receive radio signals transmitted therefrom. If the proximal door is detached from the case, the device in the case, or another device, may be able to detect the RFID chip in the proximal door when it is within the interrogation zone of the RFID chip, regardless of whether the proximal door is clearly visible to the user. In some embodiments, a sensor or RFID chip is housed in a sled, such as that shown in FIGS. 18A-C and described infra.

FIG. 18A provides a front perspective of a sled 1 that has been fitted with a charging system for an electronic device held inside the case 146 described in FIGS. 17A-17H or a case with similar power transmission mechanism in its proximal region. At the proximal end 162 of the sled 1 are four electronic posts 159 that correspond with four connectors in the proximal door 148 of a case for an electronic device. These posts 159 could be arranged to fit with any arrangement of connectors on the proximal door 148 or proximal end of a case. The four posts 159 are connected to a 12V car plug 161 by a wire 160. However, any plug to a power source could be used. A two prong or three prong plug for any wall socket could be used. Also, any data/power plugs that interact with a computer including USB and FireWire plugs could also be used.

Figure 18B:
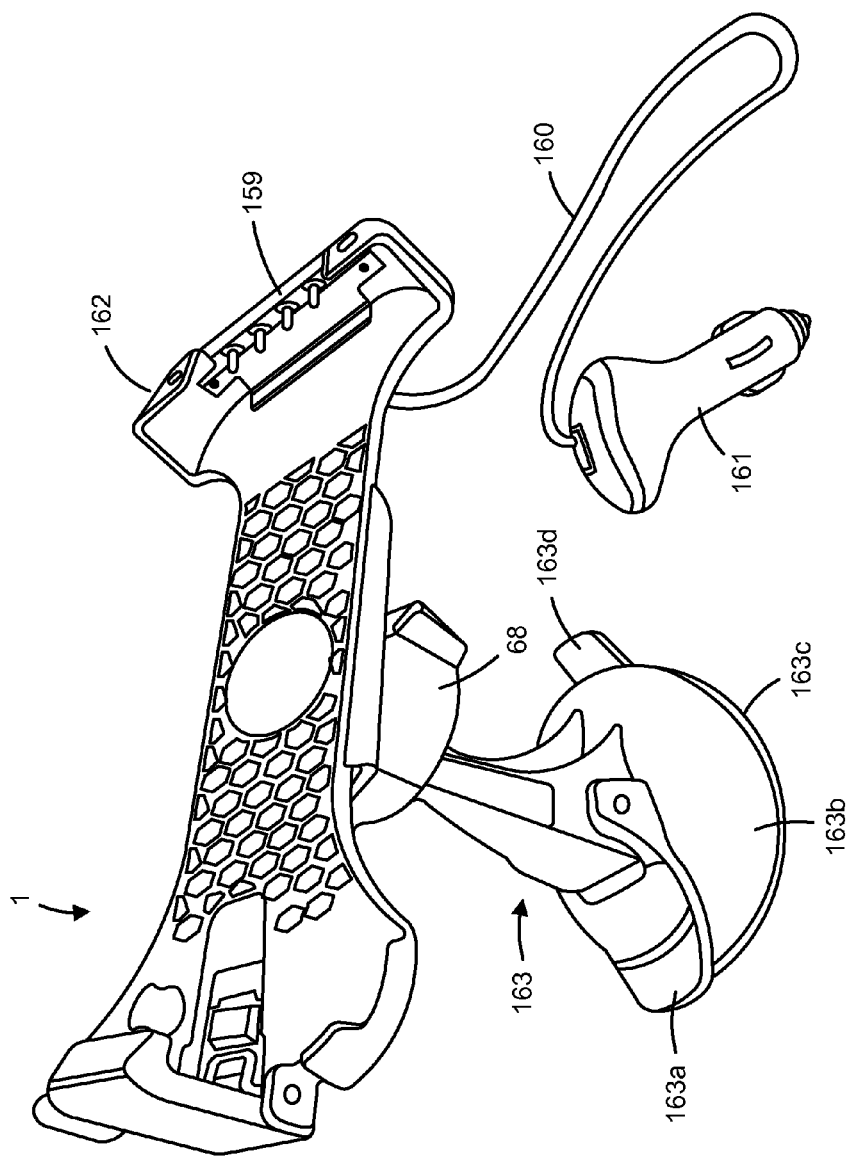

FIG. 18B shows the same sled 1 shown in FIG. 18A mounted on a suction cup base 163 via a ball mount. The suction cup base 163 is attached to the sled via a ball mount held within a tensioning element 68 attached to the sled 1. The suction cup base includes a suction cup 163c in which a vacuum is created using the vacuum lever 163a. The cup body 163b provides stability for the suction cup base 163 on the suction cup 163c. The suction cup tab 163d allows for easier removal of the suction cup 163c upon release of the vacuum lever 163a.

Figure 18C:
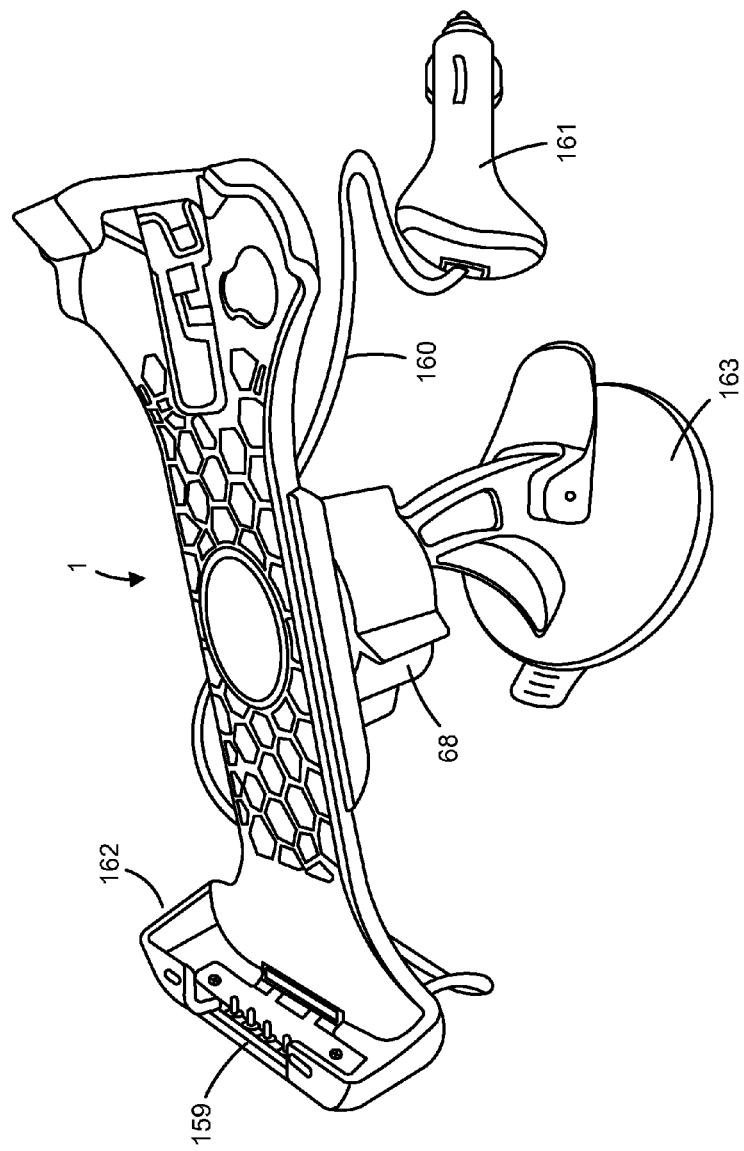
Figure 18D:
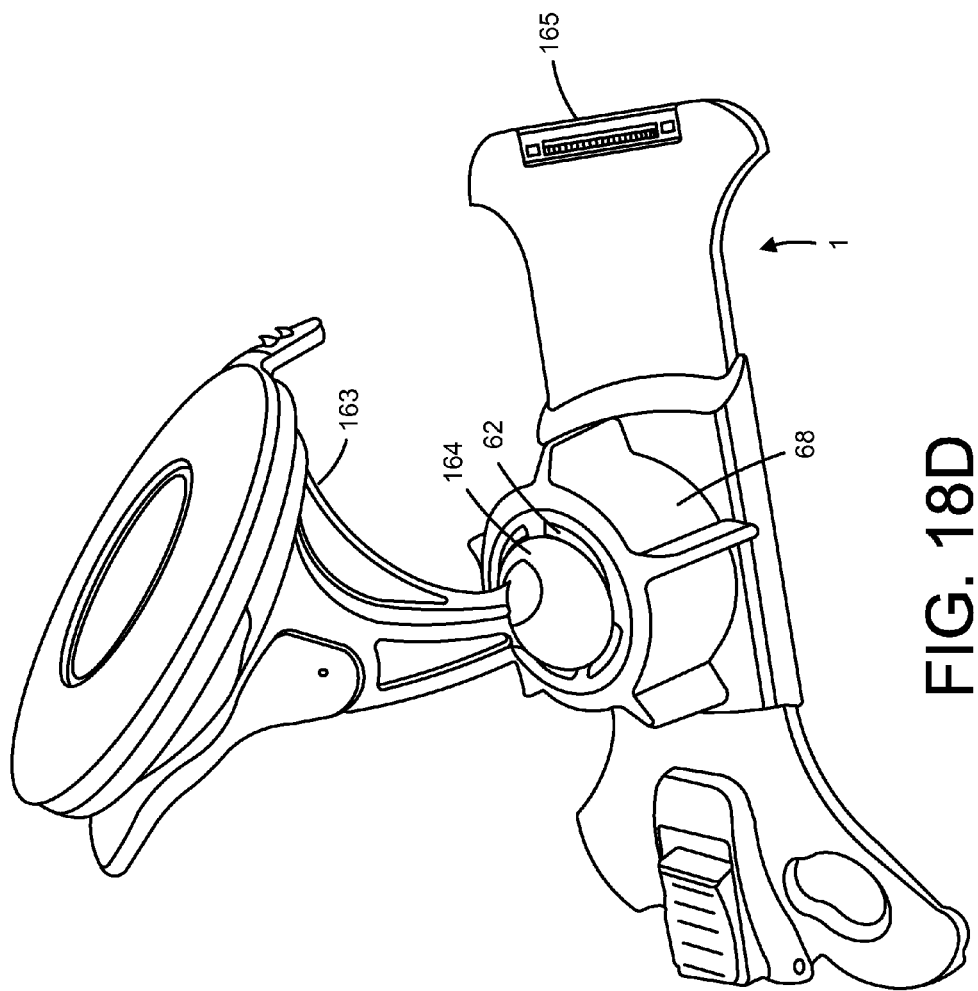

FIG. 18C shows the same sled 1 and suction cup base 163 from the opposite side. FIG. 18D shows the same sled with a suction mount from the bottom. From this perspective, the ball joint 164 can be seen within the ball attachment member receiving receptacle 62 surrounded by the tensioning member 68. This perspective also provides a view of a 30 pin socket 165 for powering and providing data connection to the four posts. This sled could be used with any mount, including those shown in FIGS. 11A-11F.

Figure 19A:
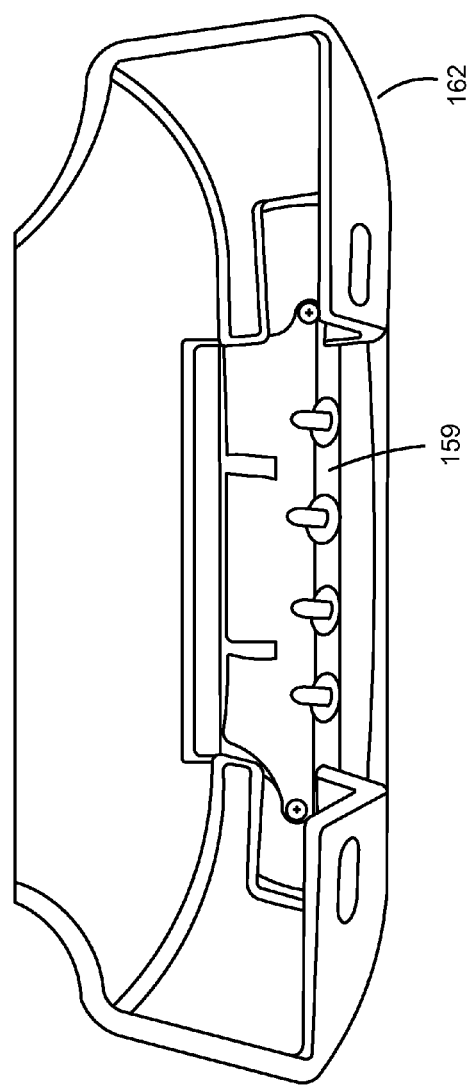
FIGS. 19A-19F are directed to other implementations of an electrical device charging system for charging the electrical device as it is enclosed.
Figure 19B:
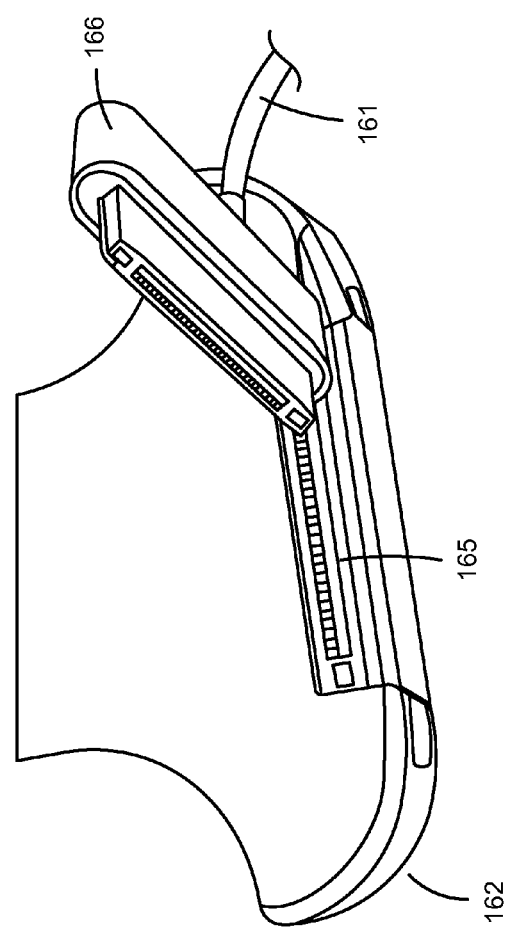
Figure 19C:
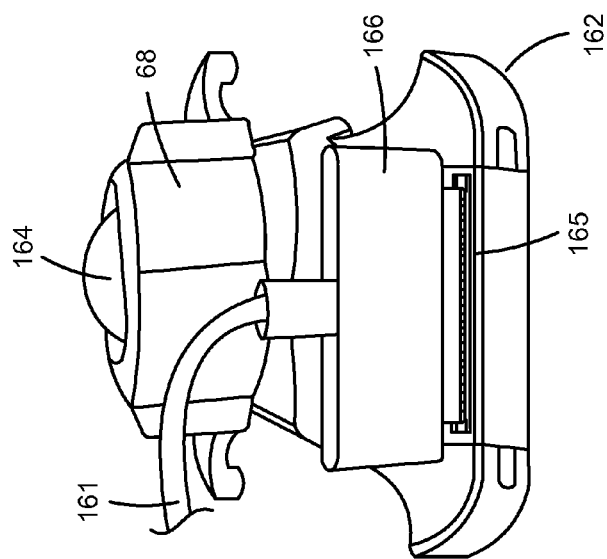
Figure 19D:
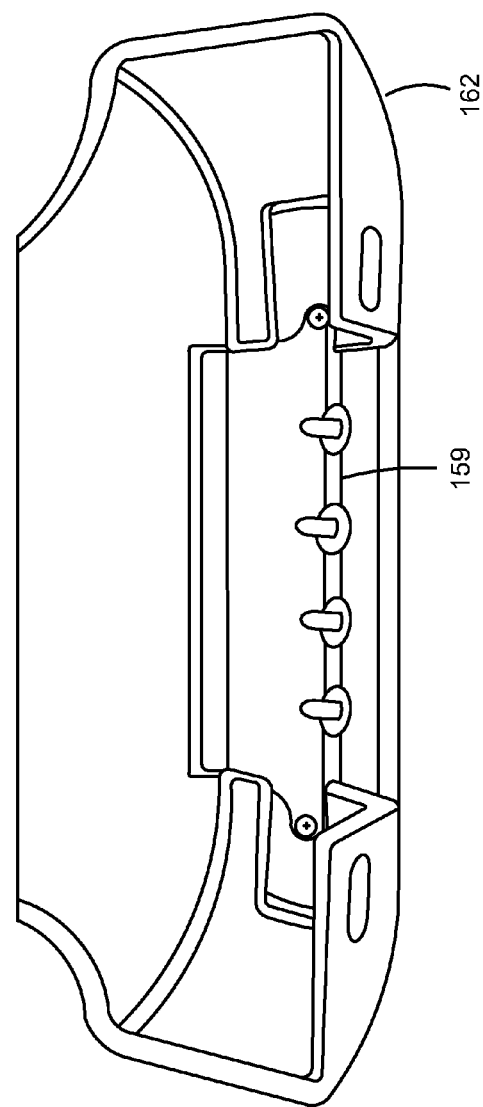
Figure 19E:
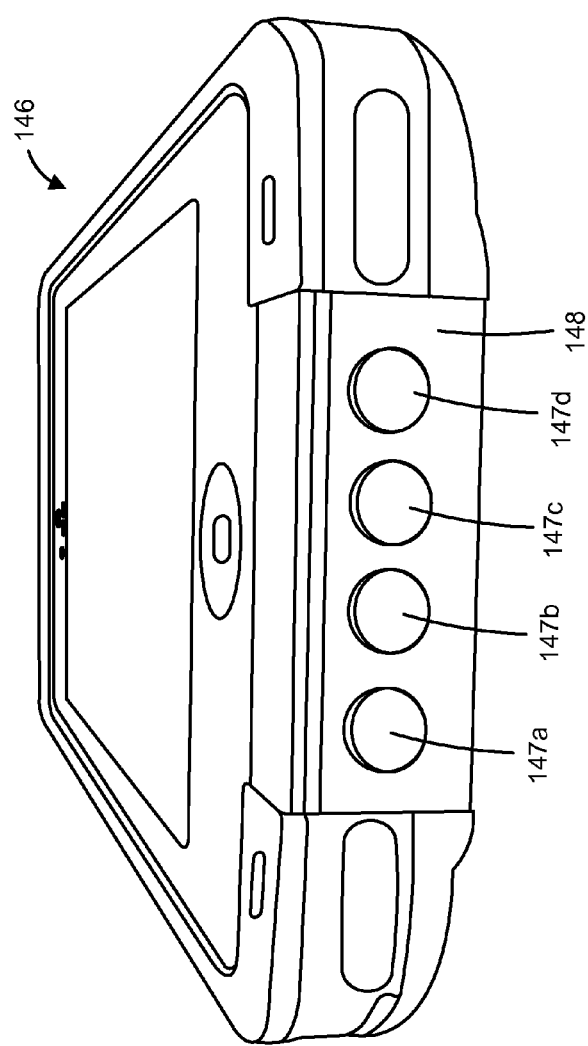
Figure 19F:
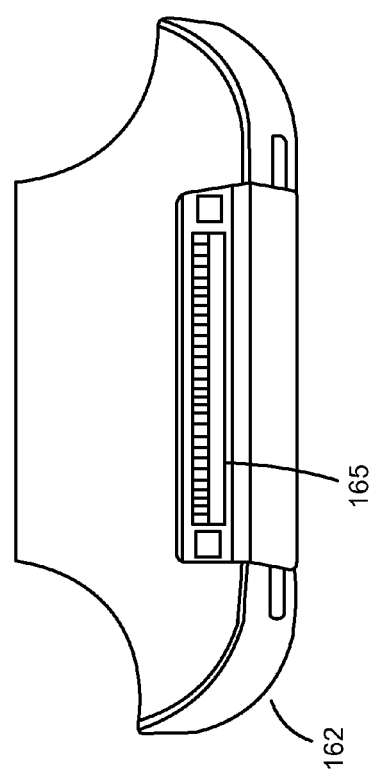

FIG. 19A shows a magnified view of the four posts 159 on the proximal end 162 of the sled 1 that interact with four connectors on the proximal end of a case. The posts are held inside the proximal corners of the sled 1. FIG. 19B shows the back proximal end of the sled. This end has a socket for a 30 pin connector 165 to connect the four posts 159 to power and/or data. Also shown is a 30 pin connector 166 that could connect via the wire to a plug for transmission of power or data. FIG. 19C shows a 30 pin connector 166 being inserted into the socket 165 on the proximal rear end 162 of the sled 1. Also shown is the tensioner 68 surrounding the ball joint 164. FIG. 19D shows a magnified view of the four posts 159 on the sled 1 that interact with the four connectors 147a, 147b, 147c and 147d on the proximal door 148 of the case 146. FIG. 19E provides a front proximal perspective view of a case 146 with a charging system that allows an electronic device contained within the case without opening the case. FIG. 19F shows the same view as FIG. 19B without the 30 pin connector plug.

Figure 20B:
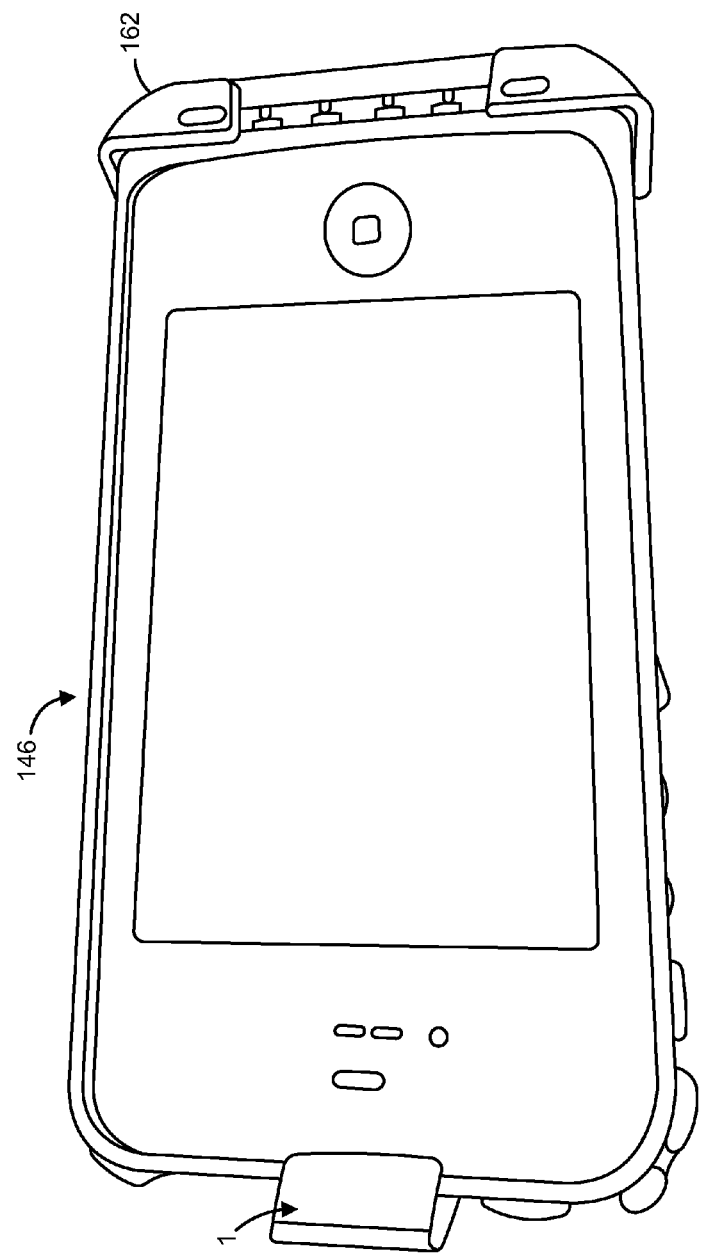

FIG. 20A shows the sled 1 with the four posts 159 and the case 146 with the four connectors 147a, 147b, 147c and 147d on its proximal door 148. The suction cup base 163 is also shown. FIG. 20B shows how the case 146 fits into the sled 1.

Figure 21A:
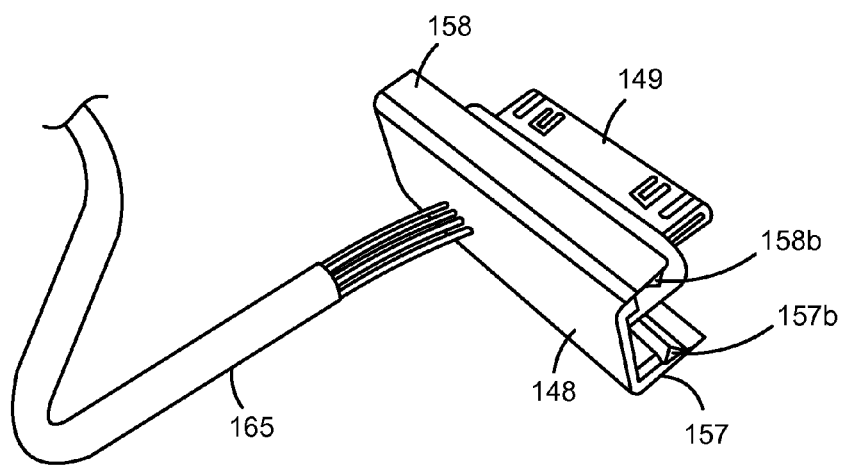
FIGS. 21A-21G are directed to other implementations of an electrical device charging system for charging the electrical device as it is enclosed.
Figure 21B:
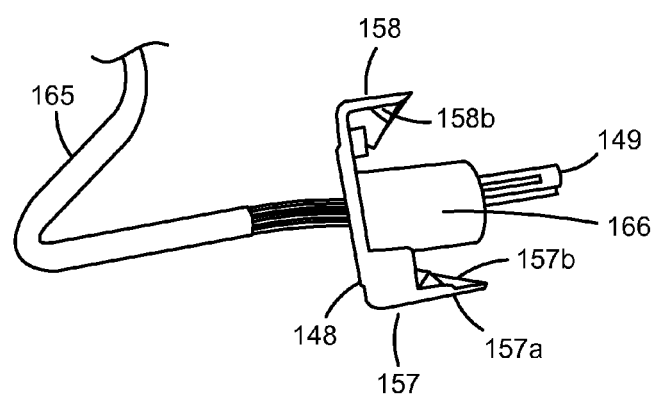
Figure 21C:
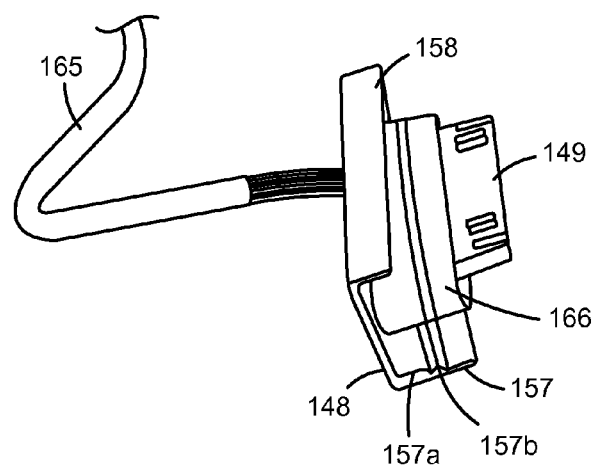

FIG. 21A shows an embodiment, where the proximal door 148 is directly connected to a source of power/data transmission via a wire 165. In this embodiment, the inner walls 157 and 158 of the door have triangular tabs 157b and 158b on them that assist the proximal door 148 in attaching to the proximal opening 150 on the case 146. FIG. 21B is a side view of the same proximal door 148. The proximal door 148 is the same as described above, except that the four connectors are replaced with a plug directly wired 165 to a power source or data transmission source. In certain embodiments, an O-ring is placed around the inner door plug 166 from which the 30 pin connector 149 extends. This O-ring enhances the waterproof aspect of the case. Also shown are the triangular tabs in the front 157b and rear walls 158b of the proximal door 148. The front wall tab 157a is also present. FIG. 21C is a perspective view of the proximal door.

Figure 21D:
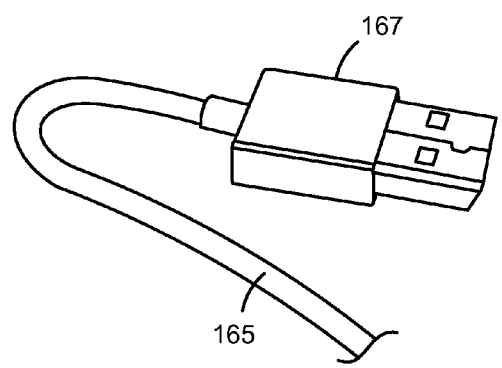
Figure 21E:
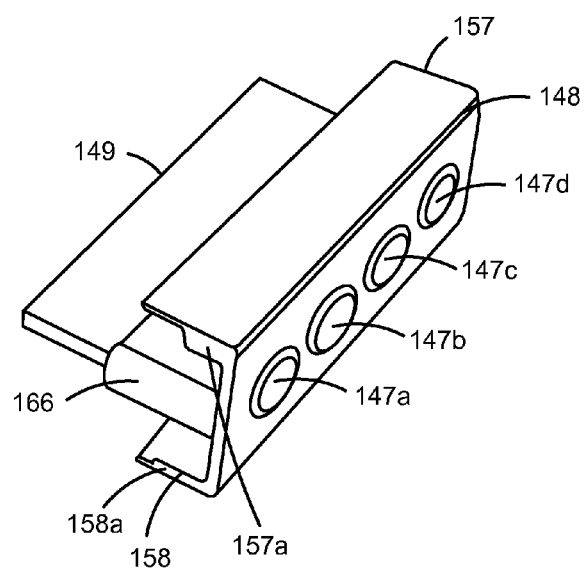
Figure 21F:
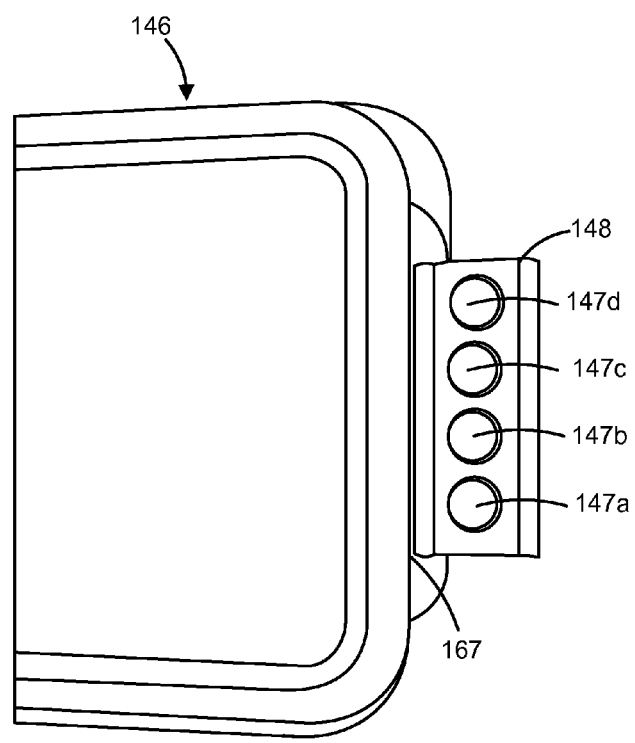
Figure 21G:
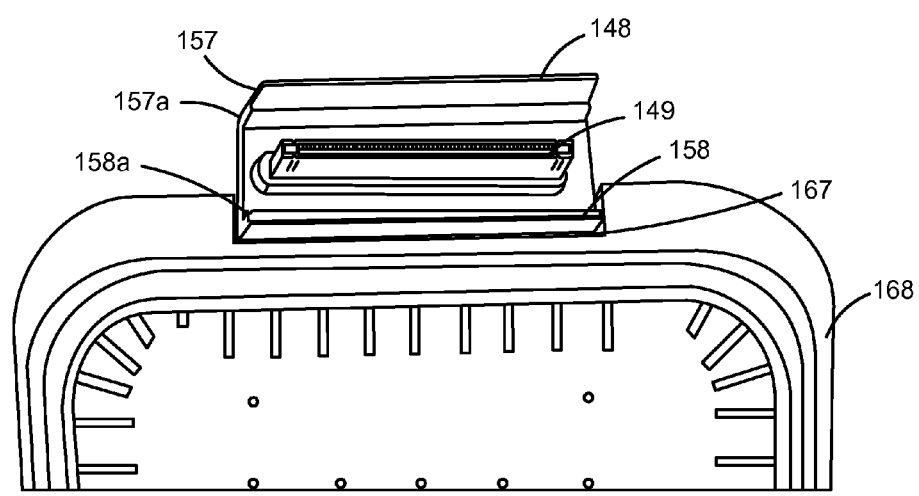

FIG. 21D provides a side perspective of a USB connector 167. In certain embodiments, this USB connector 167 is used to connect the wire 165 integrated into the proximal door 148 to a computer or plug for access to a power or data source. FIG. 21E provides a proximal side view of the proximal door 148. In this embodiment, the triangular tabs 157b and 158b are absent on the front 157 and rear 158 sides of the proximal door 148. In this embodiment, the tabs 157 and 158a shown on the front 157 and rear 158 sides of the proximal door 148 hold the door in place when it is inserted into the proximal aperture 150 of the case 146. FIG. 21F provides a rear view of the case 146 showing an additional embodiment of the proximal door 148. In this embodiment, the proximal door 148 is attached to the case 146 by a hinge 167. FIG. 21G shows a front view of the back half of the case 168 with the attached proximal door 148 attached via a hinge 167. This embodiment has the curved tabs 157a and 158a shown in FIG. 21E.

Figure 22A:
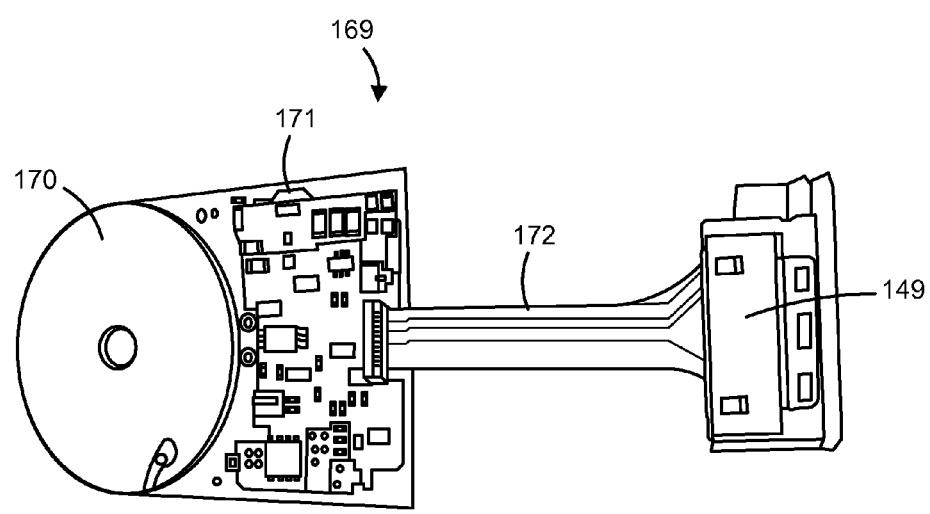
FIGS. 22A-22M are directed to other implementations of an electrical device charging system for charging the electrical device as it is enclosed.
Figure 22B:
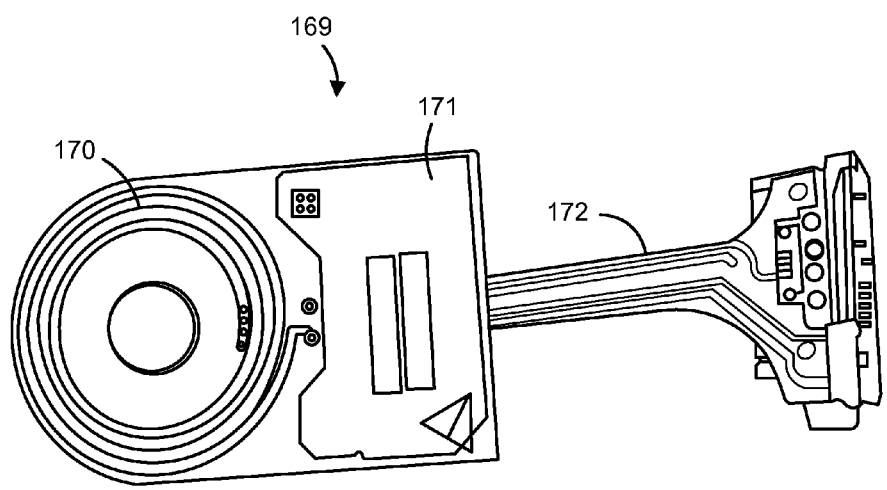

FIG. 22A shows a front view an inductive coil 170 that, in certain embodiments, is installed into the cases 146 described, herein. The inductive coil 170 allows for charging of the electronic device inside the case 146 without opening the case 146. Indeed, the inductive coil 170 allows for charging of the electronic device without penetrating the case 146 with a wire of any kind The inductive coil 170 is linked to a 30 pin plug 149 via a circuit board 171 and wires 172. When the inductive coil in the case is in sufficient proximity to a second induction coil connected to a power source, the proximity of the two induction coils forms a transformer and allows a charging voltage to be supplied to the device. In some embodiments, the inductive coil is connected to another type of connector or plug capable of supplying power to the device, such as a USB connector (standard, mini, or micro) or a Lightning connector. The 30 pin connector 149 can be inserted into the electronic device or into an adapter in the case 146 to charge the device from the coil 170. FIG. 22B shows a rear view of the same inductive coil 170. In some embodiments, the connector or plug for supplying power is part of a waterproof proximal door, such as that described supra and in FIGS. 16-17. In some embodiments, the case lacks a proximal door and the connector for supplying power is attached directly to the case.

Figure 22C:
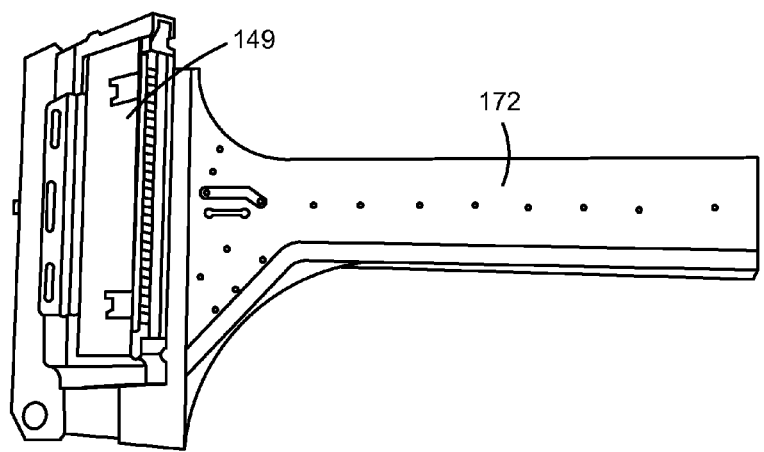

FIG. 22C provides a front detailed view of the wire 172 and 30 pin connector 149. The 30 pin connector 149 is pointed back toward the inductive coil 170. Thus, the electronic device can plug into the connector 149 on its proximal end and be laid on top of the coil 170

Figure 22D:
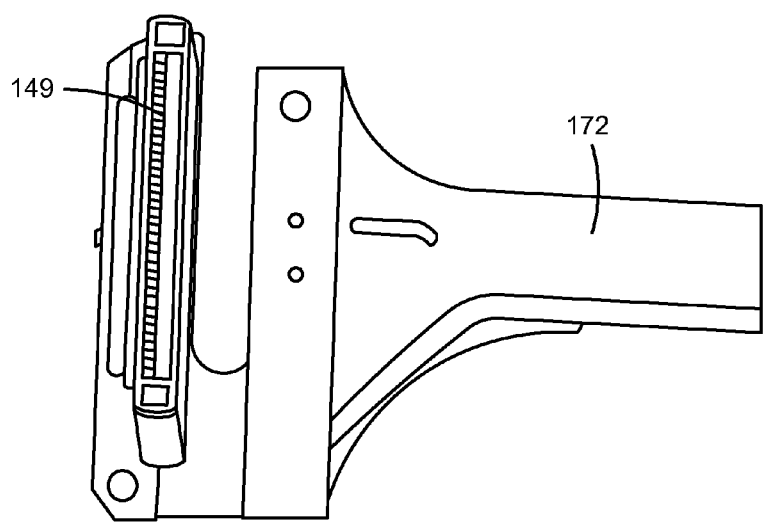

FIG. 22D shows a rear detailed view of another embodiment of the wire 172 and 30 pin connector 149. In this embodiment, the 30 pin connector 149 projects 90 degrees from the wire 172 perpendicular to the surface of the wire 172 and the inductive coil 170. This orientation is appropriate for electronic devices with a connector on their rear surface or for interacting with an adapter that plugs directly into the electronic device.

Figure 22E:
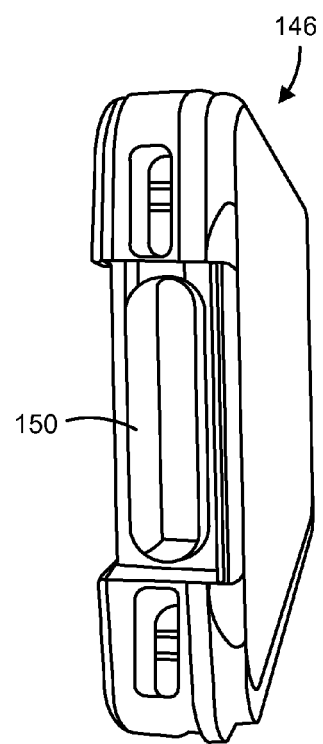
Figure 22F:
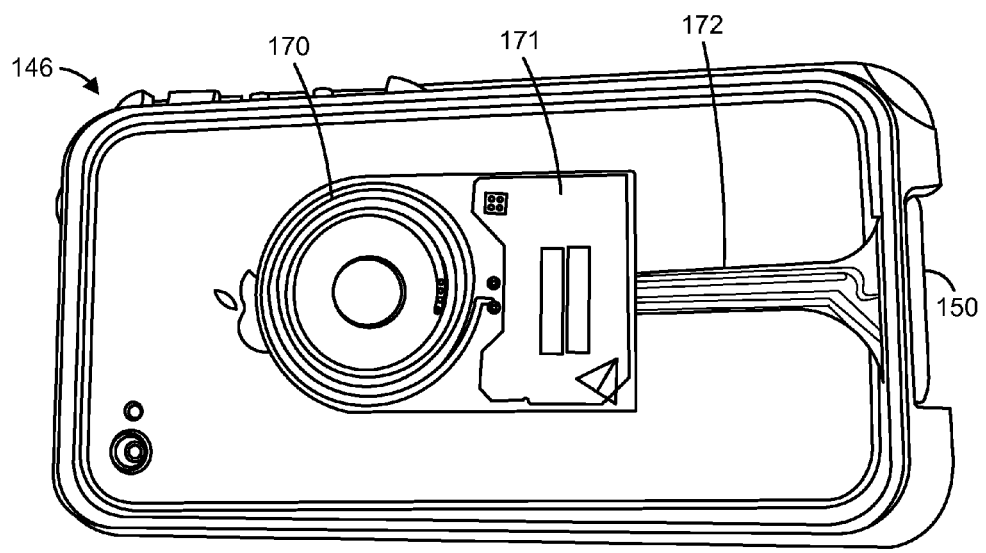
Figure 22G:
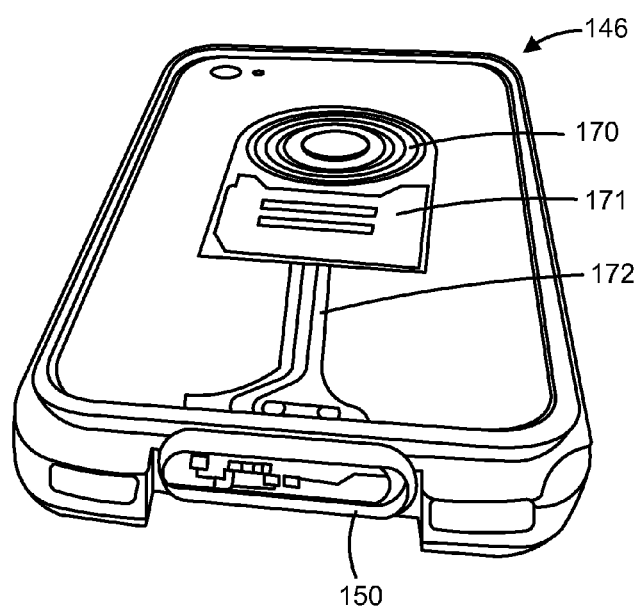
Figure 22H:
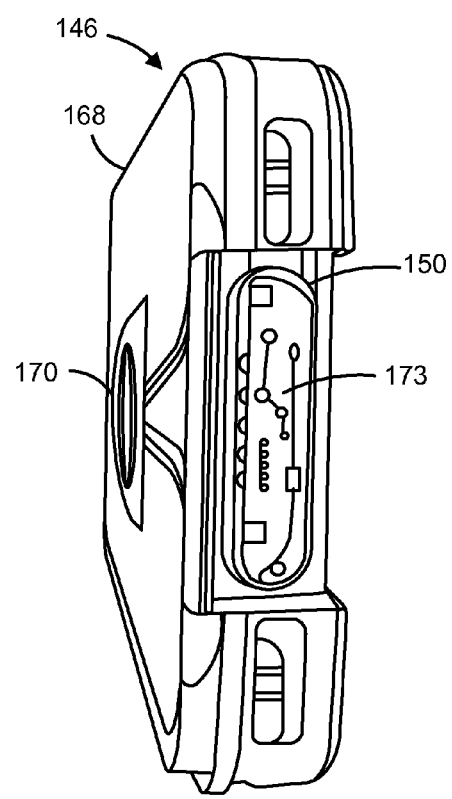
Figure 22I:
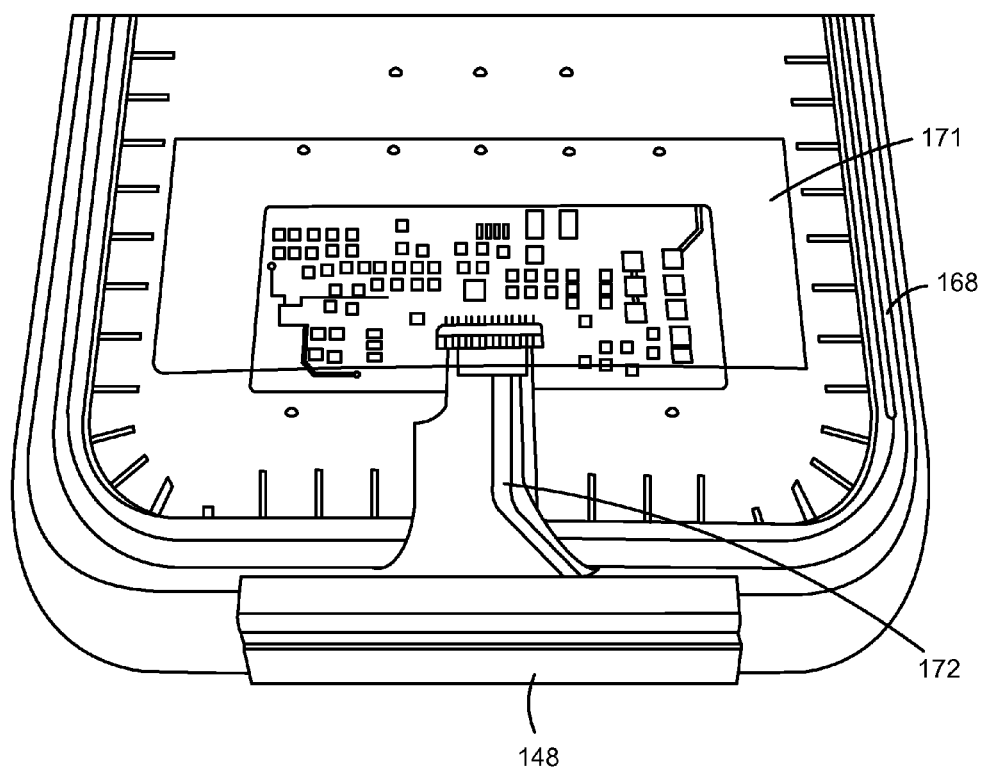
Figure 22J:
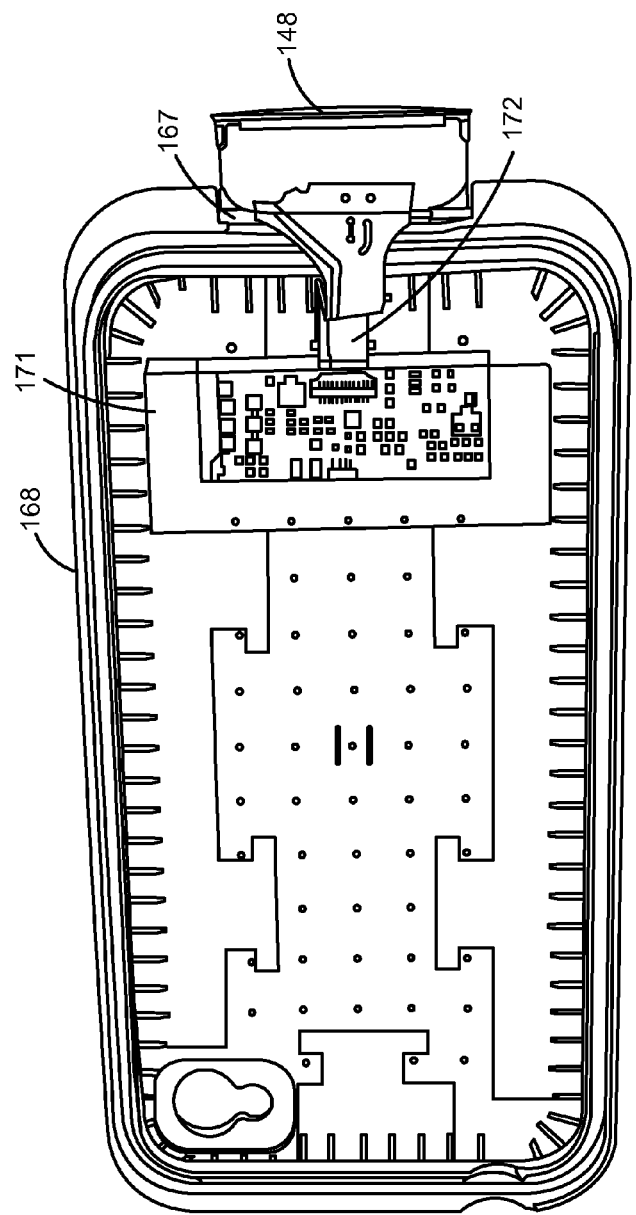
Figure 22K:
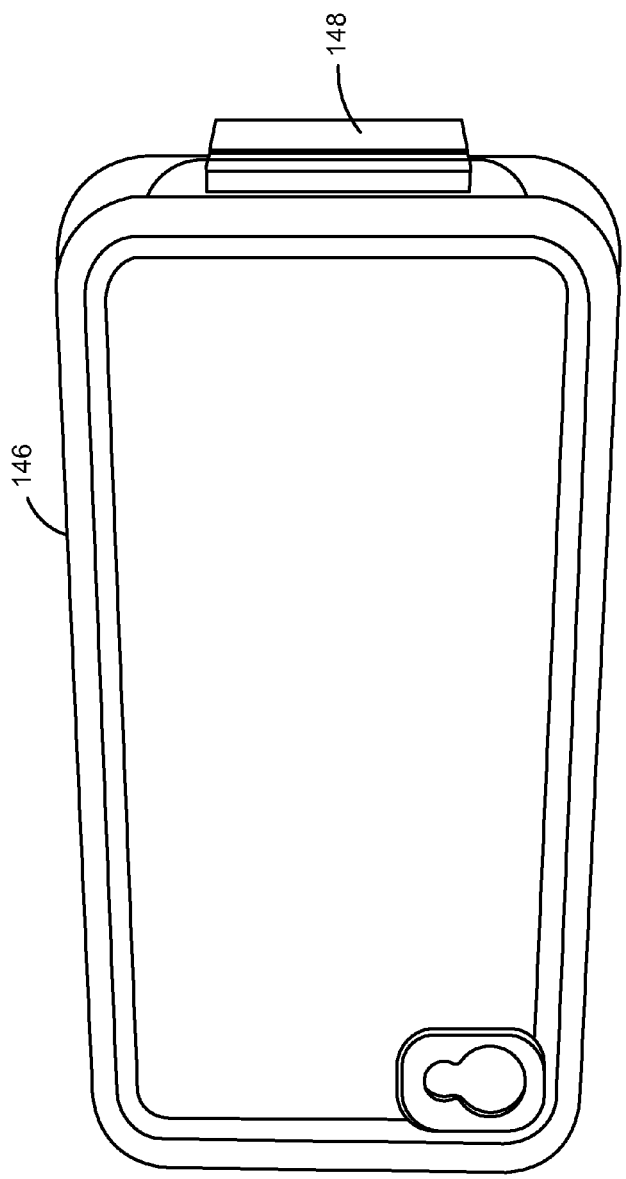

FIG. 22E provides a proximal rear perspective of the case 146 including an inductive coil 170. This proximal end of the case has a proximal aperture 150 that has not been covered by a proximal door 148. FIG. 22F shows the inductive coil 170 shown in 22B positioned along the rear portion 168 of a case 146. The wire 172 extending from the coil 170 enters the proximal aperture 150 at the proximal end of the case 146. FIG. 22G provides a rear proximal view of the case 146 with the shape of the inductive coil 170 shown through the surface of the rear portion 168 of the case. The circuit board 171 at the proximal end of the wire 172 extends from the inductive coil 170 to the proximal aperture 150. FIG. 22H provides a proximal view of the case 146 showing the interior of the proximal aperture 150 and the circuit board 173 within. Again, the inductive coil 170 is shown through the rear surface of the rear portion 168 of the case 146. FIG. 22I is a front view of the proximal end of the rear portion 168 of the case 146. Here, the circuit board 171 is shown while the inductive coil 170 is hidden, embedded in the rear wall of the rear portion 168 of the case 146. The proximal door 148 is configured with a hinge 167 and is shown closed. FIG. 22J provides a perspective view of the rear portion 168 of the case 146 with the inductive coil 170 embedded in the rear wall of the rear portion 168 of the case 146. The proximal door 148 is shown configured with a hinge 167 and open. In some embodiments, the proximal door is not connected to the case, or is linked to the case via a tether. The circuit board 171 is connected to the door 148 by a wire 172. FIG. 22K shows the rear view of the case. The inductive coil and associated circuitry is embedded inside the wall of the case 146.

Figure 22L:
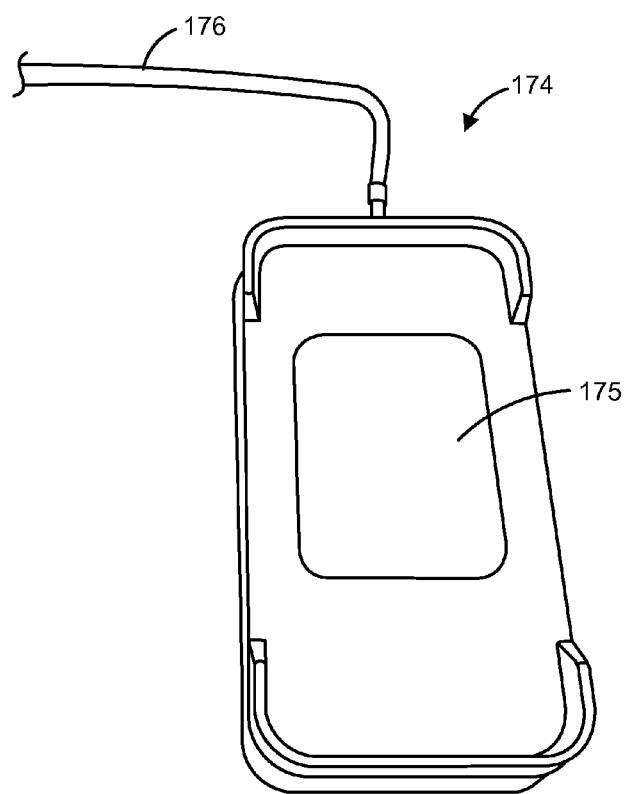
Figure 22M:
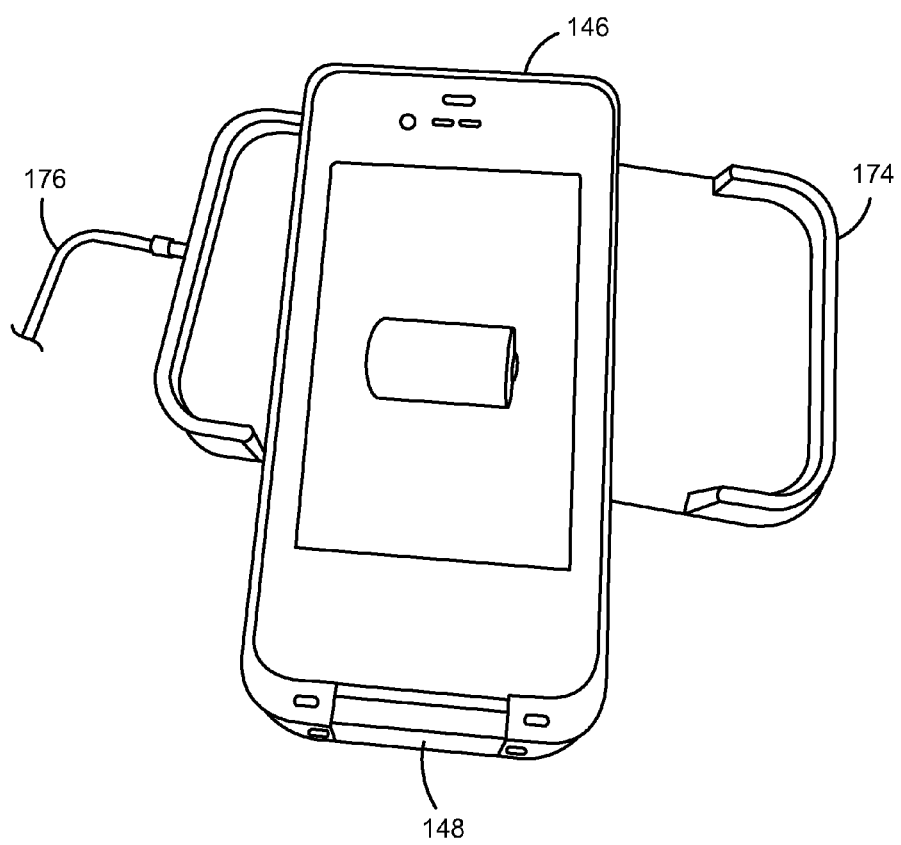

FIG. 22L shows a charger 174 that is associated with the inductive coil embodiment of the case 146. The charger 174 is shaped to hold the case 146 over a second induction coil 175 that energizes the inductive coil 170. The second induction coil receives electrical power from a power source, such as a battery, generator, or from a wall socket. The wire 176 at the distal end of the charger 174 is connected to a power source, and is electrically connected with the second induction coil. FIG. 22M shows the case 146 with an inductive coil 170 containing an electronic device interacting with the inductive charger 174. Note that the case 146 does not have to directly contact the inductive charger 174 in order for power to flow to the inductive coil 170 and thus to the electronic device. In certain embodiments, the inductive charger 174 is shaped so that the case 146 can be laid down into it, but the charger 174 could also be flat with the case 146 laid on top of it in any orientation, such as the perpendicular orientation shown in FIG. 22M. The induction coil in the case and the second induction coil in the inductive charger merely need to be in sufficient proximity and alignment to allow the two coils to interact electromagnetically and allow power transfer between them. In some embodiments, the inductive charger is sealed in a manner to prevent liquid, such as water, from entering the inductive charger. In some embodiments, the inductive charger allows charging of a device inside a case when exposed to a liquid, such as water.

Figure 23A:
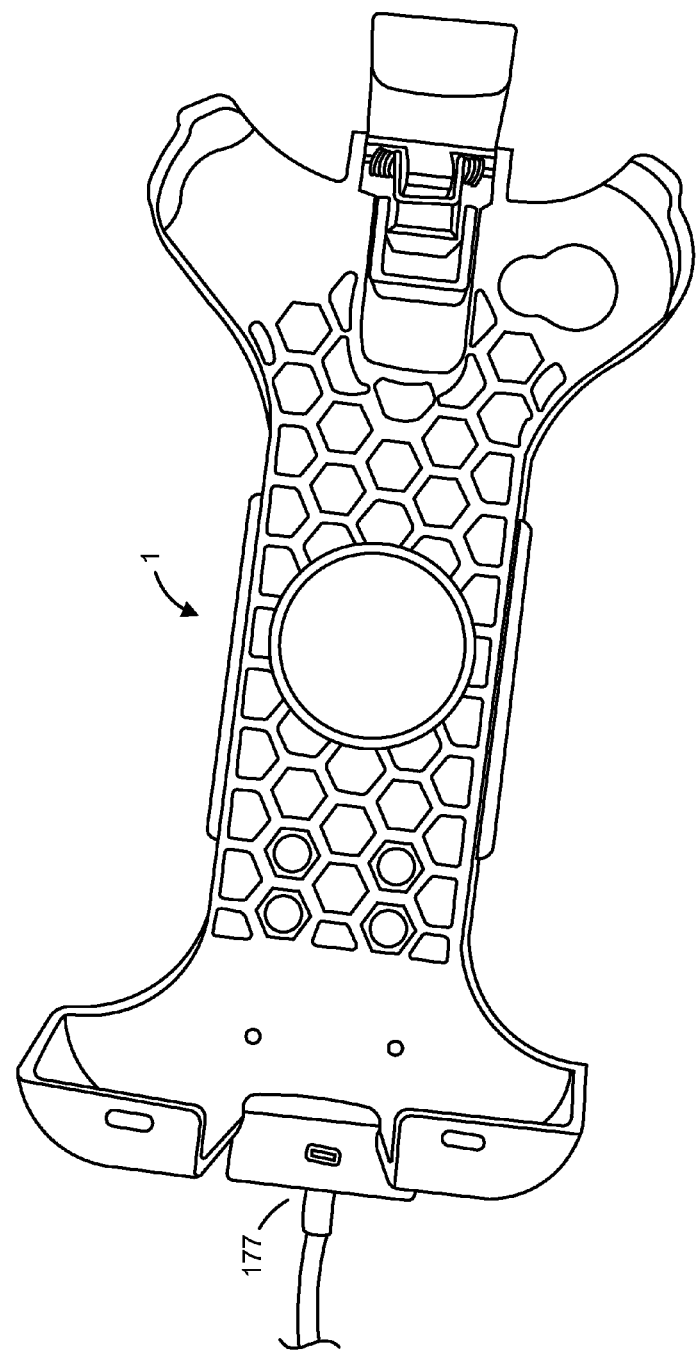
FIGS. 23A-23H are directed to other implementations of an electrical device charging system for charging the electrical device as it is enclosed, and in particular using a 30-pin connector or the like, having an O-ring to seal a charge port of the housing that encloses a charging electrical device.
Figure 23B:
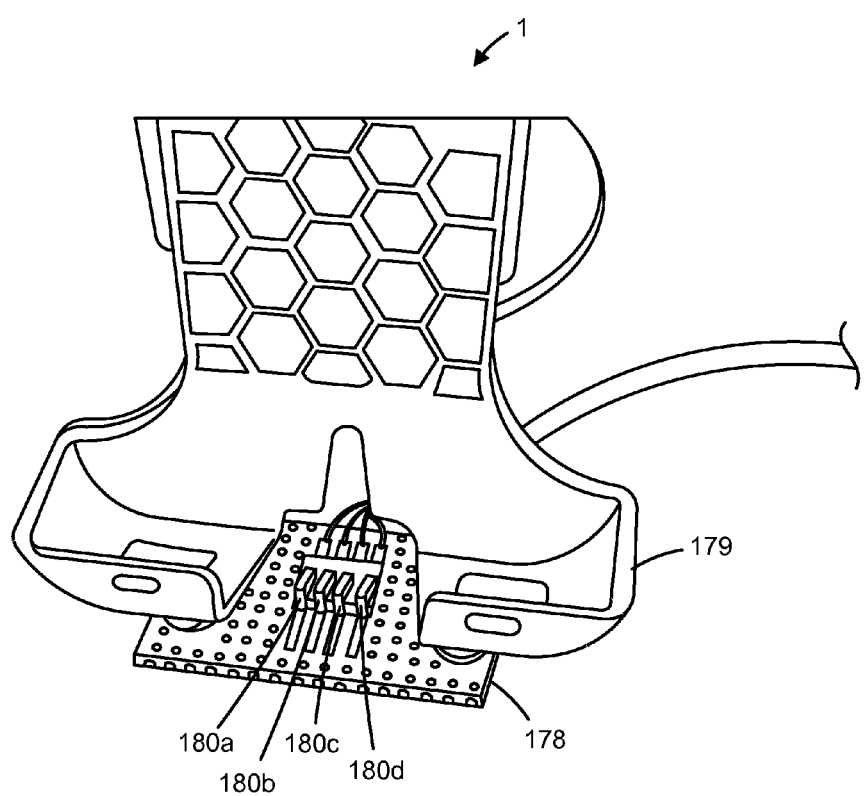

FIG. 23A shows a sled 1 with a 30 pin connector 177 associated with it. This 30 pin connector 177 can plug directly to an electronic device contained within a case 146 that has a proximal door 148 that allows direct access to the device. FIG. 23B shows a similar sled 1, wherein instead of a 30 pin connector 177, the sled 1 includes a four post device 178 that can interact with the four connector embodiment of the case 146.

Figure 23C:
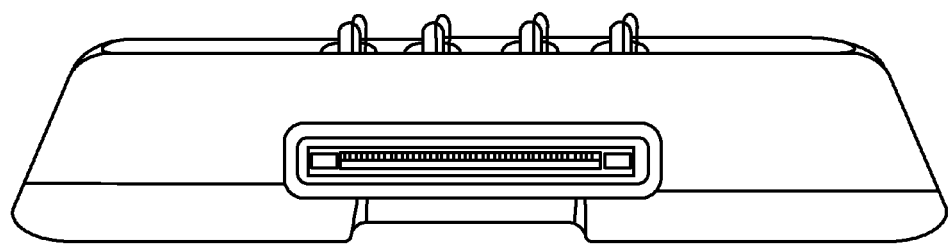

FIG. 23C shows a socket for a 30 pin connector for receiving a 30 pin insertion portion there within for the purpose of charging and/or transmitting data when coupled to both an electronic device and a 30 pin connector power cord/data transfer cord. The socket may be positioned any suitable place on the stand, and in this instance is positioned at the proximal rear end. In certain embodiments, the socket is positioned on the proximal rear portion of the sled 1.

Figure 23D:
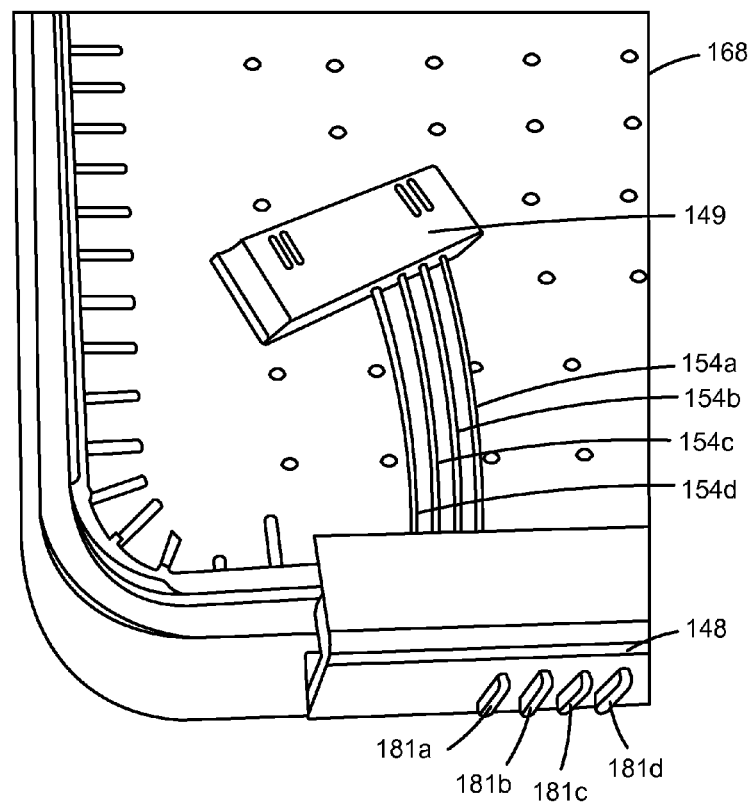

FIG. 23D shows a front proximal perspective of the rear portion 168 of the case 146 with a proximal door 148 with four pins 181*a*, 181*b*, 181*c*, and 181*d* for interacting with the posts shown in FIG. 23B. These pins 181*a*, 181*b*, 181*c*, and 181*d* can be in any number or any configuration appropriate for transmitting power and/or data to the electronic device inside the case 146. The pins in the proximal door 148 communicate electronically to the electronic device via the wires 154*a*, 154*b*, 154*c* and 154*d* and 30 pin connector 149. The wires 154*a*, 154*b*, 154*c* and 154*d* sizes are exaggerated to show the connection.

Figure 23E:
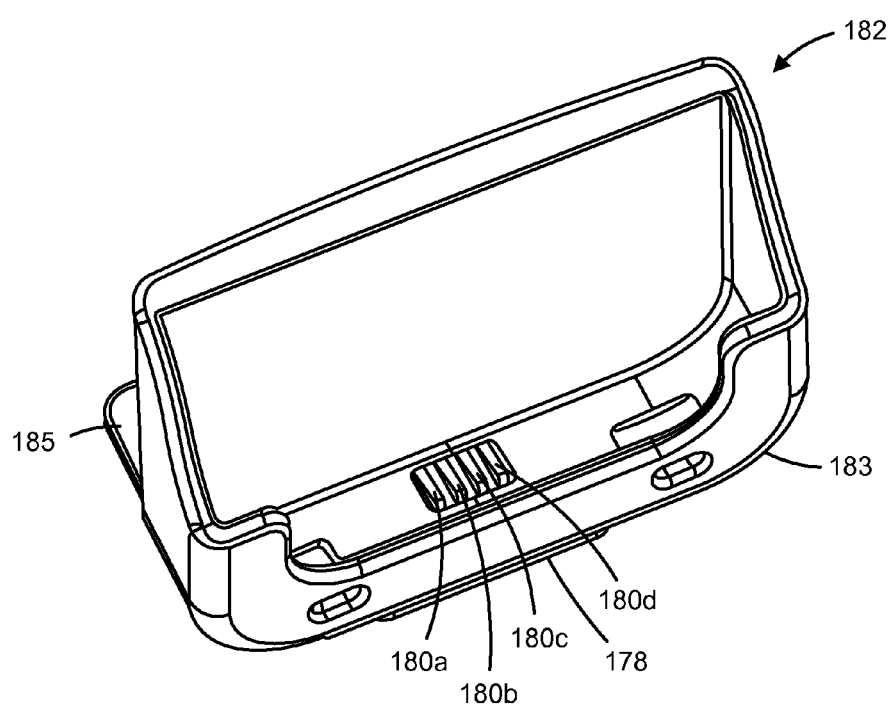
Figure 23F:
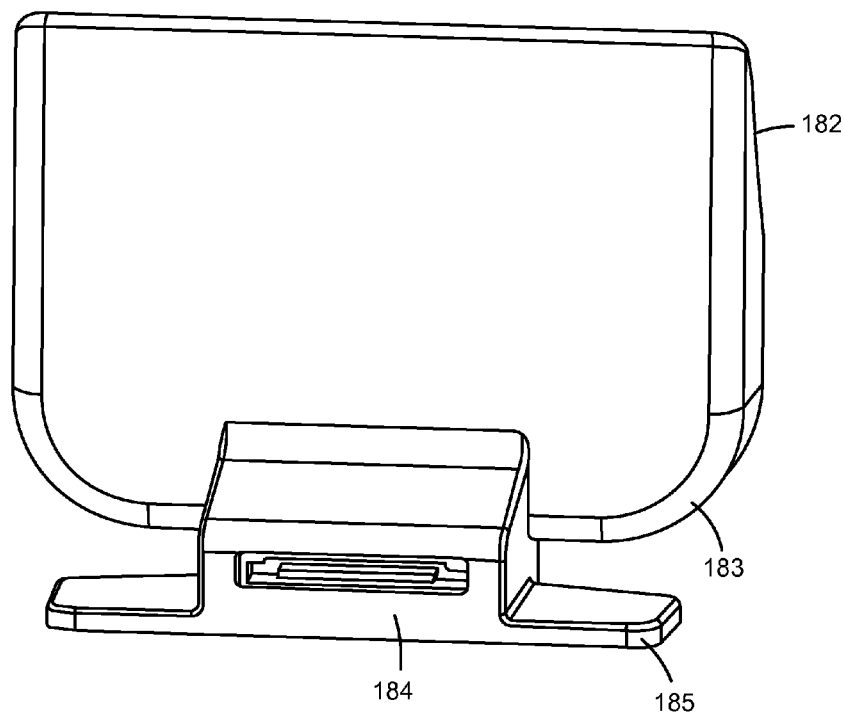
Figure 23G:
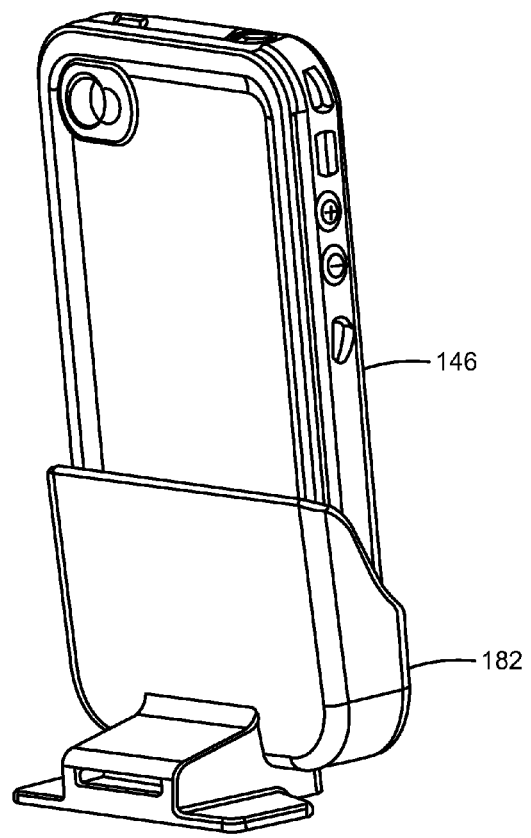
Figure 23H:
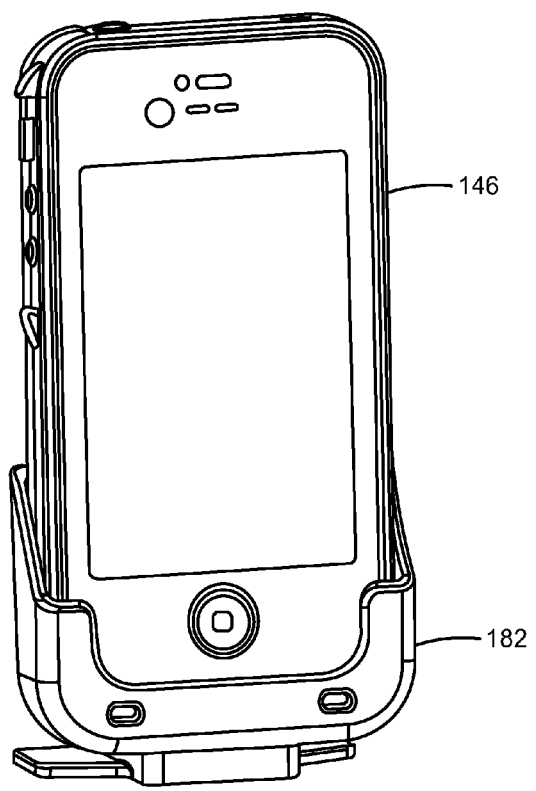

FIG. 23E shows view of the proximal interior of a stand 182 for an electronic device held with the case 146 shown above in FIG. 23D. The four pins 181*a*, 181*b*, 181*c*, and 181*d* on the proximal door 148 of the case 146 meet with the pins 180*a*, 180*b*, 180*c* and 180*d* at the proximal base 183 of this stand 182. FIG. 23F shows a rear view of the stand 182. A socket for a 30 pin connector 184 is shown in the rear portion of the stand 182 connecting to the four pins 180*a*, 180*b*, 180*c* and 180*d* shown in FIG. 23E. This form of connection to power and/or data is exemplary. Any connection form can be used to transmit power and/or data to the stand and thereby to the electronic device in the case 146. This perspective also provides a view of the base 185 of the stand 182. FIG. 23G shows the case 146 positioned inside the stand 182 so that the pins 181*a*, 181*b*, 181*c*, and 181*d* in the proximal door 148 of the case 146 are in contact with the pins 180*a*, 180*b*, 180*c* and 180*d* in the stand 182. This allows the electronic device inside the case 146 to be charged and/or synced without opening the case 146. FIG. 23H is a front view of the case 146 inside the stand 182.

Figure 24A:
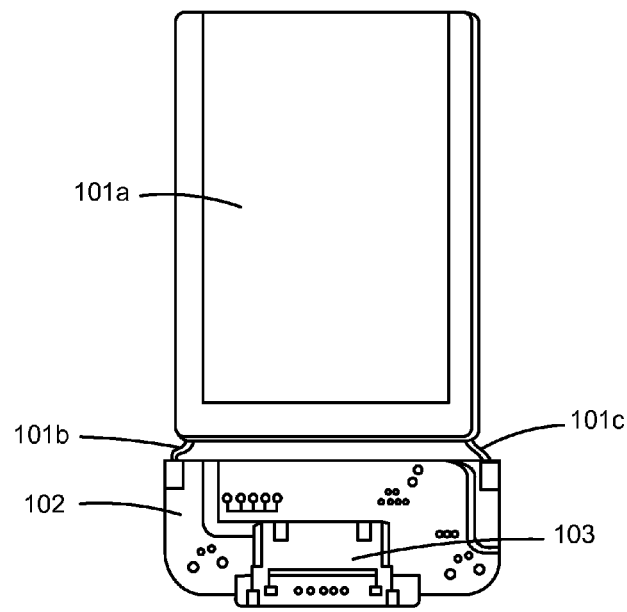
FIGS. 24A-24C are directed to implementations of an electronic device charging system including a battery associated with a case that provides additional energy storage capacity for an electronic device.

FIG. 24A shows a front view of a battery 101*a* that can be used in conjunction with the case described herein to provide a supplemental power source to an electronic device. The battery 101*a* is connected to a circuit board 102 by two wires, a left wire 101*b* and a right wire 101*c*. The connection between the battery and a circuit board can be made using any method known in the art. In certain embodiments, a circuit board is not needed and the battery is connected directly to an electronic device through a wire and/or a connector. Also, shown in a 30 pin connector 103 that connects the battery to a socket on the electronic device. This 30 pin connector 103 can be oriented in any direction that allows easy access for the 30 pin connector 103 to the electronic device. In addition to a 30 pin connector, the connector that connects the battery to a socket on the electronic device may be any suitable connector known in the art, such as a USB connector (standard, mini, micro) or Lightning connector.

Figure 24B:
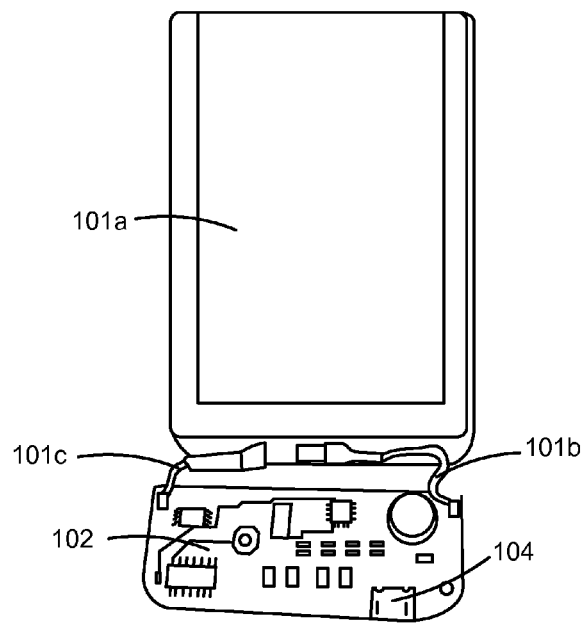
Figure 24C:
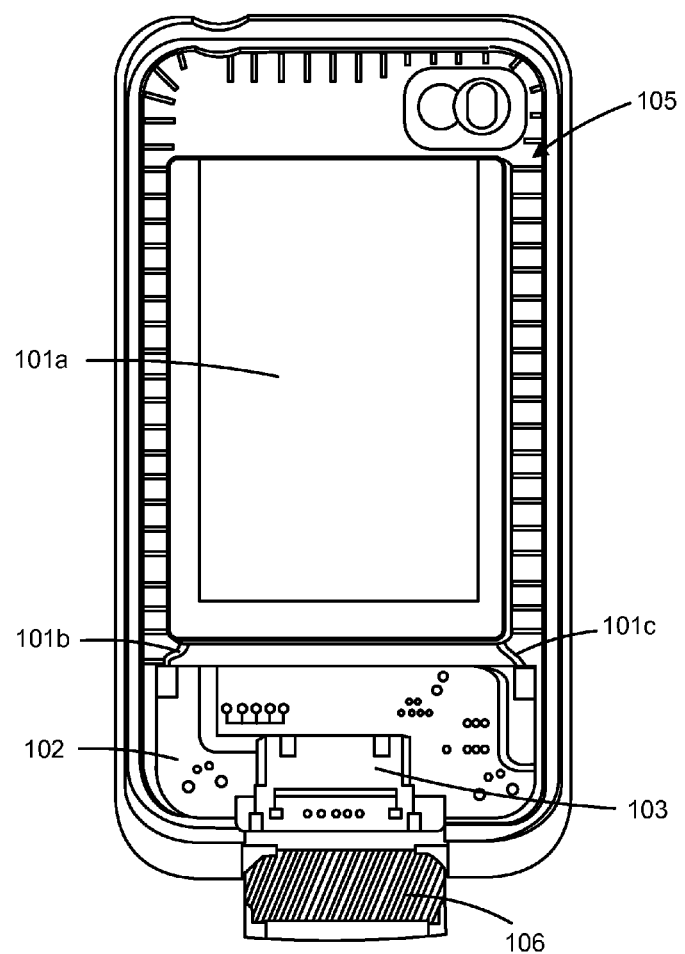

FIG. 24B shows the battery 101*a* from a rear view. The left 101*b* and right 101*c* wires are both shown connecting the battery 101*a* to the circuit board 102. Also shown on the circuit board is a micro-USB connector 104. The micro-USB connector 104 is used to provide data access to the electronic device while it is electronically coupled to the battery 101*a*. The micro-USB connector 104 or any other type of connector serving the same function, can be positioned near the proximal end of the circuit board or the battery to allow access to the connector. FIG. 24C shows the battery 101*a* positioned on the rear portion of a case 105. The battery 101*a* is positioned on or within the rear portion of the case 105. The micro-USB connector 104 can be accessed through the proximal door 106 at the proximal end of the case 105. This way, data can be transmitted to and from the electronic device without disconnecting it from the battery 101*a*. In certain embodiments, the micro-USB connector 104 is replaced with other connection options, such as other USB configurations or a 30 pin configuration. In certain embodiments, the electronic device and the battery 101*a* can both be charged through connecting through micro-USB connector 104, or another type of connector to a power source.

The invention also envisions cases, including battery-containing cases (see e.g., FIGS. 24A-C), which also include a powered flash unit integrated into the rear portion of a case. Depending on the number and position of the electronic digital camera(s) included in the electronic device to be housed inside the case, the flash unit may either serve as the primary or sole flash for the associated camera or as a supplementary flash to a flash unit included in the electronic device.

Preferably, the case-mounted flash will be synchronized with the digital camera with which it is associated when the device is housed within the case. In many embodiments this accomplished using a preferably programmable electronic timing circuit, which can either be in the device or in the case. When the timing circuit is in the device, the case-mounted flash of the invention is in electrical communication with device so that it can be triggered under when necessary. In such embodiments, the interior of the case includes the electronic circuitry and connections required to provide electrical communication and control between the timing circuit and flash unit. When the timing circuit is in the case, the case includes the required electronics.

In other embodiments, there is no electrical connection between the camera and case-mounted flash for purposes of controlling the case-mounted flash. For example, if the device itself includes a flash unit associated with the electronic digital camera, in some embodiments the case-mounted flash unit can be triggered using a case-mounted optical sensor to sense firing of the device's flash. When the case-mounted sensor senses a flash from the master flash of the device, an electronic controller in the case that controls firing of the case-mounted flash triggers the case-mounted flash to fire. Energy for the case-mounted flash can be drawn from the battery of the supplemental power source housed inside the case, although in some embodiments, energy may be drawn from the device's internal power supply. In such embodiments, the case includes circuitry that provides electrical communication between the device's power supply and the case-mounted flash.

Figure 24D:
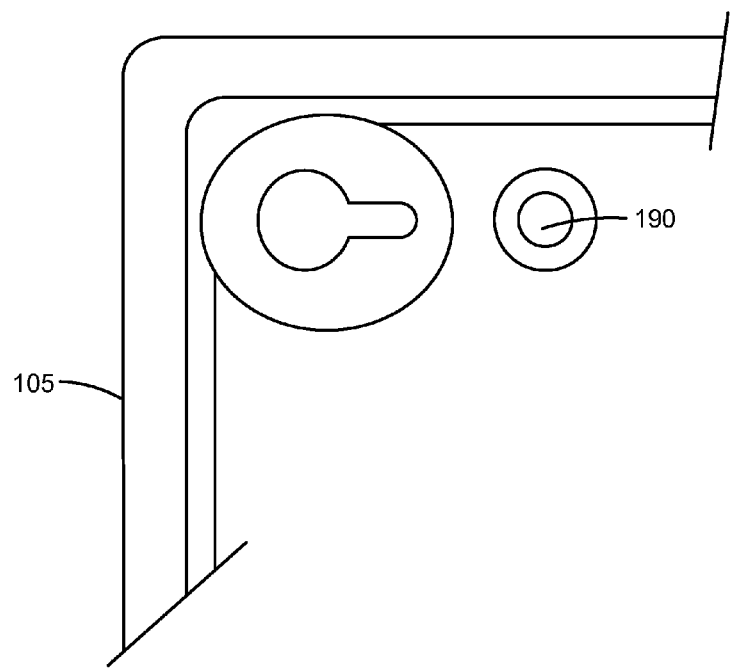
FIG. 24D is directed to a representative embodiment that includes a flash unit integrated into a case.

FIG. 24D depicts a representative example of a case that includes a flash unit. In the illustrated embodiment, the case-mounted powered flash unit 190 is integrated into the rear portion of a case 105. Required electrical connections between the case-mounted flash unit and device are provided on the interior portion of the case (not shown).

Figure 25A:
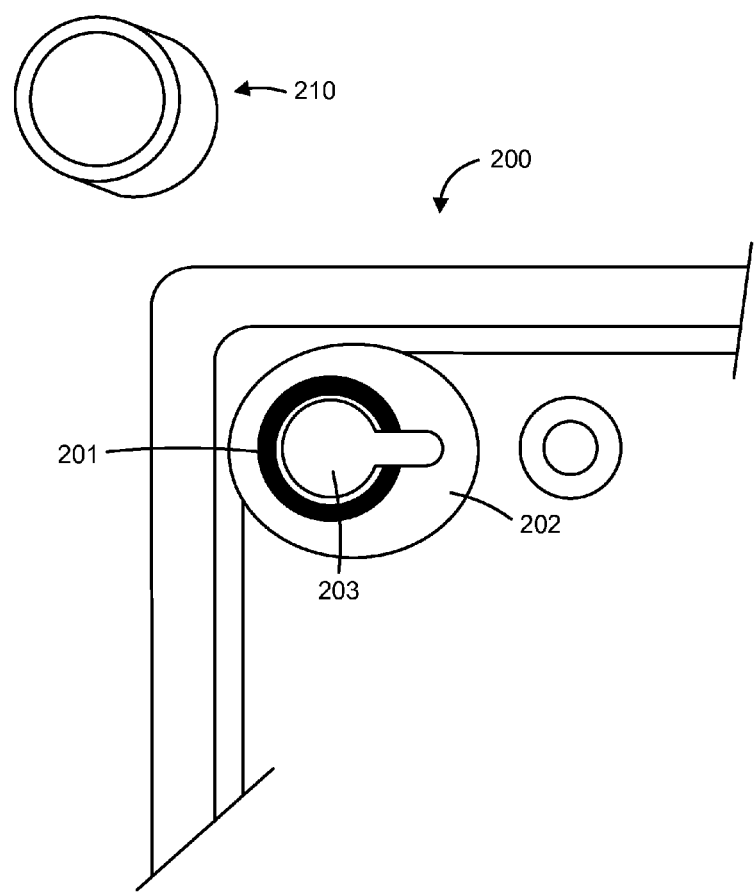
FIGS. 25A-B are directed to imaging systems that include a case for an electronic device having a camera and a lens that can be manually attached and detached from the case
Figure 25B:
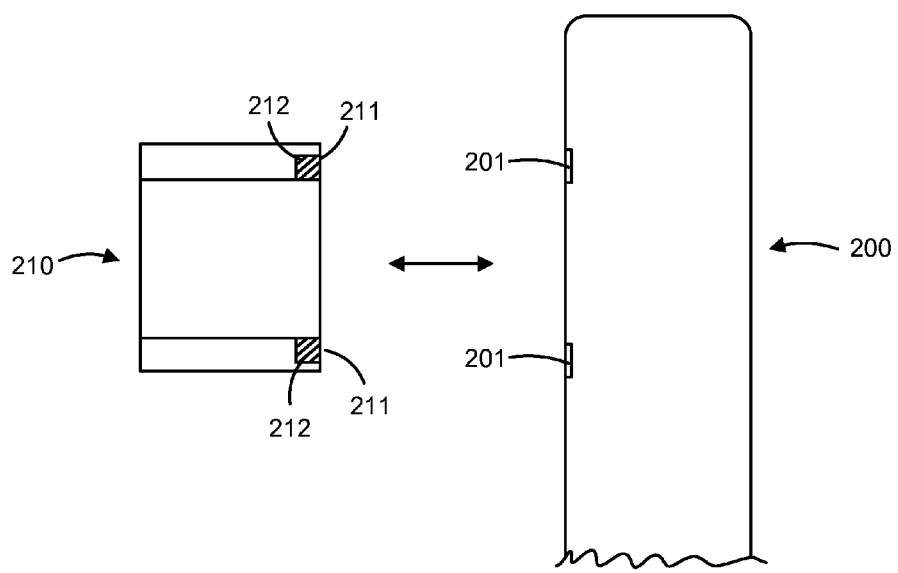

FIGS. 25A-B show an imaging system that a case 200 for an electronic device (not shown) having at least one built-in camera, such as a smart phone (e.g., an iPhone 4S, an iPhone 5, a Galaxy S, etc.) and a detachable lens 210. The case 200 can include an attachment point or mount 201 for an easily mounted, detachable camera lens 210 in a region of the case 202 that includes an optically clear region 203 that aligns with the device when it is properly positioned in the case. In other embodiments, instead of an optically clear region that aligns with an electronic device when positioned in the case, this region of the case includes a feature (or combination of features), preferably providing a watertight connection, that allow for attachment of any complementary detachable lens. For example, this region of the case may include a threaded port into which a threaded plug having an optically clear window can be inserted. When desired, the plug can be readily removed and replaced by a detachable camera lens having a complementary threaded connection.

The detachable lens 210 can be of any suitable variety, including a fish-eye, wide-angle, telephoto, zoom, or macro lens or assembly of lenses. If desired, the lens 210 can also accommodate one or more optical filters adapted for attachment to the front of the lens, opposite the end of the lens adapted for detachable connection with the case.

The attachment point or mount 201 of the case can include any mechanical or other attachment element, or combinations or grouping of mechanical or other attachment elements, compatible with the complementary mounting feature(s) on the mounting surface 211 of the detachable lens 210. Such attachment features include threaded or flange-type connectors, as well as magnetic connectors. Also included in the invention are embodiments wherein the connection between the case 200 and detachable lens 210 is waterproof. Preferably, a watertight seal between the case and lens is achieved using a gasket or seal disposed on periphery of the mounting surface of the detachable lens.

FIG. 25A shows a representative example of a particular mounting system that uses ferromagnetic force to detachably connect the lens to the case. As is known, magnetic force can be used to detachably connect components that each have a magnet, the poles of which are preferably oriented to maximize magnetic attraction between the magnets so as to facilitate and/or stabilize lens attachment to the case. Alternatively, one of the two components (i.e., the detachable lens or the case) may contain a magnet while the other component contains a ferromagnetic material (e.g., iron, nickel, cobalt, alloys containing such substances, lodestone, and the like). In such embodiments, magnetic force can be used to rapidly, easily, and reversibly attach the detachable lens to the case. If desired, other features, such as one or more complementary alignment pins and holes, ridges, bumps, etc. can be included on the mounting surface 211 of the detachable lens 210 and attachment point or mount 201 of the case to ensure proper alignment of the lens with the case, and ultimately, with a camera disposed on the device housed within the case.

In the embodiment illustrated in FIG. 25B, the mounting surface 211 of the detachable lens 210 includes a ring-shaped magnet or magnetized region 212. As those in the art will appreciate, other magnet configurations can be used, including those where a face or surface of the magnet(s) are not exposed and instead are positioned just below the mounting surface 211 of the lens 210. Similarly, the component(s) in the attachment point or mount 201 of the case can include one or more appropriately oriented magnets or be ferromagnetic such that the ferromagnetic magnet(s) are magnetically attracted to the magnetized region of the lens 210 when the two are positioned near enough for secure yet detachable connection.

Figure 26A:
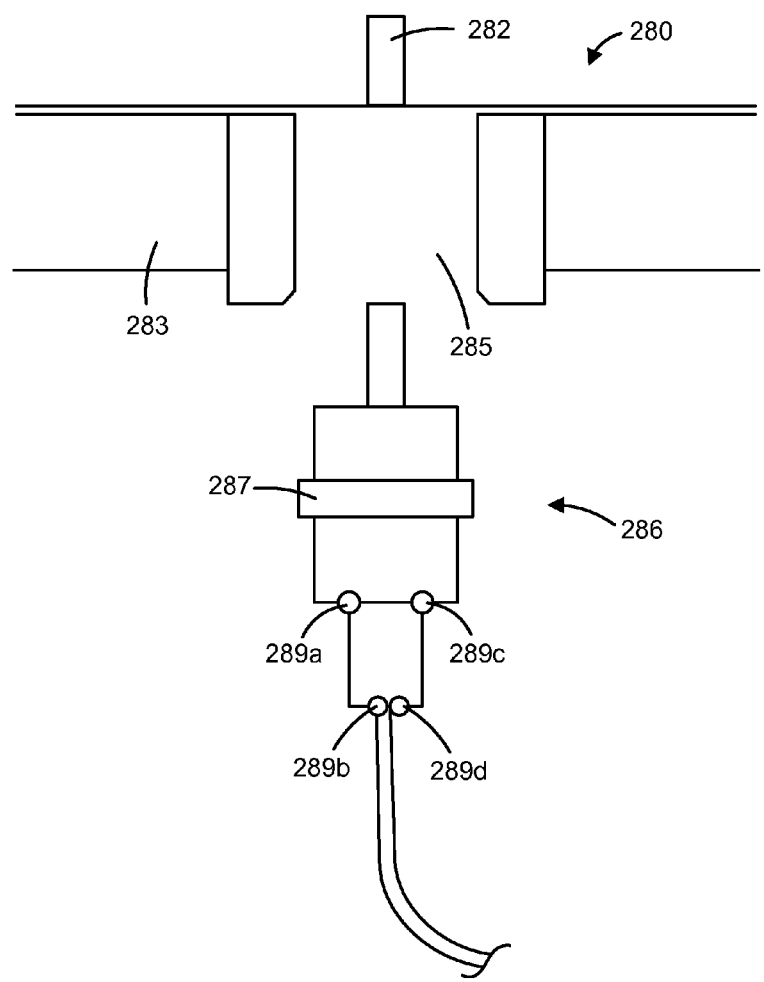
FIGS. 26A-C are directed to embodiments of cases and water sealed connectors that, when connected, result in a water tight seal that inhibits entry of water or other liquids.
Figure 26B:
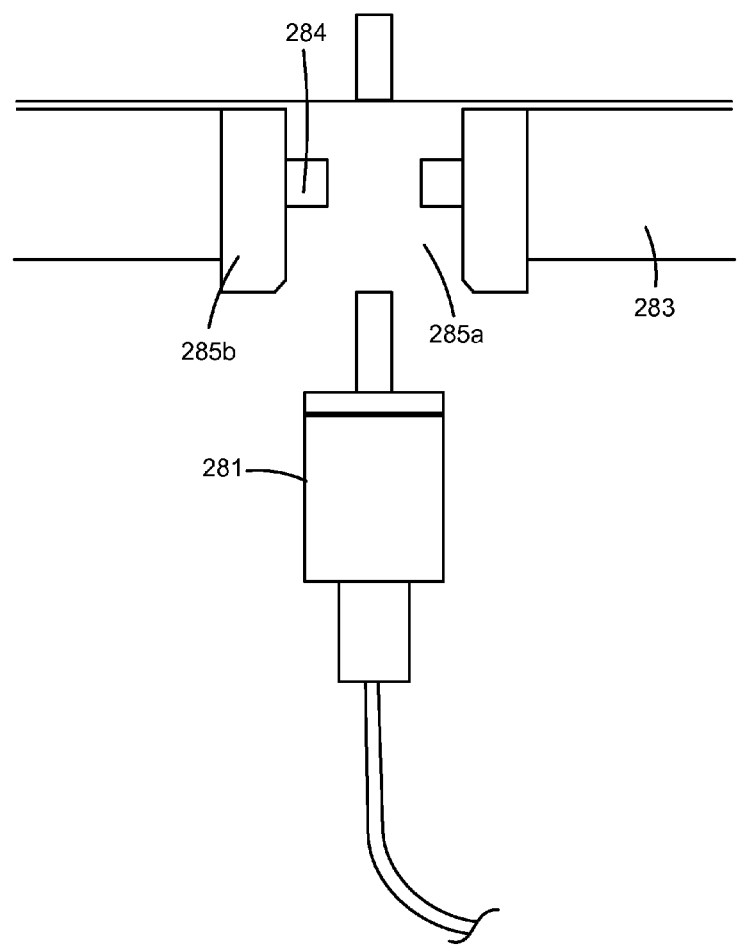
Figure 26C:
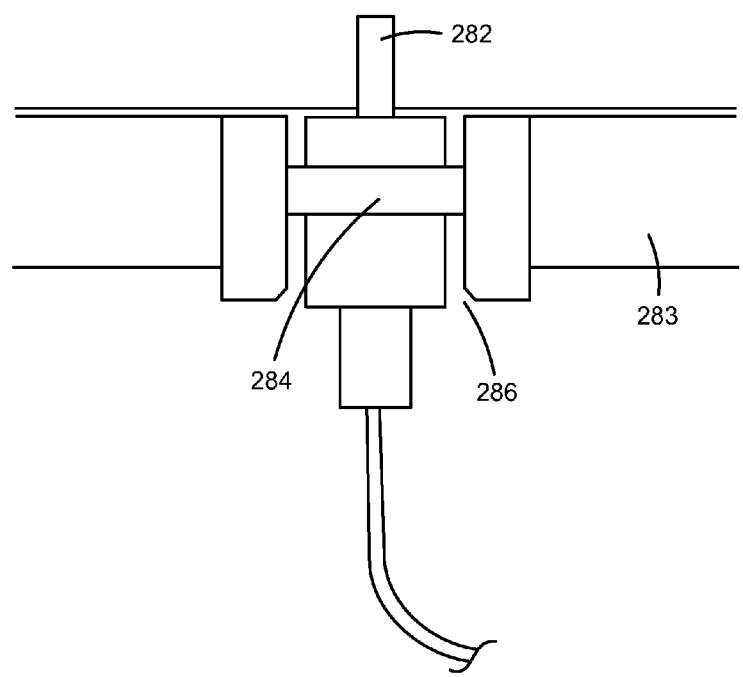

FIGS. 26A-C illustrate cross section side views of an embodiment of a case that has a proximal opening and a connector that forms a water tight seal when inserted into the proximal opening. FIG. 26A shows a portion of a mobile device 280 with a port 282 to receive a connector. The mobile device is inside a case 283 having a proximal opening 285 that is proximate the port 282. A water sealed connector 286 is near the proximal opening 285. The water sealed connector can mate with the port, and may be any suitable connector, such as a 30 pin connector, a USB connector (e.g. standard, mini, or micro), Lightning connector, or DisplayPort connector. The water sealed connector is sealed from entry by water or aqueous liquids at connector sealed points 289a, 289b, 289c, 289d. Sealing of the connector sealed points may be accomplished, for example, using a sleeve or coating formed from a material that resists or repels water (e.g. rubber or silicon). The water sealed connector 286 may have a connector gasket 287 that surrounds a portion of the water sealed connector 286, such that when the connector is inserted through the proximal opening and mated with the port, a water tight seal is formed between the proximal opening of the case and the water sealed connector. FIG. 26B illustrates an alternative embodiment of the proximal opening, in which a proximal opening gasket 284 is molded to a portion of the inner face 285b of the proximal opening 285a of the case 283.

FIG. 26B also illustrates an embodiment of the water sealed connector 286 that includes a connector face gasket 281. One of skill in the art would understand that the connector face gasket of FIG. 26B could be used in combination with the connector gasket shown in FIG. 26A. The connector face gasket can also be used to provide a water tight seal between the water-sealed connector and the mobile device. When the water sealed connector is inserted into the proximal opening and mated with the port of the mobile device, a water tight seal is formed between the inner face of the proximal opening of the case and the water sealed connector. FIG. 26C illustrates the water sealed connector 286 of FIG. 26A inserted into the proximal opening of the case 283 and mated with the mobile device port 282. Proximal opening gasket 284 seals the proximal opening from entry of water or other aqueous liquids.

Figure 27:
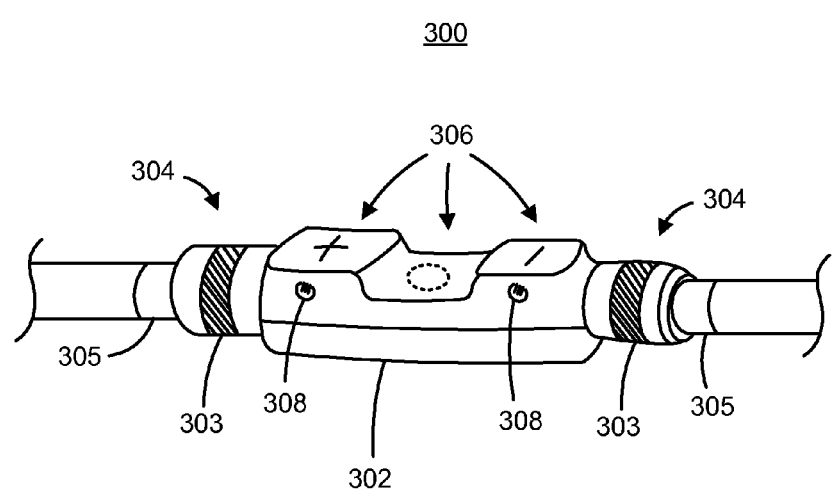
FIG. 27 is directed to an implementation of a waterproof microphone and controller.

FIG. 27 shows a waterproof microphone and controller 300 for an electronic cord, in accordance with preferred implementations. The waterproof microphone and controller 300 can be used with a mobile computing device, or with an encasement for a mobile computing device, as described herein. The waterproof microphone and controller 300 includes a body 302 that encases an electronic controller and microphone (not shown). The body 302 can be formed of any type of water or liquid resistant material, and may include one or more sealing members to seal the electronic controller and microphone from intrusion by a liquid such as water. In some implementations, the material is silicone, but may include plastic, metal, or any other material that can be sealed against liquid intrusion.

In some implementations, the body 302 includes opposing sock members 304 for receiving and coupling with distal ends of electric cables 305. The distal ends of the cables 305 may include a special electronic interface. In preferred implementations, the sock members 304 are configured for being overlaid on the distal ends of the cable. One or more collets 303 can be coupled around each of the sock members 304, preferably as a final assembly step. The collets 303 slightly crush the material that forms the body 302 and/or sock members 304 to form a water tight seal, so that no water can get in by the cable insulation jacket and/or sock members 304. In some implementations, the opposing sock members 304 are unitary with at least part of the body 302. In other implementations, the body 302 can include additional jackets for overlaying the sock members 304.

The body 302 includes one or more control button regions 306 for enabling operation and control of control buttons, switches, latches, etc., of the electronic microphone and controller within the body 302. For instance, the body 302 can include a volume up, volume down, mute, or other button. The body 302 further includes one or more sealed apertures 308 that are sealed by a water impermeable film or fabric, coupled with the material of the body 302 and overlaying a water permeable electronic feature such as a microphone or speaker. With the waterproof microphone and controller 300 described herein, and its variants, an accessory such as a headphone, earpiece, microphone, camera or other peripheral can be used with a waterproof encasement to encase a mobile computing device.

What is claimed:

1. An apparatus for covering at least part of a mobile computing device having a touch screen display, the mobile computing device further having an electrical connection available at an outer surface of a housing that houses the mobile computing device, the apparatus comprising:
   an encasement for the mobile computing device that permits operation of the touch screen display and covers at least part of the mobile computing device that includes the electrical connection, the encasement having an outer surface and an inner surface;
   an aperture passing through the inner surface and the outer surface of the encasement proximate the electrical connection of the mobile computing device;
   an electrical connection adapter having a body for closing the aperture in the encasement, the electrical connection adapter having a first electrical interface connected with the body, the first electrical interface for interfacing with the electrical connection of the mobile computing device when the body closes the aperture in the encasement, the electrical connection adapter further having a second electrical interface connected with the body, the second electrical interface for transferring electrical power and/or data signals to and/or from the mobile computing device through the first electrical interface, the second electrical interface including a plurality of sealed, electrically-conductive contacts positioned at an outer surface of the body and accessible from outside of the encasement when the aperture is closed by the body, and a plurality of electrical conductors extending through the body, each connecting a respective one of the sealed electrically-conductive contacts with the first electrical interface; and a gasket for sealing the electrical connection adapter with the encasement at the aperture.

2. An apparatus in accordance with claim 1, wherein the encasement has a bottom member to cover at least a first portion of the mobile computing device, and a top member to cover at least a second portion of the mobile computing device, the top member configured to allow touch access to the touch screen display.

3. An apparatus for covering at least part of a mobile computing device having a touch screen display, the mobile computing device further having an electrical connection available at an outer surface of a housing that houses the mobile computing device, the apparatus comprising:

an encasement that permits operation of the touch screen display and covers at least part of the mobile computing device that includes the electrical connection, the encasement having a frame; and an electrical connection adapter disposed within a surface of the frame proximate the electrical connection, the electrical connection adapter having a first electrical interface connected with the frame, the first electrical interface for interfacing with the electrical connection of the mobile computing device when the mobile computing device is covered by the encasement, the electrical connection adapter further having a second electrical interface connected with the frame, the second electrical interface for transferring electrical power and/or data signals to and/or from the first electrical interface, the second electrical interface including a plurality of sealed, electrically-conductive contacts positioned at an outer surface of the encasement and exposed to the exterior environment, and a plurality of corresponding electrical connections that connect the sealed electrically-conductive contacts with the first electrical interface.

4. The apparatus in accordance with claim 1, wherein the plurality of sealed, electrically-conductive contacts are flush with the outer surface of the encasement.

5. The apparatus in accordance with claim 2, wherein the encasement has a coupling mechanism to couple the top member with the bottom member to cover the first and second portions of the mobile computing device, and to seal the top member with the bottom member.

6. The apparatus in accordance with claim 1, further comprising a coupling mechanism to couple the electrical connection adapter to the encasement.

7. The apparatus in accordance with claim 1, further comprising a tether that connects the electrical connection adapter with the encasement.

8. The apparatus in accordance with claim 1, further comprising a hinge that connects the electrical connection adapter with the encasement.

9. The apparatus in accordance with claim 1, wherein the gasket is coupled with the body of the electrical connection adapter.

10. The apparatus in accordance with claim 1, wherein the gasket is coupled with the aperture of the encasement.

11. An apparatus for covering at least part of a mobile computing device having a touch screen display, the mobile computing device further having an electrical connection available at an outer surface of a housing that houses the mobile computing device, the apparatus comprising:

a liquid resistant encasement that prevents damage to the mobile computing device from a liquid when the mobile computing device is encased in the liquid resistant encasement and when the liquid resistant encasement is in a sealed configuration with the mobile computing device, the liquid resistant encasement further permitting operation of the touch screen display when the mobile computing device is encased therein, the encasement having an outer surface and an inner surface and an aperture passing therethrough proximate the electrical connection of the mobile computing device;

an electrical connection adapter having a body for sealing the aperture against liquid intrusion into the liquid resistant encasement, the electrical connection adapter having a first electrical interface connected with the body, the first electrical interface for interfacing with the electrical connection of the mobile computing device when the body seals the aperture in the liquid resistant encasement, the electrical connection adapter further having a second electrical interface connected with the body, the second electrical interface for transferring electrical power and/or data signals to and/or from the mobile computing device through the first electrical interface, the second electrical interface including a plurality of sealed, electrically-conductive connectors positioned at an outer surface of the body and accessible at the outer surface of the encasement when the body seals the aperture, and a plurality of electrical conductors extending through the body electrically connecting the sealed electrically-conductive connectors with the first electrical interface.

12. The apparatus in accordance with claim 11, further comprising a gasket for sealing the electrical connection adapter to the encasement at the aperture.

13. The apparatus in accordance with claim 11, further comprising a coupling mechanism to couple the electrical connection adapter to the encasement when the body closes the aperture in the encasement.

14. The apparatus in accordance with claim 11, further comprising a tether that connects the electrical connection adapter with the encasement.

15. The apparatus in accordance with claim 11, further comprising a hinge that connects the electrical connection adapter with the encasement.

16. An apparatus for covering at least part of a mobile computing device having a touch screen display, the mobile computing device further having an electrical connection attached to a housing that houses the mobile computing device, the apparatus comprising:

an encasement that covers at least part of the mobile computing device that includes the electrical connection, the encasement having a bottom member to cover at least a first portion of the mobile computing device, and a top member to cover at least a second portion of the mobile computing device, the top member configured to allow touch access to the touch screen display;

a coupling mechanism to couple the top member with the bottom member to cover the first and second portions of the mobile computing device, and to seal the top member with the bottom member;

an aperture in the encasement proximate the electrical connection of the mobile computing device, the aperture having a gasket seat;

an electrical connection adapter having a body for closing the aperture in the encasement, the electrical connection adapter having a first electrical interface connected with the body, the first electrical interface for interfacing with the electrical connection of the mobile computing device when the body closes the aperture in the encasement, the electrical connection adapter further having a second electrical interface connected with the body, the second electrical interface for transferring electrical power and/or data signals to and/or from the mobile computing device through the first electrical interface, the second electrical interface including an array of sealed, electrically-conductive contacts positioned at an outer surface of the body and exposed to the exterior environment of the encasement, and a plurality of electrical connections that electrically connect the sealed electrically-conductive contacts with the first electrical interface; and a gasket for being seated on the gasket seat to seal an interface between the aperture in the encasement and the body of the electrical connection adapter.

17. An apparatus in accordance with claim 16, further comprising a second coupling mechanism to couple the electrical connection adapter to the encasement when the body closes the aperture in the encasement.

18. The apparatus in accordance with claim 16, further comprising a second coupling mechanism to couple the electrical connection adapter to the encasement when the body closes the aperture in the encasement.

19. The apparatus in accordance with claim 16, further comprising a tether that connects the electrical connection adapter with the encasement.

20. The apparatus in accordance with claim 16, further comprising a hinge that connects the electrical connection adapter with the encasement.

21. The apparatus in accordance with claim 3, wherein the encasement has a bottom member to cover at least a first portion of the mobile computing device, and a top member to cover at least a second portion of the mobile computing device, the top member configured to allow touch access to the touch screen display, and wherein the electrical connection adapter is positioned on the top member or the bottom member.

* * * * *